US008928004B2

(12) United States Patent
Choe et al.

(10) Patent No.: US 8,928,004 B2
(45) Date of Patent: Jan. 6, 2015

(54) STRUCTURE FOR GROWTH OF NITRIDE SEMICONDUCTOR LAYER, STACKED STRUCTURE, NITRIDE-BASED SEMICONDUCTOR ELEMENT, LIGHT SOURCE, AND MANUFACTURING METHOD FOR SAME

(71) Applicant: Panasonic Corporation, Osaka (JP)

(72) Inventors: Songbaek Choe, Osaka (JP); Toshiya Yokogawa, Nara (JP); Akira Inoue, Osaka (JP); Atsushi Yamada, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 14/085,523

(22) Filed: Nov. 20, 2013

(65) Prior Publication Data
US 2014/0077223 A1    Mar. 20, 2014

Related U.S. Application Data

(63) Continuation of application No. PCT/JP2012/004958, filed on Aug. 3, 2012.

(30) Foreign Application Priority Data

Aug. 9, 2011  (JP) ................................. 2011-174300
Nov. 25, 2011 (JP) ................................. 2011-257924
Feb. 1, 2012  (JP) ................................. 2012-019641

(51) Int. Cl.
H01L 29/15    (2006.01)
H01L 31/036   (2006.01)
(Continued)

(52) U.S. Cl.
CPC ............... H01L 33/18 (2013.01); C30B 25/04 (2013.01); C30B 25/18 (2013.01); H01L 33/16
(Continued)

(58) Field of Classification Search
CPC ............ H01L 33/18; H01L 21/02542; H01L 21/0252; H01L 21/20; H01L 21/0254; H01L 29/403
USPC .............................................. 257/76; 438/478
See application file for complete search history.

(56) References Cited

U.S. PATENT DOCUMENTS 8,409,892 B2*  4/2013  Peng et al. .................. 438/38
2002/0014681 A1  2/2002  Tsuda et al.
(Continued)

FOREIGN PATENT DOCUMENTS

EP  1244140 A2  9/2002
EP  2090680 A1  8/2009
(Continued)

OTHER PUBLICATIONS

Baker et al., "Characterization of Planar Semipolar Gallium Nitride Films on Sapphire Substrates", Japanese Journal of Applied Physics, Feb. 3, 2006, L154-L157, vol. 45, No. 6, The Japan Society of Applied Physics, Tokyo, Japan. Cited in [0013] of the Specification.

(Continued)

Primary Examiner — William D Coleman
(74) Attorney, Agent, or Firm — Renner, Otto, Boisselle & Sklar, LLP

(57) ABSTRACT

A structure for growth of a nitride semiconductor layer which is disclosed in this application includes: a sapphire substrate of which growing plane is an m-plane; and a plurality of ridge-shaped nitride semiconductor layers provided on the growing plane of the sapphire substrate, wherein a bottom surface of a recessed portion provided between respective ones of the plurality of ridge-shaped nitride semiconductor layers is the m-plane of the sapphire substrate, the growing plane of the plurality of ridge-shaped nitride semiconductor layers is an m-plane, and an absolute value of an angle between an extending direction of the plurality of ridge-shaped nitride semiconductor layers and a c-axis of the sapphire substrate is not less than 0° and not more than 35°.

16 Claims, 90 Drawing Sheets

(51) Int. Cl.

| | | |
|---|---|---|
| *H01L 21/20* | (2006.01) | |
| *H01L 21/36* | (2006.01) | |
| *H01L 33/18* | (2010.01) | |
| *C30B 25/04* | (2006.01) | |
| *C30B 25/18* | (2006.01) | |
| *H01L 33/16* | (2010.01) | |
| *H01L 21/02* | (2006.01) | |
| *H01L 33/00* | (2010.01) | |
| *H01L 33/20* | (2010.01) | |
| *C30B 29/40* | (2006.01) | |
| *H01L 33/58* | (2010.01) | |
| *H01L 33/32* | (2010.01) | |
| *H01L 33/12* | (2010.01) | |

(52) U.S. Cl.
CPC .... (2013.01); *H01L 21/0242* (2013.01); *H01L 21/0243* (2013.01); *H01L 21/02433* (2013.01); *H01L 21/02458* (2013.01); *H01L 21/0254* (2013.01); *H01L 21/02639* (2013.01); *H01L 21/0265* (2013.01); *H01L 33/007* (2013.01); *H01L 33/20* (2013.01); *C30B 29/403* (2013.01); *H01L 21/20* (2013.01); *H01L 33/58* (2013.01); *H01L 21/0262* (2013.01); *H01L 21/02609* (2013.01); *H01L 21/02642* (2013.01); *H01L 33/32* (2013.01); *H01L 33/12* (2013.01)
USPC ............................................. 257/76; 438/478

(56) References Cited

U.S. PATENT DOCUMENTS

| | | |
|---|---|---|
| 2006/0099781 A1 | 5/2006 | Beaumont et al. |
| 2006/0266281 A1 | 11/2006 | Beaumont et al. |
| 2006/0270076 A1 | 11/2006 | Imer et al. |
| 2008/0135853 A1 | 6/2008 | Craven et al. |
| 2008/0258156 A1 | 10/2008 | Hata |
| 2009/0238227 A1 | 9/2009 | Kubota et al. |
| 2010/0102360 A1 | 4/2010 | Nakada et al. |
| 2010/0207136 A1 | 8/2010 | Armitage et al. |
| 2010/0308437 A1 | 12/2010 | Okuno et al. |
| 2012/0091463 A1 | 4/2012 | Yokogawa |
| 2012/0319156 A1 | 12/2012 | Yokogawa et al. |
| 2013/0015487 A1 | 1/2013 | Okuno |
| 2013/0126901 A1 | 5/2013 | Isozaki et al. |

FOREIGN PATENT DOCUMENTS

| | | |
|---|---|---|
| EP | 2602837 A1 | 6/2013 |
| JP | 2001-308462 A | 11/2001 |
| JP | 2002-016001 A | 1/2002 |
| JP | 2002-100575 A | 4/2002 |
| JP | 2003-063895 A | 3/2003 |
| JP | 2003-332697 A | 11/2003 |
| JP | 2005-020026 A | 1/2005 |
| JP | 2006-036561 A | 2/2006 |
| JP | 2007-184503 A | 7/2007 |
| JP | 2008-305971 A | 12/2008 |
| JP | 2009-018971 A | 1/2009 |
| JP | 2009-018972 A | 1/2009 |
| JP | 2009-117641 A | 5/2009 |
| JP | 2009-120425 A | 6/2009 |
| JP | 2009-182340 A | 8/2009 |
| JP | 2009-203151 A | 9/2009 |
| JP | 2009-212343 A | 9/2009 |
| JP | 2009-295994 A | 12/2009 |
| JP | 2010-258459 A | 11/2010 |
| WO | 2008/047907 A1 | 4/2008 |
| WO | WO 2011/070768 A1 | 6/2011 |
| WO | 2011/125279 A1 | 10/2011 |
| WO | 2012/017686 A1 | 2/2012 |

OTHER PUBLICATIONS

Kidoguchi et al., "Air-bridged lateral epitaxial overgrowth of GaN thin films", Applied Physics Letters, Jun. 19, 2000, 3768-3770, vol. 76, No. 25, The American Institute of Physics, Melville, New York. Cited in [0019] of the Specification.

Chen et al., "Dislocation reduction in GaN thin films via lateral overgrowth from trenches", Applied Physics Letters, Oct. 4, 1999, 2062-2063, vol. 75, No. 14, The American Institute of Physics, Melville, New York. Cited in [0019] of the Specification.

Kim et al., "Low extended defect density nonpolar $m$-plane GaN by sidewall lateral epitaxial overgrowth", Applied Physics Letters, Oct. 9, 2008, 142108-1-142108-3, vol. 93, Issue 14, The American Institute of Physics, Melville, New York. Cited in [0459] of the Specification.

Frentrup et al., "Crystal orientation of GaN layers on (1010) $m$-plane sapphire", Physica Status Solidi B, Jan. 12, 2011, 583-587, vol. 248, No. 3, Wiley-VCH Verlag GmbH & Co. KGaA, Weinheim. Cited in [0382] of the Specification.

Fischer et al., "Misfit Strain Relaxation by Stacking Fault Generation in InGaN Quantum Wells Grown on $m$-Plane GaN", Applied Physics Express, Apr. 3, 2009, 041002-1-041002-3, vol. 2, No. 4, The Japan Society of Applied Physics, Tokyo, Japan. Cited in [0420] of the Specification.

Masui et al., "Optical polarization characteristics of InGaN/GaN light-emitting diodes fabricated on GaN substrates oriented between (1010) and (1011) planes", Applied Physics Letters, Mar. 4, 2008, 091105-1-091105-3 vol. 92, Issue 9, The American Institute of Physics, Melville, New York. Cited in [0472] of the Specification.

Written Opinion with partial English translation for corresponding International Application No. PCT/JP2012/004958, dated Nov. 27, 2012.

International Search Report for corresponding International Application No. PCT/JP2012/004958, mailed Nov. 27, 2012.

Notice of Reasons for Rejection for Japanese Patent Application No. 2013-527883, which is a national phase application of PCT/JP2012/004958, and English translation thereof, mailed Sep. 10, 2013.

Extended European Search Report for corresponding Application No. 14000239 dated Sep. 18, 2014.

Extended European Search Report for corresponding Application No. 12821910.2 dated Jul. 2, 2014.

\* cited by examiner

*FIG. 11*
(a)
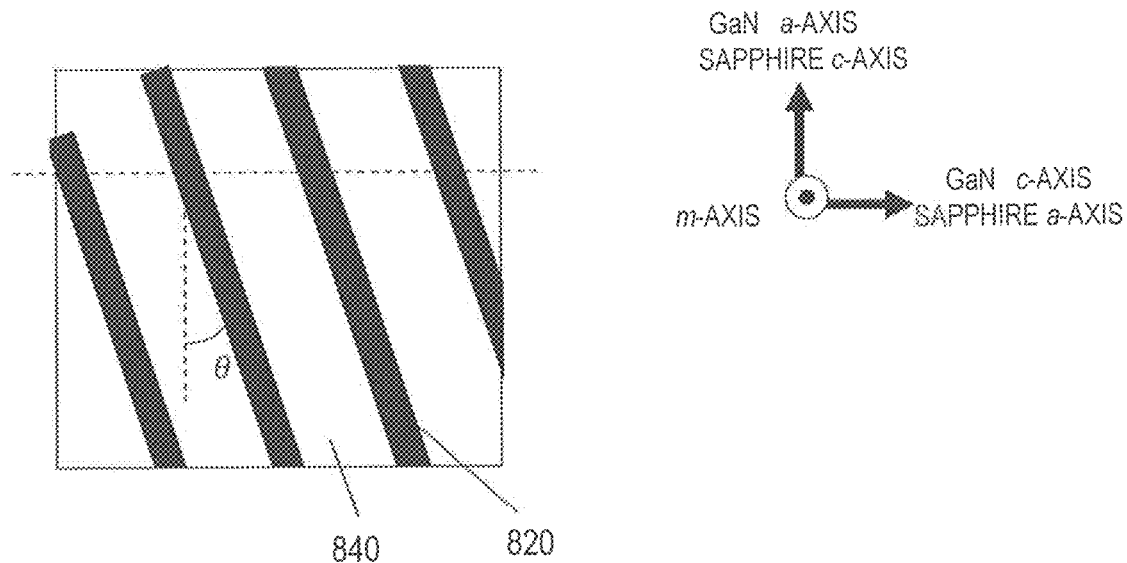
(b)
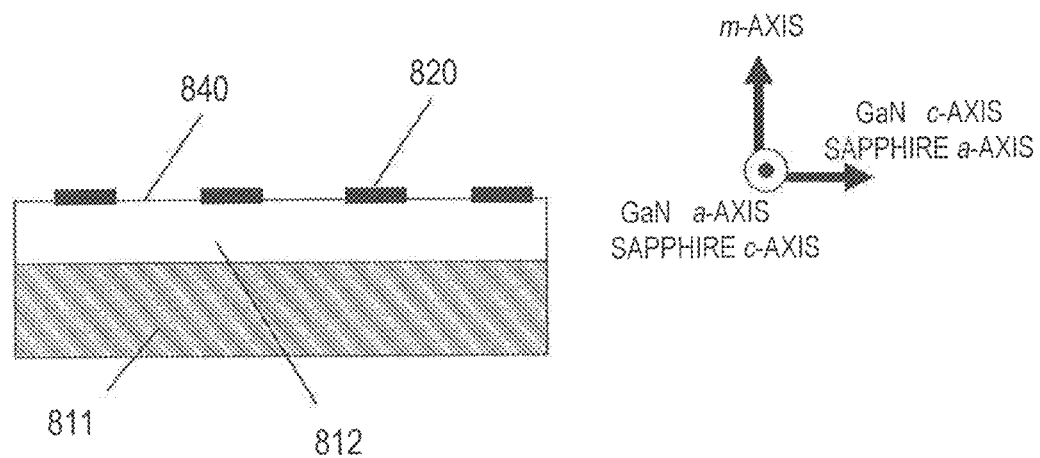

FIG. 12
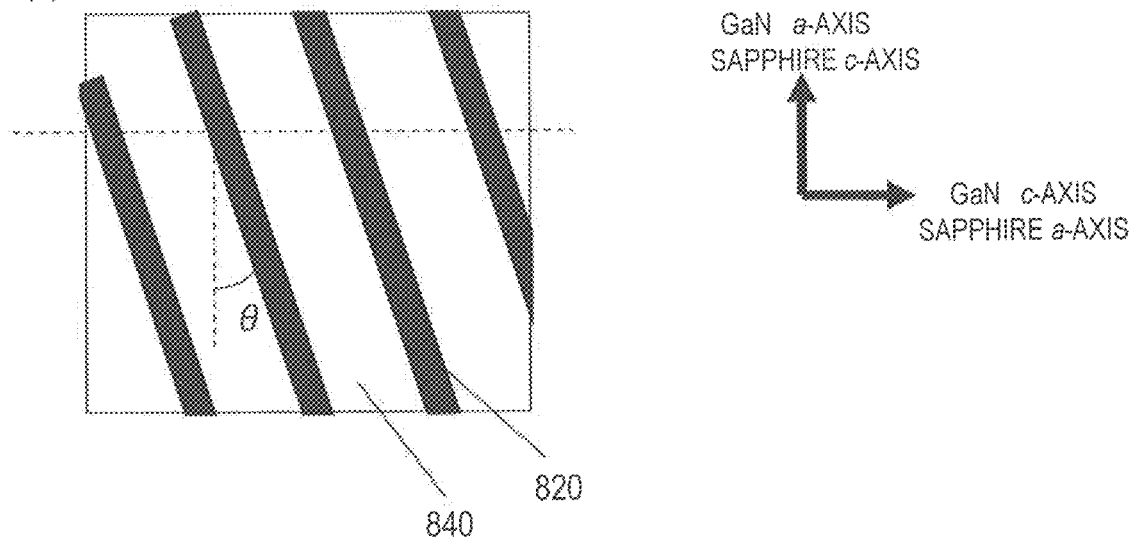
(a)
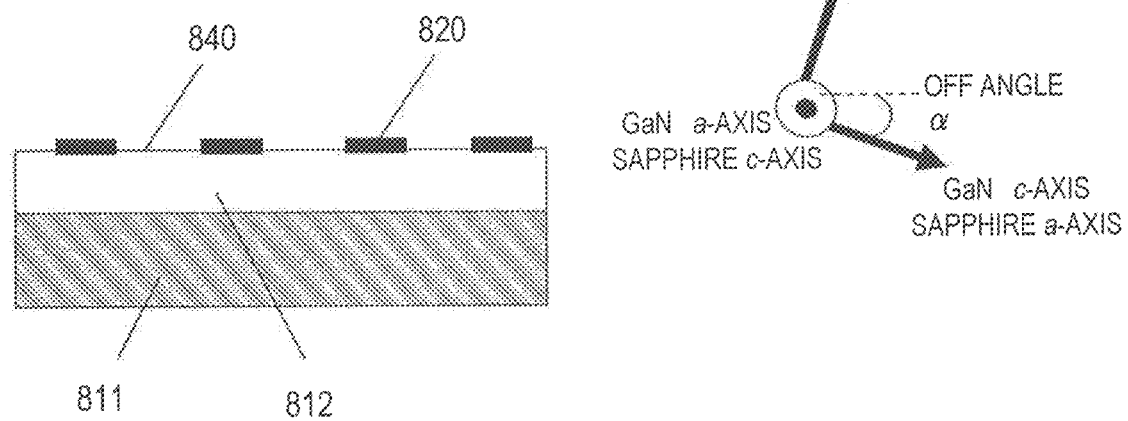
(b)

FIG.14
(a)
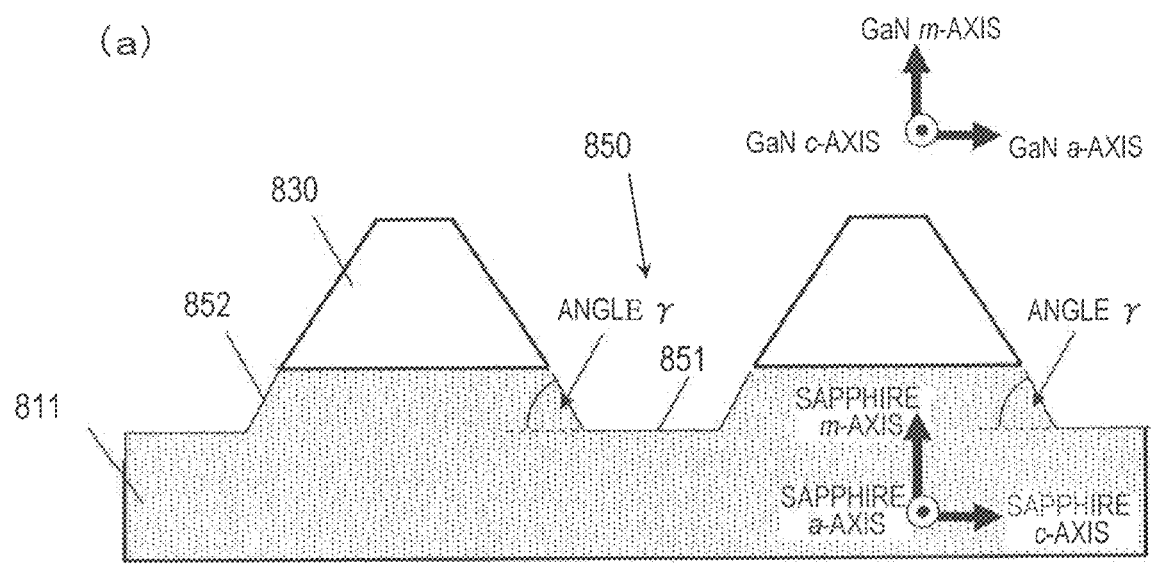
(b)
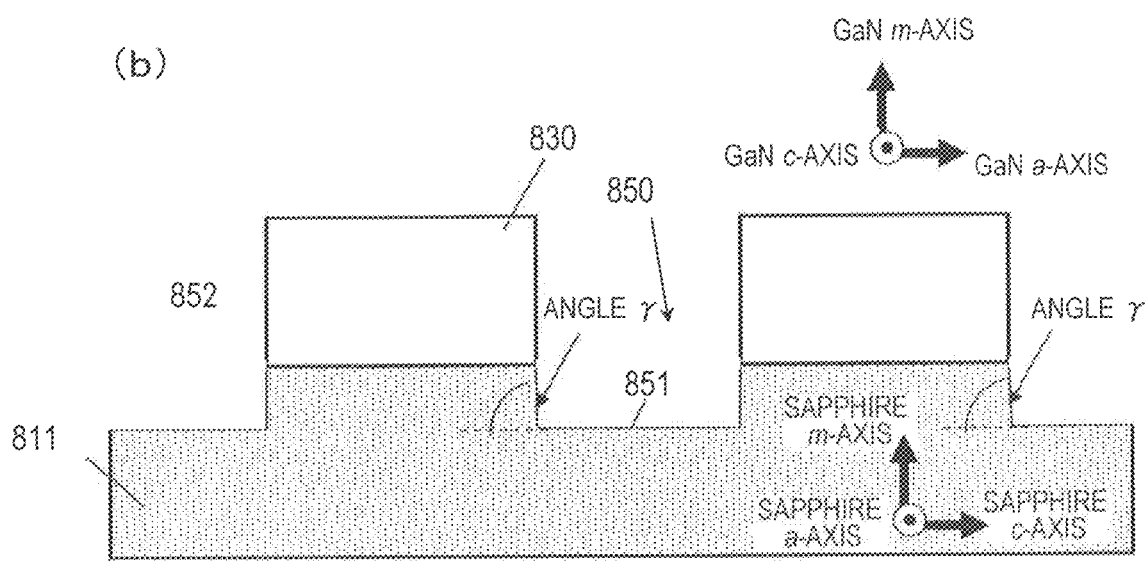

FIG.15
(a) θ = 0 deg
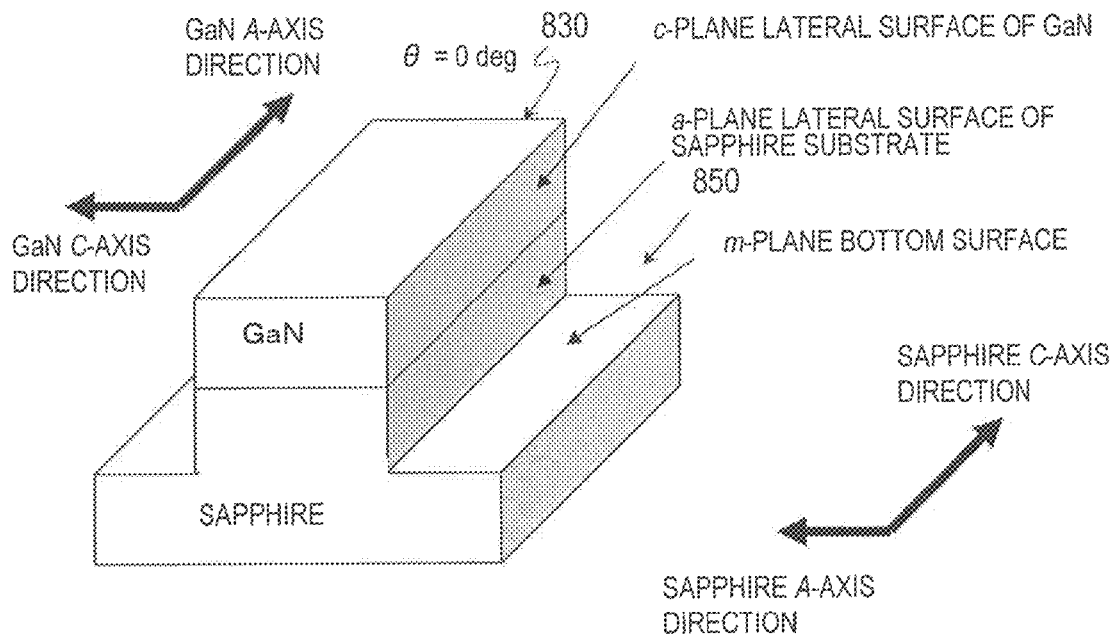
(b) θ = 90 deg
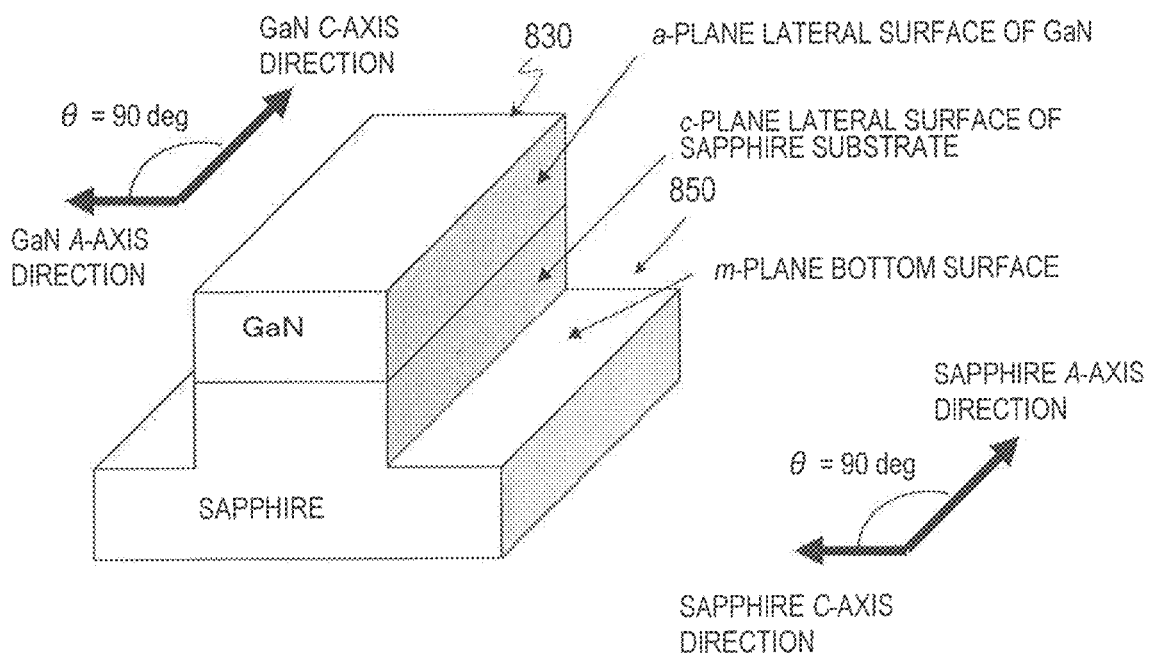

FIG.16
(a)
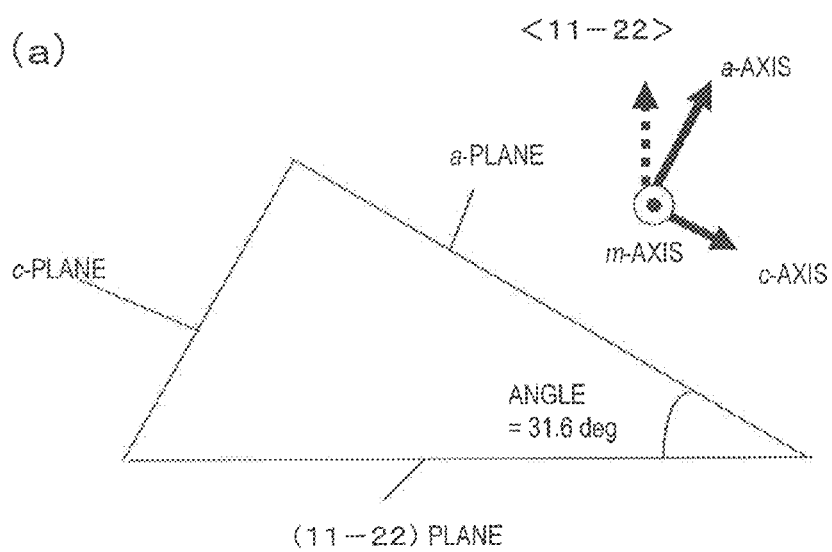
(b)
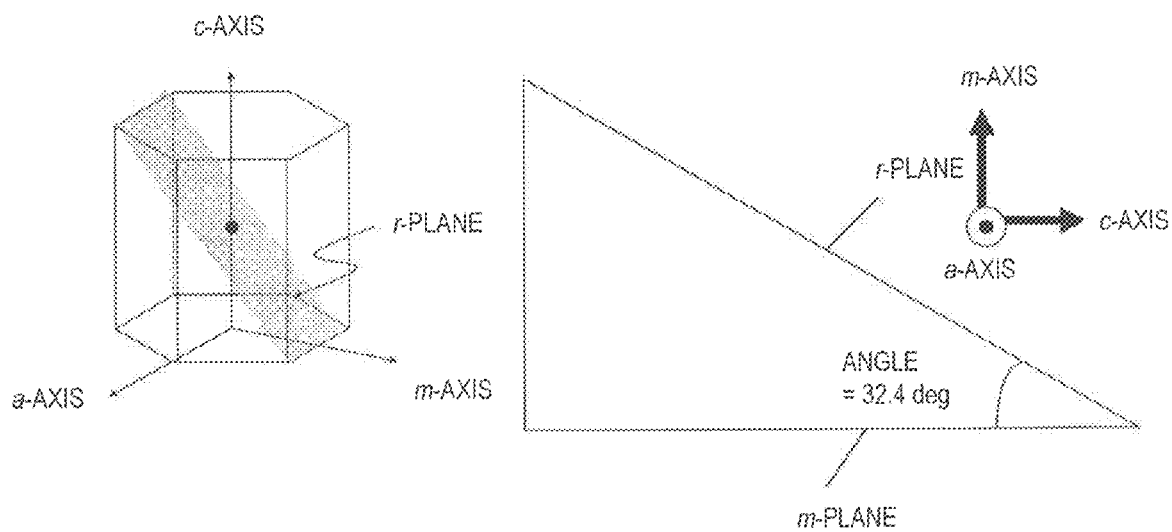

FIG.19
(a)
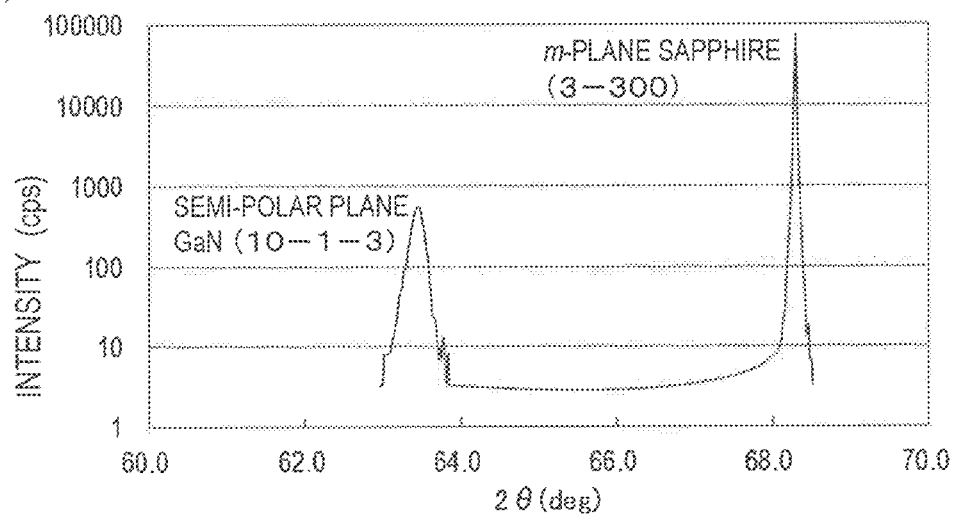
(b)
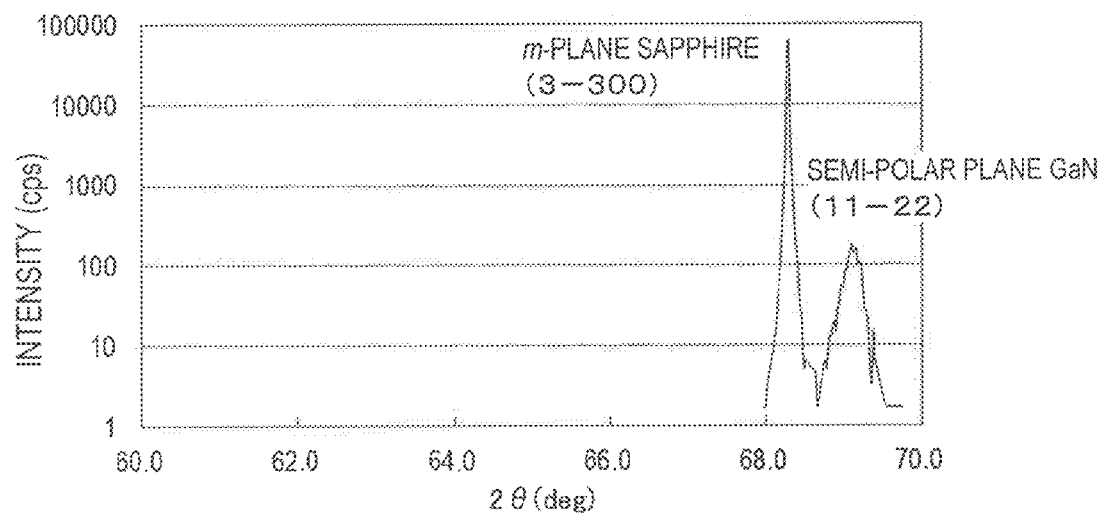

FIG.21
(a)
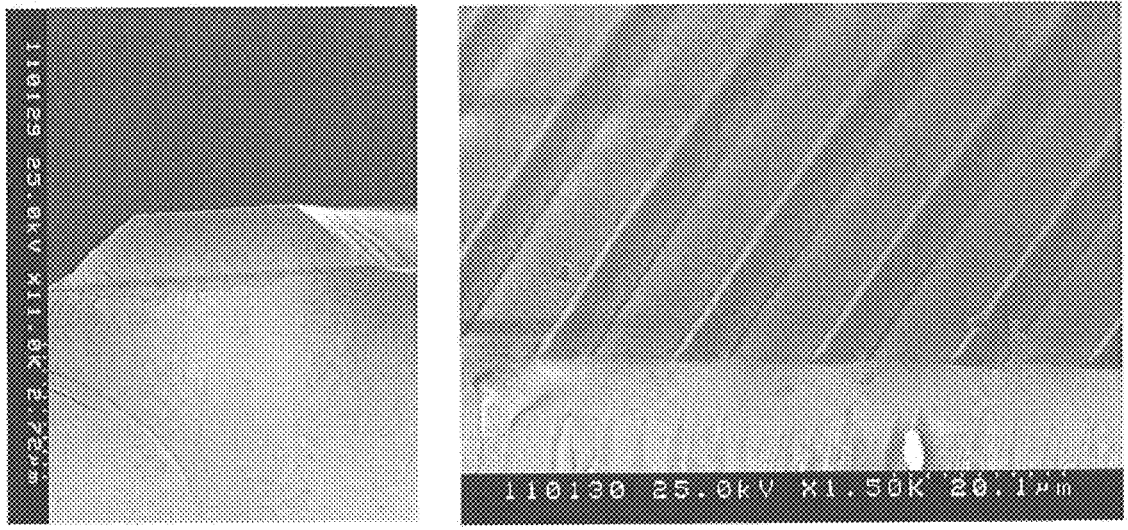
(b)

FIG.22
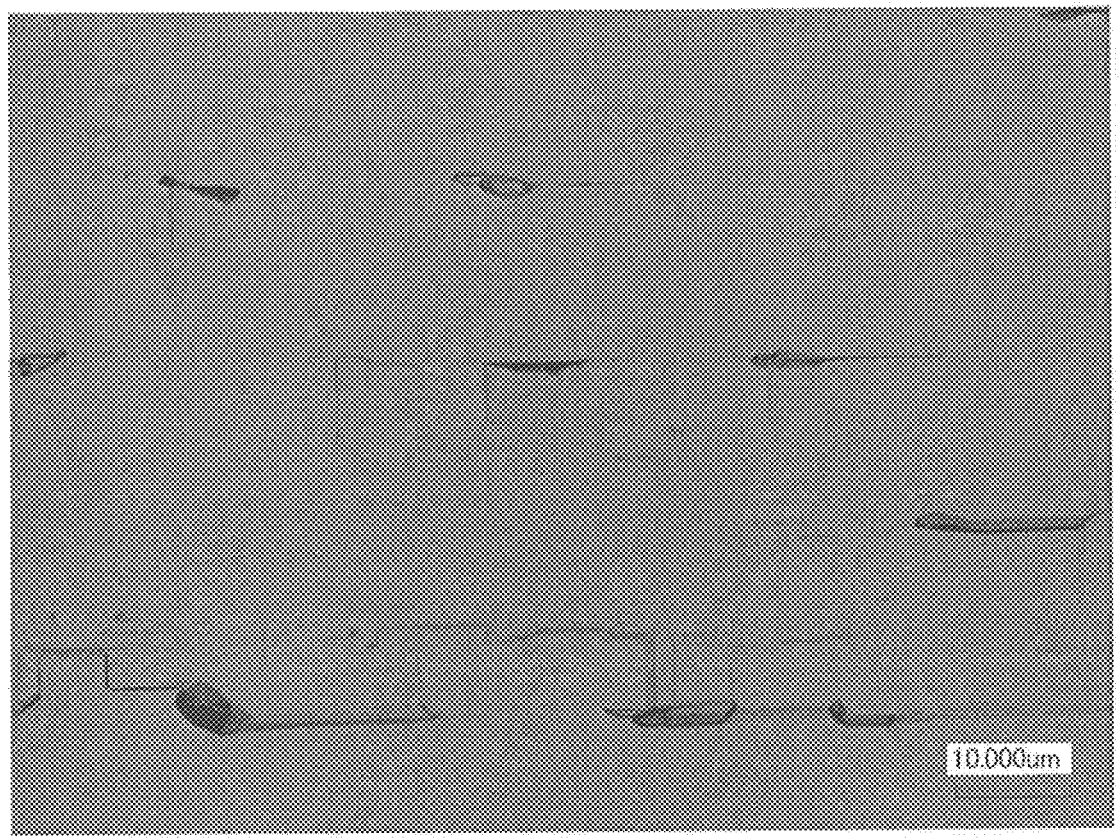
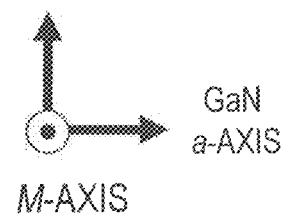

FIG.29
(a)
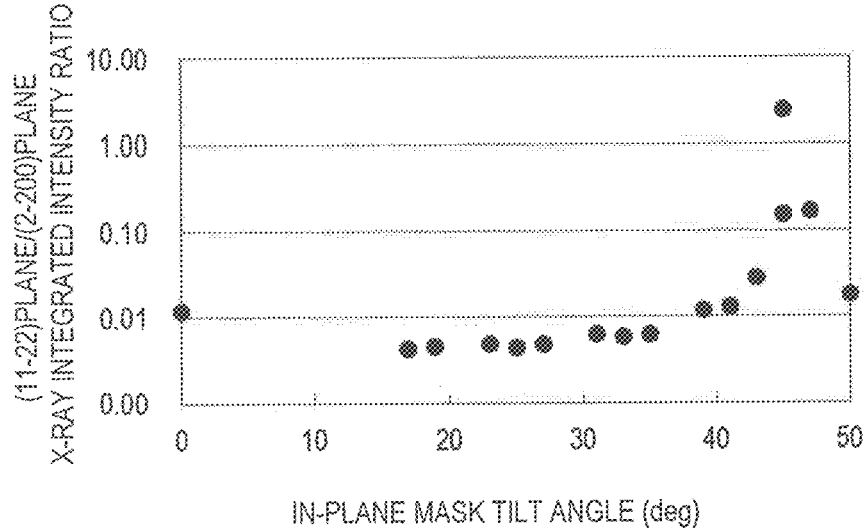
(b)
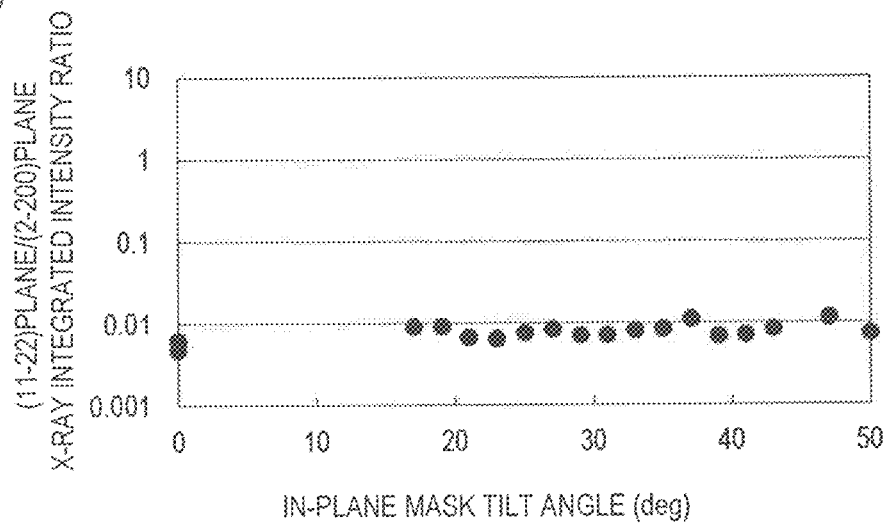

FIG. 30
(a) 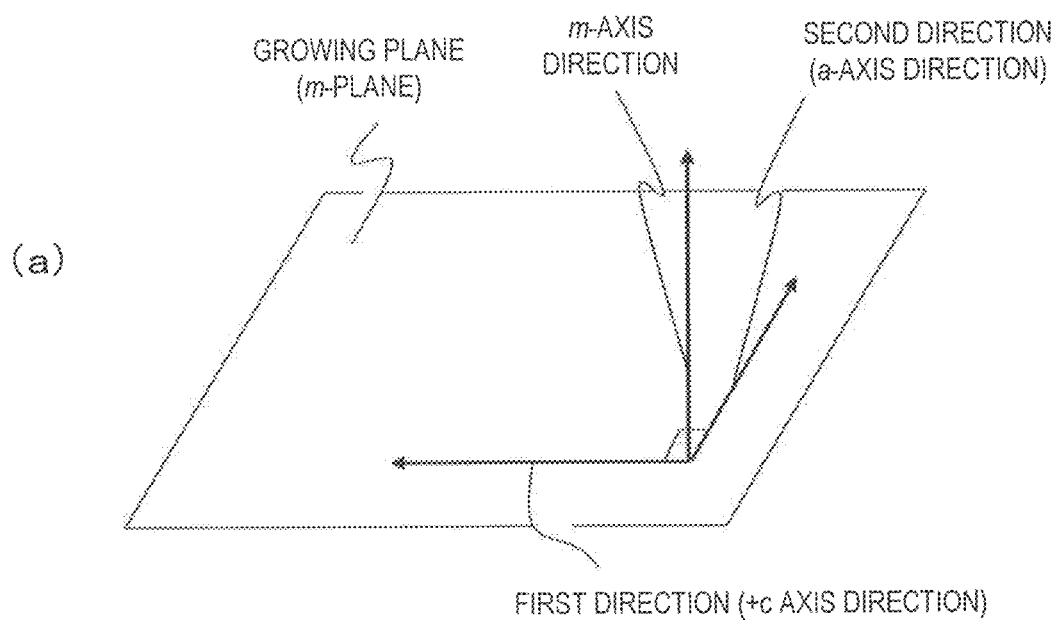
(b) 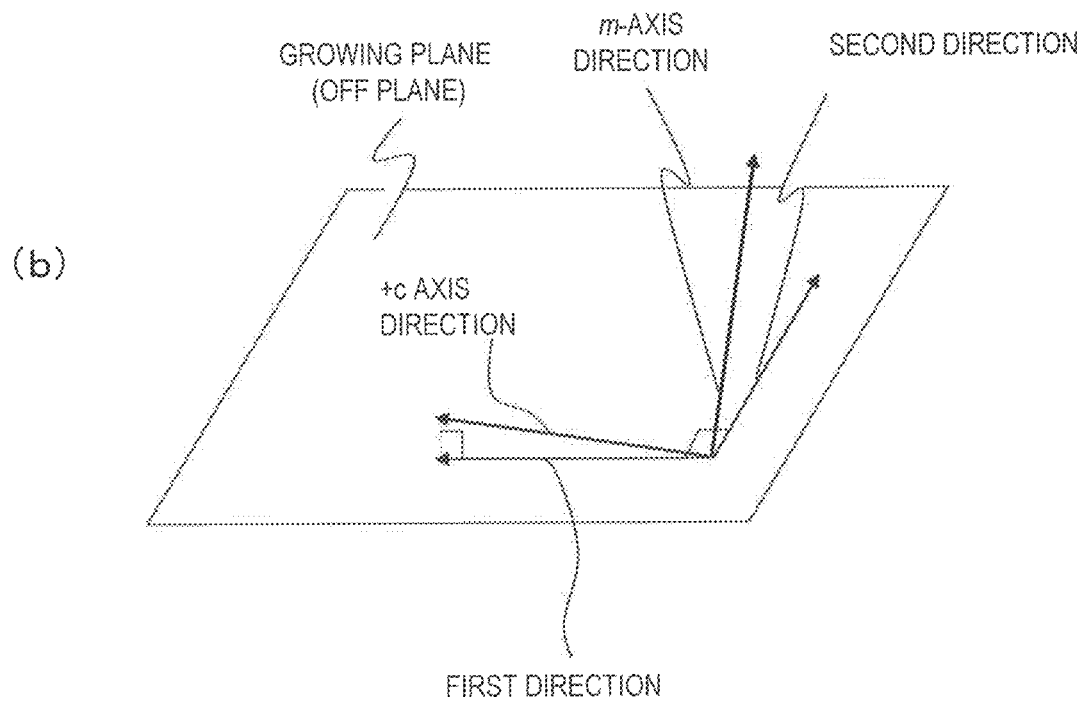

FIG.31
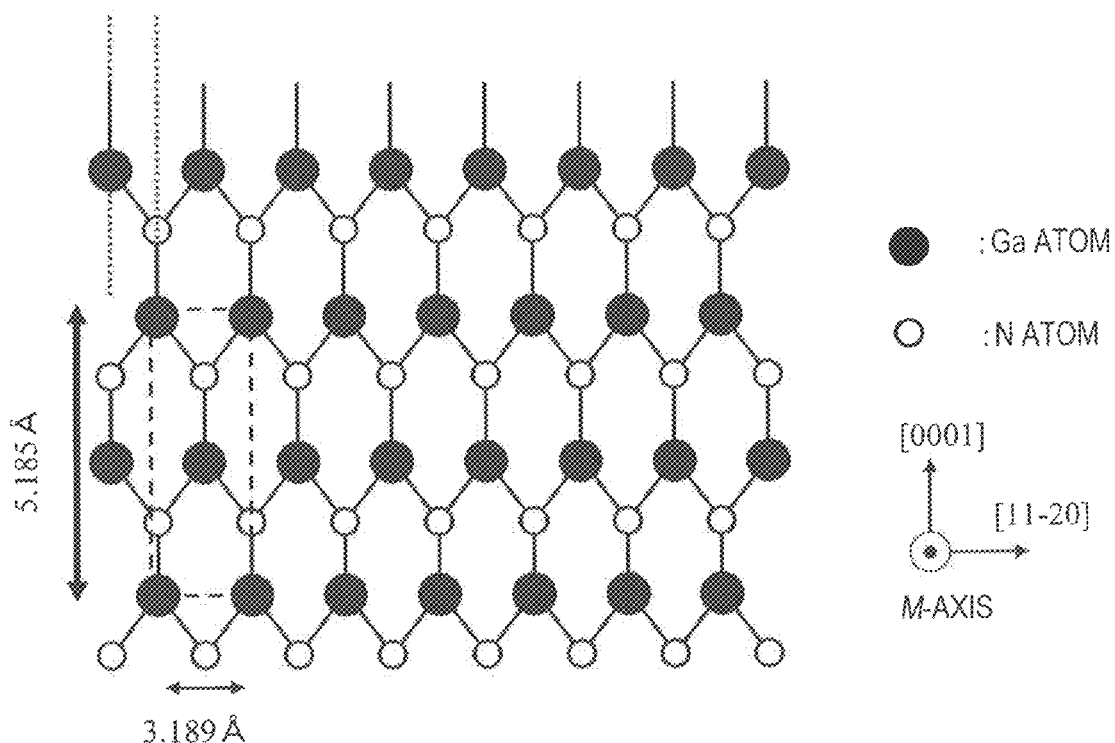
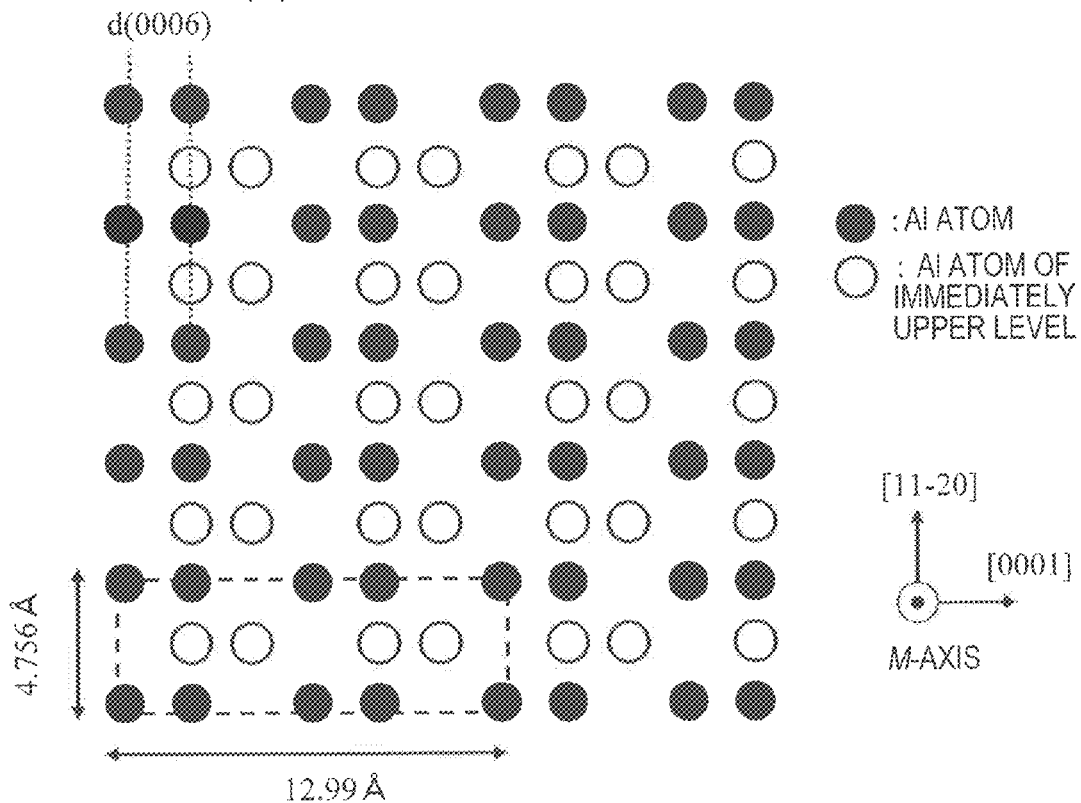

FIG.37
(a) S WIDTH/(S WIDTH+L WIDTH)=0.29
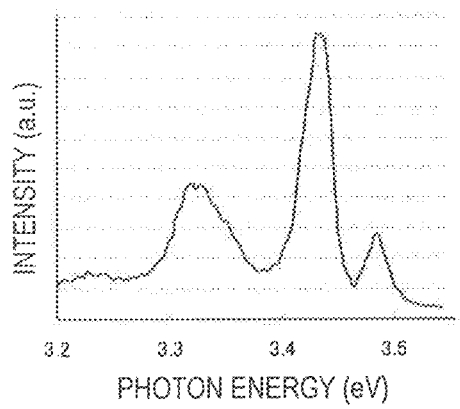
(b) 0.38
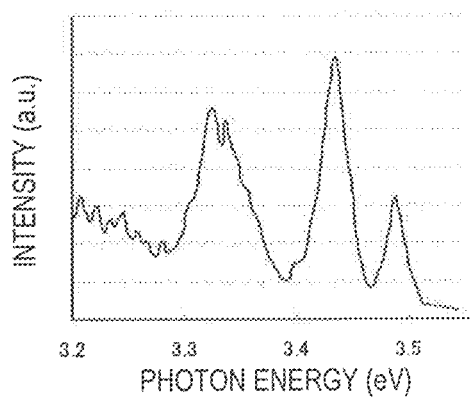
(c) 0.50
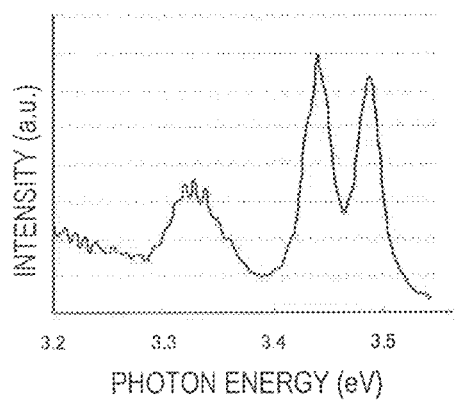
(d) 0.58
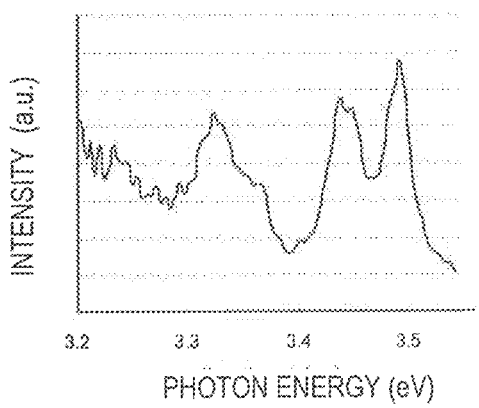
(e) 0.64
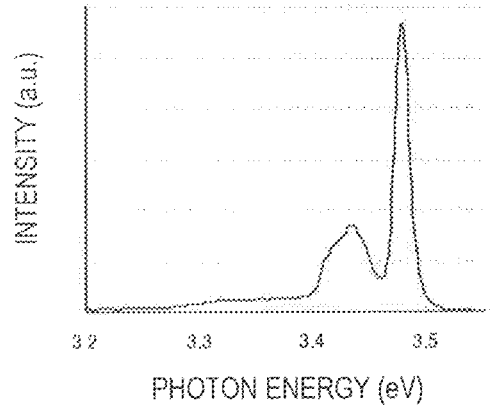
(f) 0.99
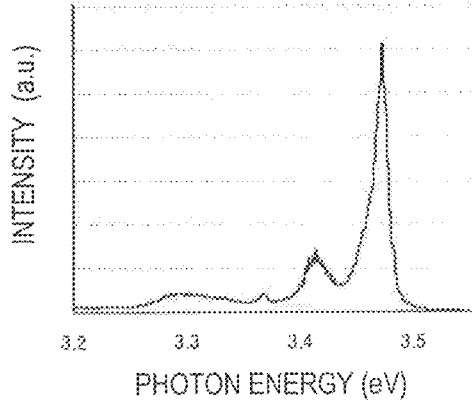

FIG.39
(a) 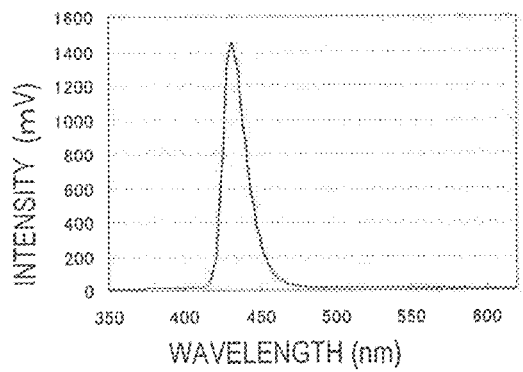
(b) 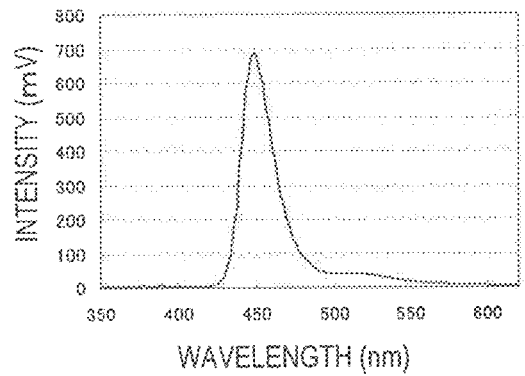
(c) 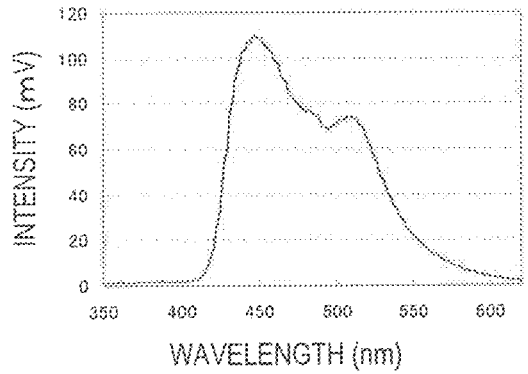

*FIG.40*
(a)
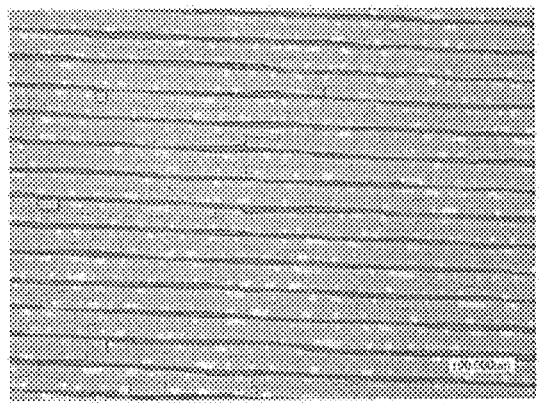
(b)
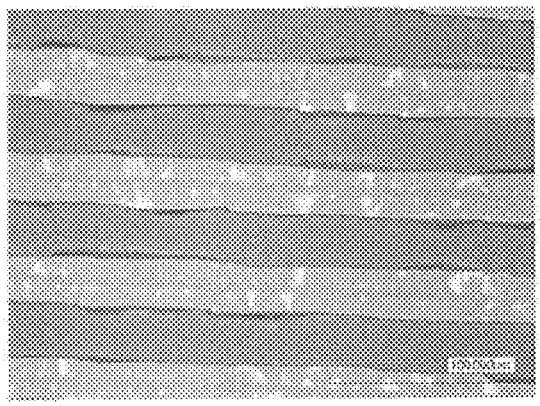
(c)
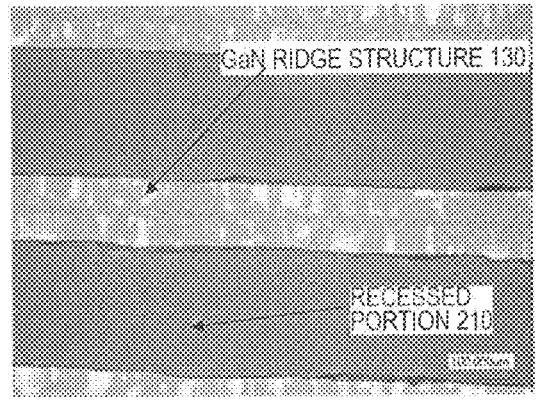
(d)
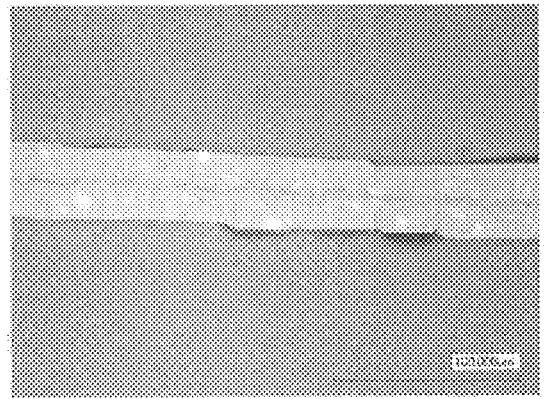
(e)
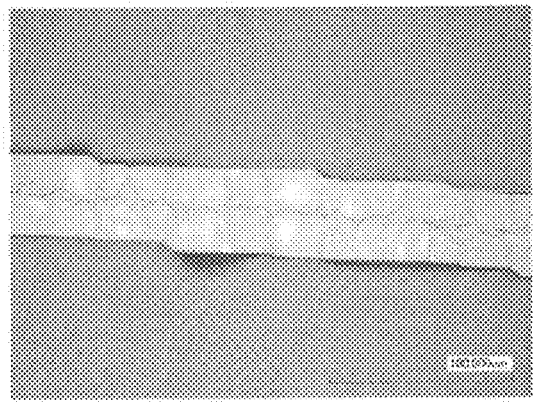

FIG.46
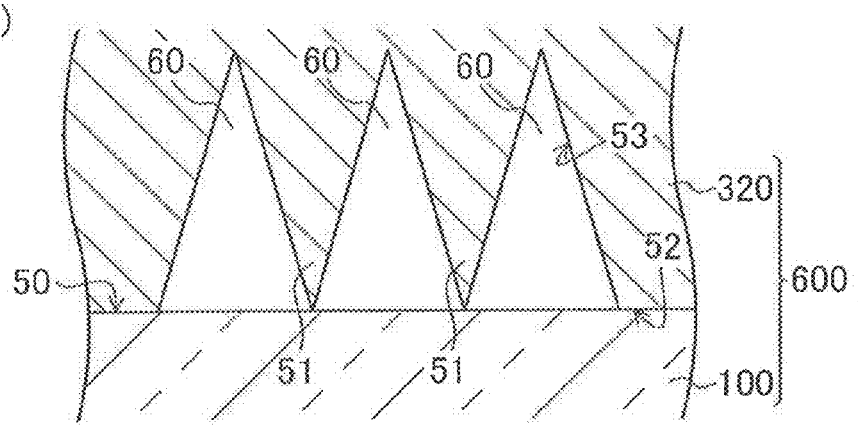
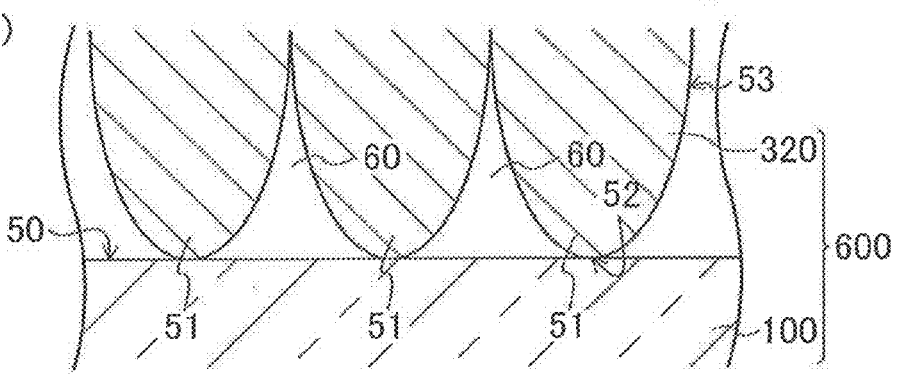
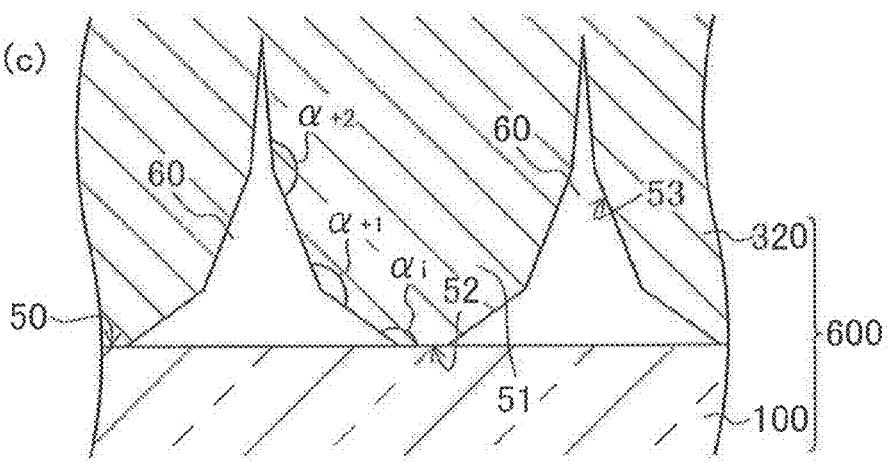

FIG.49
(a)
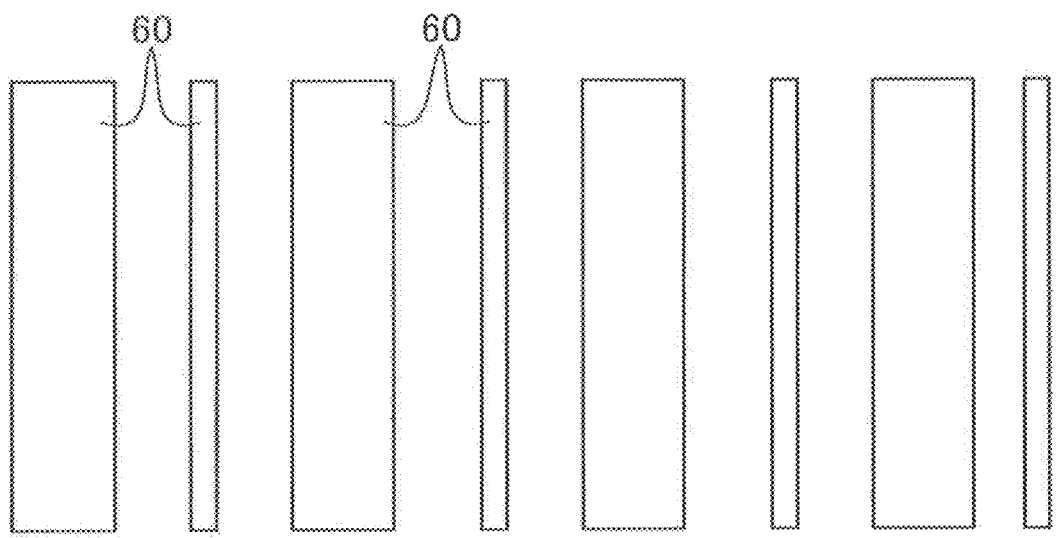
(b)
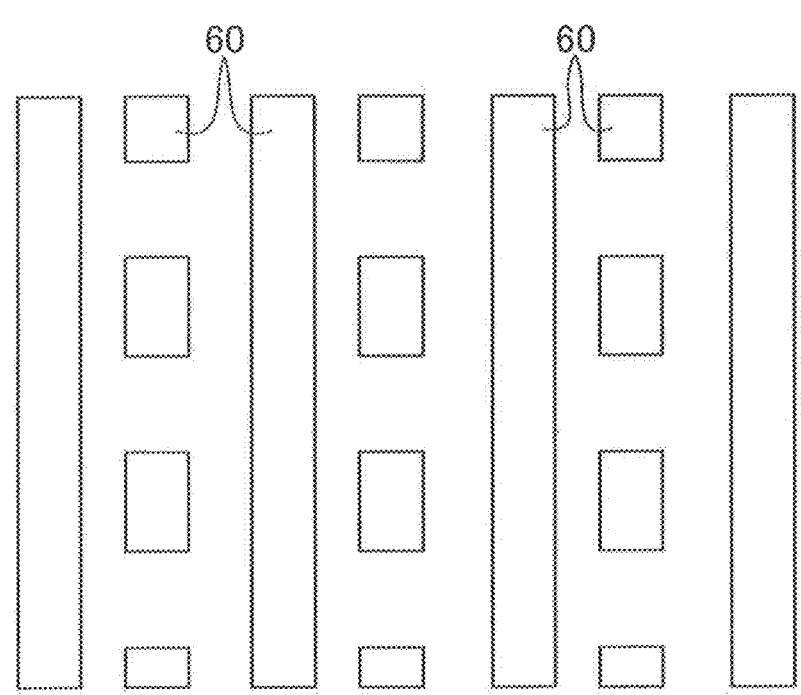

*FIG.50*
(a)
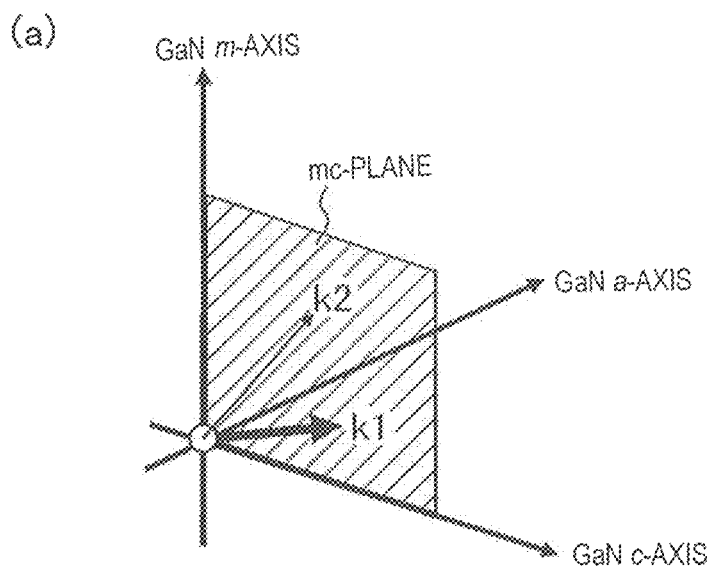
(b)
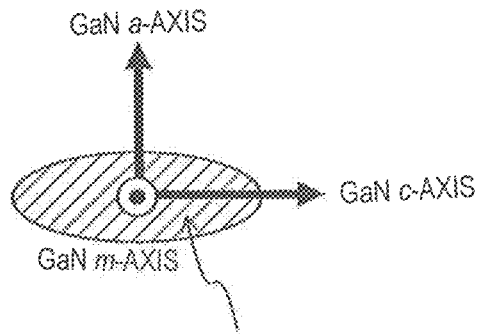
DISTRIBUTION OF LIGHT EMITTED FROM NITRIDE-BASED SEMICONDUCTOR LIGHT-EMITTING DEVICE OF WHICH PRINCIPAL SURFACE IS *m*-PLANE FIG.53
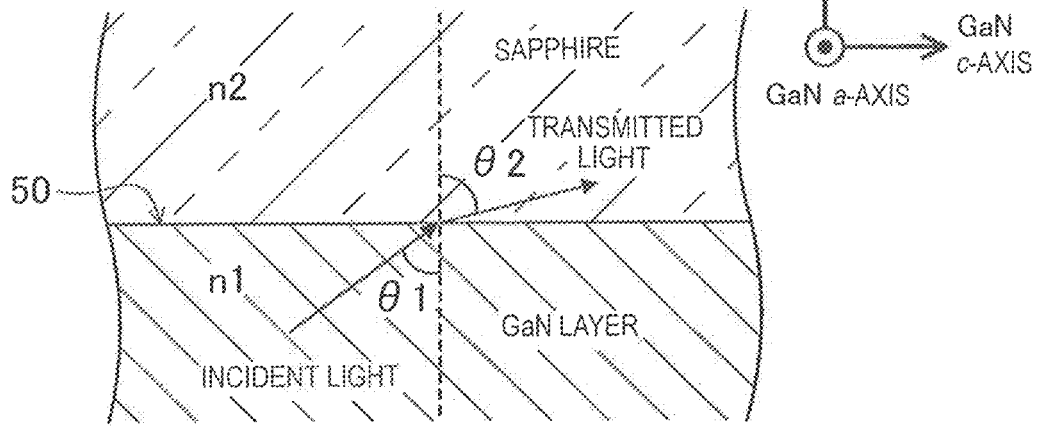
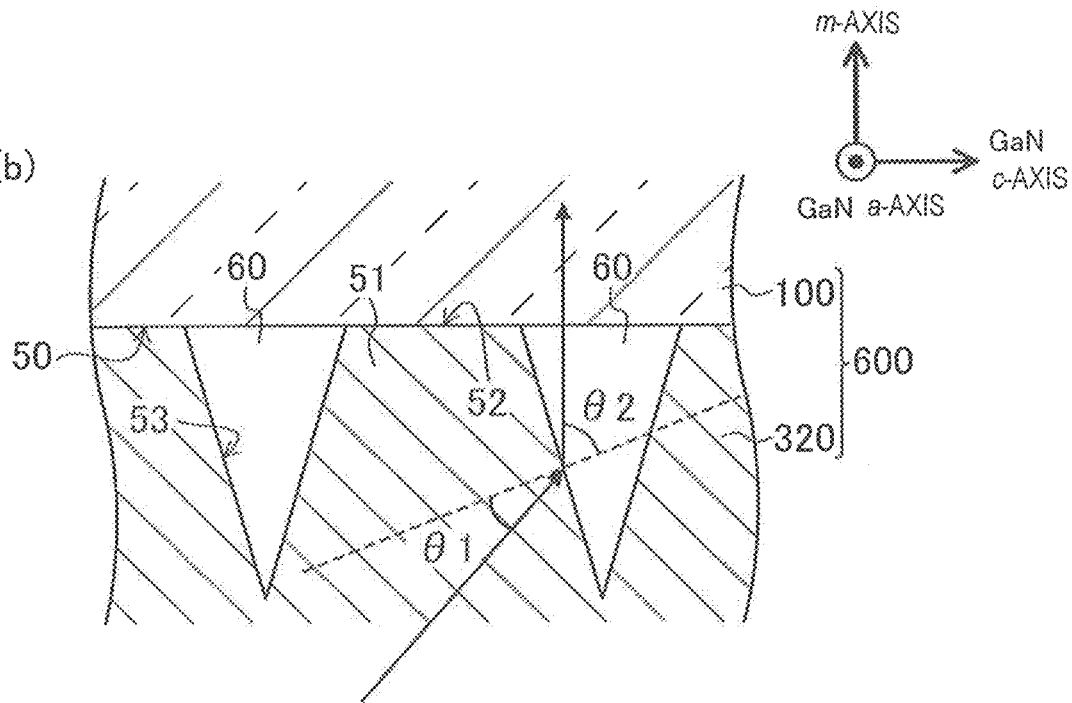

FIG.56
(a) 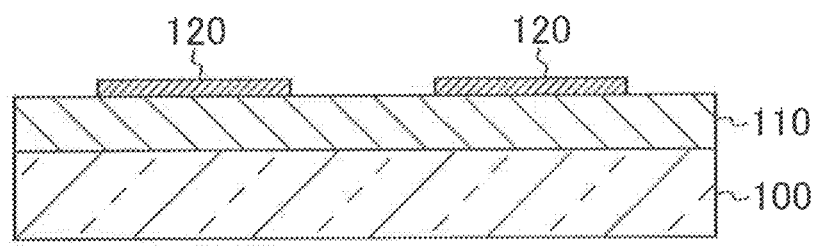
(b) 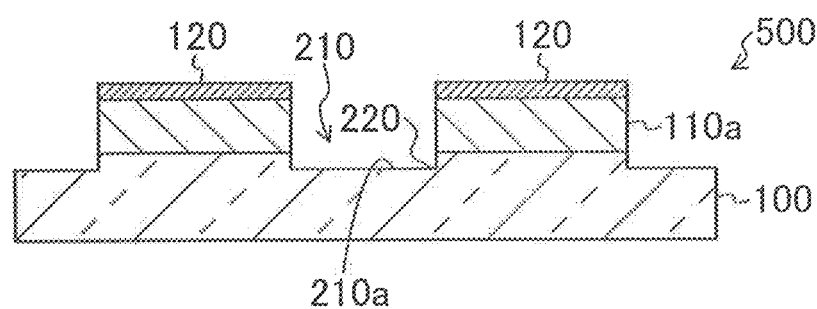
(c) 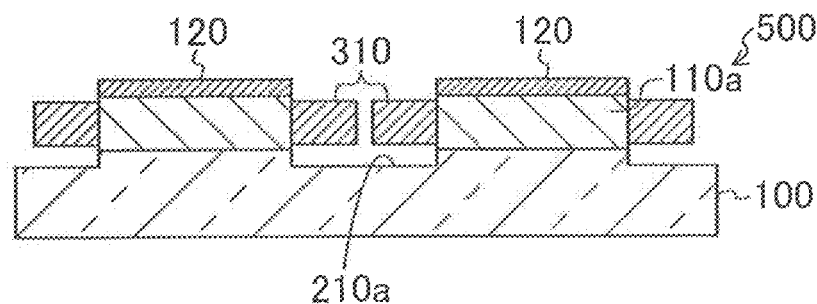
(d) 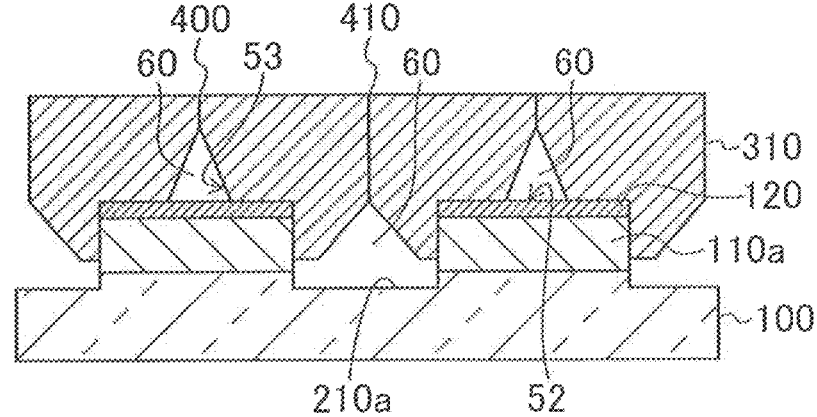

FIG.57
(a)
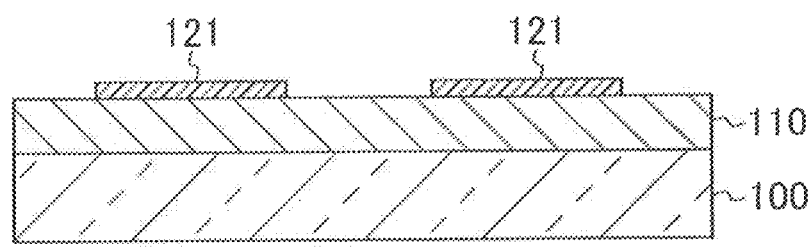
(b)
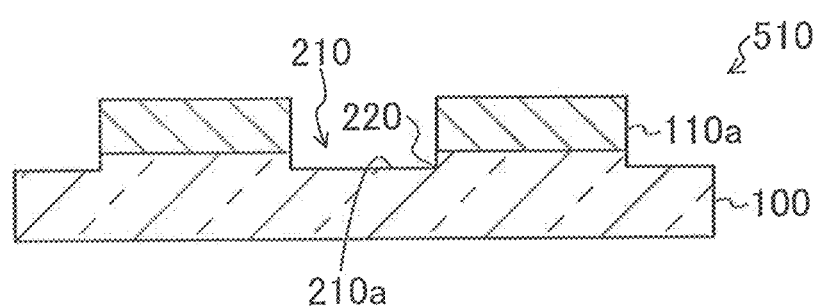
(c)
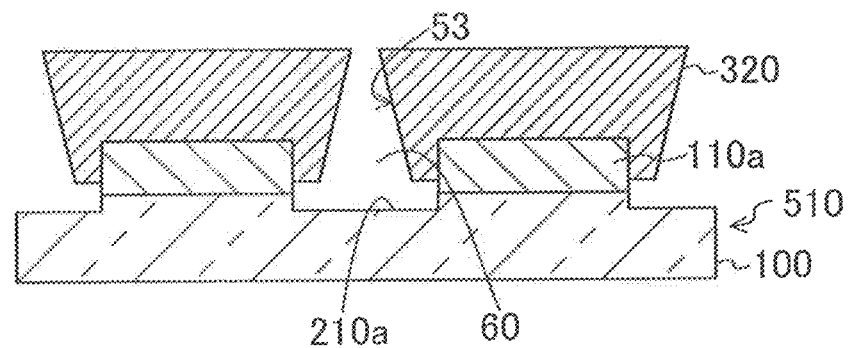
(d)
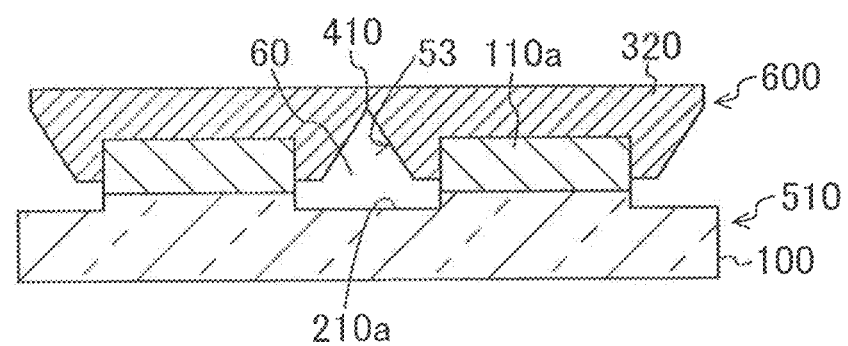

FIG.59
(a)
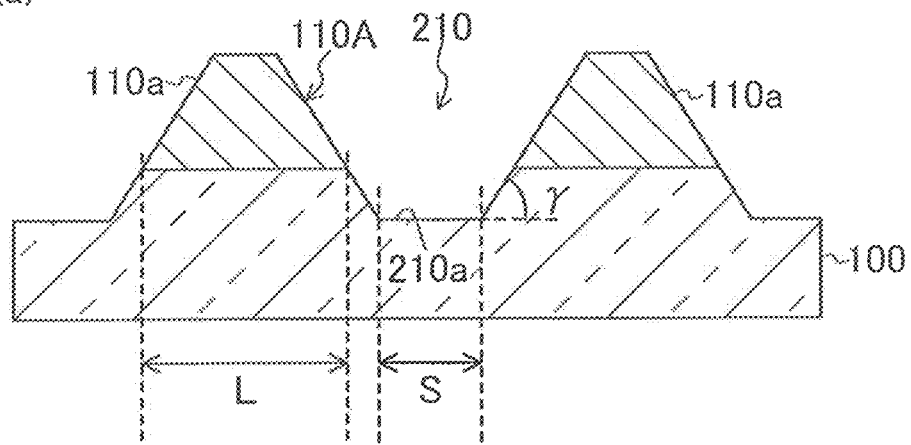
(b)
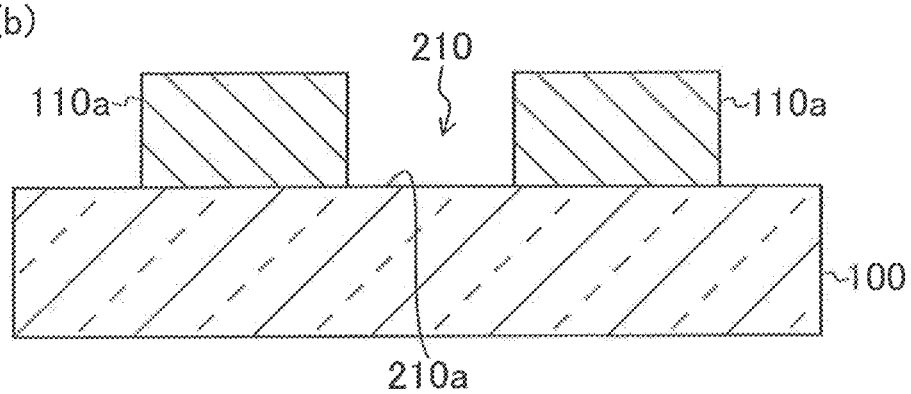

FIG.64
(a)
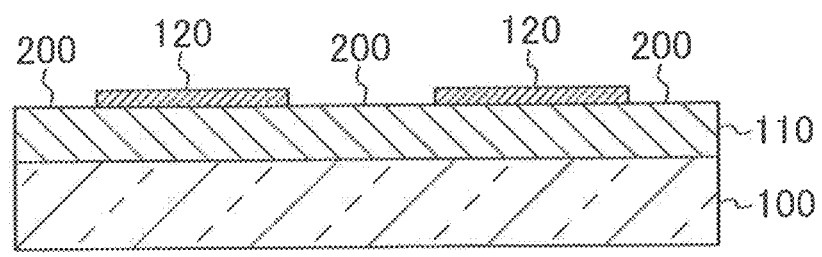
(b)
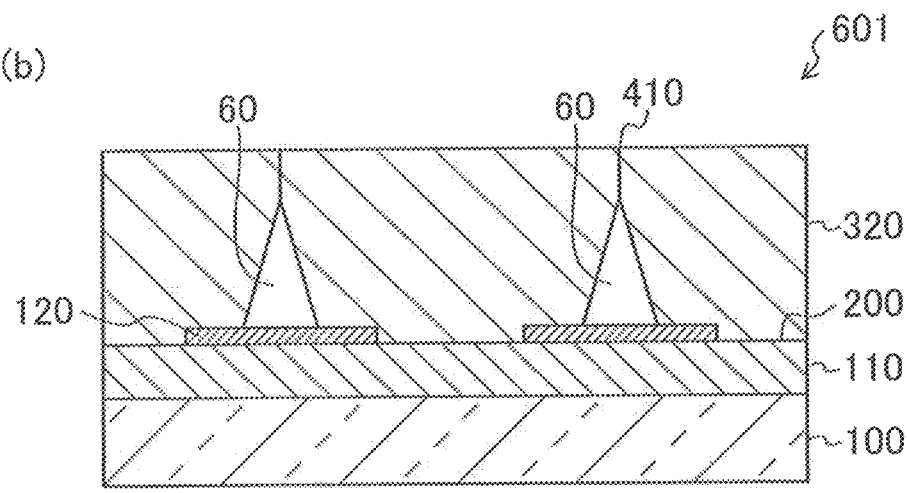

FIG. 72
(a)
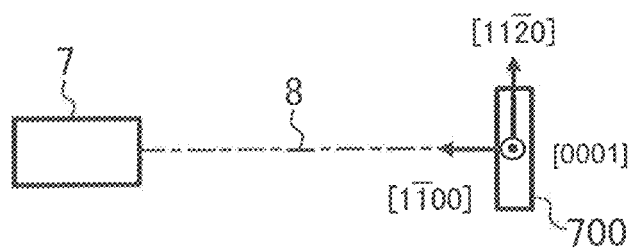
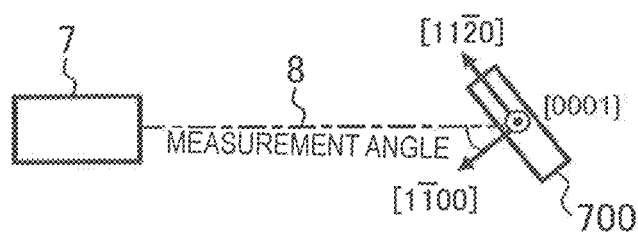
(b)
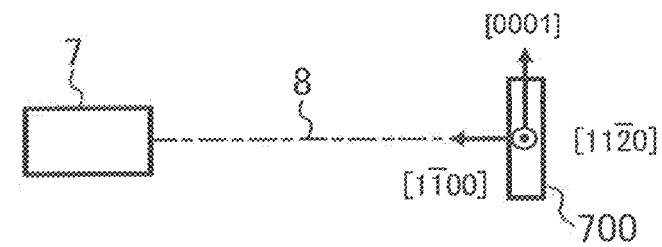
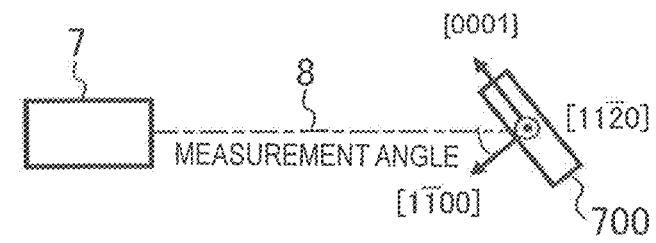

FIG. 74
(a) a-AXIS DIRECTION
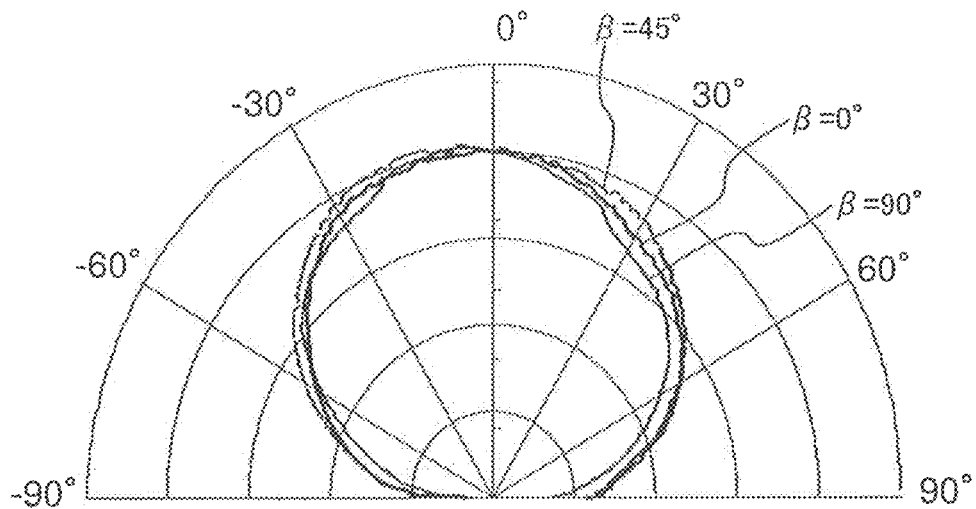
(b) c-AXIS DIRECTION
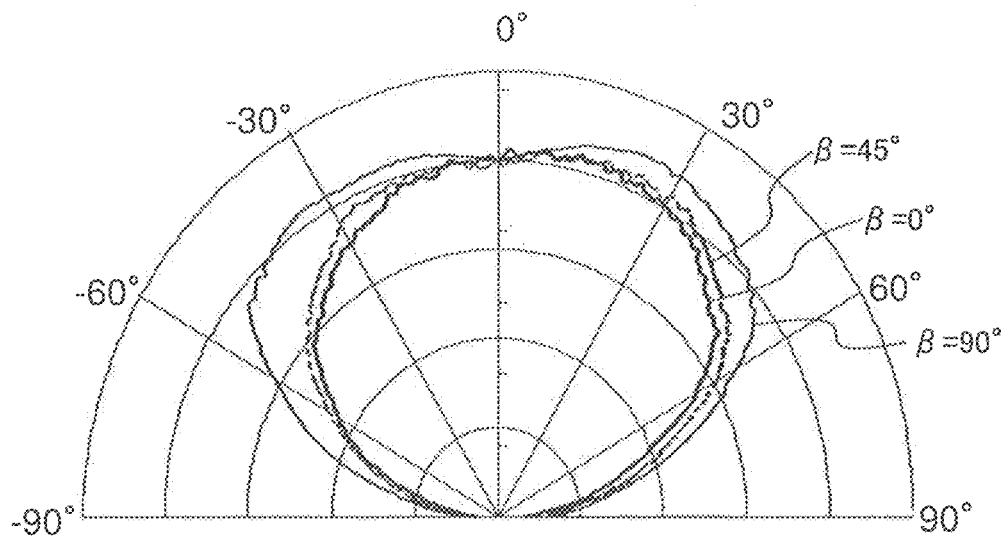

FIG. 77
(a)
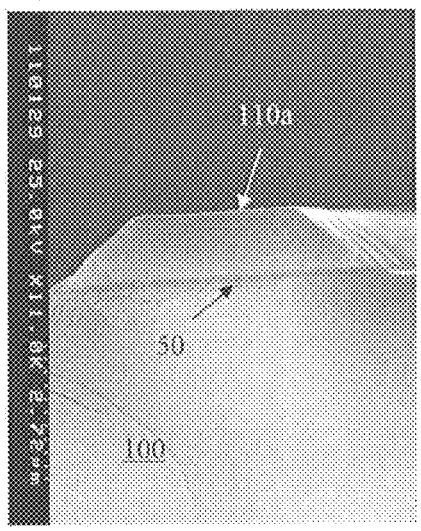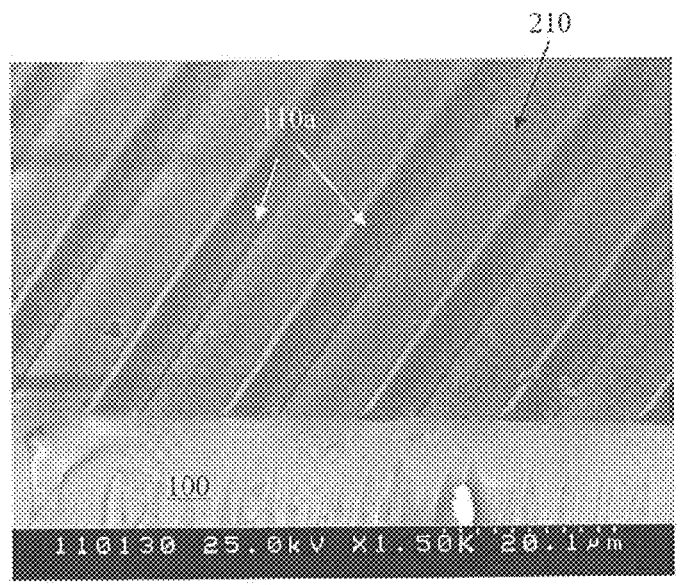
(b)
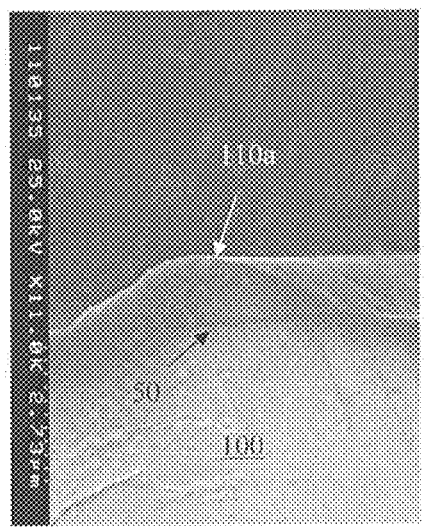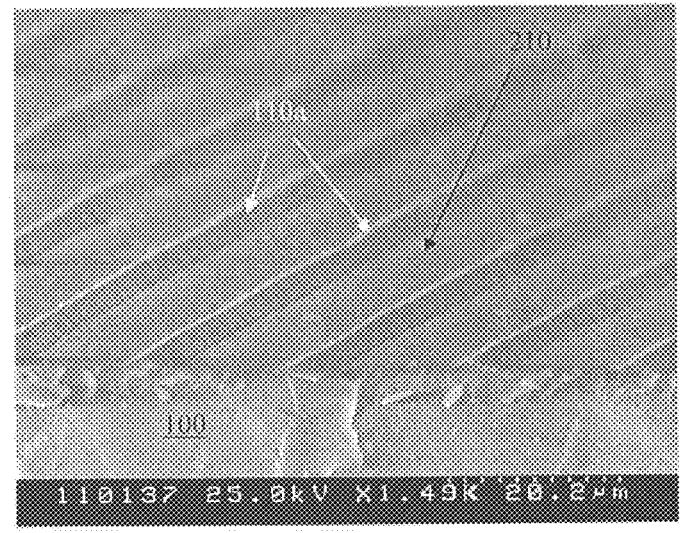

FIG. 78
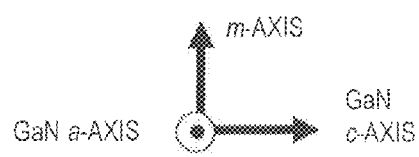
(a)
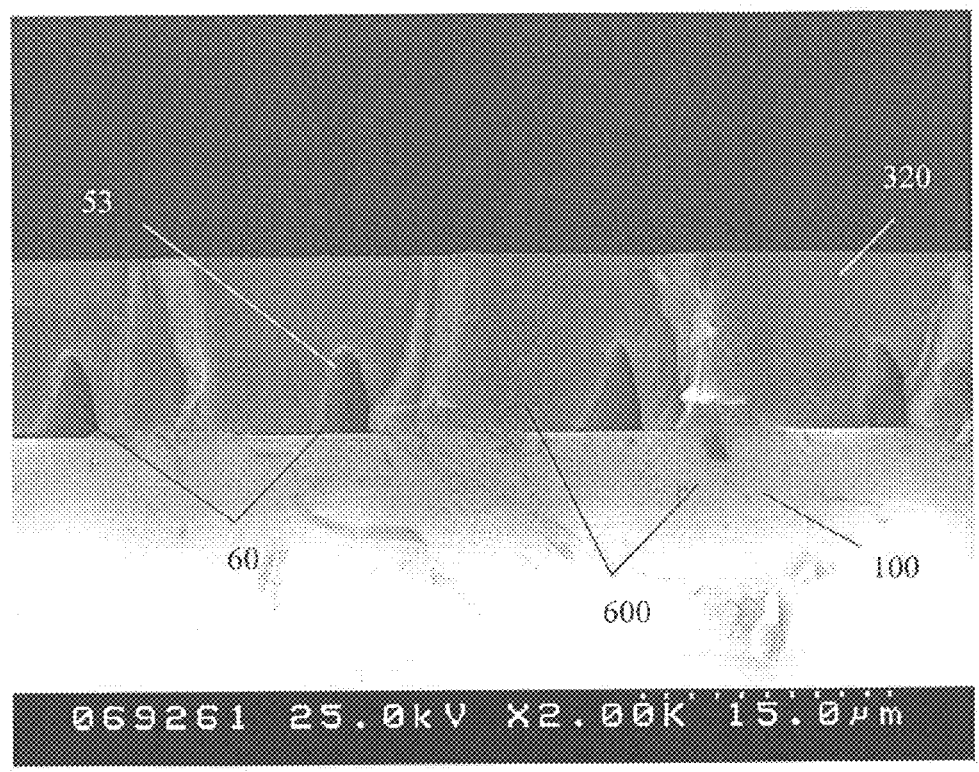
(b)
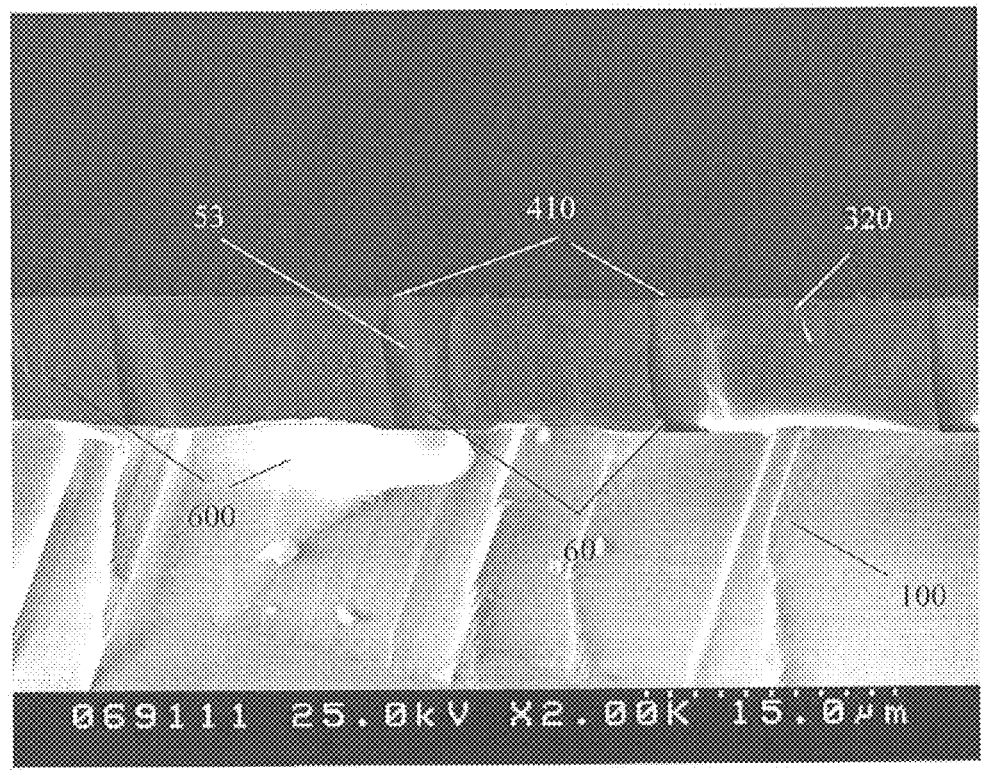

FIG. 80
(a) COMPARATIVE EXAMPLE 5
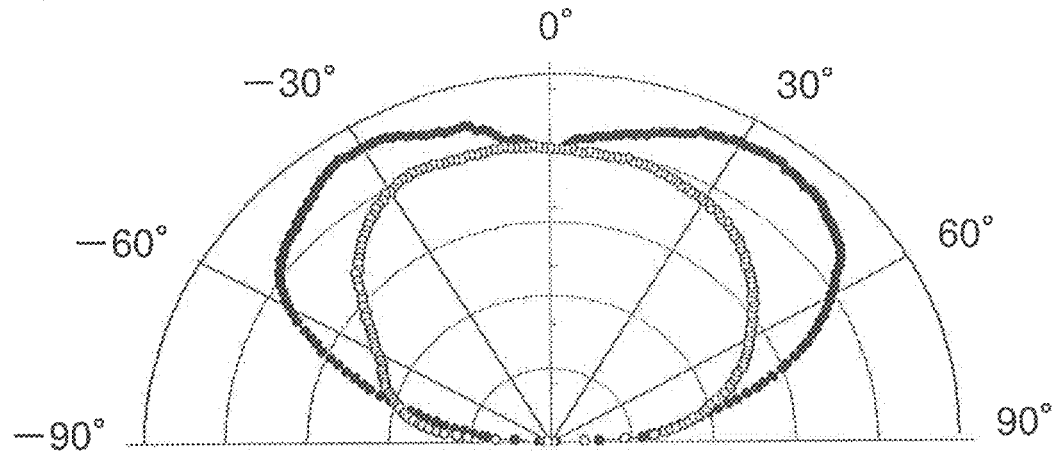
OPEN CIRCLES: a-AXIS DIRECTION
SOLID CIRCLES: c-AXIS DIRECTION
(b) INVENTIVE EXAMPLE 9
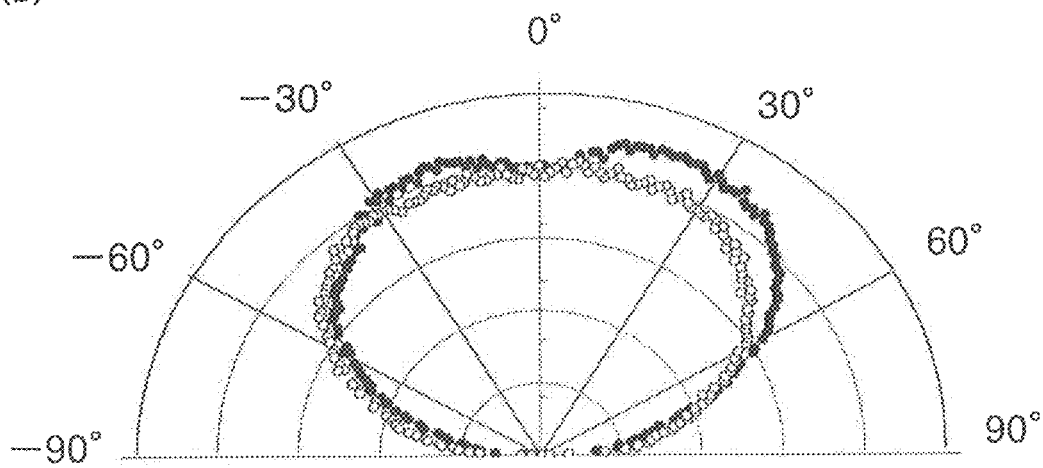
OPEN CIRCLES: a-AXIS DIRECTION
SOLID CIRCLES: c-AXIS DIRECTION

*FIG.81*
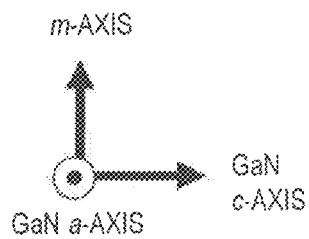
(a)
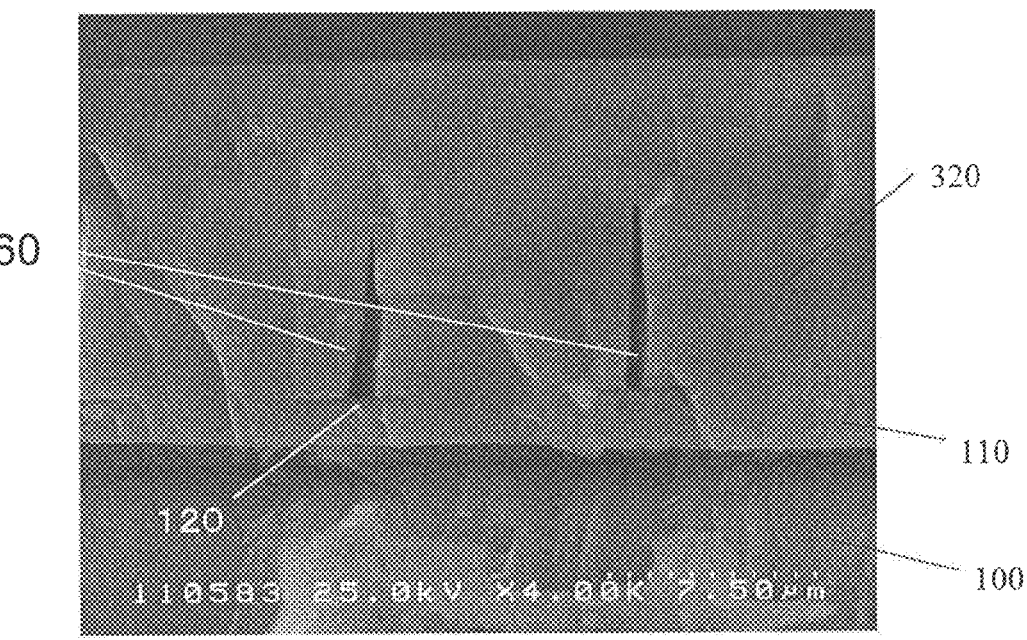
(b)
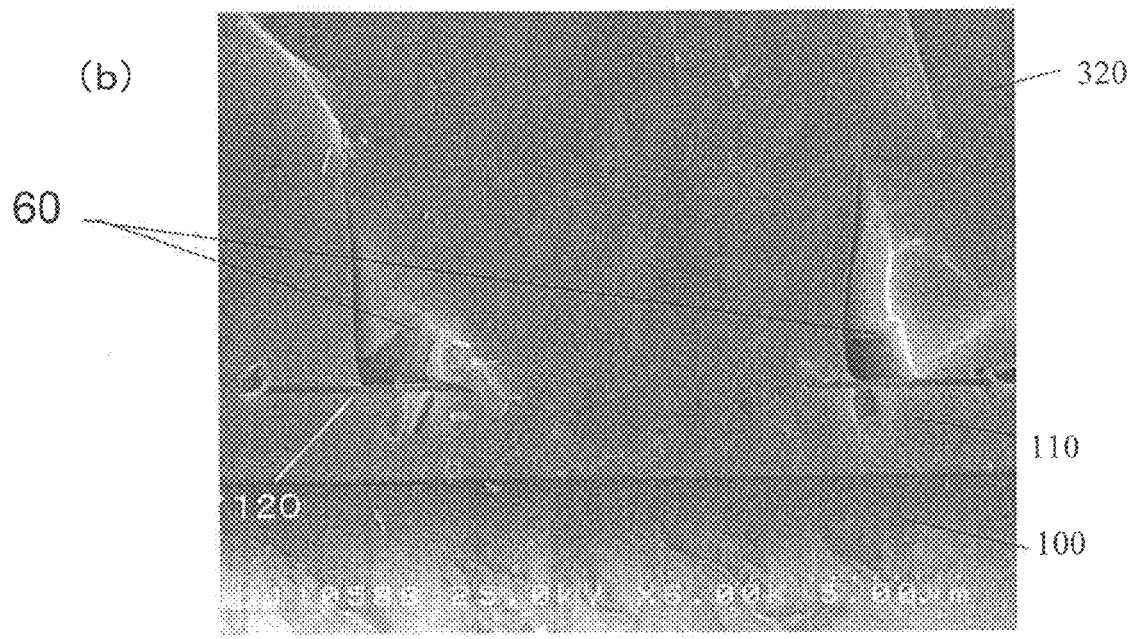

PROTRUSIONS

FIG. 86
(a) (11$\bar{2}$2) PLANE NITRIDE SEMICONDUCTOR
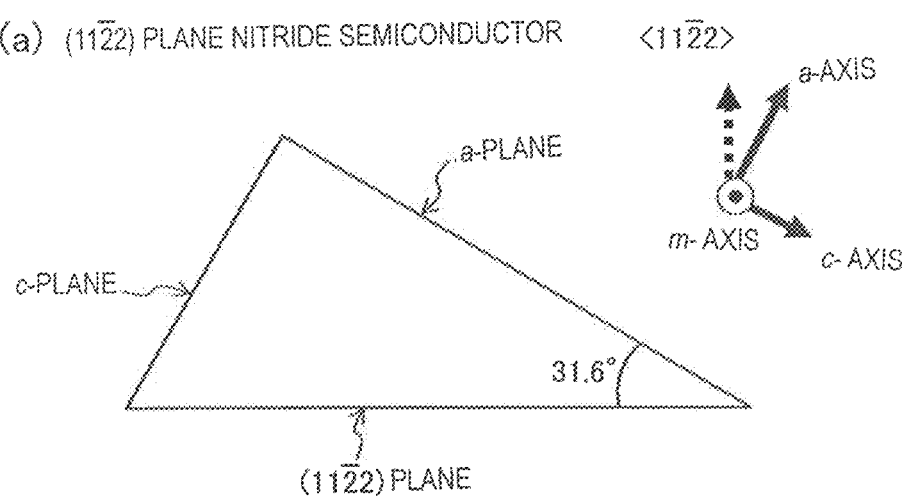
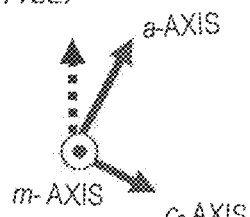
(b) m-PLANE SAPPHIRE SUBSTRATE
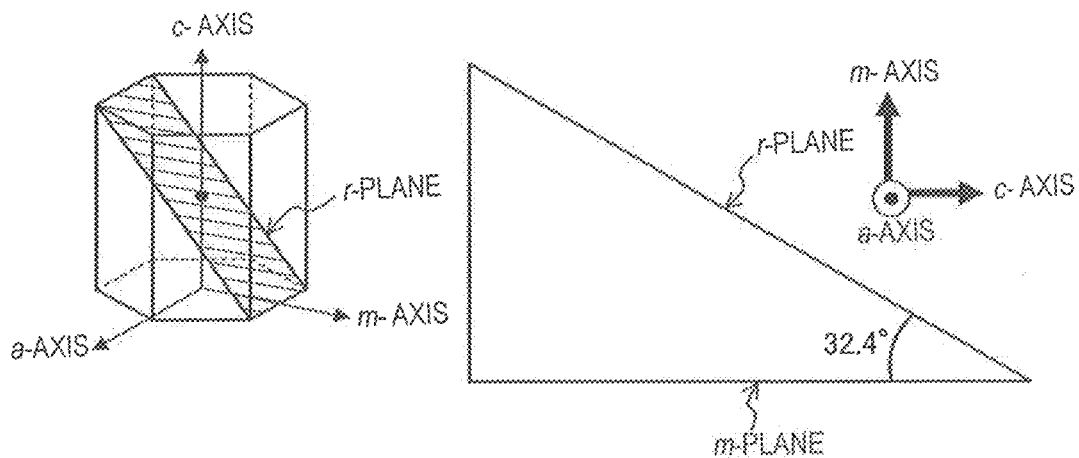

FIG.87
(a) β=0°
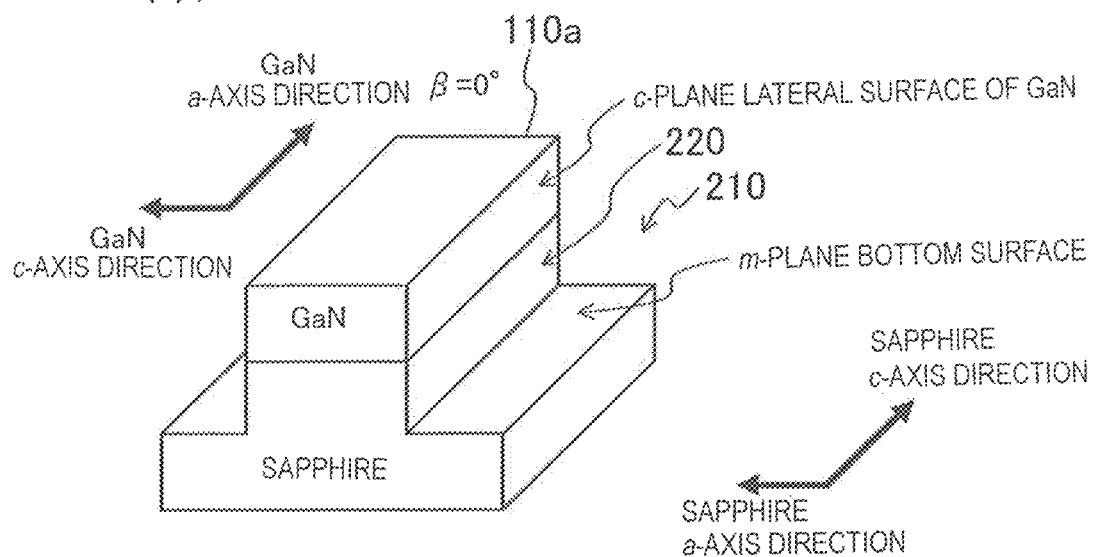
(b) β=90°
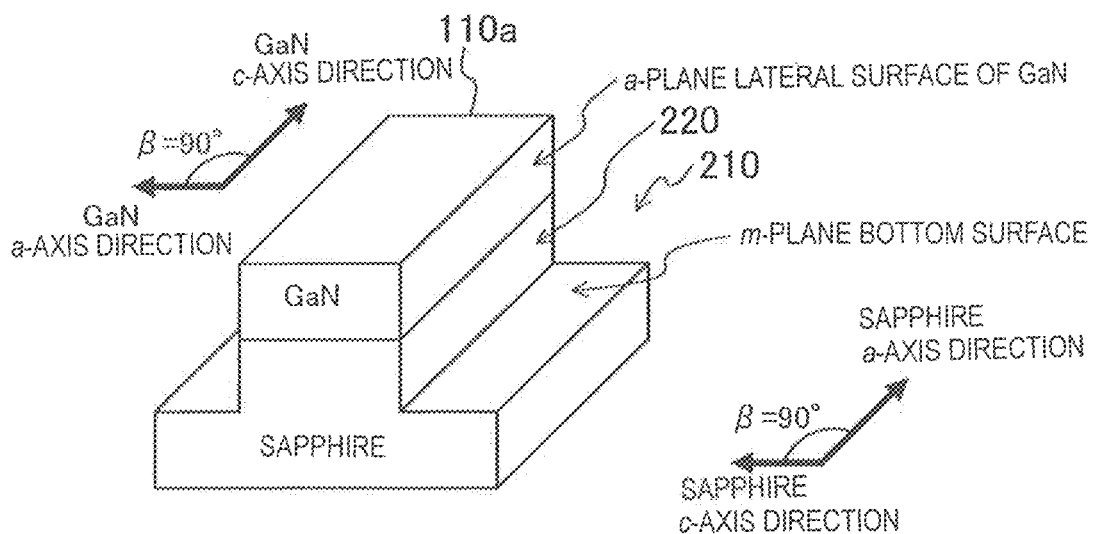

FIG.88
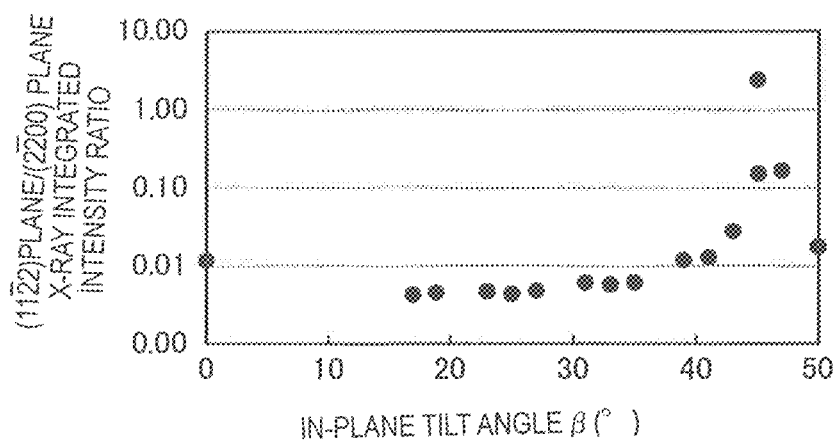
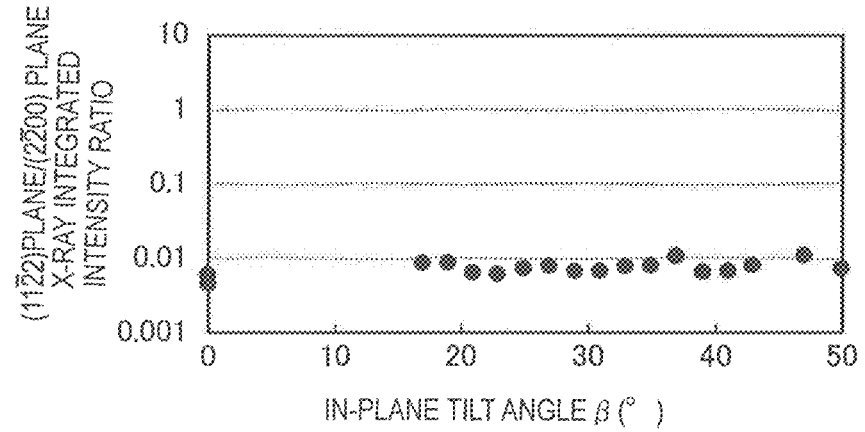

FIG.90
(a)
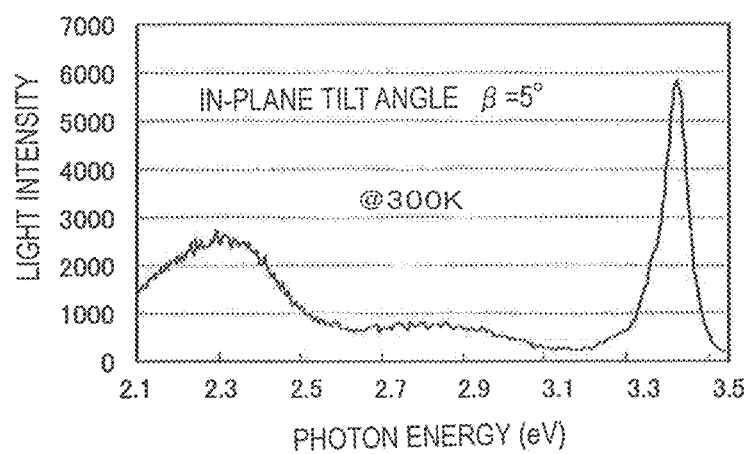
(b)
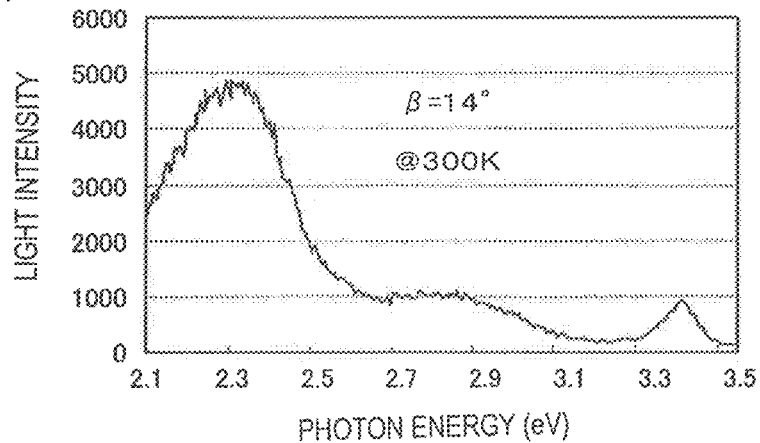

STRUCTURE FOR GROWTH OF NITRIDE SEMICONDUCTOR LAYER, STACKED STRUCTURE, NITRIDE-BASED SEMICONDUCTOR ELEMENT, LIGHT SOURCE, AND MANUFACTURING METHOD FOR SAME

This is a continuation of International Application No. PCT/JP2012/004958, with an international filing date of Aug. 3, 2012, which claims priority of Japanese Patent Applications No. 2011-174300, filed on Aug. 9, 2011, No. 2011-257924, filed on Nov. 25, 2011, and No. 2012-019641, filed on Feb. 1, 2012, the contents of which are hereby incorporated by reference.

BACKGROUND

1. Technical Field

The present disclosure relates to a structure for growth of a nitride semiconductor layer, a multilayer structure including that structure, a nitride-based semiconductor device including that multilayer structure, and a light source including that nitride-based semiconductor device, and manufacturing methods thereof.

2. Description of the Related Art

A nitride semiconductor containing nitrogen (N) as a Group V element is a prime candidate for a material to make a short-wave light-emitting device because its bandgap is sufficiently wide. Among other things, gallium nitride-based compound semiconductors (GaN-based semiconductors) have been researched and developed particularly extensively. As a result, blue light-emitting diodes (LEDs), green LEDs, and semiconductor laser diodes in which GaN-based semiconductors are used as materials have already been used in actual products (see Japanese Laid-Open Patent Publications No. 2001-308462 and No. 2003-332697, for example).

The GaN-based semiconductor includes an $Al_xGa_yIn_zN$ ($0 \leq x<1$, $0 \leq z<1$, $0<y \leq 1$, $x+y+z=1$) semiconductor and has a wurtzite crystal structure. FIG. 1 schematically illustrates a unit cell of GaN. In an $Al_xGa_yIn_zN$ ($0 \leq x<1$, $0 \leq z<1$, $0<y \leq 1$, $x+y+z=1$) semiconductor crystal, some of the Ga atoms shown in FIG. 1 may be replaced with Al and/or In atoms.

FIG. 2 shows four primitive vectors $a_1$, $a_2$, $a_3$ and c, which are generally used to represent planes of a wurtzite crystal structure with four indices (i.e., hexagonal indices). The primitive vector c runs in the [0001] direction, which is called a "c-axis". A plane that intersects with the c-axis at right angles is called either a "c-plane" or a "(0001) plane". It should be noted that the "c-axis" and the "c-plane" are sometimes referred to as "C-axis" and "C-plane".

In fabricating a semiconductor device using GaN-based semiconductors, a c-plane substrate, i.e., a substrate of which principal surface is a (0001) plane, is used as a substrate on which GaN semiconductor crystals will be grown. In a c-plane, however, there is a slight shift in the c-axis direction between a Ga atom layer and a nitrogen atom layer, thus producing electrical polarization there. That is why the c-plane is also called a "polar plane". As a result of the electrical polarization, an internal electric field is generated due to spontaneous electrical polarization or piezoelectric polarization along the c-axis direction in the InGaN quantum well in the active layer. Once such an internal electric field has been generated in the active layer, some positional deviation occurs in the distributions of electrons and holes in the active layer due to the quantum confinement Stark effect of carriers. Consequently, the internal quantum efficiency decreases. Thus, in the case of a semiconductor laser diode, the threshold current increases. In the case of an LED, the power dissipation increases, and the luminous efficacy decreases. Meanwhile, as the density of injected carriers increases, the internal electric field is screened, thus varying the emission wavelength, too.

Thus, to overcome these problems, it has been proposed that a substrate of which the principal surface is a non-polar plane such as a (1-100) plane that is perpendicular to the [1-100] direction and that is called an "m-plane" be used. As used herein, "-" attached on the left-hand side of a Miller-Bravais index in the parentheses means a "bar" (a negative direction index). As shown in FIG. 2, the m-plane is parallel to the c-axis (primitive vector c) and intersects with the c-plane at right angles. On the m-plane, Ga atoms and nitrogen atoms are on the same atomic-plane. For that reason, no electrical polarization will be produced perpendicularly to the m-plane. That is why if a semiconductor multilayer structure is formed perpendicularly to the m-plane, no piezoelectric field will be generated in the active layer, thus overcoming the problems described above. The "m-plane" is a generic term that collectively refers to a family of planes including (1-100), (-1010), (10-10), (-1100), (01-10) and (0-110) planes. As used herein, the "X-plane growth" means epitaxial growth that is produced perpendicularly to the X plane (where X=c, m, etc.) of a hexagonal wurtzite structure. As for the X-plane growth, the X plane will be sometimes referred to herein as "principal surface" or "growing plane". A layer of semiconductor crystals that have been formed as a result of the X-plane growth will be sometimes referred to herein as an "X-plane semiconductor layer".

Thus, for example, an LED which has such a non-polar plane as the principal surface can have improved emission efficiency as compared with a conventional device which is manufactured on a c-plane.

As of now, LEDs and laser diodes that employ a nitride semiconductor structure of which principal surface is an m-plane that is a non-polar plane have been realized in laboratories. Almost all of these laboratory studies employ, as the substrate for growth, a GaN bulk substrate of which principal surface is the m-plane. Therefore, the problems of lattice mismatch and thermal expansion coefficient difference between a growing film and the substrate would not occur, so that growth of a nitride semiconductor device structure with high crystal quality is possible, and a high efficiency LED and laser oscillation are realized.

However, this GaN bulk substrate which is presently used for crystal growth of a nitride-based semiconductor device of which principal surface is the m-plane is expensive as compared with a sapphire substrate which has been conventionally used for a c-plane GaN-based LED, and also, it is difficult to realize a large diameter.

For example, in the current market, the price of a GaN bulk substrate is higher than that of a sapphire substrate of the same size by two orders of magnitude or more. As for its size, a substrate of m-plane GaN has a square size of about 1-2 cm on each side, and even in the case of a bulk substrate of c-plane GaN, a large diameter of two inches or more is difficult to realize as of now. On the other hand, the sapphire substrate is presently inexpensive, e.g., several thousands of Japanese yen, so long as its size is two inches, large diameters of four inches, six inches, and greater, have already been realized.

Thus, it can be said that, even in nitride semiconductor growth on an m-plane that is a non-polar plane, using sapphire as the substrate is particularly advantageous from the viewpoint of cost reduction.

On a sapphire substrate of which principal surface is the m-plane (hereinafter, "m-plane sapphire"), an m-plane nitride semiconductor can be grown (PCT INTERNATIONAL APPLICATION PUBLICATION NO. 2008/047907). Further, on the m-plane sapphire substrate, (11-22) plane and (10-1-3) plane, which are semi-polar planes, can be grown under predetermined conditions (Japanese Journal of Applied Physics 45, No. 6, L154-L157 (2006)).

In general, a nitride semiconductor crystal grown on a heterogeneous substrate which has a different crystalline structure, lattice constant, or thermal expansion coefficient, such as a sapphire substrate, (i.e., a so-called "hetero-grown" nitride semiconductor crystal) includes threading dislocations with high density (that mean edge dislocations, screw dislocations, and mixed dislocations, which are generically and simply referred to as "dislocations") and stacking faults. This is mainly attributed to a large lattice mismatch degree and a difference in crystalline structure between the nitride semiconductor and the different type of substrate. Dislocations and defects caused at the interface between the different type of substrate and the nitride semiconductor reach the active layer or device surface, significantly deteriorating the device characteristics, such as decrease in efficiency of the LED, decrease in device life. Since stacking faults are usually produced in the c-plane, in a nitride-based semiconductor device grown on a conventional c-plane sapphire, the stacking faults would not extend in the growing direction. Therefore, in the conventional c-plane growth, stacking faults do not reach the active layer. However, in growth of a non-polar plane, there is a c-plane lateral surface, and therefore, there is a probability that stacking faults produced in the c-plane reach the active layer or device surface, and this can be a major cause of deterioration in device characteristics. Thus, in a nitride-based semiconductor device of which principal surface is a non-polar plane, in order to realize a highly-efficient LED or laser diode, it is necessary to reduce the stacking fault density in addition to the threading dislocation density.

One known technique for reducing these dislocations and stacking faults is a selective growth method in which a mask pattern is employed. Such a growth method is commonly referred to as "Epitaxy Lateral Over Growth (ELOG)".

Epitaxial lateral overgrowth with the use of a semi-polar or non-polar GaN is already reported in Japanese Laid-Open Patent Publication No. 2009-295994 and other documents. In Japanese Laid-Open Patent Publication No. 2009-295994, a GaN film of which principal surface is an A-plane is grown on an R-plane sapphire substrate, and a $SiO_2$ mask is formed on that GaN surface for achieving epitaxial lateral overgrowth. In Japanese Laid-Open Patent Publication No. 2009-295994, the plane orientation dependence of the lateral growth was examined with varying stripe-shaped $SiO_2$ mask orientations in the plane.

One of the other epitaxial lateral overgrowth methods is a Pendeo growth method. This method is similar to the previously-described ELOG method but different in that lateral growth is carried out using a substrate which has an uneven structure. Since regrowth of a nitride semiconductor starts only from raised portions of the uneven structure, a regrown film is in a hung state, which is why the method is named Pendeo ("hang" in Latin).

There are some similar epitaxial lateral overgrowth methods, and also, there are some similar names for the growth methods. In this specification, methods wherein a substrate that has an uneven structure including nitride semiconductor regions which serve as growth cores or starting points for regrowth and heterogeneous substrate surface regions which are exposed by processing, such as etching, is provided, and a nitride semiconductor film is selectively regrown from the nitride semiconductor regions of the raised portions of the uneven structure, are generically referred to as "Pendeo growth". A manner of Pendeo growth in which the regrowth is carried out with the mask remaining at the crest portions of the raised portions is simply referred to as "Pendeo growth" or "masked Pendeo growth", whereas a manner of Pendeo growth in which the regrowth is carried out without the mask at the crest portions of the raised portions is referred to as "maskless Pendeo growth".

There are also lateral selective methods in which, in Pendeo growth, the surface of the recessed portions is covered with a dielectric (Applied Physics Letters 76, 3768 (2000) and Applied Physics Letters 75, 2062 (1999)). These methods are commonly called "air-bridged ELO" or "LOFT (lateral overgrowth from trenches)". In the air-bridged ELO, etching is not continued till the heterogeneous substrate is exposed. Rather, the nitride semiconductor film is etched to some extent, and thereafter, that nitride semiconductor surface is masked with a dielectric material. In the LOFT, the surface of the heterogeneous substrate which has been exposed by etching is masked with a dielectric material. These methods would not cause regrowth on the dielectric mask as in the previously-described ELOG method.

SUMMARY

In the above-described conventional techniques, further cost reduction and improved quality for formation of the m-plane nitride semiconductor layer have been demanded. Cost reduction and improved quality have also been demanded in nitride semiconductor layers with non-polar and semi-polar planes which are different from the m-plane.

A nonlimiting exemplary embodiment of the present application reduces the cost for manufacture of a nitride semiconductor layer, nitride-based semiconductor device, and light source, while the qualities thereof are improved.

In one general aspect, a structure for growth of a nitride semiconductor layer includes: a sapphire substrate of which growing plane is an m-plane; and a plurality of ridge-shaped nitride semiconductor layers provided on the growing plane of the sapphire substrate, wherein a bottom surface of a recessed portion provided between respective ones of the plurality of ridge-shaped nitride semiconductor layers is the m-plane of the sapphire substrate, the growing plane of the plurality of ridge-shaped nitride semiconductor layers is an m-plane, and an absolute value of an angle between an extending direction of the plurality of ridge-shaped nitride semiconductor layers and a c-axis of the sapphire substrate is not less than 0° and not more than 35°.

According to the above aspect, crystal growth from the lateral surfaces of the substrate which are exposed inside recessed portions and from the bottom surfaces of the recessed portions is prevented. Therefore, a nitride semiconductor layer with high surface flatness can be formed. This enables cost reduction of a multilayer structure, nitride-based semiconductor device, and light source which have a nitride semiconductor layer, while the qualities thereof are improved.

These general and specific aspects may be implemented using a method. Additional benefits and advantages of the disclosed embodiments will be apparent from the specification and Figures. The benefits and/or advantages may be individually provided by the various embodiments and features of the specification and drawings disclosure, and need not all be provided in order to obtain one or more of the same.

BRIEF DESCRIPTION OF THE DRAWINGS

FIGS. 11(a) and 11(b) are diagrams for illustrating the definition in the case where the in-plane mask tilt angle $\theta$ is not 0° ($\theta\neq0°$).

FIGS. 12(a) and 12(b) are diagrams for illustrating the definition of the in-plane mask tilt angle in the case of using an m-plane sapphire substrate which is made off by $\alpha$ degree in the a-axis direction.

FIG. 14(a) is a schematic cross-sectional view in the extending direction (longitudinal direction) of stripes in the unevenly-processed substrate 910 in the case where the tilt angle of the lateral surface, $\gamma$, is greater than 0° and smaller than 90°. FIG. 14(b) is a schematic cross-sectional view in the extending direction (longitudinal direction) of stripes in the unevenly-processed substrate 910 in the case where the tilt angle, $\gamma$, is 90°.

FIG. 15(a) is a schematic diagram showing the ridge-shaped nitride semiconductor layer 830 and recessed portions 850 in the case where the in-plane mask tilt angle $\theta$ is 0° ($\theta=0°$). FIG. 15(b) is a schematic diagram showing the ridge-shaped nitride semiconductor layer 830 and recessed portions 850 in the case where the in-plane mask tilt angle e is 90° ($\theta=90°$).

FIG. 16(a) is a diagram showing the relationship between the (11-22) plane and the a-plane facet. FIG. 16(b) is a diagram showing the relationship between the m-plane and the r-plane facet.

FIG. 19(a) is a graph showing the result of an X-ray 2θ-ω measurement carried out on a sample in which a nitride semiconductor film with a semi-polar plane ((10-1-3) plane) principal surface was provided on an m-plane sapphire substrate. FIG. 19(b) is a graph showing the result of an X-ray 2θ-ω measurement carried out on a sample in which a nitride semiconductor film with a semi-polar plane ((11-22) plane) principal surface was provided on an m-plane sapphire substrate.

FIGS. 21(a) and 21(b) are SEM images of the unevenly-processed substrate 910 in which a stripe-shaped mask was used. FIG. 21(a) shows a cross-sectional image (trapezoidal structure) in the extending direction (longitudinal direction) of the mask and a bird's-eye view. FIG. 21(b) shows a cross-sectional image (triangular structure) in the extending direction (longitudinal direction) of the mask and a bird's-eye view.

FIG. 22 is a diagram showing a surface morphology of a heterogeneous m-plane GaN substrate (heterogeneous m-plane nitride semiconductor substrate 920) after regrowth, which was obtained by a laser microscope.

FIG. 23(a) is a bird's-eye view. FIG. 23(b) is a cross-sectional view of a raised-portion nitride semiconductor region. FIG. 23(c) is a cross-sectional view in the vicinity of the interface between the recessed portion 850 and the sapphire substrate.

FIG. 24(a) shows the observation result for $\theta=0°$. FIG. 24(b) shows the observation result for $\theta=17°$. FIG. 24(c) shows the observation result for $\theta=21°$. FIG. 24(d) shows the observation result for $\theta=25°$. FIG. 24(e) shows the observation result for $\theta=35°$. FIG. 24(f) shows the observation result for $\theta=39°$. FIG. 24(g) shows the observation result for $\theta=47°$. FIG. 24(h) shows the observation result for $\theta=80°$.

FIG. 26(a) shows the observation result for $\theta=0°$. FIG. 26(b) shows the observation result for $\theta=45°$. FIG. 26(c) shows the observation result for $\theta=90°$.

FIGS. 29(a) and 29(b) are graphs showing the in-plane mask tilt angle dependence of the (11-22) plane/m-plane (2-200) plane X-ray integrated intensity ratio in the case where the etching lateral surface depth of the sapphire substrate was 250 nm (FIG. 29(a)) and in the case where the etching lateral surface depth of the sapphire substrate was not more than 150 nm (FIG. 29(b)).

FIGS. 30(a) and 30(b) are diagrams for illustrating the direction of the crystalline axis in the cases where the growing planes are the m-plane and the off-plane, respectively.

FIG. 31 shows the epitaxy relationship of an M-plane GaN film formed on an M-plane sapphire substrate. FIG. 31(a) is a lattice diagram of the M-plane GaN. FIG. 31(b) is a lattice diagram of the M-plane sapphire.

FIGS. 37(a) to 37(f) are graphs showing the results of PL measurements carried out on a regrown heterogeneous m-plane GaN substrate (heterogeneous m-plane nitride semiconductor substrate 920) at low temperature 10K with varying stripe width ratios, S width/(L width+S width). The values of S width/(L width+S width) were (a) 0.29, (b) 0.38, (c) 0.50, (d) 0.58, (e) 0.64, and (f) 0.99.

FIGS. 39(a) to 39(c) are graphs showing the PL spectrum at low temperature (10K) of an InGaN-based quantum well structure grown on a regrown heterogeneous m-plane GaN substrate (heterogeneous m-plane nitride semiconductor substrate 920). FIG. 39(a) shows the result for the case where the structure was directly grown on an m-plane GaN bulk substrate for the sake of comparison. FIGS. 39(b) and 39(c) are graphs showing the results of measurements for the cases where a quantum well structure was grown on a Pendeo epitaxial lateral overgrowth m-plane GaN with the values of S width/(L width+S width) were 0.67 and 0.29, respectively.

FIGS. 40(a) to 40(e) are laser microscope images obtained from the front surface side (i.e., m-axis side) of a regrown heterogeneous m-plane GaN substrate (heterogeneous m-plane nitride semiconductor substrate 920) with the L width being constant at 5 μm and varying S widths, (a) 10 μm, (b) 50 μm, (c) 100 μm, (d) 200 μm, and (e) 300 μm.

FIGS. 46(a) to 46(c) are enlarged schematic cross-sectional views of heterogeneous nitride semiconductor substrates which show other variations of the gaps.

FIGS. 49(a) and 49(b) are schematic plan views of heterogeneous nitride semiconductor substrates which show other variations of the stripe structure.

FIG. 50(a) is a schematic diagram showing a propagation vector of light polarized in the a-axis direction in a GaN. FIG. 50(b) is a schematic diagram showing the light distribution characteristics in the a-axis direction and the c-axis direction when seen along the m-axis in the GaN.

FIG. 53(a) is a schematic diagram showing an example of incoming light from the a-axis direction and transmitted light with respect to an emission surface in a semiconductor light-emitting device which has a flat emission surface. FIG. 53(b) is a schematic diagram showing an example of incoming light from the a-axis direction to a gap and transmitted light according to the fourth embodiment.

FIGS. 56(a) to 56(d) are schematic cross-sectional views showing the sequential steps of a method for forming gaps according to the epitaxial lateral overgrowth method of the fourth embodiment.

FIGS. 57(a) to 57(d) are schematic cross-sectional views showing the sequential steps of a variation of a method for forming gaps according to the epitaxial lateral overgrowth method of the fourth embodiment.

FIG. 58(a) is a schematic cross-sectional view. FIG. 58(b) is a schematic plan view.

FIGS. 59(a) and 59(b) are schematic cross-sectional views showing a variation of the unevenly-processed substrate according to the fourth embodiment and the fifth embodiment.

FIG. 63(a) is a schematic cross-sectional view which is seen from the c-axis direction. FIG. 63(b) is a schematic cross-sectional view which is seen from the a-axis direction in a n-electrode.

FIGS. 64(a) and 64(b) are schematic cross-sectional views showing the sequential steps of a manufacturing method of a heterogeneous nitride semiconductor substrate for use in a semiconductor light-emitting device according to the sixth embodiment.

FIGS. 72(a) and 72(b) are schematic diagrams showing a measurement system for the light distribution characteristics.

FIGS. 74(a) and 74(b) are graphs showing the light distribution characteristics in semiconductor light-emitting devices of Inventive Example 6, Reference Example 1, and Comparative Example 1.

FIGS. 77(a) and 77(b) are cross-sectional scanning electron microscopic (SEM) images showing an unevenly-processed substrate of EXAMPLE B.

FIGS. 78(a) and 78(b) are examples of cross-sectional SEM images showing heterogeneous nitride semiconductor substrates which have gaps.

FIGS. 80(a) and 80(b) show the light distribution characteristics of EXAMPLE B. FIG. 80(a) is the evaluation result of Comparative Example 5. FIG. 80(b) is the evaluation result of Inventive Example 9.

FIGS. 81(a) and 81(b) are examples of cross-sectional SEM images showing a heterogeneous nitride semiconductor substrate which has gaps according to EXAMPLE C.

FIGS. 86(a) and 86(b) are schematic diagrams showing the relationship of the crystal orientation of a (11-22) semi-polar plane grown on an m-plane sapphire.

FIGS. 87(a) and 87(b) show a stripe-shaped nitride semiconductor layer 110a. FIG. 87(a) is a schematic perspective view in the case of the in-plane tilt angle β=0°. FIG. 87(b) is a schematic perspective view in the case of the in-plane tilt angle β=90°.

FIGS. 88(a) and 88(b) are graphs showing the in-plane tilt angle β dependence of the value of the (11-22) plane/m-plane (2-200) plane X-ray integrated intensity ratio in the case where the depth of the etching lateral surface of the sapphire substrate was varied.

FIGS. 90(a) and 90(b) are graphs showing the results of room temperature PL measurements in heterogeneous nitride semiconductor substrates in which the in-plane tilt angles β were 5° and 14°, respectively.

DETAILED DESCRIPTION

Figure 1:
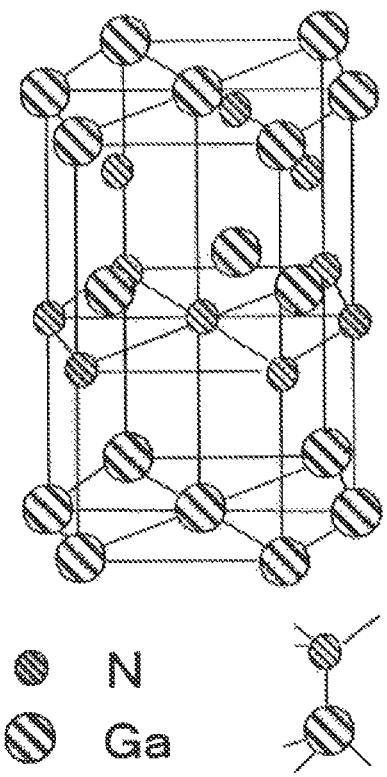
FIG. 1 is a perspective view schematically illustrating a unit cell of GaN.
Figure 2:
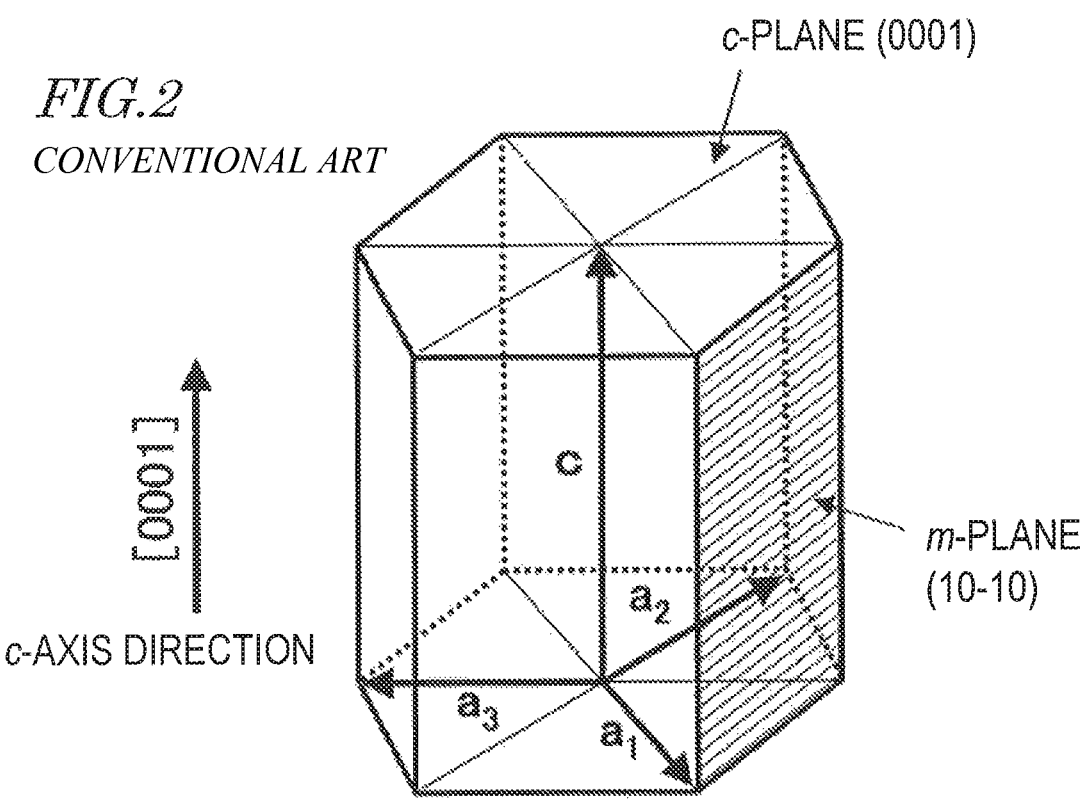
FIG. 2 is a perspective view showing primitive vectors $a_1$, $a_2$, $a_3$, and c representing a wurtzite crystal structure.

The summary of one embodiment of the present disclosure is as follows.

A structure for growth of a nitride semiconductor layer which is one embodiment of the present disclosure includes: a sapphire substrate of which growing plane is an m-plane; and a plurality of ridge-shaped nitride semiconductor layers provided on the growing plane of the sapphire substrate, wherein a bottom surface of a recessed portion provided between respective ones of the plurality of ridge-shaped nitride semiconductor layers is the m-plane of the sapphire substrate, the growing plane of the plurality of ridge-shaped nitride semiconductor layers is an m-plane, and an absolute value of an angle between an extending direction of the plurality of ridge-shaped nitride semiconductor layers and a c-axis of the sapphire substrate is not less than 0° and not more than 35°.

The absolute value of the angle may be greater than 0°.

An angle inside the plurality of ridge-shaped nitride semiconductor layers between a lateral surface which is parallel to the extending direction of the plurality of ridge-shaped nitride semiconductor layers and the m-plane may be greater than 0° and smaller than 150°.

A depth of the bottom surface relative to an interface between the sapphire substrate and the nitride semiconductor layers may be more than 0 nm and not more than 150 nm.

A structure for growth of a nitride semiconductor layer which is another embodiment of the present disclosure includes: a sapphire substrate of which growing plane is an m-plane; and a plurality of ridge-shaped nitride semiconductor layers provided on the growing plane of the sapphire substrate, wherein a bottom surface of a recessed portion provided between respective ones of the plurality of ridge-shaped nitride semiconductor layers is the m-plane of the sapphire substrate, the growing plane of the plurality of ridge-shaped nitride semiconductor layers is an m-plane, and a depth of the bottom surface relative to an interface between the sapphire substrate and the nitride semiconductor layers is not less than 0 nm and not more than 150 nm.

An angle between the extending direction of the plurality of ridge-shaped nitride semiconductor layers and the c-axis of the sapphire substrate may be not less than 0° and not more than 10°.

A structure for growth of a nitride semiconductor layer which is still another embodiment of the present disclosure includes: a substrate which has a growing plane; and a plurality of ridge-shaped nitride semiconductor layers which have a different crystal structure from that of the substrate and which are provided on the growing plane, wherein the substrate is exposed at a bottom surface of a recessed portion provided between respective ones of the plurality of ridge-shaped nitride semiconductor layers, a growing plane of the plurality of ridge-shaped nitride semiconductor layers is a non-polar plane or semi-polar plane, a lattice mismatch degree between the substrate and the plurality of ridge-shaped nitride semiconductor layers is not less than 2% in a first direction which is defined by orthogonal projection of a c-axis of the plurality of ridge-shaped nitride semiconductor layers onto the growing plane of the substrate, and the lattice mismatch degree between the substrate and the plurality of ridge-shaped nitride semiconductor layers is not less than 10% in a second direction which is perpendicular to the first direction in the growing plane, and a depth of the bottom surface relative to an interface between the substrate and the plurality of ridge-shaped nitride semiconductor layers is not less than 0 nm and not more than 150 nm.

The lattice mismatch degree in the first direction may be less than 10%.

Where an interplanar spacing of the substrate is ds, an interplanar spacing of the plurality of ridge-shaped nitride semiconductor layers is dg, and the lattice mismatch degree is M (%), the lattice mismatch degree M (%) may be represented by Formula 1 as follows:

$$M(\%)=100(dg-ds)/ds \qquad \text{(Formula 1)}$$

The substrate may be a sapphire substrate of which growing plane is an m-plane, and the growing plane of the plurality of ridge-shaped nitride semiconductor layers may be a (11-22) plane.

Where a width of the plurality of ridge-shaped nitride semiconductor layers at a base is L width and a width of the recessed portions at a bottom surface is S width, a value of S width/(L width+S width) may be not less than 0.6 and less than 1.

An upper surface of the plurality of ridge-shaped nitride semiconductor layers may not be provided with a mask.

The L width may be not less than 0.1 μm and not more than 10 μm, the S width may be not less than 0.15 μm and not more than 30 μm, and the value of S width/(L width+S width) may be not less than 0.6 and not more than 0.996.

The L width may be not less than 0.1 μm and not more than 10 μm, the S width may be not less than 30 μm and not more than 300 μm, and the value of S width/(L width+S width) may be not less than 0.75 and less than 1.

The L width may be not less than 1 μm and not more than 5 μm, the S width may be not less than 30 μm and not more than 300 μm, and the value of S width/(L width+S width) may be not less than 0.857 and less than 1.

An angle inside the plurality of ridge-shaped nitride semiconductor layers between a lateral surface which is parallel to the extending direction of the plurality of ridge-shaped nitride semiconductor layers and the growing plane of the substrate or the sapphire substrate may be greater than 0° and smaller than 150°.

The structure may further includes a buffer layer provided between the growing plane of the substrate or the sapphire substrate and the ridge-shaped nitride semiconductor layers, the buffer layer being made of $Al_xGa_yIn_zN$ (0≤x, y, z≤1, x+y+z=1).

The buffer layer may not be present on a bottom surface or lateral surface of the recessed portions.

The buffer layer may be made of AlN.

A multilayer structure which is still another embodiment of the present disclosure includes: any of the above-described structures for growth of a nitride semiconductor layer; and a nitride semiconductor layer which is in contact with the plurality of ridge-shaped nitride semiconductor layers in the structure for growth of a nitride semiconductor layer.

A multilayer structure which is still another embodiment of the present disclosure includes: any of the above-described structures for growth of a nitride semiconductor layer; and a nitride semiconductor layer which is in contact with an upper surface of the plurality of ridge-shaped nitride semiconductor layers in the structure for growth of a nitride semiconductor layer.

A nitride-based semiconductor light-emitting device which is still another embodiment of the present disclosure includes any of the above-described multilayer structures.

A light source which is still another embodiment of the present disclosure includes: the above-described nitride-based semiconductor light-emitting device; and a wavelength converter including a phosphoric material which is capable of converting a wavelength of light radiated from the nitride-based semiconductor light-emitting device.

A method for fabricating a multilayer structure which is still another embodiment of the present disclosure includes the steps of: (a) providing a substrate which has a growing plane; (b) growing a nitride semiconductor film on the growing plane; (c) forming a plurality of recessed portions so as to penetrate through the nitride semiconductor film, thereby forming a plurality of ridge-shaped nitride semiconductor layers; and (d) growing a nitride semiconductor layer such that the growth starts from the plurality of ridge-shaped nitride semiconductor layers, wherein a growing plane of the plurality of ridge-shaped nitride semiconductor layers is a non-polar plane or semi-polar plane, a lattice mismatch degree between the substrate and the plurality of ridge-shaped nitride semiconductor layers is not less than 2% in a first direction which is defined by orthogonal projection of a c-axis of the plurality of ridge-shaped nitride semiconductor layers onto the growing plane of the substrate, and the lattice mismatch degree between the substrate and the plurality of ridge-shaped nitride semiconductor layers is not less than 10% in a second direction which is perpendicular to the first direction in the growing plane, and in step (c), the plurality of recessed portions are formed such the substrate is exposed at a bottom surface of the plurality of recessed portions, a depth of the bottom surface of the recessed portions relative to an interface between the substrate and the plurality of ridge-shaped nitride semiconductor layers is not less than 0 nm and not more than 150 nm.

A method for fabricating a multilayer structure which is still another embodiment of the present disclosure includes the steps of: (a) providing a sapphire substrate of which growing plane is an m-plane; (b) growing a nitride semiconductor film on the growing plane; (c) forming a plurality of recessed portions so as to penetrate through the nitride semiconductor film, thereby forming a plurality of ridge-shaped nitride semiconductor layers; and (d) growing a nitride semiconductor layer such that the growth starts from the plurality of ridge-shaped nitride semiconductor layers, wherein a bottom surface of the recessed portions provided between respective ones of the plurality of ridge-shaped nitride semiconductor layers is the m-plane of the sapphire substrate, the growing plane of the plurality of ridge-shaped nitride semiconductor layers is an m-plane, and in step (c), the plurality of recessed portions are formed such that an absolute value of an angle between an extending direction of the plurality of ridge-shaped nitride semiconductor layers and a c-axis of the sapphire substrate is not less than 0° and not more than 35° and that where a width of the plurality of ridge-shaped nitride semiconductor layers at a base is L width and a width of the recessed portions at a bottom surface is S width, a value of S width/(L width+S width) is not less than 0.6 and less than 1.

A method for fabricating a multilayer structure which is still another embodiment of the present disclosure includes the steps of: (a) providing a sapphire substrate of which growing plane is an m-plane; (b) growing a nitride semiconductor film on the growing plane; (c) forming a plurality of recessed portions so as to penetrate through the nitride semiconductor film, thereby forming a plurality of ridge-shaped nitride semiconductor layers; and (d) growing a nitride semiconductor layer such that the growth starts from the plurality of ridge-shaped nitride semiconductor layers, wherein a bottom surface of the recessed portions provided between respective ones of the plurality of ridge-shaped nitride semiconductor layers is the m-plane of the sapphire substrate, the growing plane of the plurality of ridge-shaped nitride semiconductor layers is an m-plane, and in step (c), the plurality of recessed portions are formed such that the substrate is exposed at a bottom surface of the plurality of recessed portions, that a depth of the bottom surface of the recessed portions relative to an interface between the substrate and the plurality of ridge-shaped nitride semiconductor layers is not less than 0 nm and not more than 150 nm, and that where a width of the plurality of ridge-shaped nitride semiconductor layers at a base is L width and a width of the recessed portions at a bottom surface is S width, a value of S width/(L width+S width) is not less than 0.6 and less than 1.

A method for fabricating a multilayer structure which is still another embodiment of the present disclosure includes the steps of: (a) providing a sapphire substrate of which growing plane is an m-plane; (b) growing a nitride semiconductor film on the growing plane of the sapphire substrate; (c) forming a plurality of recessed portions so as to penetrate through the nitride semiconductor film, thereby forming a plurality of ridge-shaped nitride semiconductor layers; and (d) growing a nitride semiconductor layer such that the growth starts from the plurality of ridge-shaped nitride semiconductor layers, wherein in step (c), the plurality of recessed portions are formed such that a bottom surface of the plurality of recessed portions is the m-plane of the sapphire substrate, the growing plane of the plurality of ridge-shaped nitride semiconductor layers is an m-plane, and an absolute value of an angle between an extending direction of the plurality of ridge-shaped nitride semiconductor layers and a c-axis of the sapphire substrate is not less than 0° and not more than 35°.

In step (c), in the plurality of ridge-shaped nitride semiconductor layers, an angle inside the plurality of ridge-shaped nitride semiconductor layers between a lateral surface which is parallel to the extending direction of the plurality of ridge-shaped nitride semiconductor layers and the m-plane of the sapphire substrate may be greater than 0° and smaller than 150°.

In step (c), the plurality of recessed portions may be formed such that a minimum value of a width of the bottom surface of the plurality of recessed portions is not less than 0.1 µm and not more than 30 µm.

In step (c), the plurality of recessed portions may be formed such that a depth of the bottom surface of the plurality of recessed portions relative to an interface between the sapphire substrate and the plurality of ridge-shaped nitride semiconductor layers is more than 0 nm and not more than 500 nm.

In step (c), the plurality of recessed portions may be formed such that a depth of the bottom surface of the plurality of recessed portions relative to an interface between the sapphire substrate and the plurality of ridge-shaped nitride semiconductor layers is more than 0 nm and not more than 150 nm.

The plurality of recessed portions may be formed such that an angle between the extending direction of the plurality of ridge-shaped nitride semiconductor layers and the c-axis of the sapphire substrate is more than 0° and not more than 10°.

In step (c), the plurality of recessed portions may be formed using a photolithography technique.

A nitride-based semiconductor device which is still another embodiment of the present disclosure employs the nitride semiconductor layer formed according to any of the above-described methods as a substrate.

The substrate or the sapphire substrate may be removed.

A method for fabricating a multilayer structure which is still another embodiment of the present disclosure includes the steps of: (a) providing a sapphire substrate of which growing plane is an m-plane; (b) growing a nitride semiconductor film on the growing plane of the sapphire substrate; (c) forming a plurality of recessed portions so as to penetrate through the nitride semiconductor film, thereby forming a plurality of ridge-shaped nitride semiconductor layers; and (d) growing a nitride semiconductor layer such that the growth starts from the plurality of ridge-shaped nitride semiconductor layers, wherein in step (c), the plurality of recessed portions are formed such that a bottom surface of the plurality of recessed portions is the m-plane of the sapphire substrate, the growing plane of the plurality of ridge-shaped nitride semiconductor layers is an m-plane, and a depth of the bottom surface of the recessed portions relative to an interface between the sapphire substrate and the plurality of ridge-shaped nitride semiconductor layers is not less than 0 nm and not more than 150 nm.

A method for manufacturing a nitride-based semiconductor device which is still another embodiment of the present disclosure includes any of the above-described multilayer structure fabrication methods.

A semiconductor light-emitting device which is still another embodiment of the present disclosure includes a nitride-based semiconductor multilayer structure that includes an active layer of which principal surface is a non-polar plane or semi-polar plane and which is configured to emit polarized light, wherein the device includes a plurality of stripe structures provided at positions traversed by the polarized light with intervals therebetween, and an absolute value of an angle between an extending direction of the stripe structures and a polarization direction of the polarized light is not less than 3° and not more than 45°.

The principal surface may be an m-plane, the polarization direction may be an a-axis direction, and an absolute value of an angle between the extending direction of the stripe structures and the a-axis direction may be not less than 3° and not more than 35°.

An absolute value of an angle between the extending direction of the stripe structures and the polarization direction may be not less than 3° and not more than 10°.

A semiconductor light-emitting device which is still another embodiment of the present disclosure includes a nitride-based semiconductor multilayer structure that includes an active layer of which principal surface is a non-polar plane or semi-polar plane and which is configured to emit polarized light, wherein the device includes a plurality of stripe structures provided at positions traversed by the polarized light with intervals therebetween, and an absolute value of an angle between an extending direction of the stripe structures and a polarization direction of the polarized light is not less than 0° and less than 3°.

The semiconductor light-emitting device may have a light emission surface from which light is emitted to an outside, and the plurality of stripe structures may be provided in the light emission surface.

The plurality of stripe structures may be provided inside the nitride-based semiconductor multilayer structure.

The semiconductor light-emitting device may further include a substrate which is in contact with the nitride-based semiconductor multilayer structure, wherein the plurality of stripe structures may be provided between the nitride-based semiconductor multilayer structure and the substrate.

The substrate may be made of a material which is different from a nitride semiconductor.

The substrate may be a sapphire substrate of which principal surface is an m-plane.

A gap may be provided between adjacent ones of the stripe structures.

The stripe structures may be gaps.

A width of the gap may increase as it is more distant from the active layer.

The principal surface may be an m-plane, and the polarization direction may be an a-axis direction.

The polarized light may have such a light distribution characteristic that it has a wider radiation angle in a c-axis direction than in an a-axis direction of the active layer.

The stripe structures may include a material of which refractive index is lower than that of a nitride semiconductor.

A light source device which is still another embodiment of the present disclosure includes: any of the above-described semiconductor light-emitting devices; and a wavelength converter including a phosphoric material which is capable of converting a wavelength of light radiated from the semiconductor light-emitting device.

To realize cost reduction of a nitride-based semiconductor device of which principal surface is a non-polar m-plane, it is effective to replace an expensive GaN bulk substrate which is usually used in the conventional devices with a different type of inexpensive substrate.

As a substrate for growth of a nitride semiconductor crystal of which principal surface is the m-plane, a SiC substrate or sapphire substrate of which principal surface is the m-plane may be used. Alternatively, a $LiAlO_2$ substrate of which principal surface is the (100) plane may also be used. The sapphire substrate is advantageous because it is inexpensive, a large diameter substrate can readily be realized, and it is thermally and chemically stable. The sapphire substrate has been used in many conventional c-plane GaN-based light-emitting devices.

However, the present inventors found that, when one attempts to realize epitaxial lateral overgrowth using an m-plane nitride semiconductor film grown on an m-plane sapphire substrate, it is difficult to reduce the density of dislocations and defects is difficult, and therefore there are problems in improvement of the quality, which is not the case with c-plane nitride semiconductor growth on a conventional c-plane sapphire substrate and epitaxial lateral overgrowth in a-plane nitride semiconductor growth on an r-plane sapphire substrate.

According to the researches conducted by the present inventors, when an m-plane nitride semiconductor film is formed on an m-plane sapphire substrate to carry out Pendeo growth, a semi-polar nitride semiconductor film of the (11-22) plane can grow from the m-plane sapphire substrate exposed by etching. That is, when regrowth is carried out according to a Pendeo method, the m-plane and the semi-polar plane of (11-22) plane coexist, which may deteriorate the crystallinity and the surface roughness.

The same problems can also occur when a nitride semiconductor of which growing plane is a non-polar plane other than the m-plane or a polar plane is formed as a film on a sapphire substrate or non-sapphire substrate. The present inventors found that, even when in the first direction which is defined by orthogonal projection, on the growing plane of the substrate, of the c-axis of a plurality of ridge-shaped nitride semiconductor layers for regrowth by a Pendeo method, the lattice mismatch degree between the substrate and the plurality of ridge-shaped nitride semiconductor layers is not less than 2%, and in the second direction which is perpendicular to the first direction in the growing plane, the lattice mismatch degree between the substrate and the plurality of ridge-shaped nitride semiconductor layers is not less than 10%, crystals which have different plane orientations are likely to grow concurrently.

Under such circumstances, the present inventors found means for preventing semi-polar abnormal growth, which is an intrinsic problem that occurs when an m-plane nitride semiconductor is grown on an m-plane sapphire substrate, and abnormal growth which occurs when a nitride semiconductor of which growing plane is a non-polar plane other than the m-plane or a polar plane is formed as a film on a sapphire substrate or non-sapphire substrate, thereby achieving cost reduction and improved quality.

Figure 3:
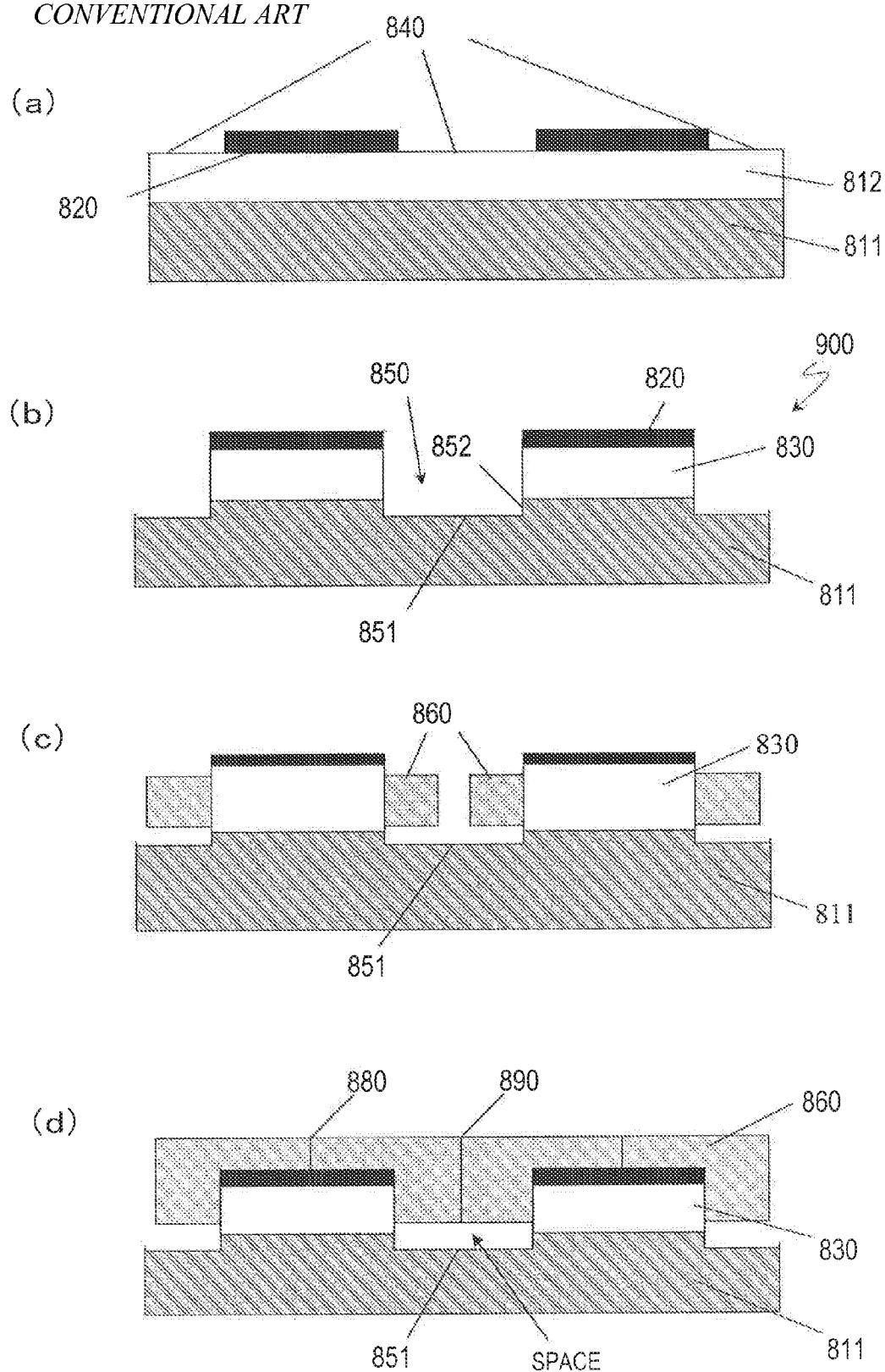
FIGS. 3(a) to 3(d) are schematic diagrams showing the process of epitaxial lateral overgrowth according to a masked Pendeo method.

Next, the Pendeo growth method is described. FIG. 3 is a schematic diagram of the Pendeo growth method. As shown in FIG. 3(a), firstly, a nitride semiconductor film 812 is grown on a heterogeneous substrate such as a sapphire substrate 811, and thereafter, a mask 820 is formed of a dielectric. For the dielectric mask, for example, $SiO_2$, SiN, SiON, or ZrO may be used. Thereafter, maskless space portions 840 are etched away, whereby the nitride semiconductor film 812 at opening portions is removed as shown in FIG. 3(b). In this way, new recessed portions 850 in which the heterogeneous substrate is exposed are formed, whereby an unevenly-processed substrate 900 is provided. Then, a nitride semiconductor film is regrown on this unevenly-processed substrate 900. This is shown in FIG. 3(c). In this phase, a nitride semiconductor film does not grow on the mask 820. The mask 820 functions as a regrowth prevention layer. Thus, in the unevenly-processed substrate 900, a nitride semiconductor film can be grown only from the lateral surfaces among the nitride semiconductor surfaces, so that a nitride semiconductor film 860 is regrown in lateral directions.

In this Pendeo growth method, as shown in FIG. 3(b), the ridge-shaped nitride semiconductor layers 830 (portions remaining after the etching), from which the regrowth is to start, and the recessed portions 850 in which the heterogeneous substrate is exposed by the etching are formed.

The recessed portions 850 formed by the etching are periodic. Although this uneven shape usually has a stripe shape which is thin and elongated along a direction which is based on the crystal orientation in one plane, it is not necessarily limited to a stripe shape so long as dislocations and defects laterally extend, and as a result, the density of dislocations and defects in the vicinity of the growing surface is reduced. It can be processed into various forms, including polygonal forms and circular forms.

In regrowth of a nitride semiconductor film on the substrate of FIG. 3(b), regrowth occurs preferentially from the nitride semiconductor layers 830 of the raised portions, and the regrown nitride semiconductor film grows in lateral directions from the lateral surfaces of the raised portion regions. The growth advances so as to cover the recessed portions 850 in which the heterogeneous substrate regions are exposed. When the growth is continued in this way, the laterally-growing nitride semiconductor films 860 connect to each other to form a connecting portion 890, so that the exposed surface of the sapphire substrate 811 (the bottom surface 851 of the recessed portions 850) is covered with the regrown film. When the growth is further continued, in this turn, a regrown nitride semiconductor film grows in a direction perpendicular to the substrate (i.e., the m-axis direction) so as to entirely cover the mask 820 and form connecting portions above the mask 820 as shown in FIG. 3(d), and finally, regrowth of a flat nitride semiconductor is possible. In this process, there is a probability that a space in which the epitaxial film is not present is produced between the recessed portions 850 and the laterally-grown nitride semiconductor film 860 (see FIG. 3(d)). Note that, however, this space gap is not always produced, and under the conditions that the source materials are sufficiently supplied, the space between the recessed portions 850 and the nitride semiconductor film 860 can be substantially not formed. Here, in the case of Pendeo growth, connecting portions are formed by the lateral growth such that two types of connecting portions, i.e., the connecting portions 880 above the mask 820 and the connecting portions 890 above the recessed portions 850, are periodically formed. Since regrowth of the nitride semiconductor film starts from the raised-portion nitride semiconductor layers 830 and advances in lateral directions, some of the dislocations bend in lateral directions rather than the m-axis direction that is the vertical direction, so that the density of dislocations and defects can be greatly reduced in recessed portions. Therefore, the quality of the surface region of the nitride semiconductor film 860 can be improved.

In general, in Pendeo growth, it is preferred that the depth of recessed portions formed by etching is as large as possible relative to the nitride semiconductor regions of the raised portions. This is because there is a probability that a nitride semiconductor film grows from the heterogeneous substrate surface of the recessed portions which has been exposed by etching in the phase of regrowth. In this Pendeo growth, regrowth is allowed to occur only from the nitride semiconductor regions of the raised portions, whereby reduction of the density of dislocations and defects is realized. Thus, it is important to prevent occurrence of regrowth from the heterogeneous substrate surface of recessed portions formed by etching, and even when such regrowth occurs, it is important to prevent the regrowth from affecting the lateral regrowth. As the etching depth increases, the source materials supplied during the regrowth become more difficult to reach the bottom of the recessed portions, so that the growth preferentially occurs only from the nitride semiconductor regions of the raised portions. Thus, the epitaxial lateral overgrowth is enhanced. Even if growth occurs in the recessed portions, the influence or interference on the regrown film is small so long as the etching depth is large.

Figure 4:
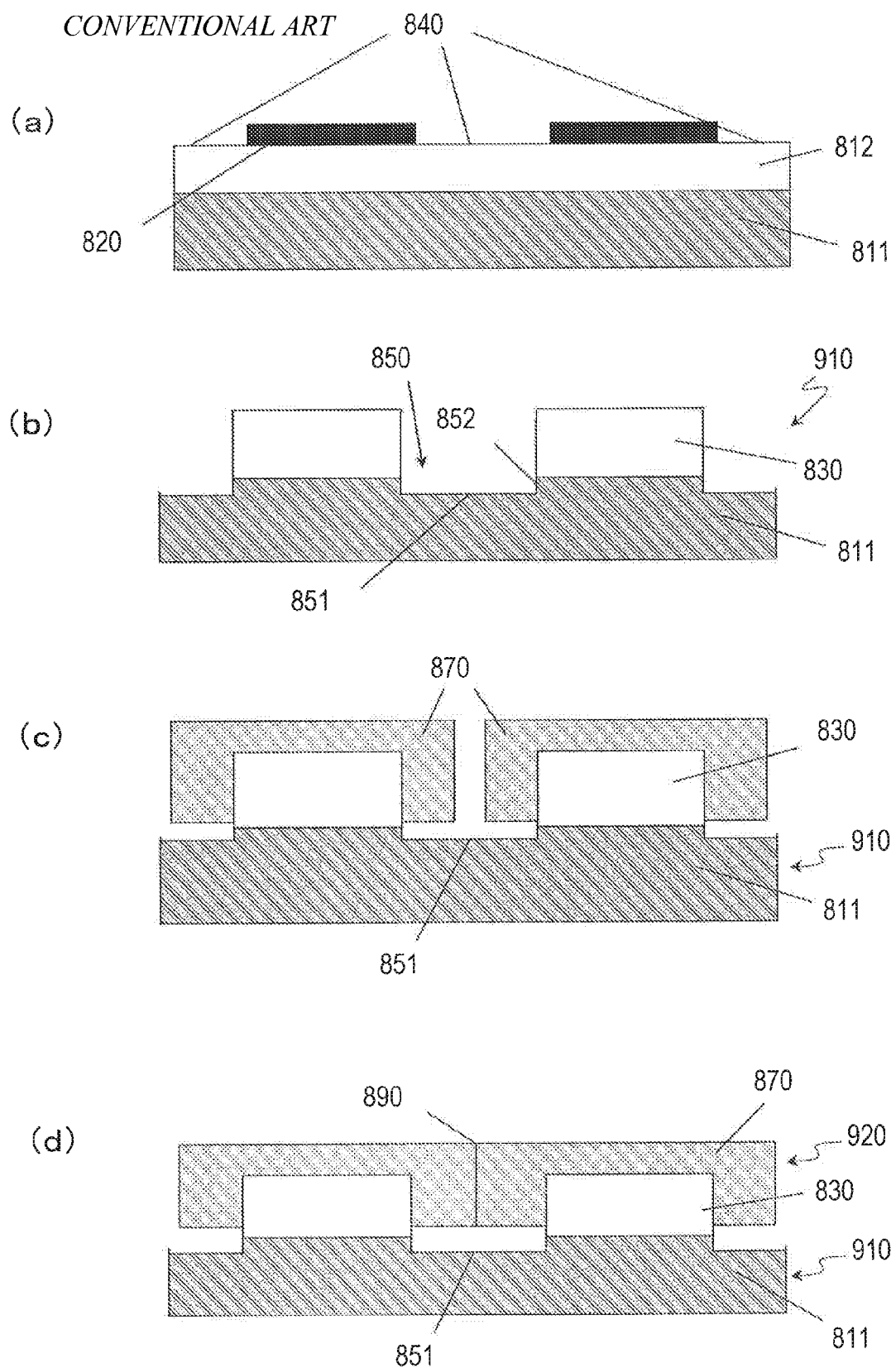
FIGS. 4(a) to 4(d) are schematic diagrams showing the process of epitaxial lateral overgrowth according to a maskless Pendeo method.

The Pendeo growth method can realize the epitaxial lateral overgrowth without the mask 820 shown in FIG. 3 which is made of a dielectric. This point is different from the ELOG method. This method is called a maskless Pendeo growth. Removing a dielectric mask is advantageous in that contamination by impurities from the mask material itself is prevented and formation of the connecting portions 880 above the mask 820 would not occur. The maskless Pendeo method is shown in FIG. 4. In the step shown in FIG. 4(a), as in masked Pendeo growth, unevenness is formed by etching, and thereafter, the unevenly-processed substrate 910 from which the mask has been removed as shown in FIG. 4(b) is used as a substrate for regrowth, and regrowth is started from the raised-portion nitride semiconductor layers 830. As shown in FIG. 4(c), lateral growth occurs so as to cover the recessed portions 850 while, concurrently, growth occurs at the upper surfaces of the raised portions. That is, the upper surfaces of the raised portions and a regrown film are in contact with each other. By continuing the regrowth, a flat nitride semiconductor film 870 can be finally obtained as shown in FIG. 4(d).

In maskless Pendeo growth, the mask is removed so that contamination by impurities from the dielectric film, such as $SiO_2$, would not occur. Therefore, there is an advantage that a high quality regrown nitride semiconductor film is obtained. Further, the step of forming a dielectric mask can be omitted, and accordingly, the manufacturing cost can advantageously be reduced.

Hereinafter, a nitride-based semiconductor device of an exemplary embodiment is described with reference to the drawings. An embodiment of the present disclosure relates to epitaxial lateral overgrowth by a Pendeo method of an m-plane nitride semiconductor on a sapphire substrate of which principal surface is the m-plane. In the drawings mentioned below, for the sake of simple description, elements which perform substantially the same functions are denoted by the same reference numerals. The present disclosure is not limited to the embodiments which will be described below.

Note that, in the present embodiment, nitride gallium layers (hereinafter, GaN layers) are mainly described as a seed crystal film and a regrown film, although these layers may contain Al, In, or B. Also, the seed crystal and the regrown film are not necessarily be formed by only a GaN layer. For example, it may include one $Al_xGa_yIn_zN$ ($0 \leq x$, y, $z \leq 1$, $x+y+z=1$) layer. Alternatively, it may include a plurality of alternately-stacked $Al_xGa_yIn_zN$ ($0 \leq x$, y, $z \leq 1$, $x+y+z=1$) layers which have different compositions, and furthermore, the B element may be contained in these layers.

(Embodiment 1)

Figure 5:
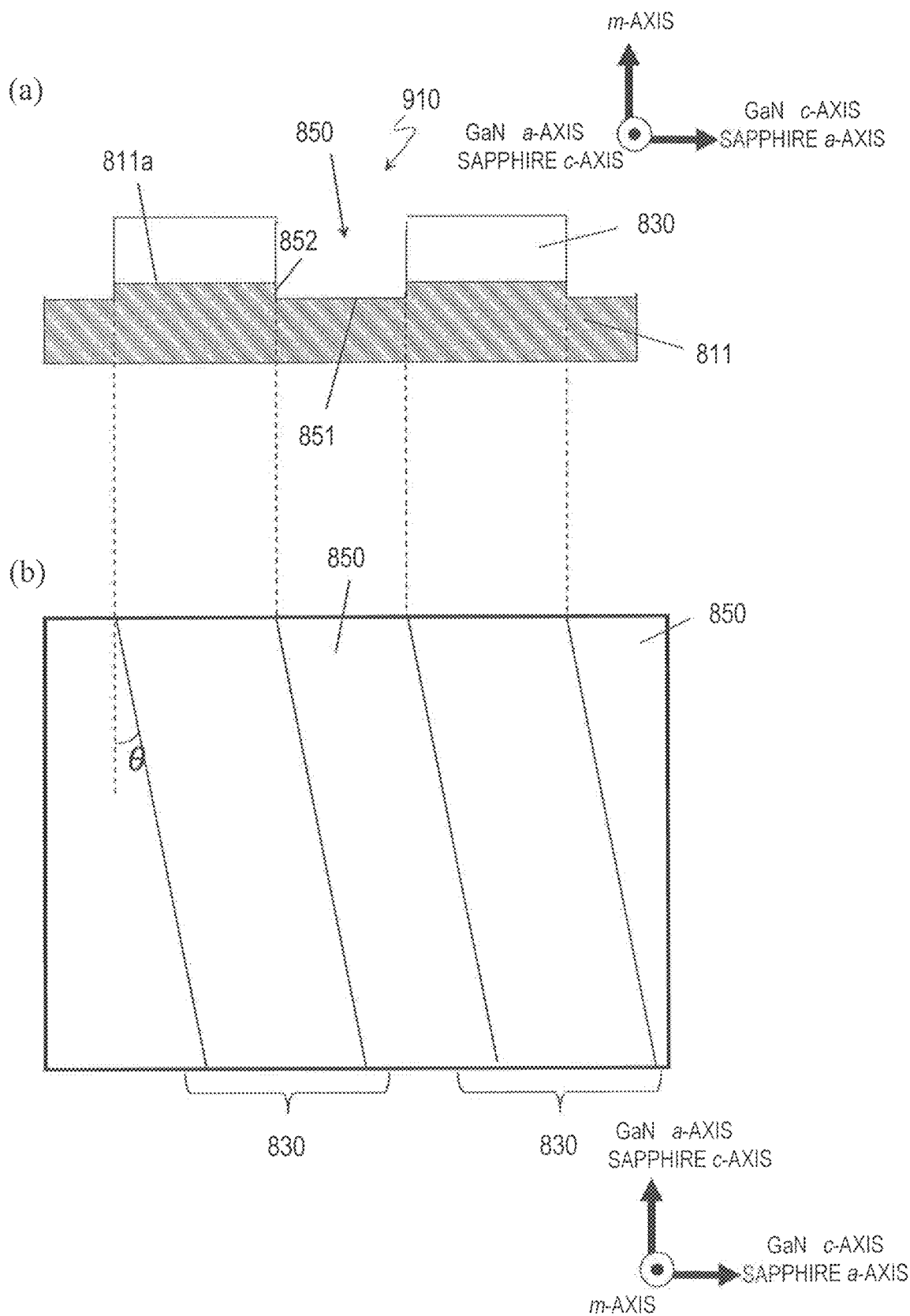
FIGS. 5(a) and 5(b) are a plan view and a cross-sectional view showing the configuration of an unevenly-processed substrate 910 (structure for growth of a nitride semiconductor layer) of exemplary Embodiment 1.

FIGS. 5(a) and 5(b) are a cross-sectional view and plan view showing a structure for growth of a nitride semiconductor layer (unevenly-processed substrate 910) according to exemplary Embodiment 1.

As shown in FIG. 5(a), the unevenly-processed substrate 910 includes a sapphire substrate 811 which has an m-plane as a growing plane 811a and a plurality of ridge-shaped nitride semiconductor layers 830 provided on the growing plane 811a of the sapphire substrate 811. Between respective ones of the plurality of ridge-shaped nitride semiconductor layers 830, there are recessed portions 850. In the example shown in FIG. 5(b), the ridge-shaped nitride semiconductor layers 830 extend in a direction which is inclined by angle θ with respect to the c-axis direction of the sapphire substrate 811. Note that, however, in the present embodiment, the extending direction of the ridge-shaped nitride semiconductor layers 830 is not necessarily inclined with respect to the c-axis direction of the sapphire substrate 811. The angle θ between the extending direction of the ridge-shaped nitride semiconductor layers 830 and the c-axis of the sapphire substrate 811 may be not less than 0° and not more than 35°. Thanks to this arrangement, when source materials are supplied for growing a nitride semiconductor layer by using the ridge-shaped nitride semiconductor layers 830 as seed crystals, growth of a semi-polar nitride semiconductor from lateral surfaces 852 of the sapphire substrate 811 which are exposed in the recessed portions 850 is prevented. Thus, the crystallinity and surface flatness of a nitride semiconductor layer which is to be grown improve.

At the bottom surface 851 of the recessed portions 850, the m-plane of the sapphire substrate 811 is exposed. The source material particles for the nitride semiconductor layer are unlikely to adhere onto the m-plane of the sapphire. Therefore, in the case where the nitride semiconductor layer is grown with the ridge-shaped nitride semiconductor layers 830 being used as seed crystals, source material particles are more likely to adhere onto the ridge-shaped nitride semiconductor layers 830 of the lateral surfaces than onto the bottom surface 851 of the recessed portions 850. As a result, growth of a low-crystallinity nitride semiconductor from the bottom surface 851 is prevented.

The growing plane (upper surface) of the ridge-shaped nitride semiconductor layers 830 is the m-plane of the nitride semiconductor. FIGS. 5(a) and 5(b) show an example where the growing plane of the ridge-shaped nitride semiconductor layers 830 is not provided with a mask, although in the present embodiment the mask 820 such as shown in FIGS. 3(a) to 3(d) may be provided.

The unevenly-processed substrate 910 of the present embodiment is formed using the sapphire substrate 811 which is in a wafer form, for example. In the drawings, only part of the wafer is shown. Respective elements are shown in consideration of visibility, and the actual scale of the respective elements is not limited to the scale of the elements shown in the drawings.

In the present embodiment, the growing plane of the sapphire substrate 811 may be inclined by an angle of not more than 5° with respect to the m-plane. A plane which is exposed at the bottom surface 851 of the recessed portions 850 may also be inclined by an angle of not more than 5° with respect to the m-plane. The growing plane of the ridge-shaped nitride semiconductor layers 830 may also be inclined by an angle of not more than 5° with respect to the m-plane.

A plane which is inclined by not more than 5° with respect to the m-plane has the same characteristics as those of the m-plane. Therefore, "m-plane" of the present disclosure includes a plane which is inclined by not more than 5° with respect to the m-plane.

In the example shown in FIG. 5(b), "the extending direction of the ridge-shaped nitride semiconductor layers 830" is identical with the extending direction of the long side of the planar shape of the ridge-shaped nitride semiconductor layers 830. These may not necessarily be identical with each other.

Further, the absolute value of the angle θ may be not less than 0° and not more than 10°. In this case, the stacking fault density can be particularly reduced. The details will be described later with reference to measurement results.

Figure 6:
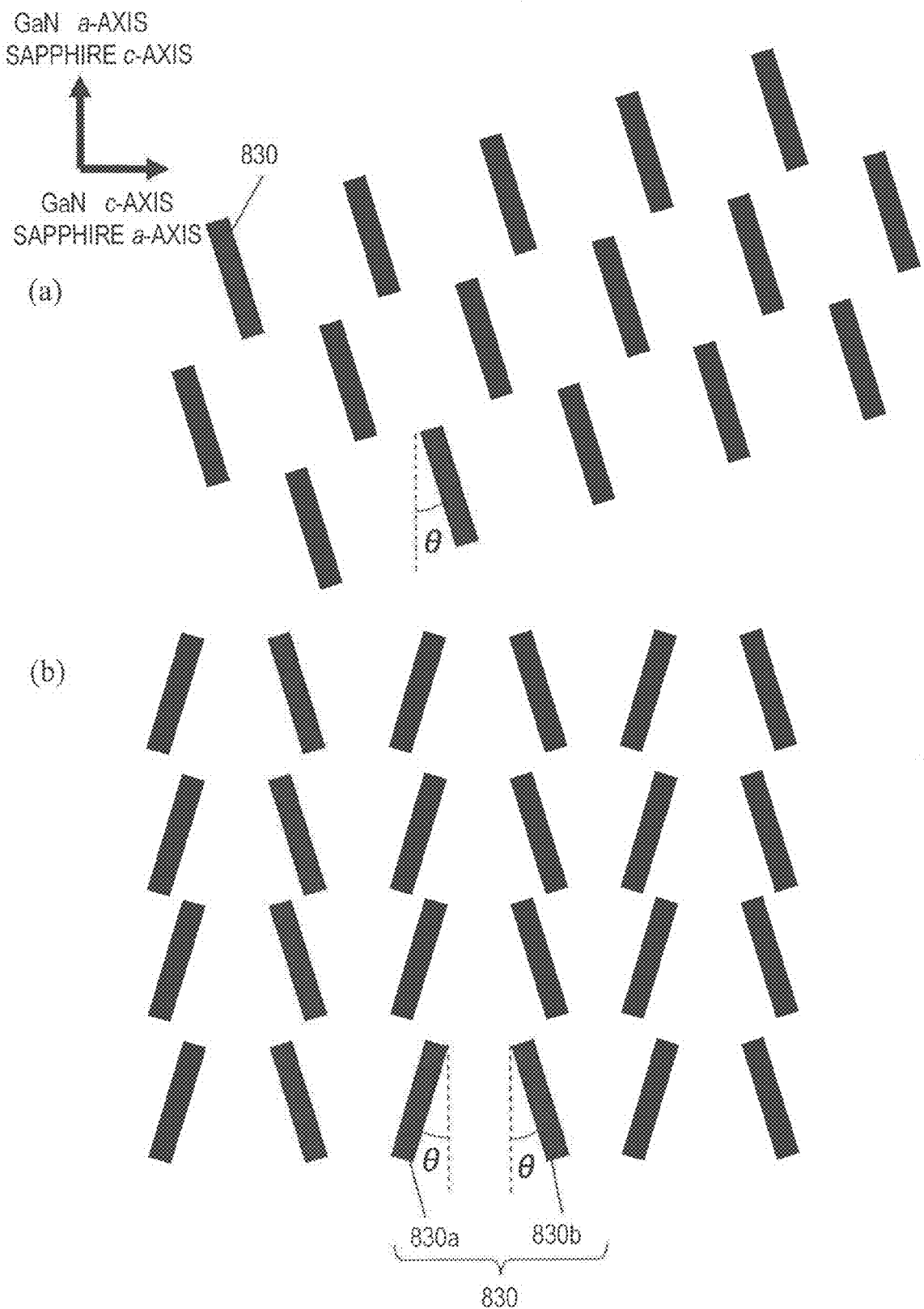
FIGS. 6(a) and 6(b) are plan views showing a variation of a ridge-shaped nitride semiconductor layers 830 of Embodiment 1.

The plurality of ridge-shaped nitride semiconductor layers 830 of the present embodiment are not limited to the arrangement shown in FIG. 5(b). Note that the ridge-shaped nitride semiconductor layers 830 may be interrupted on the wafer and may not be oriented in the same direction. For example, the plurality of ridge-shaped nitride semiconductor layers 830 shown in FIG. 6(a) have a rectangular planar shape. In FIG. 6(a), the length of the ridge-shaped nitride semiconductor layers 830 in the m-plane is smaller than the length of the wafer. Each of the ridge-shaped nitride semiconductor layers 830 is inclined by angle θ with respect to the c-axis direction of the sapphire. The absolute value of the angle θ is, for example, not less than 0° and not more than 35°. The plurality of ridge-shaped nitride semiconductor layers 830 shown in FIG. 6(b) includes ridge-shaped nitride semiconductor layers 830a which are inclined clockwise by angle θ with respect to the c-axis direction of the sapphire and ridge-shaped nitride semiconductor layers 830b which are inclined counterclockwise by angle θ with respect to the c-axis direction.

Figure 7:
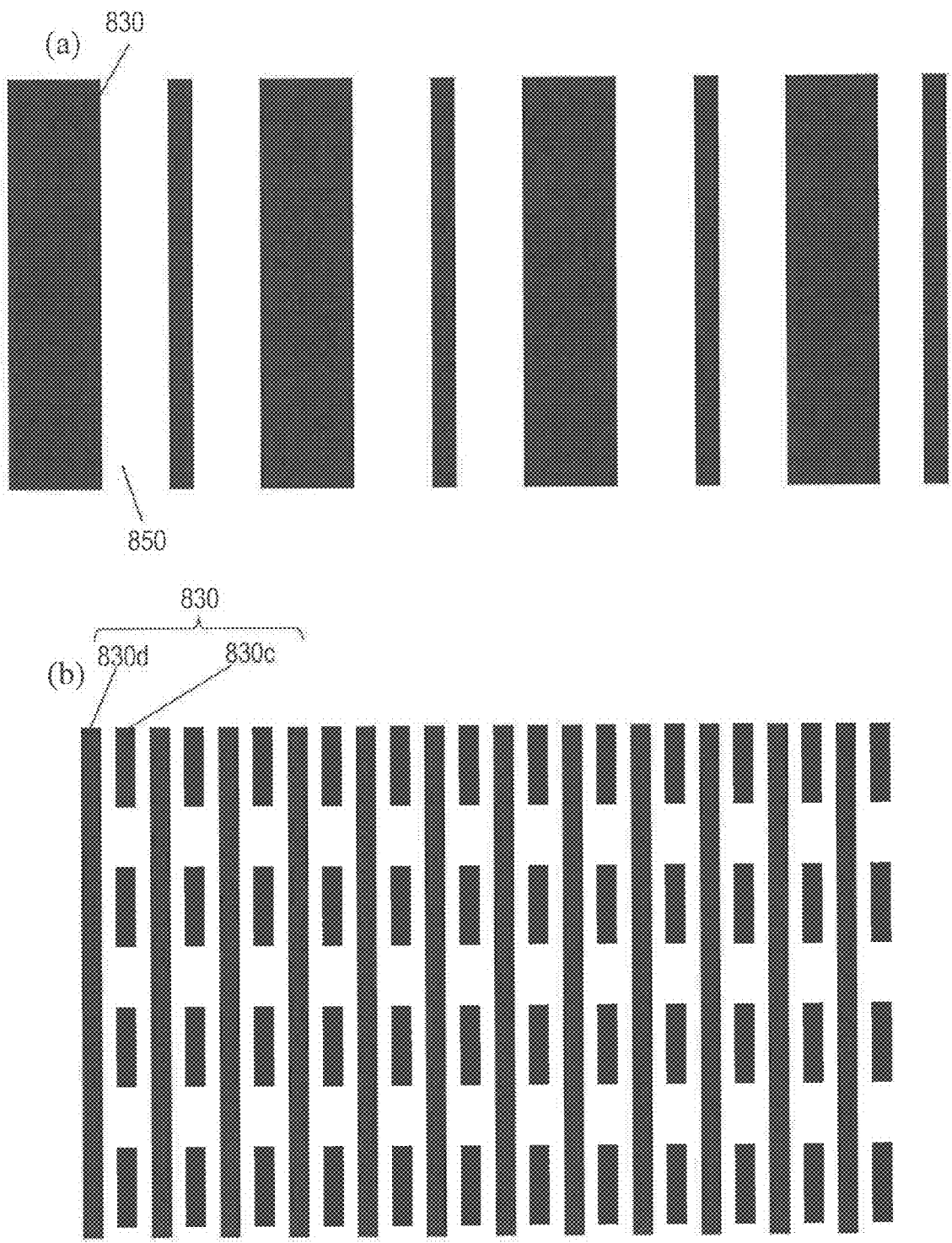
FIGS. 7(a) and 7(b) are plan views showing a variation of the ridge-shaped nitride semiconductor layers 830 of Embodiment 1.

As shown in FIG. 7(a), in the present embodiment, the widths of the ridge-shaped nitride semiconductor layers 830 and the recessed portions 850 (the length along the a-axis direction of the sapphire) may not be constant. The plurality of ridge-shaped nitride semiconductor layers 830 may have different planar shapes. For example, as shown in FIG. 7(b), ridge-shaped nitride semiconductor layers 830c, 830d which have different lengths may be arranged.

Figure 8:
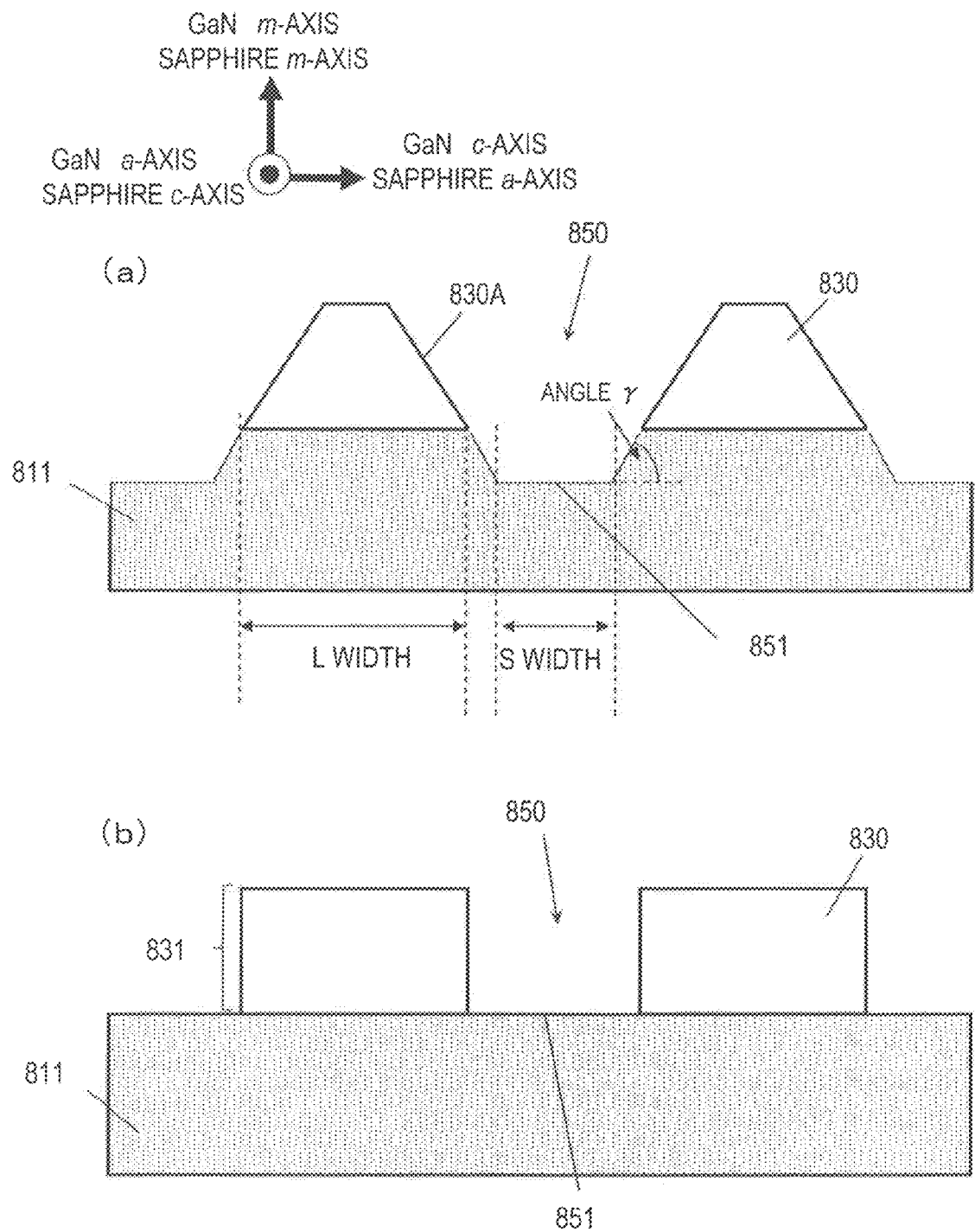
FIGS. 8(a) and 8(b) are diagrams showing a variation of the unevenly-processed substrate 910 (structure for growth of a nitride semiconductor layer) of Embodiment 1.

As shown in FIG. 8(a), in the present embodiment, lateral surfaces 830A of the ridge-shaped nitride semiconductor layers 830 may be sloped. In this case, angle γ inside the ridges which is formed between the lateral surfaces 830A that are parallel to the extending direction of the ridge-shaped nitride semiconductor layers 830 and the m-plane may be greater than 0° and smaller than 150°.

The cross section of the ridge-shaped nitride semiconductor layers 830 is not limited to a quadrangular or trapezoidal shape but may be a triangular shape or any other polygonal shape. Alternatively, it may include a curved surface.

In the present embodiment, the inclination with respect to the c-axis direction of the sapphire of the extending direction of some of the plurality of ridge-shaped nitride semiconductor layers 830, or part of one ridge-shaped nitride semiconductor layer 830, may not meet the condition of not less than 0° and not more than 35° In this case, the angle formed between the extending direction of at least 50% of the plurality of ridge-shaped nitride semiconductor layers 830 and the c-axis of the sapphire substrate 811 may be not less than 0° and not more than 35°.

The sapphire substrate 811 may be made of a sapphire crystal of which principal surface is the m-plane. The thickness of the sapphire substrate 811 is, for example, not less than 0.1 mm and not more than 1 mm. The diameter of the sapphire substrate 811 (wafer) is, for example, not less than 1 inch and not more than 8 inches. The thickness of the ridge-shaped nitride semiconductor layers 830 is, for example, not less than 10 nm and not more than 10 μm. The width of the ridge-shaped nitride semiconductor layers 830 (the length in a cross section which is parallel to the c-axis of the nitride semiconductor) is, for example, not less than 0.1 μm and not more than 30 μm. The width of the recessed portions 850 is not less than 1 μm and not more than 100 μm.

In general, the sapphire substrate has high thermal stability even under the growing condition for the nitride semiconductor, i.e., even at a high temperature which is equal to or higher than 1000° C. Also, the sapphire substrate is chemically stable, and a large diameter substrate can be realized relatively inexpensively. Thus, it is a suitable candidate for a heterogeneous substrate for use in nitride semiconductor growth, i.e., a hetero-substrate.

The nitride semiconductor layers 830 are realized by forming the recessed portions 850 in the nitride semiconductor film which is formed by m-plane growth over the entire sapphire substrate 811. The nitride semiconductor layers 830 are remaining portions after the nitride semiconductor film has been partially removed by photolithography, for example.

To avoid the nitride semiconductor from remaining on the bottom surface 851 of the recessed portions 850, the etching for formation of the recessed portions 850 can be advanced deeper. In this case, the sapphire substrate 811 is also partially removed so that the lateral surfaces 852 of the sapphire substrate 811 are exposed at the lower part of recessed portions 850 as shown in FIG. 5(a). It is not necessary to partially remove the sapphire substrate 811 for the purpose of forming the recessed portions 850. In this case, as shown in FIG. 8(b), the bottom surface 851 of the recessed portions 850 is at the same level as the interface between the sapphire substrate 811 and the nitride semiconductor layers 830.

The depth of the bottom surface 851 of the recessed portions 850 relative to the interface between the sapphire substrate 811 and the nitride semiconductor layers 830 may be, for example, not less than 0 nm and not more than 500 nm, or not less than 0 nm and not more than 150 nm.

In the present embodiment, the area of the sapphire which is exposed at the lateral surfaces of the ridge-shaped nitride semiconductor layers 830 may be reduced instead of making the absolute value of the angle formed between the extending direction of the ridge-shaped nitride semiconductor layers 830 and the c-axis of the sapphire substrate 811 fall within the range of not less than 0° and not more than 35°. That is, the depth of the bottom surface 851 of the recessed portions 850 relative to the interface between the sapphire substrate 811 and the nitride semiconductor layers 830 may be not less than 0 nm and not more than 150 nm. In this structure also, the amount of the semi-polar nitride semiconductor growing from the sapphire substrate 811 which is exposed at the lateral surfaces of the ridge-shaped nitride semiconductor layers 830 decreases, and therefore, the crystallinity and surface flatness of the nitride semiconductor layer can be improved. Note that, in the case where a plane which is different from the m-plane is exposed at the bottom surface of the recessed portions between the ridges, growth of the nitride semiconductor from the bottom surface of the recessed portions causes a problem. Therefore, it is necessary to form the recessed portions so as to have a deep bottom surface. In the present embodiment, the bottom surface 851 of the recessed portions 850 is m-plane sapphire, and therefore, the nitride semiconductor is unlikely to grow from the bottom surface 851. Thus, the depth of the recessed portions 850 can be decreased without considering the growth from the bottom surface 851.

Further, the structure may be configured such that the absolute value of the angle formed between the extending direction of the ridge-shaped nitride semiconductor layers 830 and the c-axis of the sapphire substrate 811 is not less than 0° and not more than 35° while the depth of the bottom surface 851 of the recessed portions 850 relative to the interface between the sapphire substrate 811 and the nitride semiconductor layers 830 may be more than 0 nm and not more than 150 nm. With this arrangement, even when the depth of the bottom surface 851 is more than 0 nm, the amount of the semi-polar nitride semiconductor growing from the sapphire substrate 811 which is exposed at the lateral surfaces of the ridge-shaped nitride semiconductor layers 830 can be further reduced.

(Embodiment 2)

Next, a nitride semiconductor growing method of exemplary Embodiment 2 is described with reference to FIG. 9. According to this method, the unevenly-processed substrate 910 of Embodiment 1 and the nitride semiconductor layer which is grown using the unevenly-processed substrate 910 can be formed.

[Preparation of Sapphire Substrate and Preparation of Seed Crystal Nitride Semiconductor Film 812]

According to the nitride semiconductor growing method of Embodiment 2, firstly, as shown in FIG. 9(a), an m-plane sapphire substrate 811 is provided. The sapphire substrate 811 used may have a size of 1 inch to 8 inches in diameter, for example. The thickness of the sapphire substrate 811 is, for example, from 0.1 mm to 1 mm. Also, an m-plane sapphire substrate of which substrate surface has an tilt angle (hereinafter, referred to as "off-angle") may be suitably used. So long as the off-angle is in the range of 0° to 5°, an embodiment of the present disclosure can be carried out without causing any trouble. The direction of that inclination may be a direction perpendicular to the m-axis. For example, it may be the c-axis, a-axis, or [11-22] axis direction.

Then, a surface treatment (washing or the like) is carried out on the m-plane sapphire substrate. Examples of the step of the surface treatment include organic cleaning, surface treatment with an acidic solution, such as sulfuric acid, phosphoric acid, hydrofluoric acid, or the like, and water washing. These steps may be used in combination. A thermal treatment may be employed as the surface treatment on the sapphire substrate. The sapphire substrate is thermally treated at a high temperature near 1000° C. to 1400° C., whereby a surface which has atomic layer steps can be obtained. Here, the gas atmosphere may be an atmosphere which contains nitrogen, oxygen, hydrogen, chlorine, etc. The thermal treatment method may employ an electric furnace. Alternatively, this thermal treatment step itself may be carried out in a growth furnace. This thermal treatment step may be combined with the previously-described organic cleaning or acidic cleaning. These solution-based cleanings and the surface treatment realized by a thermal treatment may be omitted. So long as a commercially-available substrate is sufficiently carefully handled, growth of a nitride semiconductor can be carried out without cleaning.

Then, as shown in FIG. 9(b), the nitride semiconductor film 812 for seed crystal is grown on the m-plane sapphire substrate 811. For growth of the nitride semiconductor, for example, the MOCVD (metal organic chemical vapor deposition) method or HVPE (hydreide vapor phase epitaxy) method may be used. The MOCVD method and HVPE method are advantageous as the nitride semiconductor growing method in that growth is possible at a high temperature, and the growth furnace is suitable to growth of a large diameter substrate. For growth of the nitride semiconductor, the MBE (molecular beam epitaxy) method may be employed. In the present embodiment, a growing method which is based on the MOCVD method is described.

In the MOCVD method, firstly, thermal cleaning of the m-plane sapphire substrate is carried out. This step is carried out mainly for the purpose of decomposition and removal of moisture and organic substances adhered on the sapphire surface but may be carried out for the purpose of obtaining the previously-described atomic layer steps in the sapphire substrate surface. The conditions are, for example, the temperature of 800-1200° C. and the duration of 10-60 minutes. Here, the pressure inside the growth furnace is 10-100 kPa. The carrier gas used may be $H_2$ or $N_2$, or a mixture gas thereof.

Then, a nitride semiconductor film is grown on the m-plane sapphire substrate. The carrier gas used may be $H_2$ or $N_2$, or a mixture gas thereof. Examples of the Group III source materials include: trimethyl gallium (TMG) and triethyl gallium (TEG) as the Ga source material; trimethyl indium (TMG) as the In source material; trimethyl aluminum (TMA) as the Al source material; and triethyl boron (TEB) as the B source material. As the nitrogen source material, for example, ammonium ($NH_3$) may be used.

The growth conditions for the nitride semiconductor film may be determined such that the plane orientation of the principal surface of the nitride semiconductor is controlled to be identical with the m-plane orientation. As described above, in growth of the nitride semiconductor on the m-plane sapphire substrate, a semi-polar plane nitride semiconductor of which principal surface is the (10-1-3) or (11-22) plane can sometimes grow according to the growth conditions. To grow the m-plane nitride semiconductor on the m-plane sapphire substrate, the conditions after thermal cleaning of the sapphire substrate, such as (1) presence or absence of the Group III source materials or Group V source materials, (2) buffer layer, (3) epi-layer on the buffer layer, and (4) growth temperature, irradiation and growth durations, etc., in respective steps, may be appropriately selected.

For example, in the present embodiment, the substrate temperature is decreased to 400° C.-800° C. after the thermal cleaning, and then, as the above step (1), TMA irradiation is carried out for 2-30 seconds under the supply rate condition of 0.1-100 μmol/min. Thereafter, an $Al_xGa_yIn_zN$ (0≤x, y, z≤1, x+y+z=1) buffer of step (2) is grown at the same temperature. Here, an AlN layer may be used as the buffer layer. The growth conditions are such that, for example, the V/III ratio is not less than 10 and not more than 5000, and the thickness is in the range of 20 nm to 500 nm. After the growth of the buffer layer, as the epi-film of step (3), growth of an $Al_xGa_yIn_zN$ (0≤x, y, z≤1, x+y+z=1) film is carried out. The epi-film may be GaN, for example. In this case, the respective conditions are such that, for example, the growth temperature is from 800° C. to 1100° C., the TMG supply rate is 1-200 μmol/min, the V/III ratio is not less than 10 and not more than 10000, and the pressure is 10-100 kPa. Carrying out the growth under such conditions enables growth of the nitride semiconductor of which principal surface is the m-plane. This nitride semiconductor layer can be used as the nitride semiconductor film 812 for seed crystal.

The thickness of the seed crystal nitride semiconductor may be appropriately selected. However, considering that a mask is formed on this seed crystal film in a subsequent step and etching is carried out till the sapphire substrate is exposed in some regions, these processes are difficult if the thickness of the seed crystal nitride semiconductor is excessively large. From this viewpoint, a desired seed crystal thickness is, for example, from 10 nm to 10 μm.

This nitride semiconductor layer may be provided with conductivity control. The n-type conductivity can be realized by, for example, doping with Si and Ge as the dopants, using $SiH_4$ and $GeH_4$ as the source material gases. The p-type conductivity can be realized by, for example, doping with Mg as the dopant, using $Cp_2Mg$ (BIS CYCLOPENTADIENYL MAGNESIUM) as the source material gas.

[Preparation of Unevenly-Processed Substrate 910]

Next, a method for manufacturing an uneven substrate for Pendeo growth is described. In the present embodiment, a method which is based on the maskless Pendeo growth shown in FIG. 4 is mainly described.

First, as shown in FIG. 9(c), a resist is applied over the seed crystal surface, and a mask pattern is formed according to a common photolithography technique. As the mask pattern, for example, a typical line & space (L&S) pattern, i.e., a pattern of thin and elongated stripes, may be used. The line portions of this mask 820 (resist portions remaining after exposure) and the space portions 840 (portions where the resist does not remain after exposure so that the surface of the nitride semiconductor film 812 for seed crystal which is the underlayer is exposed) determine the widths of the nitride semiconductor layers 830 of the raised portions and the recessed portions 850 after the processes. That is, the line portions are regions in which the seed crystals remain as they are and are therefore low crystal quality regions in which the dislocation density and the defect density are high. The space portions are regions in which a film is formed from the seed crystal portion by lateral regrowth and are high crystal quality regions. As for their widths, for example, the line width is from 0.1 μm to 30 μm, and the space width is from 1 μm to 100 μm. Note that the dislocations can be observed by, for example, a transmission microscope, or the like.

Then, the nitride semiconductor film 812 for seed crystal is removed from the space portions 840 by etching till a sapphire substrate surface portion is exposed. As a result, recessed portions 850 are formed so as to penetrate through the nitride semiconductor film 812 for seed crystal. The ridge-shaped nitride semiconductor layers 830 are formed by portions of the nitride semiconductor film 812 for seed crystal which are covered with the mask 820.

The etching method includes various methods including, for example, wet etching, sputter etching, plasma etching, sputter ion beam etching, and reactive ion beam etching. These methods may be appropriately employed.

In forming the recessed portions 850 by etching, part of the sapphire substrate 811 may be etched away together with the nitride semiconductor film 812 for seed crystal. If there is a remaining nitride semiconductor film in the recessed portions 850 that are openings without being etched away, regrowth occurs from the remaining film during regrowth of the nitride semiconductor film, so that a high quality regrown film cannot be obtained in some cases. Thus, from the viewpoint of entirely removing such a nitride semiconductor film that can remain in the recessed portions 850, it is preferred that part of the sapphire substrate is etched away. In this case, the lateral surfaces of the recessed portions 850 include not only the lateral surfaces of the ridge-shaped nitride semiconductor layers 830 but also the lateral surfaces 852 of the sapphire substrate 811. At the bottom surface of the recessed portions 850, the m-plane is exposed.

The formation method of the previously-described recessed portions 850 may be realized by a method which is different from the etching. For example, it may be a mechanical processing method, such as common scribing, or scribing with the use of laser, or may be a method which is combined with the previously-described etching method.

In the present embodiment, the etching depth of the sapphire substrate of the recessed portions 850 which is formed when the unevenly-processed substrate 910 is manufactured by etching the nitride semiconductor film 812 for seed crystal is preferably as small as possible. This etching depth of the sapphire substrate is equal to the depth (height) of the lateral surfaces 852 of the sapphire substrate 811. As described above, in common Pendeo growth, this etching depth is preferably as deep as possible. This is for the purpose of decreasing the probability that the source materials reach the sapphire substrate surface of the recessed portions 850, so that crystal growth at the opening portions can be prevented. However, it was found that, in the present embodiment, at some etching depths of the recessed portions 850, a semi-polar plane nitride semiconductor film of which crystal orientation is different from the m-plane disadvantageously grows in a subsequent regrowth step. It was found that such semi-polar plane growth occurs from the lateral surfaces 852 of the sapphire substrate 811 which have been formed in the etching. To prevent this semi-polar plane growth, the etching depth of the sapphire substrate of the recessed portions 850 (i.e., the height of the lateral surfaces 852 of the sapphire substrate 811) may be controlled so as to be not less than 0 nm and not more than 500 nm, within the range of not less than 0 nm and not more than 150 nm.

Figure 10:
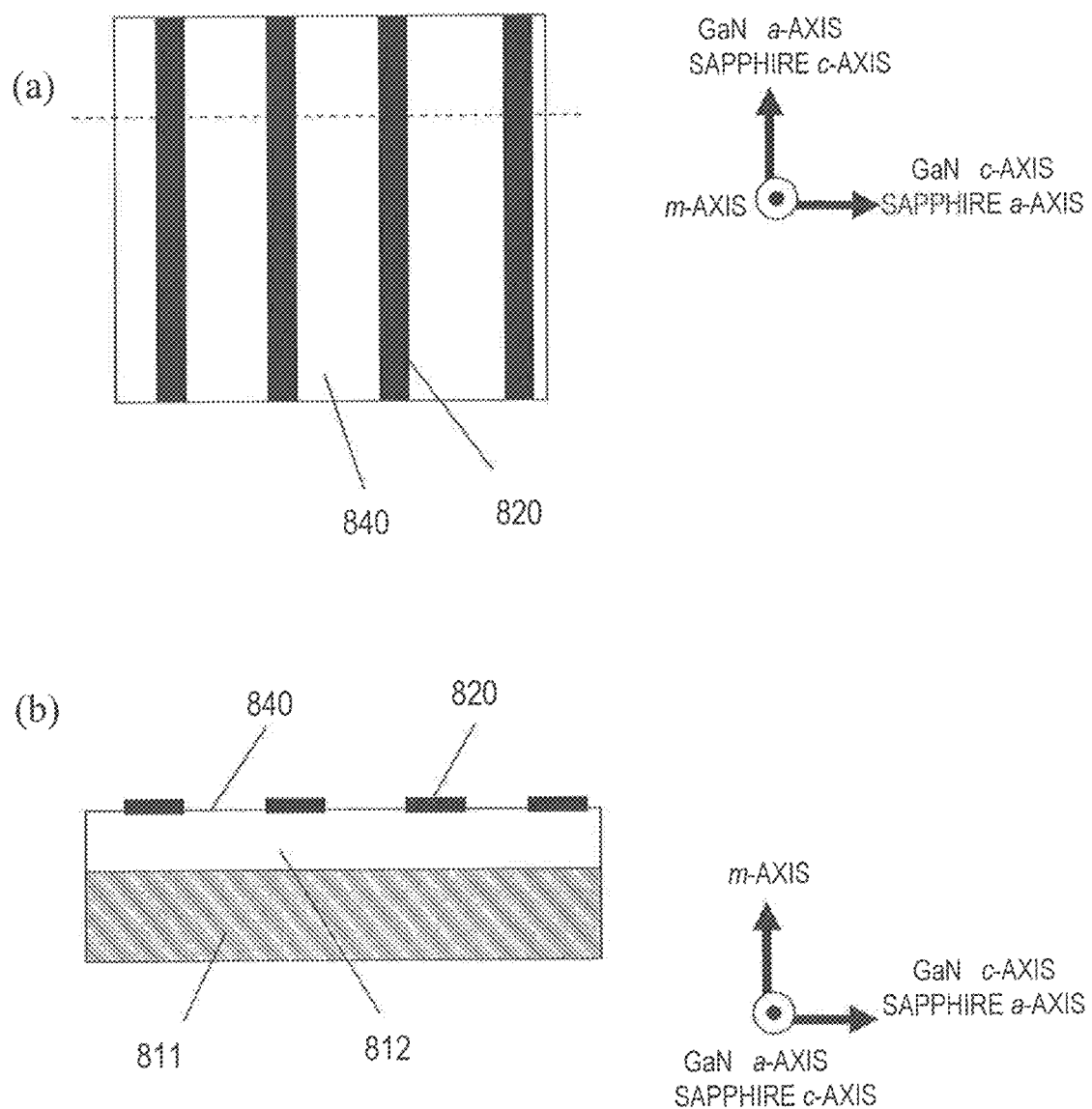
FIGS. 10(a) and 10(b) are diagrams for illustrating the definition of the in-plane mask tilt angle ($\theta=0°$).

Next, the in-plane tilt angle of the stripe mask is described. The definition of the in-plane tilt angle of the stripe mask in the present embodiment is illustrated in FIG. 10 and FIG. 11. FIG. 10 is a diagram showing the case where an m-plane GaN is grown on an m-plane sapphire substrate of which off-angle is 0°. FIG. 10(a) is a diagram which is seen from the principal surface side. FIG. 10(b) is a cross-sectional view taken along the broken line of FIG. 10(a). Note that, in this specification and drawings, the case where the extending direction of the stripe mask is parallel to the c-axis direction of the sapphire (the a-axis direction of the GaN) is assumed as θ=0° (FIG. 10). In this specification, the in-plane mask tilt angle θ≠0° means a state where the stripe mask is rotated in the plane from the c-axis direction of the sapphire (the a-axis direction of the GaN) as shown in FIG. 11. For example, FIG. 11 shows a case where 0°<θ<90°, and θ=90° means that the extending direction of the stripe mask is parallel to the a-axis direction of the sapphire (the c-axis direction of the GaN film).

FIG. 12 shows an example of the in-plane mask tilt angle where the m-plane sapphire substrate has an off-angle in the a-axis direction. For example, in the case of FIG. 12, the m-plane sapphire substrate is made off by α degree in the a-axis direction. In this case also, considering the in-plane mask tilt angle relative to the a-axis direction of the GaN, the in-plane mask tilt angle is assumed as θ=0° when the a-axis direction of the GaN (in the case of the m-plane sapphire, the c-axis direction) is parallel to the extending direction of the stripe mask. In this case, the direction of θ=90° is parallel to a projected component on the growth principal surface of the a-axis direction of the sapphire (the c-axis of the GaN).

Figure 13:
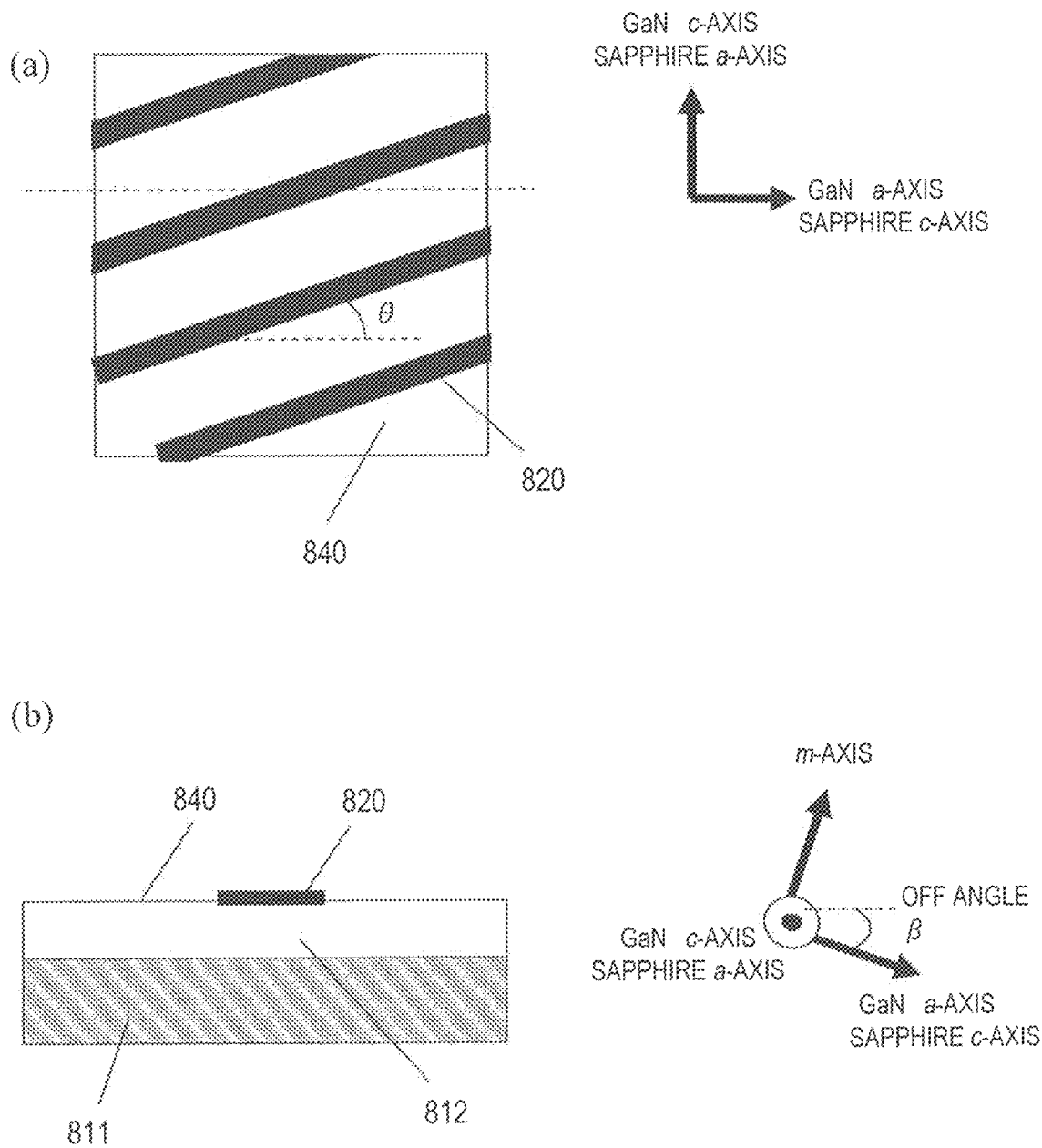
FIGS. 13(a) and 13(b) are diagrams for illustrating the definition of the in-plane mask tilt angle in the case of using an m-plane sapphire substrate which is made off by $\beta$ degrees in the c-axis direction.

FIG. 13 is an example of the in-plane mask tilt angle where the m-plane sapphire substrate has an off-angle in the c-axis direction. For example, in the case of FIG. 13, the m-plane sapphire substrate is made off by β degrees in the c-axis direction. In this case, considering the in-plane mask tilt angle relative to the direction of a projected component on the growth principal surface of the a-axis of the GaN, the in-plane mask tilt angle is assumed as θ=0° when the direction of the projected component is parallel to the extending direction of the stripe mask. In this case, the direction of θ=90° is parallel to the a-axis direction of the sapphire (the c-axis of the GaN).

In this case, an embodiment of the present disclosure can be carried out without causing any trouble so long as the range of the off-angle of the m-plane sapphire substrate is the range of 0-5° as previously described.

After the recessed portions 850 have been formed, the resist mask remaining on the surface is removed, whereby the unevenly-processed substrate 910 shown in FIG. 9(d) can be manufactured.

FIG. 14 shows a schematic cross-sectional view of the unevenly-processed substrate 910 of the present embodiment. In this drawing, the extending direction of the stripes is the c-axis direction of the GaN (i.e., the in-plane mask tilt angle θ=90°: the a-axis direction of the m-plane sapphire substrate). In FIGS. 14(a) and 14(b), the tilt angles of the lateral surfaces, γ, are different. FIG. 14(a) shows a case of 0°≤γ≤90°. FIG. 14(b) shows a case of γ=90°. The tilt angle γ refers to an angle between the m-plane of the sapphire substrate 811 and the lateral surface of the ridge-shaped nitride semiconductor layer 830. The tilt angle γ of the lateral surface can be controlled by the shape of the resist or the etching method, and as a result, the cross-sectional shape can be controlled so as to be trapezoidal, triangular, or polygonal. For example, in the case of forming the nitride semiconductor layers 830 which have a rectangular cross-sectional shape in which the upper base and the lower base have substantially the same lengths) (γ=90°), a resist mask which has also a near-rectangular cross-sectional shape may be formed, and the etching conditions may be appropriately selected. In the case of forming the ridge-shaped nitride semiconductor layers 830 which have a trapezoidal cross-sectional shape in which the lower base is longer than the upper base, for example, the cross-sectional shape of the resist mask may have a configuration which is inclined in the lateral surface direction, such as a triangular shape, and the etching conditions may be appropriately selected. In the case of forming the ridge-shaped nitride semiconductor layers 830 which have a trapezoidal cross-sectional shape in which the lower base is shorter than the upper base on the contrary) (γ>90°), the etching may be carried out in a (side etch) state where the etching rate from the lateral surfaces is increased by wet etching, or the like.

The lateral surface tilt angle γ of the lateral surfaces of the nitride semiconductor layers 830 that are seed crystals and the lateral surface tilt angle γ of the lateral surfaces 852 of the sapphire substrate 811 have generally equal values, although they do not necessarily need to be equal values. In the present embodiment, the lateral surface tilt angle γ can be selected from a wide range and, for example, the range of 0°≤γ≤150° is desirable.

In the present embodiment, the thickness of the ridge-shaped nitride semiconductor layers 830 is, for example, 10 nm to 10 μm. However, this thickness may be appropriately selected. The epitaxial lateral overgrowth of the m-plane nitride semiconductor of the present disclosure can be realized so long as the seed crystal portions of the same m-plane nitride semiconductor from which m-plane nitride semiconductor regrowth starts and the recessed portions 850 from which the nitride semiconductor film portions are removed such that the m-plane sapphire substrate is exposed are formed. Therefore, the ridge-shaped nitride semiconductor layers 830 may be realized by formation of nitride semiconductor layers of which principal surface is the m-plane. For example, the ridge-shaped nitride semiconductor layers 830 may be formed by only the previously-described buffer layers.

[Regrowth of the Nitride Semiconductor Film 870 on the Unevenly-Processed Substrate 910]

Figure 9:
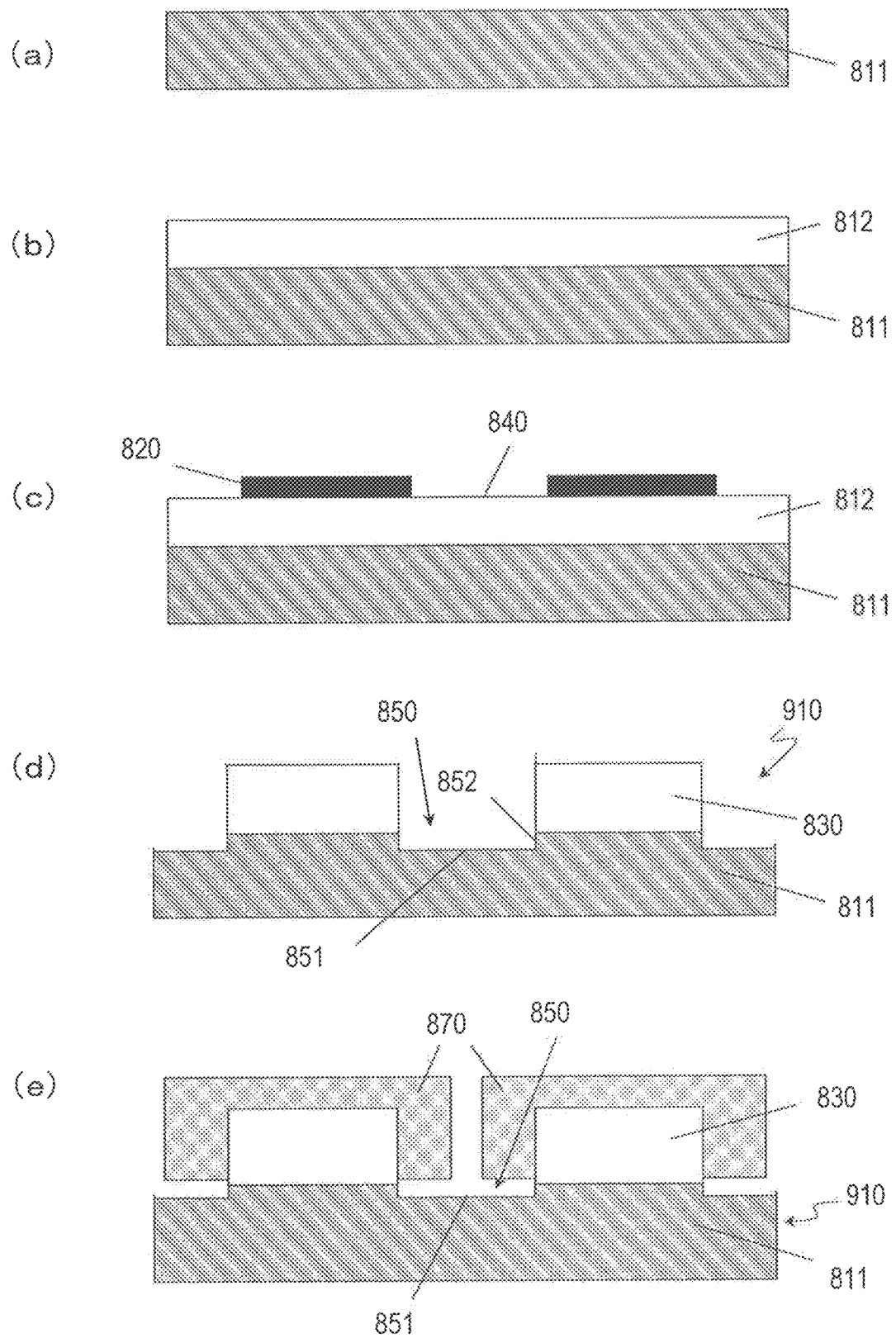
FIGS. 9(a) to 9(e) are diagrams showing a formation method of an unevenly-processed substrate 910 (structure for growth of a nitride semiconductor layer) and a heterogeneous m-plane nitride semiconductor substrate 920 according to Embodiment 2.

Then, as shown in FIG. 9(*e*), regrowth of the m-plane nitride semiconductor film 870 on the unevenly-processed substrate 910 is carried out. For regrowth of the m-plane nitride semiconductor, a method used for crystal growth of the nitride semiconductor, such as MOCVD, HVPE, MBE, or the like, may be appropriately used. The growing methods of the previously-described nitride semiconductor film 812 for seed crystal and the nitride semiconductor film 870 do not necessarily need to be the same. However, considering that growth is possible at a high temperature and it is suitable to increase in diameter, it can be said that MOCVD and HVPE are suitable regrowth methods of the nitride semiconductor. In the present embodiment, an embodiment which employs MOCVD as the regrowth method is described.

After the unevenly-processed substrate 910 is carried into an MOCVD apparatus, regrowth of the m-plane nitride semiconductor layer is performed. The carrier gas used may be $H_2$ or $N_2$, or a mixture gas thereof. Examples of the Group III source materials used include TMG, TEG, TMI, TMA, and TEB. As the nitrogen source material, for example, $NH_3$ may be used.

In the present embodiment, the pressure inside the growth furnace is 10-100 kPa. A mixture gas of $H_2$ and $N_2$ is used as the carrier gas. After the substrate is carried into the growth furnace, the substrate is increased to the growth temperature. In the middle of the temperature increase period, when the substrate temperature reaches 400-1000° C., the $NH_3$ gas is supplied into the growth furnace while the increase of the temperature is continued. In this phase, the flow rate of the $NH_3$ gas is 0.1-5 slm (standard liter/min).

After the substrate temperature reaches the regrowth temperature, the Group III source material is supplied, and regrowth is started. The regrowth temperature is 800-1100° C. When a GaN film is grown, for example, the TMG flow rate is 1-200 μmol/min, the V/III ratio is not less than 10 and not more than 10000, and the pressure is 10-100 kPa. The carrier gas used may be a $H_2$ gas or may be switched to $N_2$. Alternatively, a mixture of these gases may be used.

One of the important points in the regrowth is that films regrown from the respective stripe-shaped seed crystals are allowed to bond with each other so as to obtain a flat film. In general, in non-polar plane growth of a nitride semiconductor, a relatively flat film can be obtained under reduced pressure, low V/III ratio conditions. Therefore, the conditions for obtaining a flat regrown film are such that, for example, in the case of growing a GaN film, the regrowth temperature is 800-1100° C., the TMG flow rate is 1-200 μmol/min, and the V/III ratio is not less than 10 and not more than 250, and the pressure is 10–33 kPa. The carrier gas used may be a $H_2$ gas or may be switched to $N_2$. Alternatively, a mixture of these gases may be used.

The thickness of the regrown film can be selected from a wide range and, for example, it is from 1 μm to 30 μm. When MOCVD is employed, it is from 1 μm to 10 μm, for example.

[In-Plane Mask Tilt Angle Dependence]

The unevenly-processed substrate 910 is prepared as described above, and regrowth of a nitride semiconductor film is carried out under the above-described conditions, whereby a nitride semiconductor film 870 which has reduced dislocation density and defect density thanks to the Pendeo method can be obtained. However, in the case of the unevenly-processed substrate 910 which is formed by an m-plane nitride semiconductor film formed on an m-plane sapphire substrate, (1) the surface flatness, (2) presence/absence of semi-polar abnormal growth, and (3) the crystallinity vary depending on the in-plane tilt angle of the stripe-shaped raised portions. It can be said that such a phenomenon is specific to an m-plane nitride semiconductor provided on m-plane sapphire. Next, the reasons for this will be described.

FIGS. 15(*a*) and 15(*b*) are schematic diagrams of one raised portion (ridge structure) in the unevenly-processed substrate 910. FIGS. 15(*a*) and 15(*b*) show the most simple cases where the in-plane mask tilt angles are θ=0° and θ=90°, respectively. As for the epitaxy relationship between the m-plane sapphire substrate and the m-plane nitride semiconductor, the m-axes that are the normal directions of the principal surfaces are parallel, but the a-axes and the c-axes in the plan are deviated by 90°. Therefore, when the unevenly-processed substrate 910 is provided as shown in FIG. 15(*a*), the principal surface of the GaN at which regrowth occurs is the m-plane, while the lateral surface is the c-plane. On the other hand, the principal surface of the sapphire substrate which is formed in the same process (corresponding to the recessed portion 850) is the m-plane, while the lateral surface 852 is the a-plane of the sapphire. That is, in the case of FIG. 15(*a*), although the principal surfaces are the same m-plane, the lateral surfaces are different. Specifically, the lateral surface of the GaN is the c-plane while the lateral surface of the sapphire is the a-plane. On the other hand, in the case where the in-plane mask tilt angle shown in FIG. 15(*b*) is θ=90°, the lateral surface of the GaN is the a-plane, and the lateral surface of the sapphire is the c-plane. As a result, when the tilt angle of the stripe-shaped mask is varied in the plane from θ=0° to θ=90°, in the GaN, regrowth in which the a-plane facet serves as the starting point gradually transitions to a regrowth mode in which the c-plane facet serves as the starting point. On the other hand, at the lateral surface of the sapphire, it gradually transitions from the a-plane facet to the c-plane facet.

In the unevenly-processed substrate 910 in which the m-plane nitride semiconductor on the m-plane sapphire substrate serves as the basic body, the facet surface which serves as the starting point of lateral regrowth complicatedly varies depending on its in-plane mask tilt angle, and therefore, (1) the surface flatness, (2) presence/absence of semi-polar abnormal growth, and (3) the crystallinity of a film which can be obtained by regrowth vary. Next, the respective in-plane mask tilt angle dependences will be described.

[(1) Relationship Between the in-Plane Mask Tilt Angle and the Surface Flatness]

Firstly, the surface flatness of the regrown nitride semiconductor film 870 is described. Depending on the in-plane tilt angle of the mask, the facet surface which serves as a starting point of the epitaxial lateral overgrowth varies, and accordingly, the surface flatness greatly varies. Examples of the facet surface which serves as a starting point of the lateral growth include the a-plane, c-plane, (10-11) plane, and (11-22) plane of the GaN, and r-planes obtained by making these planes inclined in the m-axis direction. It is known that, in the lateral growth of the GaN layer, the growth speed is faster in the a-axis direction than in the c-axis direction. This is probably because the c-plane facet is more susceptible to heat than the a-plane facet, so that decomposition and omission of the GaN layer are more likely to occur, and therefore, the effective growth speed decreases. Thus, when the in-plane mask tilt angle θ is 0° (the extending direction of the stripe mask is the a-axis direction of the GaN, and the facet which serves as a starting point of the lateral growth is the c-axis direction), the growth speed is the slowest so that the effect of surface flattening is unlikely to be obtained. On the other hand, as θ increases, the surface flatness also improves (gaps are more likely to be filled). This effect is the greatest when θ=90° (i.e., the extending direction of the stripe mask is the c-axis direction of the GaN, and the facet which serves as a starting point of the lateral growth is the a-axis direction).

Performing the regrowth under the conditions that can maximize this surface flattening effect is important from the viewpoint of improving the crystallinity of the regrown nitride semiconductor film. According to the maskless Pendeo growth of the present embodiment, a film which is regrown on the nitride semiconductor layers 830 (line portions) that are seed crystal portions has remaining dislocations and defects as they are and therefore has poor crystallinity, and in a film formed by lateral regrowth in the recessed portions 850 (space portions), the effect of reducing the dislocation density and the defect density can be obtained. From this viewpoint, the ratio between the line portions and the space portions in the period of mask formation is desirably determined such that the space portions are larger. However, if the space portions are excessively large, the nitride semiconductor films 870 regrown from the nitride semiconductor layers 830 cannot sufficiently bond with each other, resulting in a regrown film which has gaps. Therefore, to form the space portions (i.e., recessed portions 850) which have a larger area ratio and obtain a flat regrown film surface without gaps, it is desired to select the in-plane mask tilt angle such that the surface flattening effect is maximized.

However, the surface flattening effect in the previously-described lateral regrowth is the result of the case where only the m-plane nitride semiconductor is considered. According to the examinations carried out by the present inventors, in the case where before the regrowth is carried out as in the present embodiment the substrate surface has a region in which the m-plane sapphire surface is exposed, such as at the bottom surface of the recessed portions 850, the relationship between the surface flatness and the in-plane mask tilt angle varies.

It was found from the results of experiments carried out by the present inventors that, in the process of providing the unevenly-processed substrate 910 and growing a regrown nitride semiconductor film 870, when the in-plane mask tilt angle θ increases from 0° to 35°, the surface flatness improves according to the same principle as the previously-described characteristics of the GaN film. However, when θ>35°, the surface flatness begins to deteriorate. In the range of 35°<θ<90°, formation of a regrown nitride semiconductor film with excellent surface flatness is difficult.

It was found that such a surface morphology variation which occurs when the in-plane mask tilt angle θ is not less than 35° has a relation with the semi-polar plane abnormal growth which will be described below.

[(2) Semi-Polar Plane Abnormal Growth from the m-Plane Sapphire Substrate]

According to the examinations carried out by the present inventors, it was found that, when the in-plane mask tilt angle is in the range of 35°<θ<90°, the surface of the regrown film deteriorates because in this angle range the (11-22) plane that is the semi-polar plane grows from the m-plane sapphire regions exposed at the recessed portions 850. Precisely, it is probably attributed to the lateral surfaces 852 of the m-plane sapphire substrate 811 which are formed in the etching of the space portions 840.

When the in-plane mask tilt angle θ is 0°, the normal line component of the lateral surface facet of the GaN is oriented in the c-axis direction, while the lateral surfaces 852 of the sapphire substrate 811 are oriented in the a-axis direction (FIG. 15(a)). As the in-plane mask tilt angle θ increases, the lateral surfaces 852 of the sapphire substrate 811 gradually transition from the a-axis direction to the c-axis direction.

That is, in the lateral surfaces 852 of the sapphire substrate 811, when θ≠0°, there are facets which have the a-plane and the c-plane. As the value of θ increases, the proportion of the c-plane facet in the lateral surfaces becomes larger than that of the a-plane facet. It is inferred that this c-plane facet of the sapphire has a relation with the (11-22) plane semi-polar plane growth. It is also inferred that the proportion of this c-plane facet increases according to the increase of θ, and that when θ>35° growth of the semi-polar plane nitride semiconductor film remarkably occurred from the lateral surfaces 852 of the sapphire substrate 811 exclusive of the nitride semiconductor layers 830.

It is known that, when a nitride semiconductor film is grown on an m-plane sapphire substrate, some growth conditions cause growth of a nitride semiconductor film of which principal surface is the (11-22) semi-polar plane rather than the m-plane (Japanese Journal of Applied Physics 45, No. 6, L154-L157 (2006)). The relationship of the plane orientation of this (11-22) semi-polar plane is shown in FIG. 16(a). It is inferred that growth of the (11-22) semi-polar nitride semiconductor on the m-plane sapphire substrate has a relation with the r-plane facet of the m-plane sapphire surface (see FIG. 16(b)). In the GaN shown in FIG. 16(a), the angle between the (11-22) plane and the (11-20) plane that is the a-plane is 31.6°. In the sapphire shown in FIG. 16(b), the angle between the (1-100) plane that is the m-plane and the r-plane (1-102) plane is 32.4°. The difference of these angles is not more than 1°. It is well known in the art that a nitride semiconductor of which principal surface is the a-plane is grown on an r-plane sapphire substrate. Therefore, as shown in FIG. 16, one of the possible causes of (11-22) semi-polar nitride semiconductor growth on an m-plane sapphire substrate is a mechanism which allows an a-plane nitride semiconductor to grow from an r-plane facet which is present on the growing plane of the m-plane sapphire. It is inferred that, as a result of the growth of the a-plane nitride semiconductor on the r-plane facet, a semi-polar nitride semiconductor of which principal surface is the (11-22) plane grows.

Considering the above circumstances, the r-plane facet of the sapphire faces in the c-axis direction. Therefore, assuming that part of the m-plane sapphire substrate is etched away together with the nitride semiconductor regions in the process of preparing the unevenly-processed substrate 910 as in the present embodiment, r-plane steps are more readily formed in the case where the c-plane facet is formed than in the case where the a-plane facet is formed, and as a result, (11-22) semi-polar plane growth is more likely to occur.

As described above, the area proportion of the c-plane facet of the sapphire included in the lateral surface varies depending on the in-plane mask tilt angle θ. Therefore, it is inferred that, as a result, the probability of occurrence of (11-22) semi-polar plane growth also varied depending on θ. According to the results of the examinations carried out by the present inventors, the range of the in-plane mask tilt angle θ which enables reduction of the effects of the semi-polar plane abnormal growth and regrowth of a nitride semiconductor crystal which has only the m-plane orientation was from 0° to 35°.

That is, by controlling the in-plane mask tilt angle of the stripe structure of the unevenly-processed substrate 910 so as to be within the range of 0° to 35°, the semi-polar plane abnormal growth can be prevented, and the nitride semiconductor film 870 which has excellent surface flatness can be obtained.

The (11-22) semi-polar abnormal growth that occurs from the recessed portions 850 at which the m-plane sapphire substrate surface is exposed depends not only on the in-plane mask tilt angle but also on the etching depth of the recessed portions 850 (i.e., the depth of the lateral surfaces 852 of the sapphire substrate 811). Even when the in-plane mask tilt angle was in the range of 0-35°, if this etching depth was excessively deep, the semi-polar plane abnormal growth occurred in some cases. This is probably because, even when the process is carried out so as to achieve θ=0°, shaping the lateral surfaces 852 of the sapphire substrate 811 so as to be flat at the atomic level is difficult in actuality, so that facets which have the c-plane and the r-plane are partially formed. It is considered that this phenomenon is more likely to occur as the area of the etched lateral surfaces of the sapphire substrate increases. Such semi-polar plane abnormal growth depends on the in-plane mask tilt angle, as a matter of course. However, the abnormal growth can be prevented more effectively by controlling the etching depth of the sapphire substrate of the recessed portions 850 (i.e., the height of the lateral surfaces 852 of the sapphire substrate 811) so as to be more than 0 nm and not more than 500 nm, more desirably more than 0 nm and not more than 150 nm.

[(3) Relationship Between the In-Plane Mask Tilt Angle and the Crystallinity and Dislocation Density/Stacking Fault Density]

Next, the in-plane mask tilt angle of the nitride semiconductor film and the effect of reducing the dislocation density and the defect density are described. First, as for the dislocation density, it is known that the dislocation density can be reduced by epitaxial lateral overgrowth over a wide range of the in-plane mask tilt angle. For example, when the previously-described surface flatness is high and the in-plane mask tilt angle θ which can prevent the semi-polar plane abnormal growth is from 0° to 35°, the crystal quality can be improved thanks to the dislocation density reducing effect. However, in the non-polar plane nitride semiconductor, reducing the stacking fault density is important as well as reduction of the dislocation density.

Figure 17:
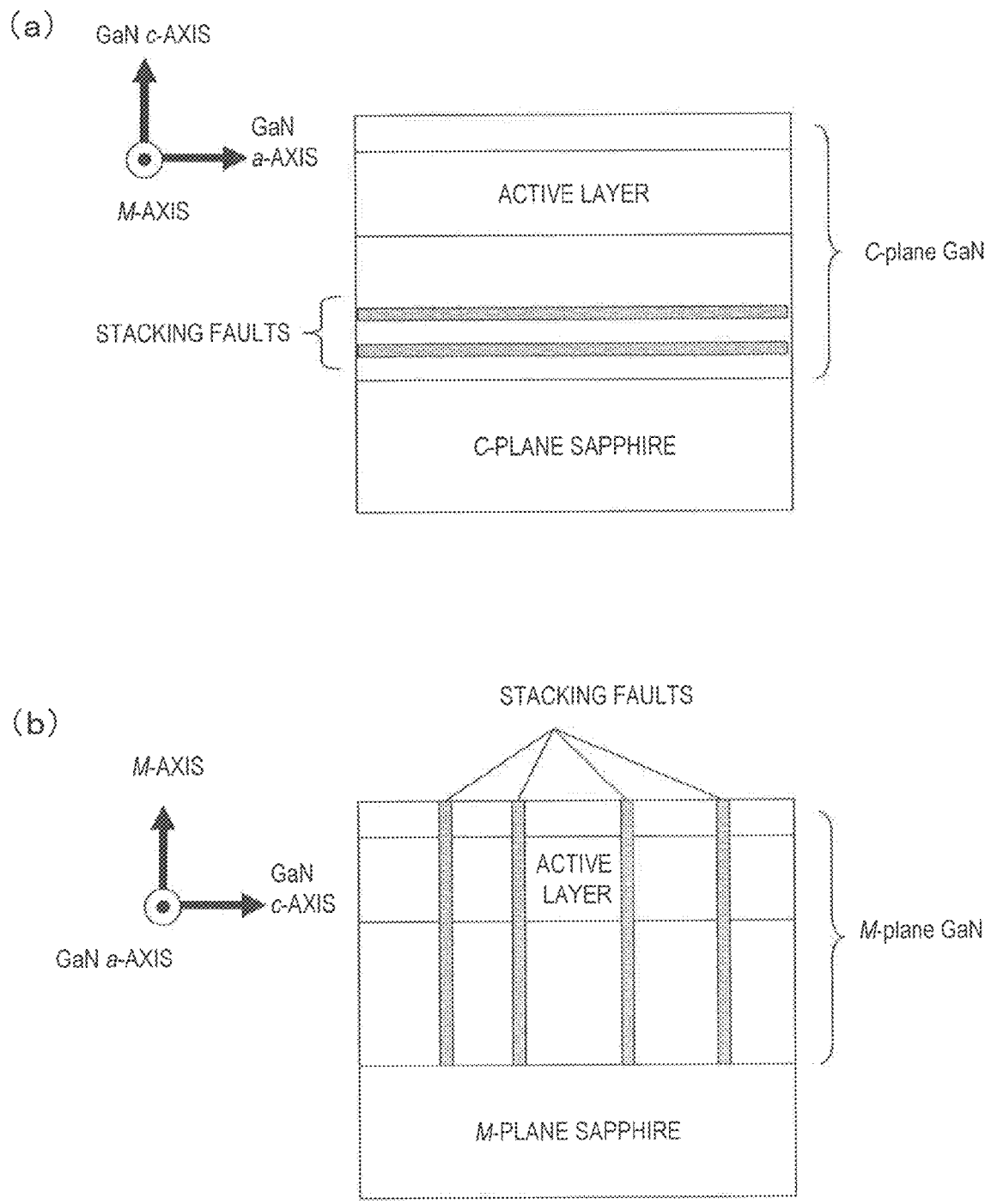
FIG. 17(a) is a diagram showing stacking faults in a c-plane GaN provided on a c-plane sapphire substrate.
FIG. 17(b) is a diagram showing stacking faults in an m-plane GaN provided on an m-plane sapphire substrate.

FIG. 17 shows a schematic diagram of stacking faults in a device structure. FIG. 17(*a*) is a schematic diagram of a common c-plane GaN of which principal surface is a polar plane. FIG. 17(*b*) is a schematic diagram of an m-plane GaN in the present embodiment. A stacking fault is usually formed along the c-plane (Such a stacking fault is commonly referred to as "Basal Stacking Fault (BSF)"). Therefore, in a conventional device structure of which principal surface is the c-plane such as an LED or the like, even if a stacking fault should occur, the probability that the fault reaches the active layer region is low, and the fault would not constitute a major cause of deterioration of the emission efficiency. On the other hand, in a non-polar plane structure and a semi-polar plane structure such as in the present embodiment, the c-plane is present in the lateral surface and the slope surface. Therefore, if a stacking fault occurs, this defect is also present in the active layer region and can be a cause of deterioration of the emission efficiency and variation of the emission wavelength.

Thus, in the non-polar plane semi-polar plane growth, it is necessary to reduce not only the dislocation density but also the stacking fault density.

The effect of reducing the stacking fault density greatly varies depending on the plane orientation of a facet at which selective growth occurs. As shown in FIG. 17, stacking faults mainly occur along the c-plane, and therefore, in the case where the in-plane mask tilt angle θ is 0° as shown in FIG. 15(*a*), even if there are stacking faults in the seed crystal, the stacking faults would not extend in lateral directions. On the other hand, in the case of θ=90° as shown in FIG. 15(*b*), the facet plane of the GaN is the a-plane, and therefore, stacking faults which are present in the c-plane extend in the a-axis direction with the progress of the lateral growth. Thus, the stacking faults are also present in a film obtained by the lateral growth. Hence, in order to reduce the stacking fault density by the epitaxial lateral overgrowth, it is desired that the normal line of the lateral growth facet plane is nearer to the c-axis. Thus, from the viewpoint of the stacking fault density reducing effect, the in-plane mask tilt angle θ is ideally closer to 0°.

On the other hand, from the viewpoint of the previously-described surface flatness, it is desired that the in-plane mask tilt angle is not less than 0°.

It was found that the previously-described stacking fault density can be reduced even when the in-plane mask tilt angle is greater than 0°. According to the examinations carried out by the present inventors, a desirable range of the in-plane mask tilt angle which enables reduction of the stacking fault density is from 0° to 10°. Further, so long as the in-plane mask tilt angle is within this range, the surface flatness can also be improved at the same time by appropriately selecting the mask pattern.

As for the above-described limitation on the in-plane mask tilt angle, the in-plane mask tilt angle does not need to be limited to the range of 0° to 10° when the stacking fault density in the m-plane nitride semiconductor film provided on the m-plane sapphire substrate that serves as the seed crystal is low (for example, not more than $10^3$ cm$^{-1}$) because it is not necessary to further reduce the stacking fault density. In this case, in the regrown film, it is only necessary to consider the surface flatness and prevention of the semi-polar abnormal growth, and therefore, the in-plane mask tilt angle may be controlled so as to be within a wide range from 0° to 35°.

Even when the in-plane mask tilt angle θ is in the range of 0° to 35°, some regrowth conditions for the nitride semiconductor (growth conditions, such as thickness), or some widths of the lines and spaces of the mask pattern, lead to failure of sufficient bonding of regrown films, resulting in a surface in which there are gaps. However, so long as the in-plane mask tilt angle is in this range, the semi-polar abnormal growth would not occur, and a regrown film of an m-plane nitride semiconductor which has high quality crystallinity is obtained.

As for the surface flatness, even when θ is 0°, a gapless surface can be obtained by, for example, decreasing the space width or increasing the growth duration. From the viewpoint of device application, gaps do not necessarily need to be removed. In the case where a device structure is designed on the assumption that there are gaps, it is only necessary to prevent the semi-polar plane abnormal growth. Therefore, the in-plane mask tilt angle may be appropriately selected from the range of 0° to 35°.

In the present embodiment, the maskless Pendeo epitaxial lateral overgrowth method has been mainly described. The same effects can also be achieved in a Pendeo growth method with a mask, in which the nitride semiconductor film 870 is formed with a dielectric mask of $SiO_2$, SiN, or the like, a metal mask which is made of Ti, Ni, Ta, Al, W, Mo, or the like, or a nitride metal mask, such as TiN or the like, remaining as the mask 820 of the raised-portion nitride semiconductor regions as shown in FIG. 3. In this case, in the mask 820 of FIG. 3, dislocations which are present in the nitride semiconductor layers 830 can be prevented from extending to a portion overlying the mask 820, so that there is a probability that the crystallinity can be improved.

The raised-portion nitride semiconductor layers 830 and nitride semiconductor films 870 grown over the m-plane sapphire substrate may be provided with n-type dopant or p-type dopant additives for conductivity control. Preferred examples of the n-type dopant include Si and Ge. Preferred examples of the p-type dopant include Be, Zn, and Mg.

In the present embodiment, as the mask used in manufacture of the unevenly-processed substrate 910, thin and elongated stripe-shaped structures which are periodically arranged have been mainly described, although the shape of the mask is not limited to this example. Masks of various shapes may be used. For example, mask shapes which have a polygonal shape, such as a quadrangular shape, or a circular shape, such as an elliptical shape, may be periodically arranged. Alternatively, the mask structure may be configured such that structures which are bent in a zigzag fashion are elongated along one direction in the plane and are periodically arranged in a direction orthogonal to the direction of the elongation, rather than a linear stripe-shaped mask. Each of these patterns does not necessarily need to be formed periodically. However, in the case of reducing not only the dislocation density but also the stacking fault density by the epitaxial lateral overgrowth as described above, it is desirable that the normal lines of the lateral surfaces which are provided in directions perpendicular to the extending direction of the raised-portion nitride semiconductor regions which are formed by the processes are closer to the c-axis direction of the nitride semiconductor. Since a desirable range of the in-plane mask tilt angle in which the stacking fault density reducing effect can be obtained is from 0° to 10°, a heterogeneous m-plane nitride semiconductor substrate 920 which has low dislocation density and low stacking fault density can be manufactured irrespective of the shape of the mask so long as etched lateral surfaces which satisfy such a condition are formed.

Pendeo growth is carried out using the m-plane nitride semiconductor film on the m-plane sapphire substrate as the seed crystal under the above-described conditions, whereby the heterogeneous m-plane nitride semiconductor substrate 920 in which the semi-polar plane abnormal growth which is a specific problem in the case of using an m-plane sapphire substrate is prevented, and which has excellent surface flatness and excellent crystallinity, can be obtained.

INVENTIVE EXAMPLE 1

Hereinafter, a method for manufacturing a high quality m-plane heterogeneous GaN substrate of the present disclosure is described based on a specific example.

However, embodiments of the present disclosure are not limited to examples which will be described below.

[Growth of an m-Plane Nitride Semiconductor on an m-Plane Sapphire Substrate that Serves as the Seed Crystal]

Firstly, a method for manufacturing an m-plane nitride semiconductor on an m-plane sapphire substrate that is used as the seed crystal of this example is described. This manufacturing method includes the following steps:
(1) Surface treatment on the m-plane sapphire substrate;
(2) Thermal cleaning on the m-plane sapphire substrate;
(3) Trimethyl aluminum (TMA) source material irradiation on the m-plane sapphire substrate and low temperature $Al_xGa_yIn_zN$ (0≤x, y, z≤1, x+y+z=1) buffer layer growth; and
(4) Growth of an m-plane GaN film.

Hereinafter, the respective steps will be described.

[Step (1): Surface Treatment on the m-Plane Sapphire Substrate]

In this example, the thickness of the m-plane sapphire substrate was 430 μm, the diameter was 2 inches, and the angle between the normal line of the principal surface of the m-plane sapphire substrate and the normal line of the m-plane was 0°+0.1°. Washing of the substrate before growth was carried out through the following procedure. The substrate was washed with an organic solvent. Thereafter, the substrate was washed in a solution containing sulfuric acid and phosphoric acid which were mixed in the ratio of 1:1 at 130° C. for 15 minutes, and rinsed with pure water. Even when this substrate washing process is omitted, it did not largely affect the crystallinity or the surface flatness of the m-plane GaN which will be described later.

[Step (2): Thermal Cleaning of the m-Plane Sapphire Substrate]

In this example, a MOCVD (metal organic chemical vapor deposition) method was used for the growth of the m-plane nitride semiconductor. The carrier gas used was a mixture gas of $H_2$ and $N_2$.

The m-plane sapphire substrate was carried into a MOCVD apparatus, and thereafter, the temperature was increased for thermal cleaning. The thermal cleaning temperature was 1000-1200° C., and the duration was 10-60 minutes.

[Step (3): TMA Irradiation on the m-Plane Sapphire Substrate and Growth of a Buffer Layer]

After the thermal cleaning was finished, the substrate temperature was decreased to 400-800° C., and then, the substrate was irradiated with TMA. Thereafter, a buffer layer was grown at a temperature continuously maintained at the same level.

The TMA irradiation duration was 2-30 seconds. Thereafter, the substrate was irradiated with $NH_3$ as the nitrogen source so as to grow a buffer layer at the same temperature. The buffer layer used herein was an AlN layer. The growth conditions were such that the V/III ratio was not less than 10 and not more than 5000, and the thickness was in the range of 20 nm to 500 nm.

[Step (4): Growth of m-Plane GaN Film]

After the buffer layer was grown, the substrate temperature was increased to a temperature in the range of 900° C. to 1100° C. with the substrate being irradiated with $NH_3$, and then, the procedure waited for the temperature stability for 1-5 minutes before growth of a GaN film. In this example, a 1-3 μm thick GaN film was grown under the conditions that the substrate temperature was 950° C., the flow rate of trimethyl gallium that was the Ga source material was 40 sccm, the flow rate of $NH_3$ was 500 sccm, and the pressure was 13 kPa.

Figure 18:
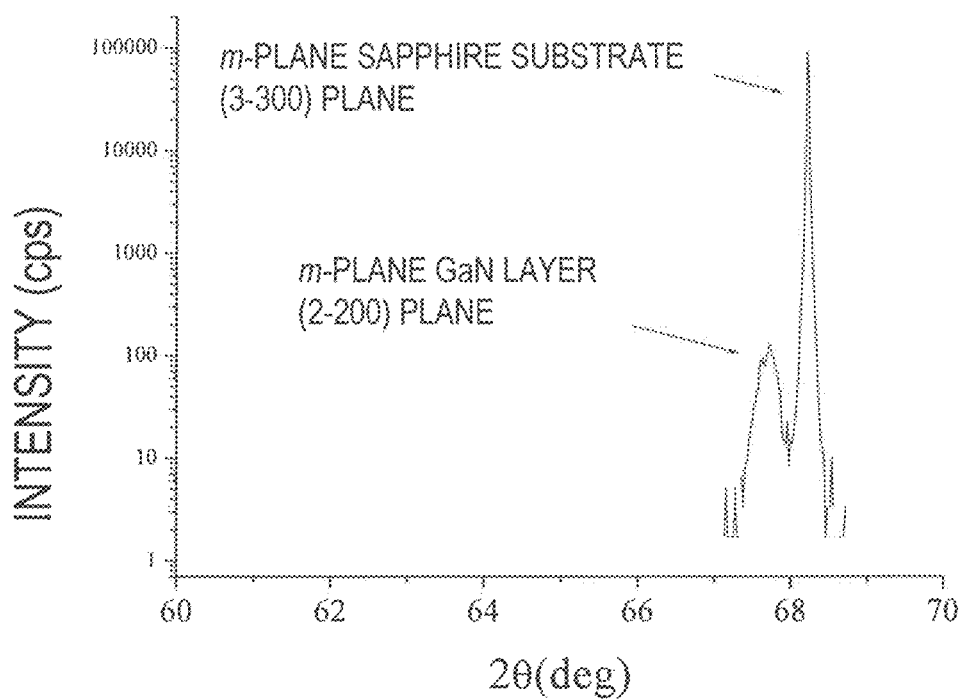
FIG. 18 is a graph showing the result of an X-ray 2θ-ω measurement carried out on a seed crystal m-plane nitride semiconductor film 812 grown on an m-plane sapphire substrate.

The plane orientation of the grown GaN film can be confirmed by X-ray diffraction measurement. FIG. 18 is the 2θ-ω measurement result of an m-plane GaN seed crystal on an m-plane sapphire substrate prepared in this example. In this measurement, the incoming X-ray was parallel to the a-axis direction of the m-plane GaN.

In FIG. 18, the peak at 2θ=68.7° is the peak of the m-plane sapphire substrate, which is the diffraction peak of the (3-300) plane. On the lower angle side of this peak, there is a diffraction peak from the (2-200) plane of the m-plane GaN, which was observed near 2θ=67.9°. In the m-plane GaN film on the m-plane sapphire substrate prepared in this example, no peak from other semi-polar plane GaN films was observed.

In the case of film formation under growth conditions which were greatly deviated from those of this example, peaks from the semi-polar plane GaN such as shown in FIGS. 19(a) and 19(b) were observed. FIG. 19(a) is the 2θ-ω measurement result of a semi-polar plane GaN which has the (10-1-3) plane. The diffraction peak of the (10-1-3) plane was observed near 2θ=63.5°. FIG. 19(b) is the 2θ-ω measurement result of a semi-polar plane GaN which has the (11-22) plane. The diffraction peak of the (11-22) plane was observed near 2θ=69.2°.

It has been described that, by appropriately selecting the growth conditions for the GaN film on the m-plane sapphire substrate as described above, crystal growth of only a nitride semiconductor of which principal surface is the m-plane (i.e., no coexistence of a semi-polar plane crystal) can be realized. However, the crystallinity of the thus-obtained m-plane nitride semiconductor is generally low.

Figure 20:
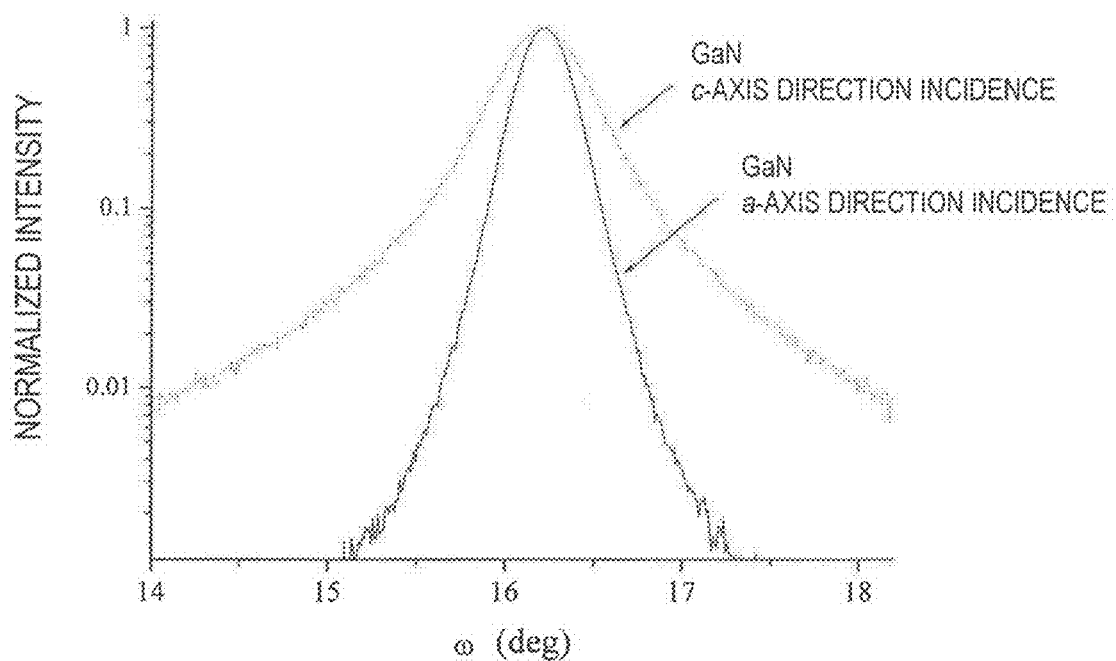
FIG. 20 is a graph showing the result of an X-ray rocking curve measurement carried out on a seed crystal m-plane nitride semiconductor film 812 grown on an m-plane sapphire substrate.

FIG. 20 shows an example of the (1-100) plane X-ray ω rocking curve (XRC) measurement result of an m-plane GaN film on an m-plane sapphire substrate which was obtained by the above-described growth method. The solid line and the dotted line represent the XRC measurement results in the case where the incoming X-rays were respectively parallel to the a-axis and c-axis directions of the GaN. The crystal quality and the density of dislocations and defects can be estimated from the half-value widths of the XRC. For example, in a conventional c-plane GaN on a c-plane sapphire substrate, the half-value width of the symmetrical plane (0002) plane that is the principal surface is generally about several hundreds of seconds. However, the (1-100) plane XRC full width at half maximum of the m-plane GaN obtained in this example was about 1000 seconds, which was a very large value, when the incoming X-ray came along the a-axis direction of the GaN. This means that the crystal quality of the m-plane GaN film obtained in this example is worse than that of the conventional c-plane GaN film, and the m-plane GaN film has a very high dislocation density. The dislocation density estimated by a transmission electron microscope is on the order of about $10^{10}$ cm$^{-2}$, which is higher than that of the conventional nitride semiconductor film on the c-plane sapphire by one or more orders of magnitude, considering that the dislocation density of the conventional nitride semiconductor film on the c-plane sapphire is $10^8$ to $10^9$ cm$^{-2}$ or smaller.

The XRC full width at half maximum obtained when the incoming X-ray came along the c-axis direction of the m-plane GaN film was worse than the above, which was about 2000 seconds. A heterogeneous m-plane GaN film which was thus obtained in the present embodiment exhibited a result such that the XRC full width at half maximum greatly varied when the X-ray incidence direction in the plane was changed. This means that the crystallinity of the heterogeneous m-plane GaN film has asymmetry in the plane. Occurrence of such asymmetry is attributed to stacking faults, which are plane defects, in the heterogeneous m-plane GaN film.

That is, in heterogeneous growth of an m-plane nitride semiconductor on an m-plane sapphire substrate according to the present embodiment, there are dislocations at high density due to a large degree of lattice mismatch with the sapphire substrate. In addition, as can be confirmed from asymmetry of the XRC, there are stacking faults. Thus, to improve the crystal quality of the m-plane GaN formed by heterogeneous growth and improve the device characteristics, it is necessary to reduce both the density of the dislocations and the density of the stacking faults, which is not the case with the conventional heterogeneous growth of the c-plane GaN.

In this example, the m-plane GaN film on this m-plane sapphire substrate is used as the seed crystal in order to manufacture a high quality regrown m-plane nitride semiconductor substrate which has reduced dislocation density and reduced stacking fault density according to a epitaxial lateral overgrowth method which will be described below.

[Manufacture of Unevenly-Processed Substrate 910]

In this example, a method for manufacturing the unevenly-processed substrate 910 for maskless Pendeo growth shown in FIG. 4 is described. Firstly, an m-plane nitride semiconductor film grown on an m-plane sapphire substrate was prepared through the previously-described growth procedure, and a mask pattern was formed by a common photolithography technique (FIG. 4(a)). As the mask pattern, a typical line & space (L&S) pattern, i.e., a pattern of thin and elongated stripes, was used. In the L&S pattern used in this example, the width of the line portions of the mask 820 was L=5 μm, and the width of the space portions 840 was S=10 μm. The thickness of the resist after the photolithography step was finished was about 2-3 μm. In this example, the in-plane mask tilt angle θ was 0°.

Then, part of the nitride semiconductor film 812 for seed crystal was removed from the space portions 840 using an inductively coupled plasma etching (ICP etching) apparatus such that m-plane sapphire substrate surface portions were exposed, whereby ridge-shaped nitride semiconductor layers 830 and recessed portions 850 were formed. In forming the recessed portions 850 by etching, part of the sapphire substrate 811 was also etched away such that part of the nitride semiconductor film 812 for seed crystal would not remain.

The etching was carried out such that part of the GaN layer which was present in the regions of the space portions 840 was entirely removed, and the m-plane sapphire substrate surface was exposed, whereby the recessed portions 850 were formed. Thereafter, the resist mask remaining on the surface was removed, whereby the unevenly-processed substrate 910 shown in FIG. 4(b) was completed.

Examples of the unevenly-processed substrate 910 of the present embodiment are shown in FIGS. 21(a) and 21(b). FIGS. 21(a) and 21(b) are scanning electron microscopic images (SEM images) obtained after raised portion GaN films and recessed portions 850 in which the sapphire surface was exposed by etching were formed using a stripe-shaped L&S pattern mask. Here, a cross-sectional view taken along the extending direction of the raised portion GaN (left) and a bird's-eye view (right) are shown. The shape of the ridge-shaped nitride semiconductor layers 830 can be controlled by appropriately selecting the mask formation conditions or etching conditions. As shown in FIG. 21, the cross-sectional shape of the ridge-shaped nitride semiconductor layers 830 can be controlled so as to be (a) trapezoidal or (b) triangular. In this example, a GaN film of which cross-sectional shape was trapezoidal was used as the ridge-shaped nitride semiconductor layers 830. Also, as shown in FIGS. 21(a) and 21(b), in this example, in the recessed portions 850, the sapphire substrate was also partially etched away, and the depth was about 250 nm.

When the in-plane mask tilt angle is 0° or an angle near 0° as in this example, the opposite lateral surfaces of the ridge-shaped nitride semiconductor layer 830 are GaN facets of the +c plane and the −c plane (or planes inclined with respect to ±c planes). In general, the +c plane and the −c plane have different etching tolerances and therefore have different etching speeds. Thus, normally, when etching is carried out with the in-plane mask tilt angle being near 0°, the cross-sectional shape can be asymmetry in some cases.

In this example, cross sections with relatively good symmetry was successfully obtained as shown in FIGS. 21(a) and 21(b) by appropriately selecting the previously-described ICP dry etching conditions. However, in the present embodiment, the regrowth starts from the raised-portion nitride semiconductor layers 830, and therefore, it is inferred that the effect of asymmetry of the shapes of the stripe-shaped opposite lateral surfaces on the regrown film is small. Thus, the opposite lateral surfaces formed in the raised portion nitride semiconductor layer do not necessarily need to have symmetrical tilt angles.

In this example, the thickness of the raised-portion nitride semiconductor layers 830 is about 1-3 μm, although this thickness may be appropriately selected. The epitaxial lateral overgrowth of the m-plane nitride semiconductor of the present disclosure can be realized so long as the seed crystal portions of the same m-plane nitride semiconductor from which m-plane nitride semiconductor regrowth starts and the recessed portions 850 from which the nitride semiconductor film portions are removed such that the m-plane sapphire substrate is exposed are formed. As described above, the TMA irradiation on the m-plane sapphire substrate and the buffer layer are processes which are necessary for obtaining a nitride semiconductor film of which principal surface is the m-plane (i.e., for preventing the semi-polar plane growth) and are therefore indispensable steps in this example. Thus, in one embodiment, the raised-portion nitride semiconductor layers 830 may be formed by only the previously-described buffer layer.

However, as shown in FIG. 4, the crystal quality of the m-plane nitride semiconductor film 870 of this example which is obtained by lateral selective regrowth largely depends on the crystal quality of the ridge-shaped nitride semiconductor layers 830 that serve as the seed crystal. In the case where the previously-described raised-portion nitride semiconductor layers 830 are formed by only the buffer layer, it is difficult to obtain a high quality regrown nitride semiconductor film. In view of such, in this example, the nitride semiconductor film 812 for seed crystal, of which growing plane was the m-plane, was formed on the buffer layer, and this layer was processed to obtain the raised-portion nitride semiconductor layers 830. In general, as the thickness of the raised-portion nitride semiconductor layers 830 increases, the crystallinity is more likely to improve, and it is more advantageous in improving the quality of the nitride semiconductor film 870. However, disadvantageously, the cost increases due to increase of the seed crystal growth duration, increase of the etching step duration, etc. In this example, the thickness of the nitride semiconductor film 812 for seed crystal was 1-3 μm in consideration of a trade-off between the crystallinity of the seed crystal and the growth duration.

[Regrowth of the Nitride Semiconductor Film 870 on the Unevenly-Processed Substrate 910]

Then, regrowth of an m-plane nitride semiconductor film 870 was carried out on the unevenly-processed substrate 910.

The unevenly-processed substrate 910 was carried into a MOCVD apparatus, and thereafter, the temperature was increased to the regrowth temperature. The carrier gas used was a mixture gas of $H_2$ and $N_2$. In this example, a $NH_3$ gas was supplied in the middle of the increase of the temperature. This is for the purpose of preventing thermal decomposition of the raised-portion nitride semiconductor layers 830. At the timing when the substrate temperature reached 500° C., 0.5 slm $NH_3$ gas was supplied into the growth furnace, and the supply was configured till the regrowth temperature was reached, and then, regrowth of the GaN film was continued. In this example, the growth temperature was 950° C.

The other growth conditions for the nitride semiconductor film 870 were set as follows: the V/III ratio=160, the growth pressure 13.3 kPa, the growth speed about 4 μm/hour. The growth conditions for the nitride semiconductor film 870 are not limited to these conditions but may be appropriately selected. However, to obtain a flat film by allowing nitride semiconductor films 870 regrown from the respective raised-portion nitride semiconductor regions to bond with each other as shown in FIG. 4(d), it is desired that the regrowth is carried out under the conditions of suitable growth temperature, V/III ratio, and growth pressure. The regrowth conditions for the m-plane nitride semiconductor film may be such that the growth temperature is 850-1100° C., the V/III ratio is 50-2000, and the growth pressure is 1-100 kPa. More specifically, the conditions may be such that the growth temperature is 950-1100° C., the V/III ratio is 50-200, and the growth pressure is 1-30 kPa.

FIG. 22 shows a microscopic image of a surface of a sample after the regrowth. In this example, the in-plane mask tilt angle θ=0°, and therefore, the extending direction of the stripes is parallel to the a-axis direction of the GaN.

It can be seen that, since the growth conditions used enhanced the previously-described lateral growth, the uneven shape shown in FIG. 21 was not seen, the unevenness was filled by the regrowth, and a relatively flat m-plane GaN regrown film was realized. On the other hand, some pits can be seen along the extending direction of the stripe-shaped uneven structures. These correspond to the connecting portion 890 of FIG. 4(d). Due to these pits, the surface roughness increases, and the surface rms (root mean square) roughness of the sample of FIG. 22 was about 133 nm.

As shown in FIG. 15(a), in the case of the in-plane mask tilt angle θ=0°, the lateral surface facet which serves as a starting point of the lateral growth has the c-axis direction component in the GaN. As previously described, the c-plane facet has a slow growth speed and a short migration length as compared with the a-plane facet, and the surface flatness improving effect is small as compared with the a-plane facet. Thus, by increasing the in-plane mask tilt angle so as to incline this lateral surface facet in the a-axis direction, the migration effect is enhanced, and generation of pits can be prevented. The in-plane mask tilt angle dependence will be described later in Inventive Example 2.

In this example, the space interval is 10 μm. However, by shortening this space interval, a flat regrown film surface which does not have pits or gaps can be obtained even when the in-plane mask tilt angle is 0°. For example, it was confirmed from the experimental results that, when the space interval is 7 μm, the pits that are seen in FIG. 22 would not occur, and a flat regrown nitride semiconductor surface can be obtained. That is, by narrowing the interval of the raised-portion nitride semiconductor regions, the problem of short migration length can be overcome, and the surface flatness can also be improved.

However, high-quality low-dislocation/defect density regions obtained by the maskless Pendeo epitaxial lateral overgrowth of this example are the regions of the recessed portions 850. In regrown films which are regrown on the raised-portion nitride semiconductor layers 830 that are the seed crystals, dislocations and defects that are present in the seed crystals remain as they are, so that the effect of improving the crystallinity of these ridge-shaped nitride semiconductor layers 830 is low. Therefore, from the viewpoint of improving the characteristics of the device structure that is to be formed on this film, optimizing the width of the recessed portions 850 such that, at the surface of the nitride semiconductor film 870, the dislocation density and the stacking fault density can be reduced and higher crystal quality can be obtained is important.

For example, the method for improving the crystallinity of the nitride semiconductor film 870 may be decreasing the width of the raised-portion nitride semiconductor layers 830, i.e., L of the L&S pattern. This width of L may be suitably selected in the present embodiment. The range of the width may be from 1 nm to 100 μm or may be from 1 nm to 10 μm.

To reduce pits and gaps so as to obtain a flatter regrown surface, the regrowth duration may be increased in addition to shortening the S (space) interval of the L&S pattern, such that a regrown film can be deposited till pits and gaps are filled up.

Figure 23:
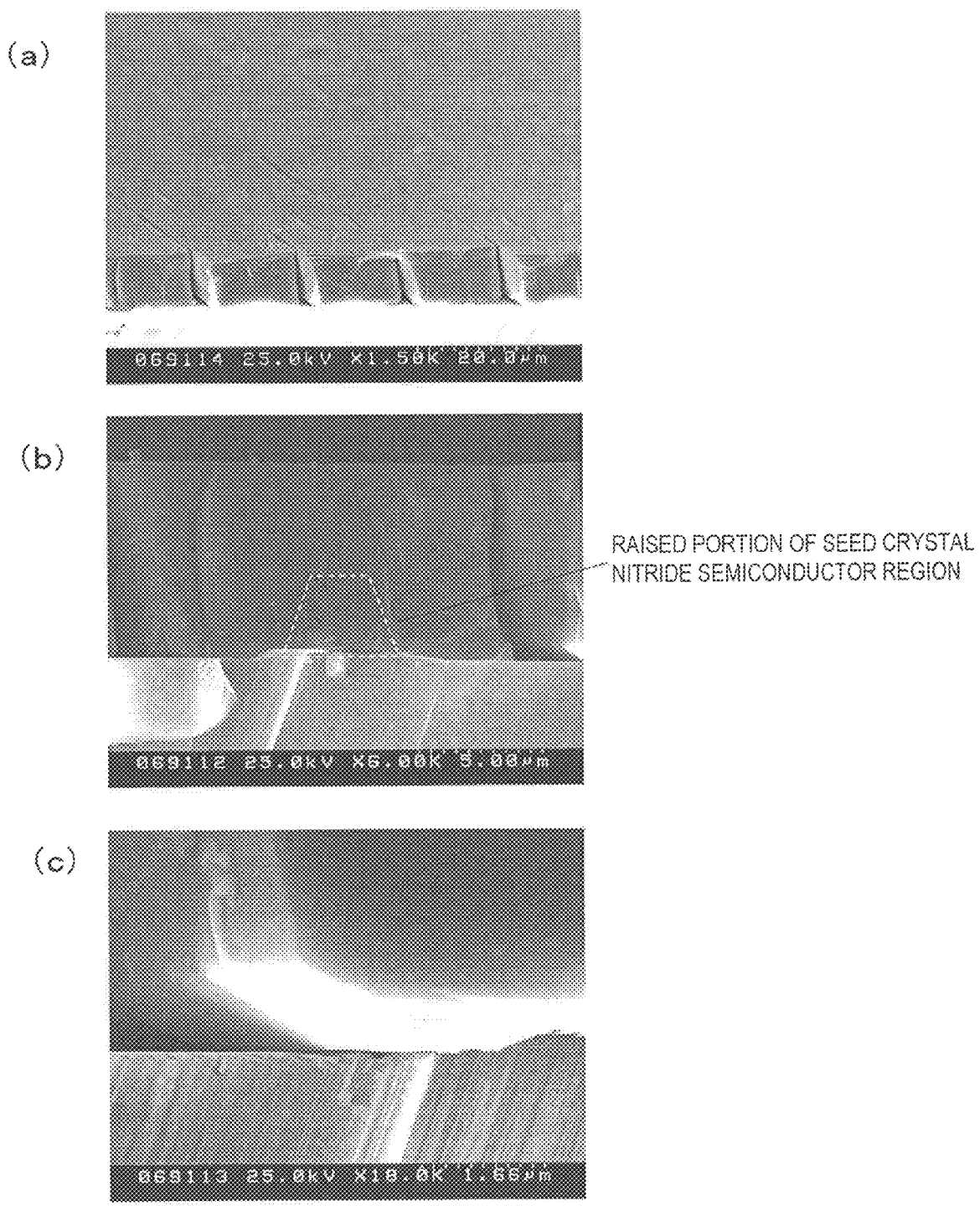
FIGS. 23(a) to 23(c) show SEM images of a heterogeneous m-plane GaN substrate (heterogeneous m-plane nitride semiconductor substrate 920) after regrowth.

FIGS. 23(a), 23(b), and 23(c) show SEM images of a regrown GaN film (heterogeneous m-plane nitride semiconductor substrate 920) obtained in Inventive Example 1. FIG. 23(a) is a bird's-eye view. FIG. 23(b) is a cross-sectional view of the nitride semiconductor film 870 regrown from the raised-portion nitride semiconductor layer 830. FIG. 23(c) is a cross-sectional SEM image in the vicinity of an exposed sapphire substrate surface of the recessed portion 850. The thickness of the regrown nitride semiconductor film was about 8 μm. It can be appreciated from the cross-sectional SEM image that regrowth occurred from the raised-portion nitride semiconductor layers 830 that were the seed crystals, and films regrown from adjacent raised portions bonded with each other so that a flat surface was finally formed.

In FIG. 23(c), regrowth of a nitride semiconductor from the exposed sapphire surface of the recessed portions 850 is not found. It can be appreciated that a source material arriving at the uneven substrate surface underwent migration, without being adsorbed by the sapphire surface of the recessed portions 850, and reached the raised-portion nitride semiconductor regions, so that regrowth preferentially occurred only from this nitride semiconductor film. That is, it can be appreciated that the source material is unlikely to be adsorbed by the m-plane sapphire surface, and epitaxial growth of the arriving source material is unlikely to occur at the m-plane sapphire surface.

In this example, a mask with a space width of 10 μm was used. It was also confirmed that, in an unevenly-processed substrate with a space width of 30-250 μm, by optimizing the growth conditions, the source material is preferentially supplied to the seed crystal portions, rather than the exposed sapphire substrate surface of the recessed portions 850, so that epitaxial lateral overgrowth occurs. Thus, it was found that the source material supplied in the regrowth is unlikely to be adsorbed by the sapphire surface and reaches the seed crystal portions to contribute to growth of the nitride semiconductor film. Details of the examinations on the space width will be described in detail in the section of Inventive Example 5.

In this example, the height of the lateral surfaces 852 of the sapphire substrate was about 250 nm, but even with such a relatively small etching depth, regrowth from the sapphire surface which has the m-plane would not occur, so that epitaxial lateral overgrowth can be realized. This is attributed to the previously-described features. The dependence of the height of the lateral surfaces 852 of the sapphire substrate 811 (etching depth) will be described later in detail in the section of Inventive Example 3.

An X-ray 2θ-ω measurement was carried out on this sample. Only the (2-200) peak from the GaN layer regrown on the unevenly-processed substrate 910 and the (3-300) peak from the m-plane sapphire substrate were observed as in the result of FIG. 18, and peaks which are attributed to the semi-polar planes ((10-1-3) plane and (11-22) plane) were not observed. That is, in a GaN film which was regrown using the unevenly-processed substrate 910 that was manufactured under the conditions of Inventive Example 1, only diffraction peaks which are attributed to the m-plane were observed. It was found that the semi-polar plane abnormal growth did not occur.

The results of the (1-100) plane X-ray ω rocking curve (XRC) half-value width of the regrown m-plane GaN film obtained in this example are shown in Table 1. Here, the incoming X-ray was parallel to the a-axis and c-axis directions of the GaN. For the sake of comparison, the values of the half-value width of the m-plane GaN film used as the seed crystal are shown together in the same table. The half-value width of the m-plane GaN film that was grown on the m-plane sapphire substrate as described above is a high value which is not less than 1000 seconds. When the X-rays are incident in the a-axis and c-axis directions of the GaN, the XRC full width at half maximum in the case of incidence in the c-axis direction of the GaN is about twice as large as that in the case of incidence in the a-axis direction. This is because, as previously described, information of stacking faults is reflected in when the X-ray is incident in the c-axis direction. That is, it can be seen that the m-plane GaN film that is the seed crystal of this example is a crystal which has asymmetry in the XRC measurement results for the X-ray incidence in the a-axis and c-axis directions and which includes many stacking faults.

TABLE 1

|  | GaN a-axis direction incidence | GaN c-axis direction incidence |
|---|---|---|
| Seed crystal m-plane GaN | 1326 seconds | 2325 seconds |
| Regrown m-plane GaN | 537 seconds | 639 seconds |

On the other hand, when the m-plane GaN film was regrown after the unevenly-processed substrate 910 was formed using the same m-plane GaN as the seed crystal, the XRC full width at half maximums in the a-axis and c-axis directions decreased to 537 seconds and 639 seconds, respectively. The value obtained when the X-ray was incident in the a-axis direction of the GaN decreased to about a half. This means that the dislocation density was greatly reduced by regrowth. The values of the half-value width of the regrown film for the a-axis and c-axis incidence are similar to the results of the seed crystal, and the symmetry improved. This means that, in the regrown m-plane GaN film of this example, not only the dislocation density but also the stacking fault density decreased.

One of the reasons of the decrease of the stacking fault density is that, in this example, the stripe-shaped L&S pattern was formed in the a-axis direction of the GaN (mask tilt angle 0°). Since stacking faults are present in the c-plane of the nitride semiconductor film as shown in FIG. 17, in order to effectively reduce the stacking fault density, it is preferred that lateral surfaces are formed in the c-axis direction of the nitride semiconductor, and epitaxial lateral overgrowth is caused from the lateral surfaces.

The thicknesses of the two samples of Table 1 are different by a factor of about four, the thickness of the regrown film being greater than that of the seed crystal film. That is, it can be inferred that the results of Table 1 were attributed to the difference in thickness. However, according to the results of the examinations carried out by the present inventors, when only the thickness was increased to about 8 µm in the growth of the seed crystal m-plane GaN, for example, no extensive improvement was achieved in the XRC full width at half maximum, and the values obtained when X-rays were incident in the a-axis and c-axis directions of the GaN only improved to about 1100 seconds and 1900 seconds, respectively. That is, it can be appreciated that the results of Table 1 show the improving effect which was obviously obtained by the lateral selective regrowth.

In this Inventive Example 1, the results of the regrown m-plane nitride semiconductor film on the unevenly-processed substrate in which the cross-sectional shape of the raised-portion nitride semiconductor regions has a triangular structure as shown in FIG. 21(b) are shown, although also in the case where the raised portion nitride semiconductor which has the trapezoidal structure shown in FIG. 21(a) was used as the seed crystal, the effect of reducing the dislocation density and the stacking fault density was similarly achieved. That is, the crystallinity of the regrown nitride semiconductor film 870 is greatly affected by the crystallinity of the raised-portion nitride semiconductor layers 830 that are the seed crystals, and therefore, it is inferred that the dependence on the shape of the raised-portion nitride semiconductor regions is small. Thus, the cross-sectional shape of the extending direction of the raised-portion nitride semiconductor layers 830 that have a shape of thin and elongated stripes may be appropriately selected. It may have a polygonal structure, such as a quadrangular (rectangular), trapezoidal, or triangular structure, or may have a cross-sectional structure which includes a curve.

INVENTIVE EXAMPLE 2

[In-Plane Mask Tilt Angle Dependence of the m-Plane Nitride Semiconductor Maskless Pendeo Growth]

In Inventive Example 1, the method of preparing the unevenly-processed substrate 910 such that the in-plane mask tilt angle is 0°, i.e., the extending direction of the stripe-shaped mask is parallel to the a-axis direction of the m-plane nitride semiconductor, and carrying out the epitaxial lateral overgrowth thereon, and the characteristics of that film have been described. By performing the process in such a way, the normal lines of the opposite lateral surfaces of the stripe-shaped raised-portion nitride semiconductor layers 830 have ±c axis direction components of the nitride semiconductor. Since those lateral surfaces were employed as starting points of the lateral growth, not only the dislocation density but also the stacking fault density were reduced. However, on the other hand, when the in-plane mask tilt angle θ was 0°, the migration length was not sufficient, and many pits were found in the surface. The flatness of the surface was insufficient under the conditions of Inventive Example 1.

In view of the above circumstances, in this Inventive Example 2, for the purpose of improving the surface flatness, an experiment was carried out with the in-plane mask tilt angle of raised-portion nitride semiconductor regions which were formed by stripe-shaped mask processing being varied from 0° to 90° with intervals of 1° at the minimum.

In this Inventive Example 2, washing of the m-plane sapphire substrate, the growing step of the nitride semiconductor film 812 for seed crystal, and the fabrication step of the unevenly-processed substrate 910 were carried out under basically the same conditions as those in the steps explained in Inventive Example 1 except that the in-plane tilt angle of the stripe-shaped mask was varied in the range of 0° to 90°. Thus, description of the details of the steps is herein omitted.

Samples of the unevenly-processed substrate 910 were prepared such that the extending direction of elongated raised-portion nitride semiconductor regions in the shape of stripes had different tilt angles in the m-plane that is the principal surface. Regrowth of m-plane nitride semiconductor films was carried out under generally the same conditions as those of Inventive Example 1.

Figure 24:
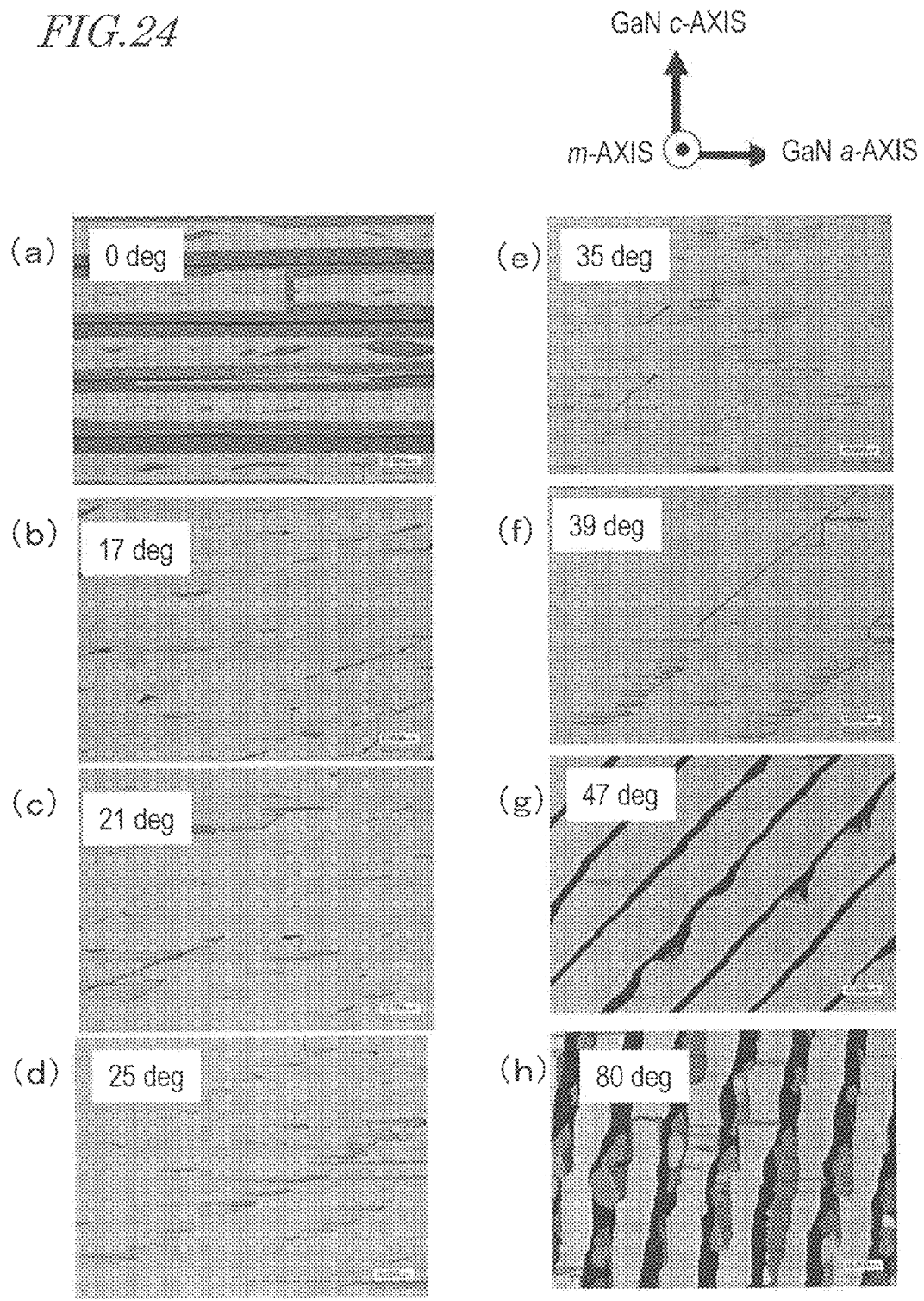
FIGS. 24(a) to 24(h) show the in-plane mask tilt angle dependence of the surface morphology.

FIG. 24 shows examples of the surface morphology of the GaN substrates (heterogeneous m-plane nitride semiconductor substrates 920) after the Pendeo regrowth with varying in-plane mask tilt angles, which were obtained by a laser microscope. It can be seen that the surface flatness greatly varied depending on the in-plane mask tilt angle. In this Inventive Example 2, even when the in-plane mask tilt angle was 0°, gaps were produced, so that the surface roughness was worse than that of Inventive Example 1. In this Inventive Example 2, in order to check the difference in surface flatness and migration effect, the inventors dared to adjust the growth temperature of the regrown nitride semiconductor film so as to be lower than the condition of Inventive Example 1 by 30° C., such that recessed portions 850 were produced even when the in-plane mask tilt angle was 0°. It is inferred that decreasing the other conditions than the growth temperature, such as the growth pressure and the V/III ratio, enhances the migration length and hence improves the surface flatness.

When the in-plane mask tilt angle θ increased to 17°, the gaps which were found in the case of 0° were filled so that the surface flatness greatly improved. This is probably because, as previously described, the lateral growth in the c-axis direction of the GaN shifted to the lateral growth in the a-axis direction so that the angle θ increased, and as a result, the migration length increased, and the surface flatness improved.

On the other hand, when the in-plane mask tilt angle θ was near 35°, the surface flatness started to deteriorate. Some unconnected regions are seen in the plane, and when θ exceeded 40°, this tendency was conspicuously observed.

Figure 25:
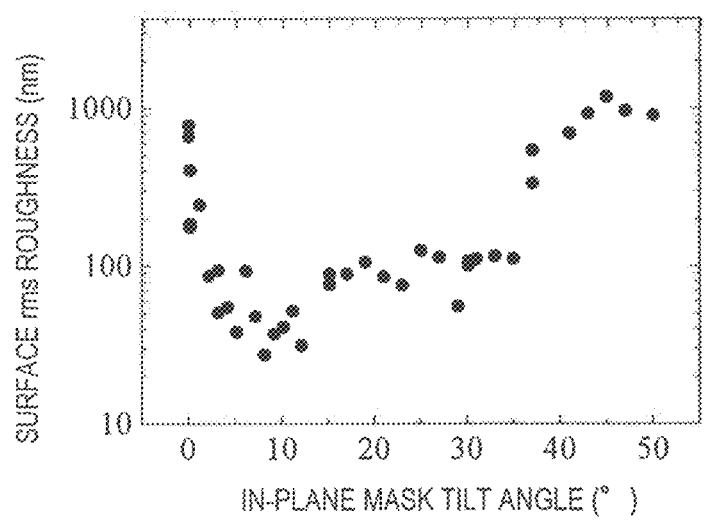
FIG. 25 is a graph showing the in-plane mask tilt angle dependence of the surface rms roughness of a heterogeneous m-plane GaN substrate (the heterogeneous m-plane nitride semiconductor substrate 920) after regrowth.

FIG. 25 shows the relationship between the tilt angle and the surface roughness. This graph shows the surface rms roughness estimated from the laser microscopic images of FIG. 24 and the in-plane mask tilt angle. The surface flatness improved as the in-plane mask tilt angle θ increased from 0° and exhibited the best values near the range of 5° to 35°, but the surface roughness increased when 35° was exceeded. The variation of the surface flatness in a low angle range was attributed to the difference in plane orientation of the facet plane that served as the starting point of the lateral growth and the difference in migration length. On the other hand, it is inferred that the variation in the range of not less than 35° was attributed to different causes. According to the examinations carried out by the present inventors, it was found that this variation has a relation with the semi-polar plane abnormal growth.

As seen from the surface morphologies of FIG. 24 for the cases where the in-plane mask tilt angles were (g) 47° and (h) 80°, there are protrusions that grew between the gaps of which crystal planes were apparently different from the m-plane. The number of such protrusions increased as the angle shifted to the higher angle side. Particularly in the sample of θ=80°, a large number of such protrusions were found.

Figure 26:
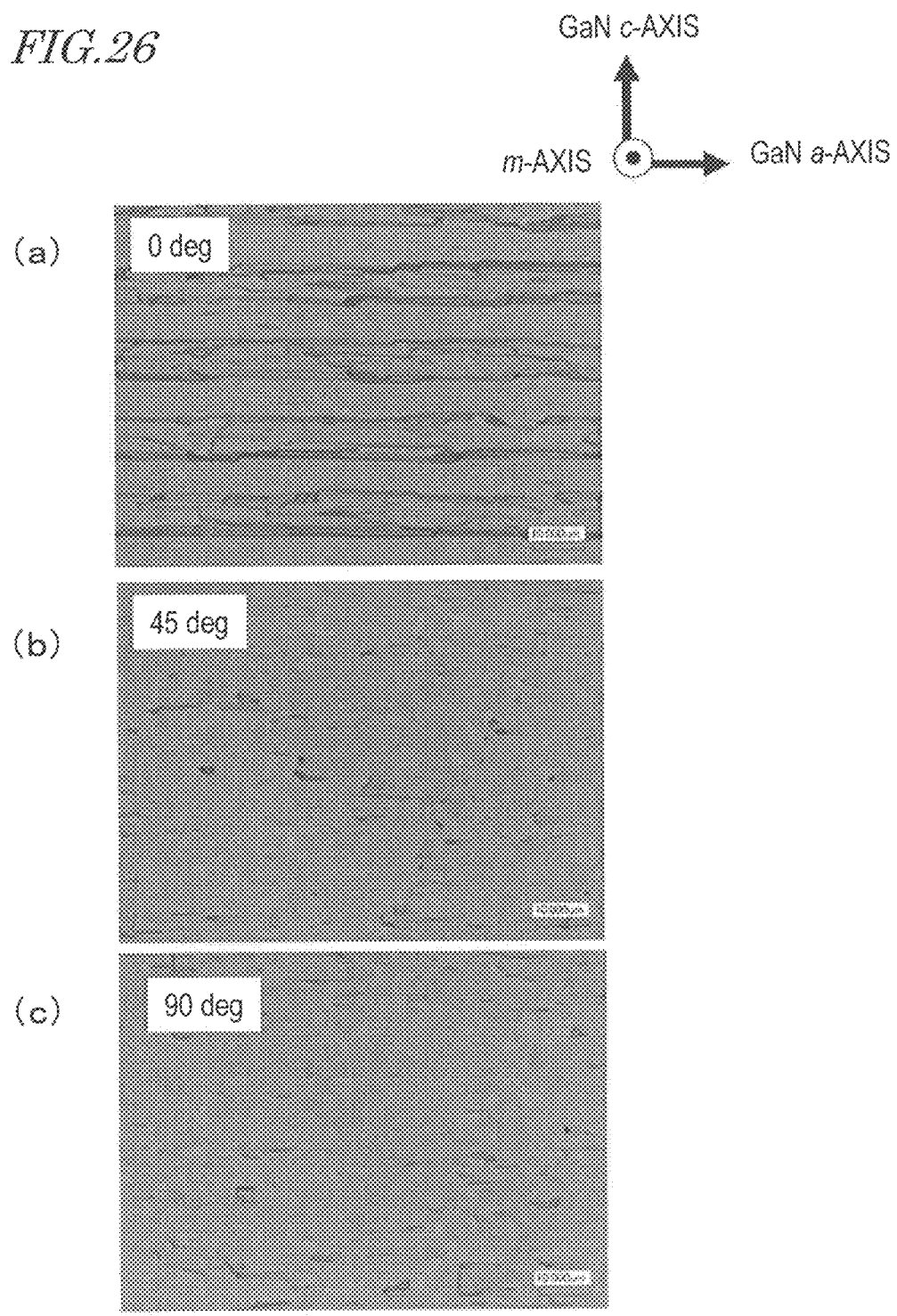
FIGS. 26(a) to 26(c) show the surface morphology in the case where regrowth is carried out on an unevenly-processed substrate which is formed of only a GaN layer.

FIG. 26 shows the results of the cases where regrowth was carried out on uneven substrates which were made of only GaN for the sake of comparison. In these samples, the etching of the space portions 840 was ended in the middle of the nitride semiconductor film 812 for seed crystal, rather than carrying out the etching till the m-plane sapphire substrate was exposed. Therefore, the effect of the sapphire substrate was avoided, so that the dependence on the in-plane mask tilt angle of the uneven substrates that were made of only GaN was examined. In the drawing, the in-plane mask tilt angles were varying angles of 0°, 45°, and 90°. In the case of 0°, the uneven shape was remaining after the regrowth. This was attributed to the short migration length in the c-axis direction of the GaN. On the other hand, it can be seen that, when the angle was 45° or 90°, the uneven shape was filled so that flatness was achieved. The differences from FIG. 24 are obvious. It can be seen that, as in this example, deterioration of the surface flatness and generation of protrusions which occurred when the in-plane mask tilt angle θ was not less than 35° were apparently attributed to the exposed m-plane sapphire substrate surface of the recessed portions 850.

Figure 27:
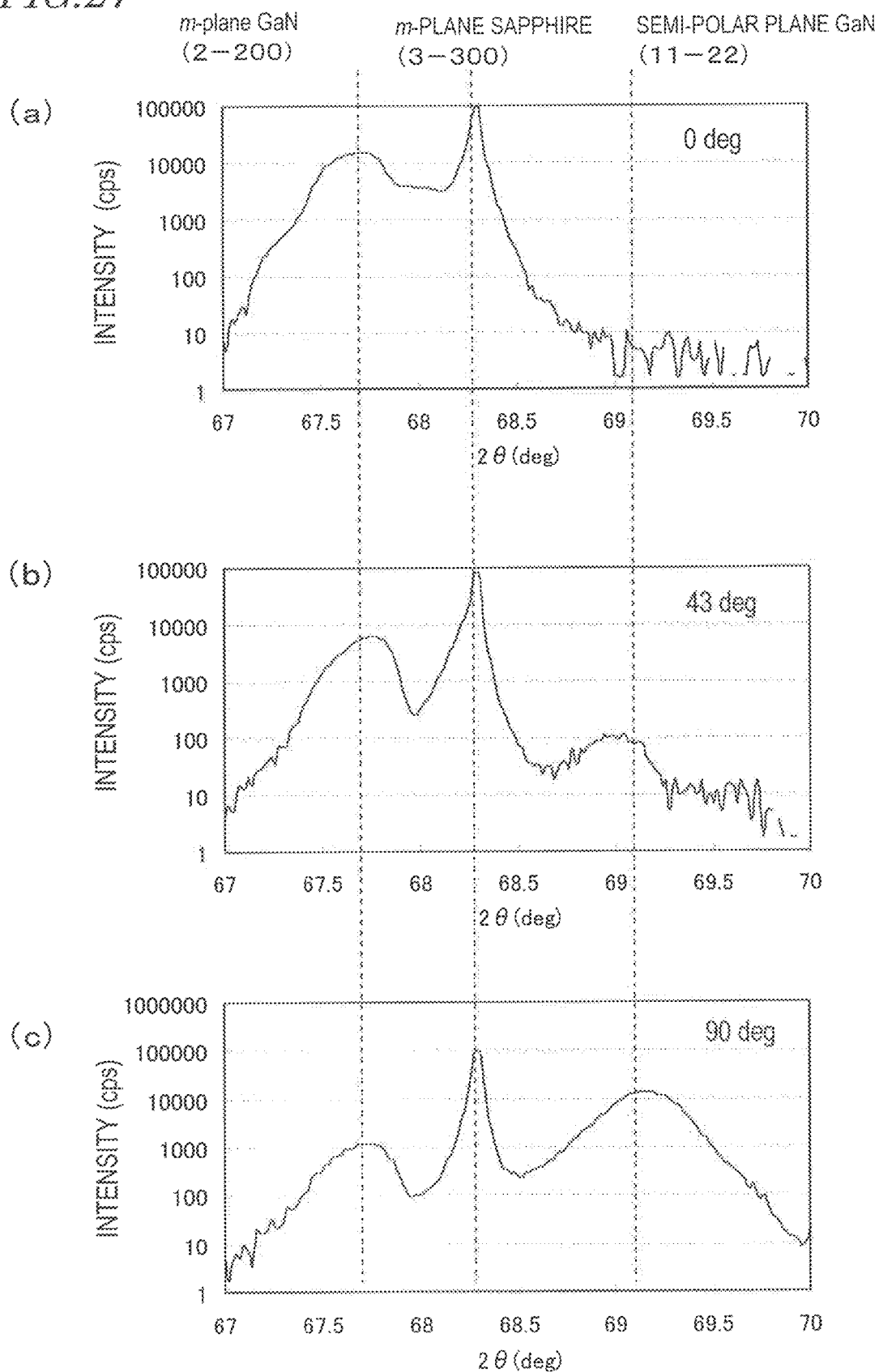
FIGS. 27(a), 27(b), and 27(c) are graphs showing the results of X-ray 2θ-ω measurements carried out on a regrown heterogeneous m-plane GaN substrate (heterogeneous m-plane nitride semiconductor substrate 920) in the cases where the in-plane mask tilt angles were 0° (FIG. 27(a)), 43° (FIGS. 27(b)), and 90° (FIG. 27(c)).

It was clarified from the XRD 2θ-ω measurements that the protrusions were actually the (11-22) semi-polar plane. FIG. 27 shows the 2θ-ω measurement results for the cases where the in-plane mask tilt angles θ were 0°, 43°, and 90°. When the in-plane mask tilt angle was 0°, only the peaks of the m-plane sapphire (3-300) and the m-plane GaN (2-200) were observed. When the in-plane mask tilt angle was 43°, the diffraction peak of the (11-22) plane emerged on the higher angle side. When the in-plane mask tilt angle was 90°, the intensity of this peak was still higher.

Figure 28:
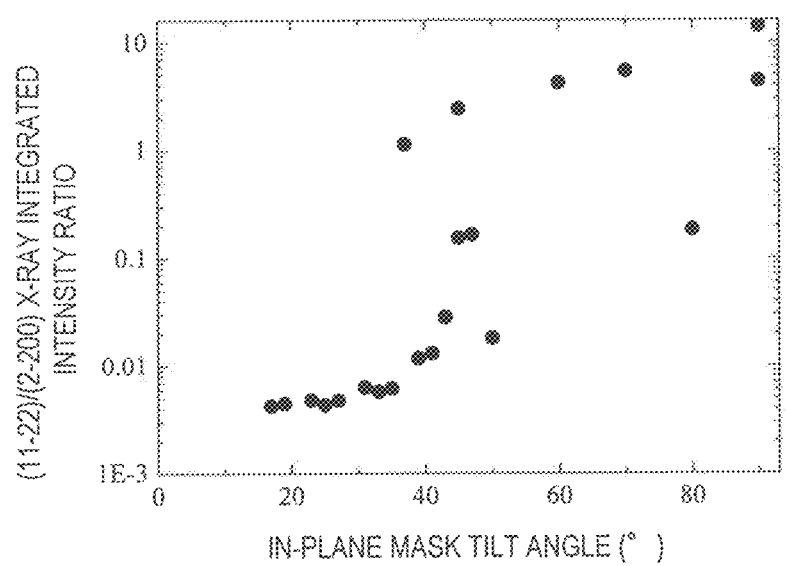
FIG. 28 is a graph showing the in-plane mask tilt angle dependence of the X-ray integrated intensity ratio between the (11-22) plane and the m-plane (2-200) plane.

FIG. 28 shows the in-plane mask tilt angle dependence of the integrated intensity ratio between the (11-22) plane and the m-plane (2-200) plane, which was estimated from the above XRD 2θ-ω measurement results. It can be seen that the integrated intensity of the (11-22) plane started to increase near 35° at which the surface roughness also started to increase. Such a variation of the XRD measurement result accords with the variation of the surface morphology (FIG. 25). It is inferred from the above result that deterioration of the surface flatness which would occur at the in-plane mask tilt angle of not less than 35° is attributed to the semi-polar plane abnormal growth, and it was found that the mentioned semi-polar plane refers to the growth with the (11-22) plane principal surface.

The present inventors proved, by a method which will be described below, that the (11-22) plane semi-polar abnormal growth in this Inventive Example 2 is direct growth from the m-plane sapphire substrate.

In regrowing an m-plane GaN film on the unevenly-processed substrate 910, an unprocessed m-plane sapphire substrate was placed in the MOCVD apparatus at the same time. That is, in this m-plane sapphire substrate, none of the previously-described TMA irradiation and buffer layer was used, and the process of the regrown nitride semiconductor growth which has been described in Inventive Example 1 was directly carried out.

According to the XRD 2θ-ω measurement result for the case where a nitride semiconductor film was directly grown on an m-plane sapphire substrate through the previously-described process, only the (3-300) peak from the m-plane sapphire and the diffraction peak from the (11-22) plane were observed as in FIG. 19(b), while the peak of (2-200) which was attributed to the m-plane GaN was not observed. That is, it was found that, when the process of the regrown nitride semiconductor is directly carried out on an m-plane sapphire substrate, a nitride semiconductor of which principal surface was the m-plane does not grow, while a semi-polar plane nitride semiconductor of which principal surface is the (11-22) plane grows.

Thus, it was found that, in the Pendeo epitaxial lateral overgrowth of an m-plane nitride semiconductor with the use of the m-plane sapphire substrate of the present embodiment, there is a problem that a semi-polar plane nitride semiconductor grows from m-plane sapphire substrate regions which are exposed in the uneven process.

The above-described problem of undesirable growth of the semi-polar plane is inherent in the Pendeo growth with the use of the m-plane sapphire substrate. For example, an m-plane SiC substrate may be used as the heterogeneous substrate of the m-plane GaN, although in this case, in the first place, the semi-polar plane nitride semiconductor growth would not occur. According to methods which are different from the Pendeo growth, such as ELOG, LOFT, air-bridged ELO, regions in which regrowth is to occur are formed by only nitride semiconductor regions, while the other regions are masked with a dielectric material, or the like, such that the heterogeneous substrate surface is not exposed. Therefore, the semi-polar nitride semiconductor growth from the heterogeneous substrate surface, such as seen in this example, can be prevented. However, each of the aforementioned methods is disadvantageous because there are concerns about the problem of the substrate cost and deterioration of the crystal quality due to contamination with impurities from the mask materials, such as a dielectric. Thus, realizing a Pendeo growth method of an m-plane nitride semiconductor on an m-plane sapphire substrate at a low cost, without using a mask, as in the present embodiment is of great importance.

As previously described in Inventive Example 1, it is inferred that the (11-22) plane semi-polar plane abnormal growth was attributed to the lateral surfaces 852 of the sapphire substrate 811 which was formed in formation of the unevenly-processed substrate 910. It is inferred that semi-polar plane abnormal growth occurred such that the growth started from r-plane facets which were present in the lateral surfaces 852 of the sapphire substrate 811 and which were oriented in the c-axis direction. It is inferred from the experimental results that, when the in-plane mask tilt angle is smaller than 35°, the number of r-plane facet regions which serve as starting points of the semi-polar plane growth is small, and only a small number of semi-polar plane regions are formed so that they cannot be detected by the XRD measurement. Therefore, its effect is at a negligible level as compared with the regrown m-plane regions. On the other hand, when the angle exceeds 35°, growth of the semi-polar plane remarkably occurs, and the source materials are supplied not only to the GaN layer but also to the lateral surface 852 regions of the sapphire substrate 811, at which the growth occurs. Thus, it is inferred that the surface morphology also changed, so that a regrown film was obtained in which the m-plane and the (11-22) plane coexist.

It was found from the above results that, in the Pendeo growth in which the m-plane nitride semiconductor film on the m-plane sapphire substrate is employed as the seed crystal, occurrence of the semi-polar plane abnormal growth depends on the in-plane mask tilt angle. It was found that avoiding this effect and obtaining a regrown film which is excellent in surface flatness and controlled so as to be in the m-plane orientation, controlling the in-plane mask tilt angle so as to be in a range of 0° to 35° is necessary.

INVENTIVE EXAMPLE 3

In the descriptions of Inventive Example 2 of the present application, the semi-polar plane abnormal growth starts from the lateral surfaces 852 of the sapphire substrate 811 in the recessed portions 850, and this phenomenon remarkably occurs in an unevenly-processed substrate in which the in-plane mask tilt angle is greater than 35°. The reason why such a tendency can be seen is that, as the in-plane mask tilt angle increases, the facet plane of the lateral surfaces 852 of the sapphire substrate 811 changes from the a-axis direction to the c-axis direction. It is inferred that, when the normal line of the lateral surfaces 852 of the sapphire substrate 811 is close to the c-axis direction, the r-plane facet is likely to be formed, so that semi-polar plane growth is likely to occur (see FIG. 16). That is, in the present embodiment, if there is a facet which includes a c-axis or r-axis direction component at least partially in the lateral surfaces 852 of the sapphire substrate 811, there is a probability that semi-polar plane abnormal growth starts from that facet.

In consideration of the above, it can be said that, for example, even when the in-plane mask tilt angle is 0°, the probability that the semi-polar plane abnormal growth occurs is not zero. In forming lateral surfaces by etching, making that etched surfaces flat at the atomic level is almost impossible. Therefore, the etched lateral surfaces have some fluctuations. That is, even in the case of 0°, the facet plane of the lateral surfaces cannot be perfectly controlled, and a facet which has a crystal plane that is different from the a-plane facet (e.g., r-plane) can be present in the lateral surfaces 852 of the sapphire substrate 811.

Actually, in Japanese Laid-Open Patent Publication No. 2009-203151, direct growth of a nitride semiconductor on an unevenly-processed m-plane sapphire substrate is examined, and there is a report that even when, in that case, the extending direction of the raised portions was the c-axis direction and the normal line of the lateral surfaces of sapphire was oriented in the a-axis direction (corresponding to the case where the in-plane mask tilt angle was 0° in the present embodiment), the (11-22) plane growth was confirmed.

To prevent the semi-polar plane abnormal growth, controlling the in-plane mask tilt angle as described in Inventive Example 2 so as to reduce the number of facets which have normal line components in the c-axis or r-axis direction is effective and, it is inferred that, reducing the area of the lateral surfaces 852 of the sapphire substrate 811 in which the semi-polar plane growth can occur is also effective. In principle, when the depth of the lateral surfaces 852 of the sapphire substrate 811 is close to 0, the semi-polar plane growth is unlikely to occur, and the in-plane mask tilt angle dependence is small. Further, even when the semi-polar plane growth occurs, it must occur only in a very small area as compared with the original m-plane nitride semiconductor regions. Therefore, the effect on the entire regrown film must be extremely small.

In this Inventive Example 3, the depth dependence of the lateral surfaces 852 of the sapphire substrate 811 was examined.

In this Inventive Example 3, washing of the m-plane sapphire substrate, the growing step of the nitride semiconductor film 812 for seed crystal, stripe-shaped L&S patterns which had varying in-plane mask tilt angles from 0° to 90°, the step of preparing the unevenly-processed substrate 910, and the step of growing the nitride semiconductor film 870 were carried out under basically the same conditions as those employed in Inventive Examples 1 and 2. Note that, however, to examine the effect of the depth of the lateral surfaces 852 of the sapphire substrate 811, the etching duration in the process of the uneven structure was varied.

FIGS. 29(a) and 29(b) show the in-plane mask tilt angle dependence of the X-ray diffraction peak integrated intensity ratio between the (11-22) plane and the m-plane (2-200) plane of nitride semiconductor films 870 which were fabricated with varying etching depths of the lateral surfaces 852 of the sapphire substrate 811. FIG. 29(a) employs the same result as Inventive Example 2 shown in FIG. 28 and, in this case, the depth of the lateral surfaces 852 of the sapphire substrate 811 was approximately 250 nm. On the other hand, FIG. 29(b) is the sample for which the etching duration in the process of the uneven structure was short, and the etching depth was approximately 150 nm.

As seen from FIG. 29(a), as previously described, when the in-plane mask tilt angle θ is not less than 35°, the diffraction intensity of the (11-22) plane is high, and it is appreciated that a semi-polar plane is also present together in the regrown film. On the other hand, in the sample of FIG. 29(a) where the etching depth was 150 nm, such a tendency was not observed that the diffraction intensity of the (11-22) plane sharply increases as the value of θ increases.

These experimental results demonstrate that the semi-polar plane abnormal growth can be prevented by reducing the depth of the lateral surfaces 852 of the sapphire substrate 811 and reducing the area of these lateral surface regions. This is probably because, as previously described, the number of r-plane facets that could serve as the starting points of the semi-polar plane abnormal growth was decreased by reducing the depth of the lateral surfaces 852 of the sapphire substrate 811.

From the foregoing results, it was found that, in the Pendeo growth where the m-plane nitride semiconductor film on the m-plane sapphire substrate serves as the seed crystal, the semi-polar plane abnormal growth can be prevented by controlling not only the in-plane mask tilt angle but also the etching depth of the sapphire substrate so as to be within predetermined ranges. By controlling the in-plane mask tilt angle, the semi-polar plane growth can be prevented even when the etching depth of the lateral surfaces 852 of the sapphire substrate 811 is in the range of 0 nm to 500 nm. By controlling the etching depth of the lateral surfaces 852 of the sapphire substrate 811 so as to be within the range of 0 nm to 150 nm, the semi-polar plane abnormal growth can be prevented more effectively.

The results of the examinations carried out by the present inventors demonstrated that, as for the problem of abnormal growth of a nitride semiconductor with an unintended plane orientation in the Pendeo regrowth, regions in which facets having different plane orientations are present can be relatively reduced by controlling the height of the substrate lateral surfaces 852 formed in the etching step so as to be within the range of not less than 0 nm and not more than 500 nm, or within the range of not less than 0 nm and not more than 150 nm, the abnormal growth from the substrate lateral surfaces 852 can be effectively prevented, without depending on the in-plane mask tilt angle. Thus, a Pendeo regrown film of a non-polar plane nitride semiconductor which has high quality and excellent flatness can be obtained.

In the step of preparing the unevenly-processed substrate 910, the height of the substrate lateral surfaces 852 is controlled so as to be within the range of not less than 0 nm and not more than 500 nm or within the range of not less than 0 nm and not more than 150 nm, and the in-plane mask tilt angle is within the range of 0° to 35° at which abnormal growth of a nitride semiconductor with an unintended plane orientation is unlikely to occur, whereby abnormal growth from the regions of the substrate lateral surfaces 852 can be prevented more effectively.

Here, the dependence of the tilt angle γ of the opposite lateral surfaces which are perpendicular to the extending direction of the stripes in FIG. 14 is also described. The r-plane facet of sapphire is a crystal plane which is inclined from the c-axis to the m-axis as shown in FIG. 16. As previously described, the semi-polar plane abnormal growth which starts from the r-plane facet is more likely to occur when the normal lines of the lateral surfaces 852 of the sapphire substrate 811 are oriented in the c-axis direction (e.g., FIG. 15) rather than the a-axis direction. Likewise, as shown in FIG. 14, when the tilt angle γ of the lateral surfaces of the sapphire substrate is controlled so as to be 90°, the r-plane facet would not occur in principle, and there is a probability that the semi-polar plane abnormal growth can be prevented even when the in-plane mask tilt angle θ is 90°. However, in view of the existing technology, etching processing with steep lateral surfaces at the atomic level is difficult. It is inferred that, even when the lateral surface tilt angle is designed to be γ=90°, r-plane facets occur in some regions, and regions of γ<90° occur, and there is a high probability that the semi-polar plane growth occurs from those regions. In view of the existing technology, by controlling the in-plane mask tilt angle θ and the depth of the lateral surfaces 852 of the sapphire substrate 811, the semi-polar plane abnormal growth can be sufficiently prevented. The lateral surface tilt angle γ in FIG. 14 can be selected from a wide range and is, desirably, controlled so as to be within the range of 0°<γ<150°, for example.

<Conditions Under which the Semi-Polar Abnormal Growth is Likely to Occur>

The cause of the semi-polar abnormal growth that occurs in Pendeo regrowth which employs an m-plane sapphire substrate resides in that, when a nitride semiconductor film is grown on an m-plane sapphire substrate, the plane orientation (crystal orientation) that the nitride semiconductor film can have includes a plurality of types of plane orientations rather than only one type of plane orientation.

Specifically, as previously described, when a nitride semiconductor film is grown on an m-plane sapphire substrate, growth of a nitride semiconductor of which principal surface is the (1-100) plane or (10-1-3) plane, which is the m-plane, or the (11-22) plane, occurs. If one of these plane orientation undergoes film formation according to the growth conditions or the state of the substrate surface before the growth, film formation can sometimes occurs such that those plane orientations coexist.

For example, as shown in FIGS. 14(a) and 14(b), at the lateral surfaces of the recessed portions 850, different plane orientations such as, for example, the a-plane of the nitride semiconductor and the c-plane of the sapphire substrate, are exposed. The reasons why a mismatch occurs between the plane orientation of the substrate and the plane orientation of the grown film is that, in the first place, the substrate and the grown film have different crystal structures (the sapphire has a corundum structure while the nitride semiconductor has a wurtzite structure), and there is a complicated epitaxy relationship between the substrate and the grown film.

In the Pendeo lateral selective regrowth of an m-plane nitride semiconductor that is a non-polar plane in the present embodiment, the problem that growth of a crystal of which plane orientation is different from that of the m-plane nitride semiconductor concurrently occurs can arise when the substrate used concurrently meets the following two conditions: (1) the substrate has a crystal structure which is different from that of the nitride semiconductor; and (2) there is a probability that a nitride semiconductor film which has a plurality of types of plane orientations, rather than only one type of plane orientation, is formed.

Firstly, the condition (1) is described. For example, when a semiconductor or oxide which has the same wurtzite structure as that of the nitride semiconductor, such as a GaN bulk substrate or ZnO, is used as the substrate, even if the recessed portions 850 such as shown in FIGS. 14(a) and 14(b) are formed and regions where the substrate surface is exposed or the lateral surfaces 852 of the substrate are formed, a crystal of which plane orientation is different from the principal surface would not be formed from these regions in the regrowth process. Although, strictly speaking, the crystal structures are different, it is inferred that, when using a SiC substrate of which crystal structure is very close to that of the nitride semiconductor, the problem of concurrent growth of different plane orientations would not occur.

This is because the grown film and the substrate have the same crystal structures, and not only the growth principal surface but also the lateral surfaces 852 of the substrate formed by etching have the same plane orientation as that of the lateral surfaces formed by etching of the grown film.

Next, the condition (2) is described. As previously described, growth of a nitride semiconductor of which principal surface is the plane orientation of the (1-100) plane or (10-1-3) plane, which is the m-plane, or the (11-22) plane, can occur on an m-plane sapphire substrate.

FIGS. 30(a) and 30(b) are diagrams for illustrating the direction of the crystalline axis in the cases where the growing planes are the m-plane and the off-plane, respectively. In FIGS. 30(a) and 30(b), the "growing plane" refers to a growing plane of the substrate.

When the growing plane of the sapphire substrate is not inclined from the m-plane (i.e., not made off) as shown in FIG. 30(a), the c-axis direction and the a-axis direction are parallel to the growing plane. In this case, the present inventors found that crystals which have different plane orientations are likely to concurrently grow when the lattice mismatch degree between the m-plane sapphire substrate and the nitride semiconductor film in the c-axis direction (first direction) of the nitride semiconductor film is not less than 2% and, in the growing plane, the lattice mismatch degree between the m-plane sapphire substrate and the nitride semiconductor film in the second direction (a-axis direction) that is perpendicular to the first direction is not less than 10%.

When the growing plane of the sapphire substrate is inclined with respect to the m-plane (i.e., made off) as shown in FIG. 30(b), the c-axis direction is not parallel to the growing plane in some cases. In such a case, the lattice mismatch degree is derived relative to a direction which is defined by orthogonal projection of the c-axis of the nitride semiconductor onto the growing plane of the sapphire substrate (first direction: the c-axis direction component in the growing plane). That is, in the first direction, the lattice mismatch degree between the substrate and the nitride semiconductor film is not less than 2%. In the second direction that is perpendicular to the first direction in the growing plane of the substrate, the lattice mismatch degree between the substrate and the nitride semiconductor layer is not less than 10%.

Here, the lattice mismatch degree (strain amount) M (%) is calculated by the following formula 1:

$$M (\%) = 100(dg-ds)/ds \quad \text{(Formula 1)}$$

where ds is the interplanar spacing of the substrate, and dg is the interplanar spacing of a film grown on the substrate.

The lattice mismatch degree is defined from the value of the difference between the interplanar spacing of the grown film and the interplanar spacing of the substrate at the interface between the grown film and the substrate, and is basically different from the residual strain which is obtained when the thickness of the grown film exceeds the critical thickness and is sufficiently large. In this specification, the lattice mismatch degree refers to the strain amount which can be theoretically estimated from the epitaxy relationship between the grown film and the substrate and the difference in interplanar spacing, and is different from the experimentally-determined residual strain amount.

The growth mode (epitaxy mode) of the grown film varies depending on the largeness of the value of the difference in interplanar spacing between the substrate and the grown film. When the value of the difference in interplanar spacing between the grown film and the substrate is not so large (e.g., less than 10%), the growth occurs in the lattice match mode. On the other hand, when the value of the difference in interplanar spacing is extremely large, e.g., not less than 10%, the epitaxy occurs in the domain match mode rather than the lattice match mode.

In the lattice match mode, the following relationship holds true at the interface between the grown film and the substrate:

$a \cdot ds = a \cdot dg$ ($a$ is an integer equal to or greater than 1)

where, for example, ds is the interplanar spacing in the growing plane of the substrate, and dg is the interplanar spacing in the growing plane of a grown film which has an epitaxy relationship with the lattice plane of the substrate. In this case, the lattice plane of the substrate and the lattice plane of the grown film are in a one-to-one relationship.

On the other hand, in the domain match mode, the following relationship holds true at the interface between the grown film and the substrate:

$(a \pm 1) \cdot ds = a \cdot dg$ ($a$ is an integer equal to or greater than 1).

The growth in the domain match mode is premised on a very large lattice mismatch. Therefore, to reduce this mismatch, a lattice plane is added (or removed) such that the strain is decreased. Since as described herein an extremely large strain is relieved in the domain match mode, matching of lattice planes is achieved such that plural ones of the lattice planes of the grown film and plural ones of the lattice planes of the substrates form pairs (domains).

The interface grown in the domain match mode adjusts the number of a plurality of lattice planes of the grown film and the substrate so as to relieve the strain. However, in the first place, the grown film and the substrate have different numbers of lattice planes, and therefore, at the interface, there is a misfit dislocation in every period of that domain.

Note that, in the above-described domain match mode, the difference in the number of interplanar spacings between the grown film and the substrate is assumed as 1. However, this number may be greater than 1 and may vary depending on the type of the material. However, in epitaxial growth of a nitride semiconductor on a heterogeneous substrate, it is 1 in almost all the cases.

As shown in above Formula 1, the lattice mismatch degree in the present embodiment is calculated on the assumption that the lattice match mode is employed rather than the domain match mode. That is, the calculation is carried out on the assumption that the lattice planes (interplanar spacings) correspond on a 1:1 fashion.

FIG. 31 shows the relationship of the respective crystal axes and the lattice constants in the case where an m-plane GaN film is formed on an m-plane sapphire. FIG. 31 shows the atomic arrangements which are seen from the m-axis side. Note that, in FIG. 31, illustration of oxygen atoms is omitted.

As shown in FIG. 31, in the case of growing an m-plane nitride semiconductor, the difference in lattice constant (asymmetry) between the a-axis ([11-20] direction) and the c-axis direction ([0001] direction) in the growing plane is large. Such a tendency also applies to a case where a nitride semiconductor of a non-polar plane which is different from the m-plane, or a nitride semiconductor of a semi-polar plane, is grown. This asymmetry is very large unless, as described above, the crystal structure of the substrate material is the same as, or similar to, that of the nitride semiconductor.

For the sake of comparison, a case where, for example, a GaN bulk substrate or ZnO substrate is used is considered. In the case where an m-plane GaN is grown on these substrates, the c-axis and a-axis of the grown film are identical with the c-axis and a-axis of the substrate. Therefore, the lattice mismatch degree which is achieved when the GaN bulk substrate is used is 0% in both directions. The lattice mismatch degree which is achieved when the ZnO substrate is used is 0.4% in the c-axis direction and 1.9% in the a-axis direction. Thus, the asymmetry is very small.

However, as shown in FIG. 31, the crystal structure of the m-plane sapphire substrate is different from that of the nitride semiconductor, and in the growing plane, the c-axis and a-axis of the m-plane sapphire substrate and the c-axis and a-axis of the nitride semiconductor are in the relationship of 90° rotation. That is, the growth occurs in a state where the a-axis of the GaN corresponds to the c-axis of the sapphire, and the c-axis of the GaN corresponds to the a-axis of the sapphire. The lattice mismatch degree in the a-axis direction of the sapphire and the c-axis direction of the GaN is 8.3% (which is calculated by assigning the interplanar spacing d(11-20) of the sapphire and the interplanar spacing d(0002) of the GaN in Formula 1), and is in the epitaxy relationship of the lattice match mode. On the other hand, the lattice constant of the c-axis direction of the sapphire and the lattice constant of the a-axis direction of the GaN are 12.99 Å and 3.189 Å, respectively, which are different from each other by a factor of about 3. This lattice mismatch degree in the crystal axis direction is obtained using the interplanar spacing in the c-axis direction of the sapphire, d(0006)=2.165 Å (which is the quotient of 12.99 Å divided by 6), and the interplanar spacing in the a-axis direction of the GaN, d(11-20)=1.595 Å (which is equal to the quotient of 3.189 Å divided by 2), and is 26%.

When there is such a large lattice mismatch degree, an epitaxy relationship in the domain match mode where matching of lattices is achieved with a plurality of interplanar spacings, three sapphire c-axis direction interplanar spacings, i.e., d(0006)×3, and four GaN a-axis direction interplanar spacings, i.e., d(11-20)×4, being a single unit holds true. In this case, the lattice mismatch degree in the domain match mode decreases to 1.8%. However, in this crystal axis direction, in the first place, the number of interplanar spacings for the sapphire is three while the number of interplanar spacings for the GaN is four, i.e., there is a gap between the sapphire and the GaN. Therefore, it leads to a structure where a misfit dislocation is included in every period of the interplanar spacings. This is an example of the previously-described epitaxy relationship in the domain match mode.

In general, in heteroepitaxy of the non-polar plane nitride semiconductor, there is no substrate which has a small lattice constant difference, and the asymmetry of the lattice mismatch degree in the plane is large. It can be said that such asymmetry of the lattice mismatch degree is one of the factors that discourage improvement in quality of a non-polar plane nitride semiconductor heteroepitaxy film.

In heteroepitaxy which has such large in-plane lattice mismatch degree asymmetry, the crystal growth mode varies depending on the direction in the growing plane as previously described. In the epitaxy of the m-plane GaN on the m-plane sapphire substrate, in the c-axis direction of the GaN (the a-axis direction of the sapphire) in which the lattice constant difference is relatively small, crystal growth progresses in the lattice match mode, while in the a-axis direction of the GaN (the c-axis direction of the sapphire) in which the lattice constant difference is very large, crystal growth progresses in the domain match mode.

In heteroepitaxy of a nitride semiconductor which has a non-polar plane, the crystal growth mode varies in the plane as described above in almost all the cases. Up to now, similar results have been reported for the a-plane nitride semiconductor growth on the r-plane sapphire substrate, the m-plane nitride semiconductor growth on the γ-LiAlO$_2$ substrate, the m-plane ZnO growth on the m-plane sapphire substrate, the m-plane nitride semiconductor growth, and the like. For example, in growth of the a-plane GaN on the r-plane sapphire substrate, the relationship of its in-plane lattice constant is such that the a-axis of the sapphire and the m-axis of the GaN are parallel to each other, and the [-1101] direction of the sapphire and the c-axis of the GaN are parallel to each other. The respective lattice mismatch degrees are about 16.1% and about 1.2%.

In this case, the epitaxy in the a-axis of the sapphire and the m-axis direction of the GaN, in which the lattice mismatch degree is very large, is in the domain match mode, and dislocations are present periodically so that the strain is relieved. Growth in the domain match mode occurs with six d(10-10) planes of the GaN for seven d(11-20) planes of the sapphire. In this case, the mismatch degree is reduced to 0.5%. On the other hand, the epitaxy in the [-1101] direction of the sapphire and the c-axis direction of the GaN, in which the lattice mismatch degree is small, occurs in the lattice match mode.

The above-described asymmetry of the in-plane strain and growth mode in the heteroepitaxy of the non-polar plane nitride semiconductor was confirmed in some studies. Such a characteristic that a nitride semiconductor which has a plurality of plane orientations is likely to grow such as seen in the present embodiment is notably displayed in the case where an m-plane nitride semiconductor is grown on an m-plane sapphire.

As described above, in the heteroepitaxy of the m-plane nitride semiconductor on the m-plane sapphire, the lattice mismatch degree between the c-axis of the sapphire and the a-axis of the GaN is 26%, and the lattice mismatch degree between the a-axis of the sapphire and the c-axis of the GaN is 8.2%. In the c-axis of the sapphire and the a-axis direction of the GaN, growth occurs in the domain match mode. Basically, the strain is positively relieved with periodic dislocations being included every four d(11-20) planes of the GaN (on the sapphire side, every three d(0006) planes). In this crystal axis direction, the domain match mode contributes to reduction of the strain.

On the other hand, in the a-axis of the sapphire and the c-axis direction of the GaN which are deviated from the above direction by 90°, growth occurs in the lattice match mode. The strain amount in this direction is about 8%, which is a large value. The present inventors speculate that this large strain amount in the c-axis direction of the GaN is a cause of growth of a nitride semiconductor which has a plurality of different plane orientations, which is not seen in other non-polar heteroepitaxy.

As a matter of fact, growth of a plurality of plane orientations was not confirmed. In heteroepitaxy in which plane orientation control of a non-polar plane nitride semiconductor is relatively easy, the crystal axis direction in which growth occurs in the lattice match mode includes a c-axis component, and its strain amount is about 1%, which is a small value. For example, in the a-plane GaN on the r-plane sapphire substrate, the lattice mismatch degree between the [-1101] direction of the sapphire and the c-axis direction of the GaN is 1.2%. Further, in the m-plane GaN on the (100) plane γ-LiAlO$_2$, epitaxy occurs such that the [010] direction of the γ-LiAlO$_2$ is parallel to the c-axis of the GaN. The lattice mismatch degree of this direction is 0.3%.

As described above, in the m-plane GaN growth on the m-plane sapphire substrate, the strain amount of the c-axis direction component of the GaN in the plane is extremely large as compared with the other non-polar nitride semiconductor heteroepitaxies. It is inferred that this large strain amount serves as a starting point of unintended growth of a nitride semiconductor of which plane orientation is different from the m-plane.

In the case where the m-plane nitride semiconductor is grown on the m-plane sapphire substrate, using an AlN layer as the buffer layer enables control of the plane orientation with high reproducibility. From this fact, it can be confirmed that the above-described model is correct. Since the c-axis length of the m-plane AlN is shorter than that of the GaN, the strain amount of the sapphire a-axis/AlN c-axis is about 4%, which is about a half of that of the GaN. It is inferred that this is one of the reasons that a plane orientation which is different from the m-plane, i.e., semi-polar plane abnormal growth, was prevented.

However, in the Pendeo epitaxial lateral overgrowth of the present embodiment, a buffer layer of AlN is not used in regrowth. Therefore, the bottom surface 851 of the recessed portions 850 at which the sapphire substrate 811 is exposed and the lateral surfaces 852 have different plane orientations, and accordingly, the relationship of the strain between the regrown GaN and the sapphire surface is also different. Particularly, as previously described, when the lateral surfaces 852 include a sapphire r-plane facet, the (11-22) plane GaN grows through the same mechanism as that through which the a-plane GaN grows from this r-plane facet. This is probably attributed to the fact that, in the m-plane GaN on the m-plane sapphire, the lattice mismatch degree in the c-axis direction of the GaN (about 8%) is dramatically reduced in the (11-22) plane GaN growth in which this r-plane facet serves as a starting point. (In this case, the lattice mismatch degree is reduced to 1.2% through the same mechanism as that of the a-plane GaN on the r-plane sapphire.)

In epitaxy which occurs in the lattice match mode in the crystal axis which includes an in-plane c-axis direction component of the nitride semiconductor film, it is inferred that, when its strain amount is about 1%, abnormal growth of a nitride semiconductor of which plane orientation is different from that of the principal surface is unlikely to occur, in view of the aforementioned examples of the a-plane GaN on the r-plane sapphire substrate (the lattice mismatch degree in the lattice match mode=1.2%) and the m-plane GaN on the γ-LiAlO$_2$ substrate (the lattice mismatch degree in the lattice match mode=0.3%). Therefore, in the in-plane c-axis direction component of the nitride semiconductor film in which epitaxy occurs in the lattice match mode, it is inferred that growth of a nitride semiconductor which has a plurality of plane orientations is likely to occur when its strain amount exceeds 2%.

In summary of the foregoing, it is inferred that, in the heteroepitaxy of a non-polar plane nitride semiconductor, when of two directions (in-plane growth axes) defined by directions in the growing plane which are different from each other by 90°, the lattice mismatch degree in a direction defined by orthogonal projection of the c-axis of the nitride semiconductor onto the growing plane (first direction) is not less than 2% and the lattice mismatch degree in a direction in the growing plane which is perpendicular to the first direction (second direction) is not less than 10%, abnormal growth of a nitride semiconductor which has a plurality of plane orientations is likely to occur.

The conditions under which abnormal growth of the nitride semiconductor is more likely to occur are such that, of two directions defined by directions in the growing plane which are different from each other by 90°, the lattice mismatch degree in a direction defined by orthogonal projection of the c-axis of the nitride semiconductor onto the growing plane (first direction) is not less than 2% and less than 10%, and the lattice mismatch degree in a direction in the growing plane which is perpendicular to the first direction (second direction) is not less than 10%.

There are some other materials which can cause the above problem, in addition to the combination of the m-plane sapphire substrate and the m-plane GaN. Such materials are combinations which can enhance heterogeneous growth of a semi-polar plane nitride semiconductor, for example.

One possible option is the combination of an m-plane sapphire substrate and a (11-22) semi-polar nitride semiconductor. In this combination, when growth of a (11-22) semi-polar plane is attempted, there is a high probability that an m-plane or (10-1-3) plane grows unintendedly.

According to Physica Status Solidi B 248, No. 3, 583 (2011), the [11-20] direction of the sapphire and the [1-100] direction of the GaN are parallel to each other, and the direction of the sapphire and the [-1-123] direction of the GaN are parallel to each other. Further, it is reported that the respective lattice mismatch degrees are 16.1% and -6.3%. Since the [-1-123] direction of the GaN is a direction defined by orthogonal projection of the c-axis direction of the GaN onto the growing plane, in Physica Status Solidi B 248, No. 3, 583 (2011), the strain amount of the in-plane c-axis direction component of the semi-polar (11-22) plane GaN (lattice mismatch degree) is -6.3%. In this Physica Status Solidi B 248, No. 3, 583 (2011), the strain amount is calculated in the domain match mode. In this example, estimation of the lattice mismatch degree in the lattice match mode leads to a further increased lattice mismatch degree, which has a value of not less than 10%.

That is, in the epitaxy for growing a semi-polar plane (11-22) plane GaN on an m-plane sapphire substrate, the in-plane lattice mismatch degree has a large value not less than 10% in both the c-axis direction component of the GaN (the first direction that is a direction defined by orthogonal projection of the c-axis onto the growing plane of the substrate) and a direction in the growing plane which is perpendicular to the first direction.

In the epitaxy of a (11-22) semi-polar nitride semiconductor on an m-plane sapphire substrate, an unevenly-processed substrate 910 is prepared, a ridge-shaped nitride semiconductor layer is formed, and Pendeo regrowth is carried out through the process illustrated in FIG. 4, whereby the stacking fault density and the dislocation density are reduced, so that the crystal quality of the (11-22) semi-polar nitride semiconductor layer can be improved.

However, to dramatically reduce the stacking faults which are present at high density in the non-polar plane or semi-polar plane nitride semiconductor layer and effectively improve the crystal quality, the angle between the extending direction of the ridge-shaped nitride semiconductor layers and the c-axis of the m-plane sapphire substrate may be 90°.

In the case of the epitaxy of the m-plane nitride semiconductor on the m-plane sapphire substrate, the c-axis direction ([0001]) in the plane of the nitride semiconductor is parallel to the a-axis direction ([11-20]) of the sapphire. To effectively reduce the stacking fault density in addition to the dislocation density, the extending direction of the ridge-shaped nitride semiconductor layers may be approximately parallel to the c-axis of the m-plane sapphire substrate (details of the in-plane mask tilt angle and the stacking fault density will be described in detail in the section of Inventive Example 4).

However, in the case of a (11-22) semi-polar plane nitride semiconductor on an m-plane sapphire substrate, the c-axis direction component of the nitride semiconductor (a direction defined by orthogonal projection of the c-axis direction onto the growing plane, i.e., [-1-123]) is parallel to the c-axis direction ([0001]) of the sapphire.

From the above reasons, in the case of carrying out Pendeo regrowth of a (11-22) semi-polar plane nitride semiconductor layer on an m-plane sapphire substrate, the form of the unevenly-processed substrate 910 may undergo photolithography or etching processing such that the angle between the extending direction of the ridge-shaped nitride semiconductor layers and the c-axis of the m-plane sapphire substrate is 90°.

Further, in the step of preparing this unevenly-processed substrate 910, when the height of the lateral surfaces 852 of the sapphire substrate which are formed in etching is controlled so as to be within the range of not less than 0 nm and not more than 500 nm, or within the range of not less than 0 nm and not more than 150 nm, abnormal growth from these lateral surfaces of a nitride semiconductor layer other than the (11-22) plane can be effectively prevented, and a Pendeo regrown film of a semi-polar plane nitride semiconductor which has high quality and excellent flatness can be obtained.

Note that, in this case, the angle between the extending direction of the ridge-shaped nitride semiconductor layers and the c-axis of the m-plane sapphire substrate does not necessarily need to be perfectly parallel to 90°. According to the results of examinations carried out by the inventors, when this angular range is controlled so as to be 90°±10°, the unevenly-processed substrate 910 is prepared, and Pendeo regrowth is carried out, a (11-22) plane semi-polar nitride semiconductor layer can be obtained in which not only the dislocation density but also the stacking fault density are effectively reduced. Details of these features will be described in the section of Inventive Example 4.

INVENTIVE EXAMPLE 4

As previously described in the section of Embodiment 1, in the non-polar plane nitride semiconductor growth, reduction of the stacking fault density is important as well as reduction of the dislocation density. In this example, the in-plane mask tilt angle dependence of the crystallinity of a regrown m-plane GaN film was examined. The effect of reducing the dislocation density was evaluated based on the XRC full width at half maximum. Here, the X-ray incidence direction was the a-axis direction of the GaN. The effect of reducing the stacking fault density was evaluated by photoluminescence (PL) measurement. This is because the PL evaluation can more precisely examine the effect of the stacking fault density.

In this Inventive Example 4, washing of the m-plane sapphire substrate, the growing step of the nitride semiconductor film 812 for seed crystal, stripe-shaped L&S patterns which had varying in-plane mask tilt angles from 0° to 90°, the step of preparing the unevenly-processed substrate 910, and the step of growing the nitride semiconductor film 870 were carried out under basically the same conditions as those employed in Inventive Examples 1 and 2.

Figure 32:
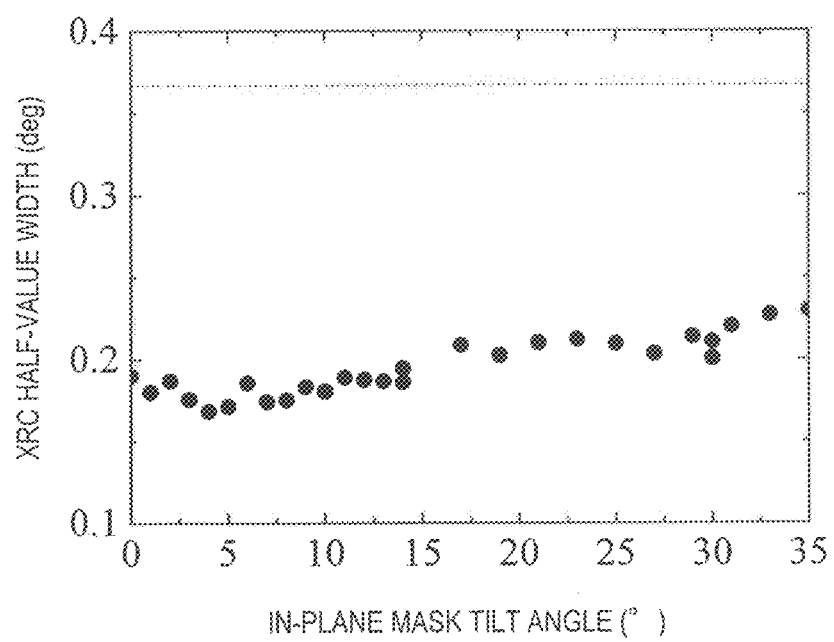
FIG. 32 is a graph showing the in-plane mask tilt angle dependence of the XRC full width at half maximum of a regrown heterogeneous m-plane GaN substrate.

FIG. 32 shows the XRC full width at half maximum of the nitride semiconductor film 870 with the in-plane mask tilt angle θ varied from 0° to 35°. The X-ray incidence direction was parallel to the a-axis of the GaN. In this experiment, two m-plane GaN films on an m-plane sapphire substrate were used as the nitride semiconductor film 812 for seed crystal, and they were different between the sample where θ was 0 to 15° and the sample where θ was 17° to 35°. The dotted line in the graph represents the value of the XRC full width at half maximum of a typical seed crystal GaN film shown in Table 1 (1326 seconds, 0.37 degree). The two seed crystal GaNs had generally the same XRC full width at half maximums. The XRC full width at half maximum was approximately half of the value of the seed crystal over a wide range of the in-plane mask tilt angle. It is inferred that, thanks to the Pendeo regrowth of the present disclosure, the dislocation density was reduced. Note that it seems that the XRC full width at half maximum in the graph gradually deteriorates as the in-plane mask tilt angle increases. This is attributed to the difference of the seed crystal m-plane GaN films and is not an indication of the in-plane mask tilt angle dependence.

Figure 33:
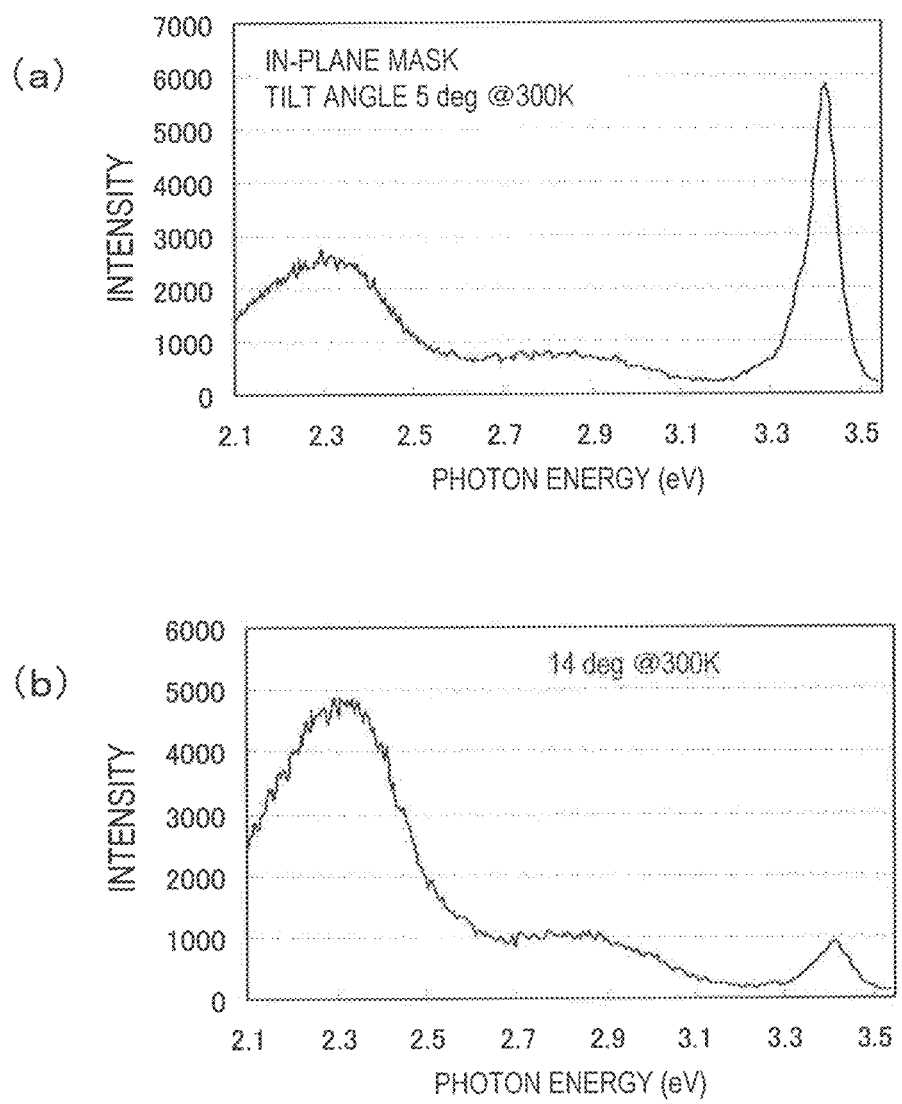
FIGS. 33(a) and 33(b) are graphs showing the results of room temperature PL measurement carried out on a regrown heterogeneous m-plane GaN substrate (heterogeneous m-plane nitride semiconductor substrate 920) in the case where the in-plane mask tilt angle was 5° (FIG. 33(a)) and in the case where the in-plane mask tilt angle was 14° (FIG. 33(b)).

FIG. 33 shows the PL spectrum at room temperature. In the PL evaluation, a He—Cd laser (continuous wave, intensity: up to 30 mW) was used as the excitation source. FIG. 33 shows, as examples, the results of samples in which the in-plane mask tilt angle was θ=5° and 14°. The emission peak near the band edge of the GaN was seen at around 3.4 eV, while the other emissions were resulted from Deep Level. Both samples did not have a large difference in the value of the XRC full width at half maximum of FIG. 32. However, the emission intensity at the band edge was high in the sample with a small in-plane mask tilt angle θ=5°, while in the sample of θ=14°, the Deep Level emission was dominant.

Considering that there is no difference in the XRC full width at half maximum shown in FIG. 32, there is a small probability that the cause of the difference in emission spectrum between the two samples is the dislocation density. Therefore, it is probably because of the effect of the stacking faults which was not reflected in the results of the XRC full width at half maximum in FIG. 32.

Figure 34:
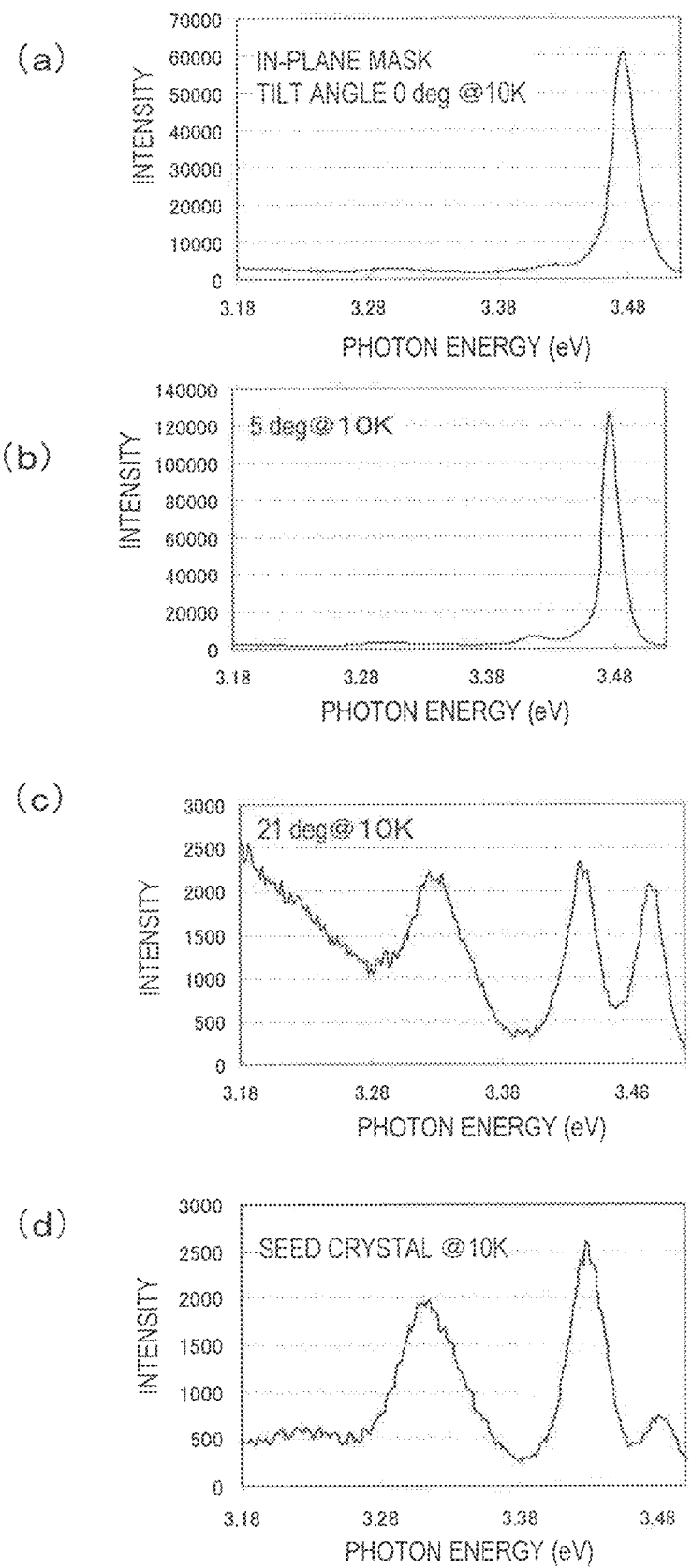
FIGS. 34(a) to 34(c) are graphs showing the results of low temperature (10K) PL measurements carried out on a regrown heterogeneous m-plane GaN substrate (heterogeneous m-plane nitride semiconductor substrate 920) in the cases where the in-plane mask tilt angles were 0°, 5°, and 21°, respectively.
FIG. 34(d) is a graph showing the result of a low temperature (10K) PL measurement of a seed crystal m-plane GaN before selective growth was carried out.

The effect of the stacking faults was examined by low temperature (10K) PL measurement. FIGS. 34(a) to 34(c) shows the results in the cases where the in-plane mask tilt angles θ were 0°, 5°, and 21°, respectively. For the sake of comparison, the spectrum of the nitride semiconductor film 812 for seed crystal is shown in FIG. 34(d). In the samples of θ=21° and seed crystal, three peaks were mainly observed. Although the values of the respective emission peaks have some deviations depending on, for example, the strain amount of a grown film in some cases, it is inferred from the systematic analysis of the experimental results obtained herein and the comparison and analysis with other document results that the emission at 3.42 eV was attributed to the stacking faults, and the peak at 3.48 eV was the emission that was attributed to the donor bound exciton (D0, X). First, comparing the results of (d) seed crystal and (c) θ=21°, in the sample of θ=21°, the intensity of (D0, X) increases with respect to the peak which was attributed to the stacking faults, and it can be seen that the stacking fault density decreased as compared with the seed crystal. However, the intensity of (D0, X) was generally equivalent to that of the stacking faults, and the overall emission intensity was weak.

In comparison to the above results, in the samples of (a) 0° and (b) 5° in which the in-plane mask tilt angle θ was small, the peak intensity which was attributed to the stacking faults was weak, and the emission which was attributed to (D0, X) was dominant. Further, the emission intensity also increased by one or more orders of magnitude as compared with the sample of θ=21°.

As described above, in the room temperature PL measurement, in a regrown GaN film in which the emission intensity near the band edge was strong, great reduction of the emission intensity that was attributed to the stacking faults and increase of the (D0, X) intensity were confirmed even in the low temperature PL measurement. It was found that, by appropriately selecting the range of the in-plane mask tilt angle in this way, not only the dislocation reducing effect but also the effect of reducing the stacking fault density can be obtained.

Figure 35:
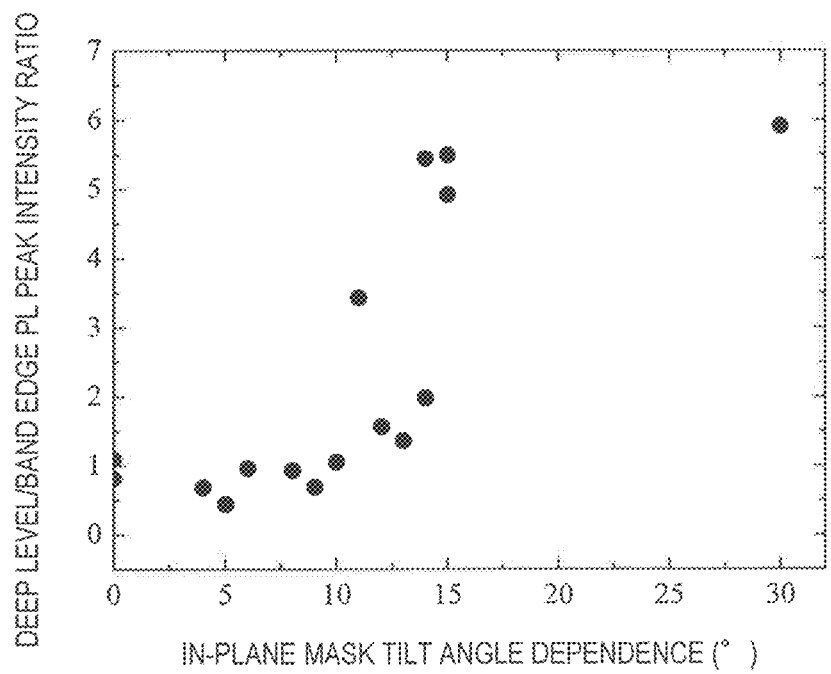
FIG. 35 is a graph showing the relationship between the ratio between the Deep level emission intensity and the band edge emission intensity and the in-plane mask tilt angle in a regrown heterogeneous m-plane GaN substrate (heterogeneous m-plane nitride semiconductor substrate 920).

FIG. 35 shows the in-plane mask tilt angle dependence of the ratio between the emission intensity from the Deep Level and the emission intensity near the band edge which were obtained from the room temperature PL measurement. It is inferred that, in the range of the in-plane mask tilt angle from 0° to 10°, the intensity ratio was low, and the emission near the band edge was strong even at the room temperature, so that the stacking fault density was reduced. On the other hand, the ratio between the emission intensity at the Deep Level and the emission intensity near the band edge scarcely varied so long as the in-plane mask tilt angle θ was not more than 10°, and the ratio sharply increased when the angle exceeded 10°, so that the emission at the Deep Level became dominant.

As described above, as seen from the measurement results of the XRC full width at half maximum, the effect of improving the crystal quality which is achieved by dislocation density reduction can be realized at least in the range of the in-plane mask tilt angle θ from 0° to 35°. To obtain the effect of reducing the stacking fault density in addition to the crystal quality improving effect, it is necessary to narrow the range of the in-plane mask tilt angle. It was proved from the experimental results that the angle θ is in the range of 0° to 10°.

It was proved from the results of FIG. 35 that, even when the in-plane mask tilt angle is not 0°, the effect of reducing the stacking fault density can be obtained. As previously described in the section of Inventive Example 1, in order to improve the surface flatness, it is desired that the in-plane mask tilt angle is greater than 0°. When θ is greater than 0°, the migration effect is enhanced, and the surface flatness can be improved. Also, the recessed portions 850 can be designed so as to have a larger area while the flatness is maintained.

Figure 36:
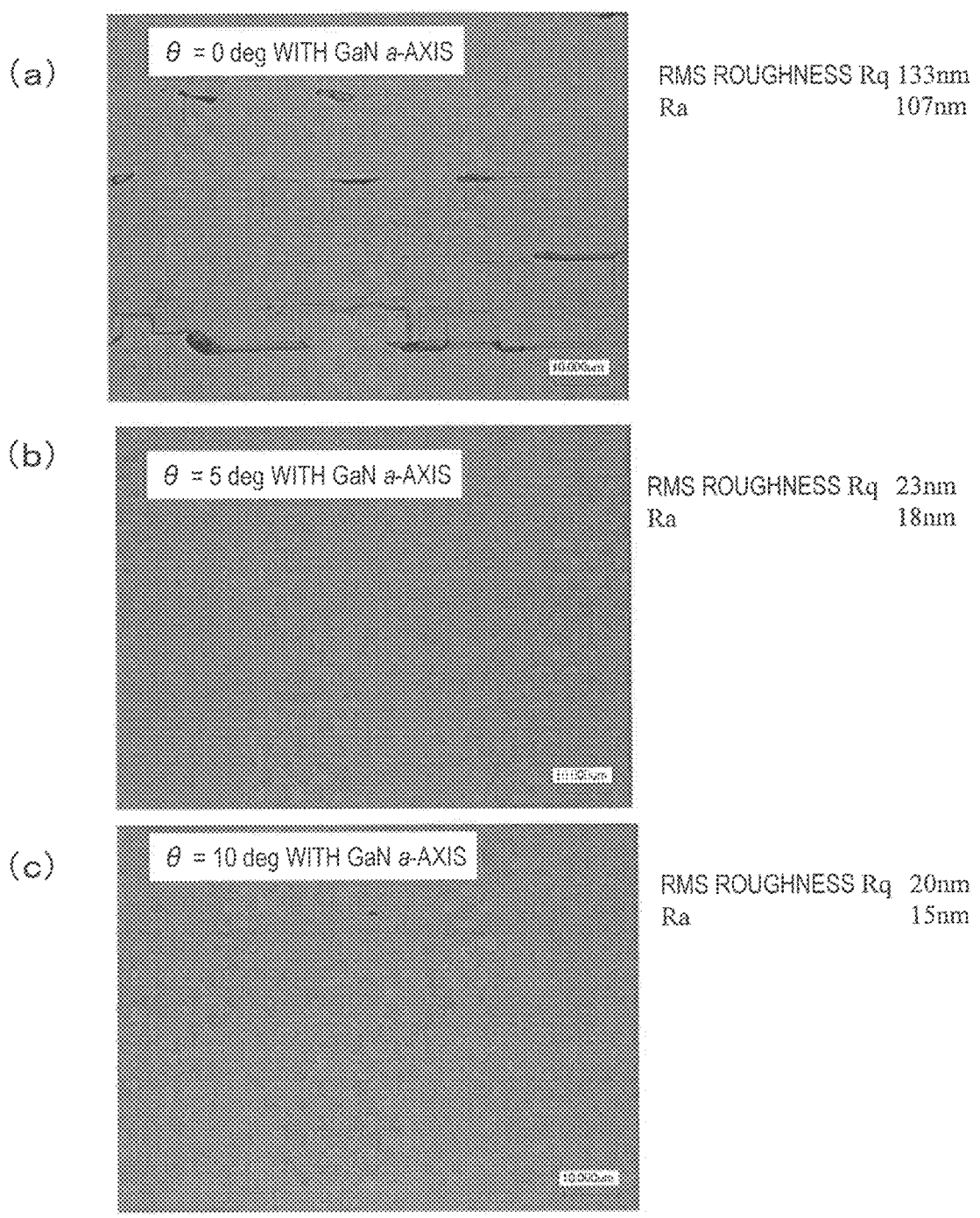
FIGS. 36(a) to 36(c) are graphs showing the surface morphology, the surface RMS roughness, and the value of Ra in the cases where the in-plane mask tilt angles were 0°, 5°, and 10°, respectively.

FIG. 36 shows the variation of the surface morphology which occurred when the in-plane mask tilt angle was varied from 0° to 10°. It can be seen that only the variation from 0° to 5° resulted in that pits in the surface vanished away. Thus, it is appreciated that the surface flatness was improved. Further, when θ=10°, the rms roughness further decreased to 20 nm.

It was found from the above results that a range of the in-plane mask tilt angle in which both the dislocation density and the stacking fault density are concurrently reduced while migration is enhanced and the surface flatness can also be improved concurrently is, for example, from 0° to 10°.

INVENTIVE EXAMPLE 5

Hereinafter, the results of examination of the effect of stacking faults and the dependence of the L width/S width are described.

Inventive Example 4 demonstrated that, so long as the in-plane mask tilt angle is in the range of 0° to 10°, not only the dislocation density but also the stacking fault density can be effectively reduced, so that excellent optical characteristics can be obtained. However, it is the result obtained when the L width and the S width were constant at 5 μm and 10 μm, respectively. The L width refers to the width of the ridge-shaped nitride semiconductor layers 830 that are the seed crystal (in a plan view, the length along a direction which is perpendicular to the extending direction of the ridge-shaped nitride semiconductor layers 830). In growth from this region in which the ridge-shaped nitride semiconductor layers 830 are provided, the crystal quality realized in the seed crystal is maintained as it is, so that the effect of reducing the dislocation density and the stacking fault density which is achieved by selective growth is hardly obtained. Therefore, in a semiconductor layer grown from this region, the dislocation density and the stacking fault density are high as compared with a semiconductor layer grown from the recessed portions 850, so that its crystallinity deteriorates. Therefore, it is inferred that the optical characteristics of an m-plane nitride semiconductor film obtained by the Pendeo regrowth are also affected by the ratio between the L width and the S width.

In view of such, in this Inventive Example 5, the variation of the optical characteristics with varying ratios between the L width and the S width was mainly examined by a PL evaluation method.

In this example, samples were prepared with the in-plane mask tilt angle θ being constant at 5°. The other growth conditions were the same as those of Inventive Examples 1 and 2. The reason why the in-plane mask tilt angle θ was constant at 5° is to clarify the relationship between the L width and the S width, without being affected by the in-plane mask tilt angle θ, in the range of the in-plane mask tilt angle from 0° to 10° in which the effect of the stacking fault density can be sufficiently prevented as previously described in the section of Inventive Example 4. Note that, although the in-plane mask tilt angle θ of the samples was 5°, it was confirmed that there is no large variation in the relationship between the ratio of L width and S width and the optical characteristics which will be described later so long as the in-plane mask tilt angle θ is in the range of 0° to 10°. In this example, the samples were prepared by Pendeo growth without a mask such as shown in FIGS. 4(a) to 4(d) rather than Pendeo growth with the use of the mask 820 such as shown in FIGS. 3(a) to 3(d).

In this example, the L width was constant at 5 μm while the S width was varying, and the ratio of the stripe width was defined as S width/(L width+S width). That ratio of the stripe width and the optical characteristics were compared. In this example, the L width was constant at 5 μm, but the L width is not limited to this example. The L width can be selected from a wide range, and the range of the L width may be not less than 0.1 μm and not more than 10 μm. Note that, as shown in FIG. 8(a), when the lateral surfaces of the recessed portions 850 are sloped, the L width refers to the width of the base of the ridge-shaped nitride semiconductor layers.

The unevenly-processed substrates 910 were prepared with varying S widths as described above, and a heterogeneous nitride semiconductor substrate 920 which was obtained by regrowth of a nitride semiconductor film was evaluated.

FIG. 37 shows the PL spectra of m-plane GaN samples obtained by Pendeo regrowth with varying stripe width ratios, S width/(L width+S width), which were measured at the low temperature (10K). When the stripe width ratio, S width/(L width+S width), is in the range of 0.29 to 0.58, the ratio between the peak intensity of the emission that is attributed to the donor bound exciton (D0, X), which is seen near 3.48 eV, and the peak intensity of the emission that is attributed to the stacking faults (near 3.42 eV) is generally at the same level, or rather, the peak that is attributed to the faults has a higher intensity. However, it was found that, when this stripe width ratio, S width/(L width+S width), is not less than 0.6, the ratio of the peak intensity of the emission that is attributed to the donor bound exciton (D0, X) to the peak intensity that is attributed to the stacking faults greatly increases.

Figure 38:
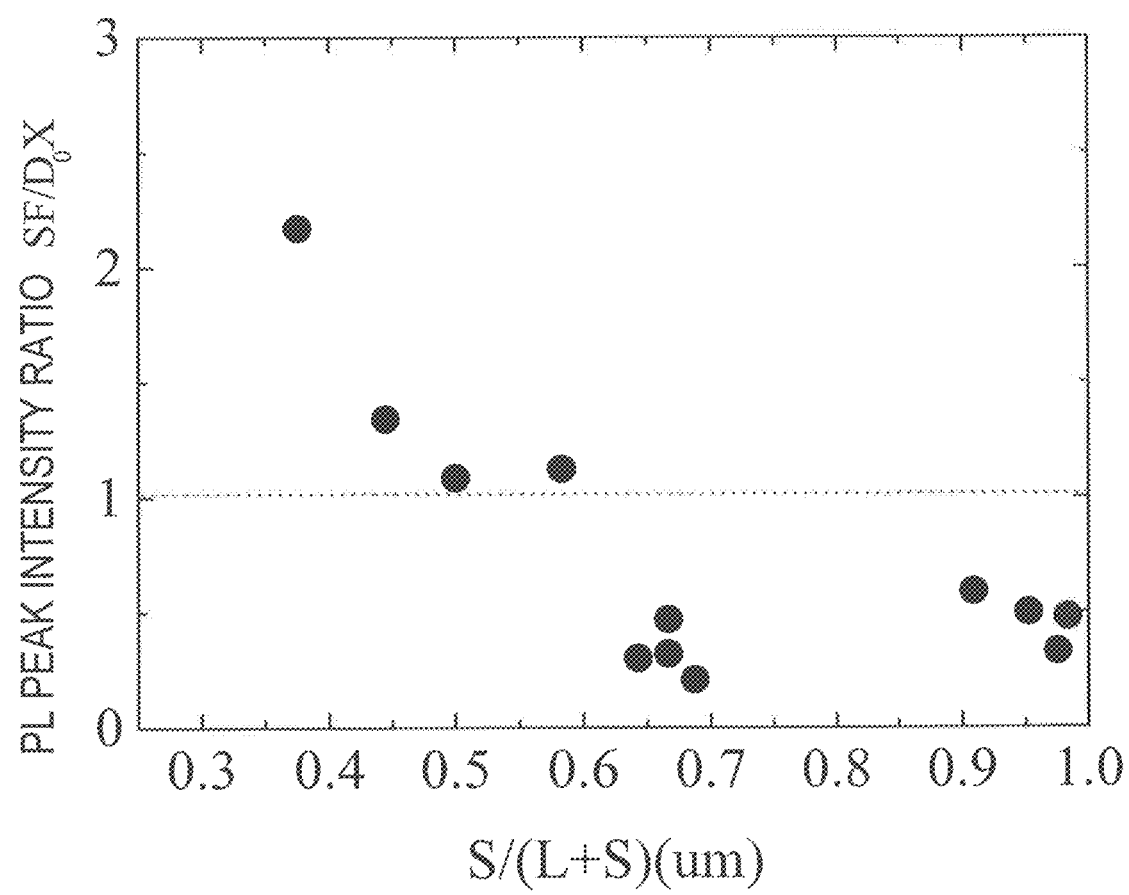
FIG. 38 is a graph showing the relationship between the intensity ratio between the emission that is attributed to the donor bound exciton (D0, X) near 3.48 eV and the emission that is attributed to the stacking faults near 3.42 eV and the stripe width ratio, S width/(L width+S width), in the PL spectrum at low temperature 10K of a regrown heterogeneous m-plane GaN substrate (heterogeneous m-plane nitride semiconductor substrate 920).

FIG. 38 shows the relationship of the intensity ratio between the emission that is attributed to the donor bound exciton (D0, X) near 3.48 eV and the emission that is attributed to the stacking faults near 3.42 eV, which were measured by PL measurement at the low temperature 10K, with respect to the stripe width ratio, S width/(L width+S width). The vertical axis represents the value of the intensity of the emission that is attributed to stacking faults which is divided by the intensity of the emission that is attributed to the donor bound exciton. As this value decreases, the effect of the stacking faults also decreases. It can be seen that, when the stripe width ratio, S width/(L width+S width), is near 0.6, the emission intensity ratio greatly varies. When the stripe width ratio, S width/(L width+S width), was not more than 0.6, the intensity of the emission that is attributed to the stacking faults is higher than or generally equal to the intensity of the emission that is attributed to the donor bound exciton, i.e., the value was not less than 1. In a stripe width structure of not less than 0.6, the relative intensity of the donor bound exciton emission, which was the emission near the band edge, abruptly improved to be not more than 0.5. That is, it was found that, in an m-plane nitride semiconductor structure that was obtained by Pendeo regrowth in which the stripe width ratio, S width/(L width+S width), was not less than 0.6, deterioration of the optical characteristics due to the stacking fault density can be prevented.

It is inferred that the same effect can be obtained in a Pendeo regrown film in which an m-plane nitride semiconductor structure grown on a heterogeneous substrate is the basic body, irrespective of the sapphire substrate, and also can be obtained in the case of the previously-described semi-polar plane (11-22) nitride semiconductor.

Next, the importance for device applications of setting the stripe width ratio, S width/(L width+S width), to a value not less than 0.6 such that the effect of the stacking fault density is reduced as much as possible was confirmed by a method which will be described below.

A blue light-emitting InGaN quantum well structure was formed on a Pendeo regrown m-plane GaN film of a sample in which the stripe width ratio, S width/(L width+S width), was 0.67 (L width/S width=5 μm/10 μm), and the optical characteristics of the structure were evaluated by PL measurement at the low temperature (10K). For the sake of comparison, the optical characteristics of InGaN quantum well structures formed on an m-plane GaN bulk substrate of which stacking fault density was approximately 0 and on a sample in which the stripe width ratio, S width/(L width+S width), was 0.29 were evaluated on the other hand.

The quantum well structure of the emission layer was formed by 15 cycles of 3 nm thick InGaN well layers in which the In mole fraction was 0.13 and 12.5 nm thick InGaN barrier layers in which the In mole fraction was 0.03. Note that, between the ridge-shaped nitride semiconductor layers and the emission layer, there was a GaN layer which had a thickness of about 1 μm.

FIG. 39 shows the PL spectra at the low temperature (10K) of the aforementioned three quantum well structures. FIG. 39(a) shows the result for the case where a quantum well structure was grown on an m-plane GaN bulk substrate. FIG. 39(b) shows the result for the case where a quantum well structure was grown on a Pendeo epitaxial lateral overgrowth m-plane GaN in which S width/(L width+S width) was 0.67. FIG. 39(c) shows the result for the case where a quantum well structure was grown on a seed crystal m-plane GaN which did not undergo the epitaxial lateral overgrowth.

From the quantum well structure grown on the m-plane GaN bulk substrate of FIG. 39(a), a unimodal blue emission peak was observed.

On the other hand, in the quantum well structure formed on the seed crystal m-plane GaN of FIG. 39(c), not only a blue emission peak which was attributed to the quantum well but also another emission in a long wavelength region which was derived from a different origin were observed in comparison to the quantum well structure formed on the GaN bulk substrate. Further, the emission intensity itself was weak as compared with the result of the structure grown on the bulk substrate, and the half-value width of the emission spectrum was broad. It is considered that the origin of the emission which was thus seen in the long wavelength region other than the quantum well was attributed to the stacking faults. Thus, in the structure which underwent the measurement of FIG. 39(c), the crystal defect density was large.

This is because stacking faults are present in the seed crystal m-plane GaN with high density as compared with the GaN bulk substrate and Pendeo epitaxial lateral overgrowth film.

Applied Physics Express 2, 041002 (2009) suggests that segregation of In occurs near stacking faults. Thus, it is inferred that the origin of the emission of which wavelength was longer than the original emission of the quantum well as seen in FIG. 39(c) was attributed to segregation of the In mole fraction which occurred due to the stacking faults.

In comparison to the above results, the emission spectrum shown in FIG. 39(b) of the quantum well structure on a heterogeneous m-plane GaN formed by Pendeo epitaxial lateral overgrowth in which the stripe width ratio, S width/(L width+S width), was 0.67 was similar to the result of the structure grown on the bulk substrate. It can be seen that the original blue emission of the quantum well structure was dominant, and the emission in the long wavelength region which was attributed to the stacking faults was greatly reduced.

That is, it was found that, when the ratio of S width/(L width+S width) is not less than 0.6, the stacking fault density can be effectively reduced. By reducing the stacking fault density, the emission efficiency can be improved, and control of the emission wavelength can be readily achieved.

The experimental fact that setting the ratio of S width/(L width+S width) to a value not less than 0.6 as described above enables to greatly reduce deterioration of the optical characteristics due to the stacking faults suggests that, in the surface area of a heterogeneous m-plane nitride semiconductor film 920 which is obtained by Pendeo epitaxial lateral overgrowth (shown in FIG. 4), how much the proportion of the regions including the stacking faults (i.e., the ridge-shaped nitride semiconductor layers (seed crystal regions) 830) can be reduced relative to the S width that is the low defect density region is important. Therefore, the range in which the stacking fault density can be reduced can be defined by relative values of the L width and the S width.

Considering that a range of the L width which is desirable from the viewpoint of realizing the epitaxial lateral overgrowth and achieving sufficient dislocation density reducing effect is not less than 0.1 μm and not more than 10 μm, or not less than 1 μm and not more than 5 μm, an optimum range of the S width in which the effect of the stacking fault density can be sufficiently reduced may be as follows because the ratio of S width/(L width+S width) is greater than 0.6. The stripe structure may be formed such that, for example, the S width is not less than 0.15 μm when the L width is 0.1 μm; the S width is not less than 1.5 μm when the L width is 1 μm; the S width is not less than 7.5 μm when the L width is 5 μm; and the S width is not less than 15 μm when the L width is 10 μm.

Next, the optimum region of S width/(L width+S width) was examined. What was clarified in this example is that the effect of the stacking faults on the optical characteristics can be reduced by securing a relatively large S width region relative to the L width. In this example, the L width was constant at 5 μm. In this case, as shown in FIG. 38, it was confirmed that the emission of (D0,X) that was an emission near the band edge was dominant when the ratio of S width/(L width+S width) was in the range of not less than 0.6 and not more than 0.99, and that the emission which was attributed to the stacking faults can be sufficiently prevented.

In the case where the epitaxial lateral overgrowth in heterogeneous m-plane nitride semiconductor growth of the present embodiment is carried out, allowing nitride semiconductors which are formed by the epitaxial lateral overgrowth in the regions of the recessed portions 850 to be sufficiently combined and forming the connecting portion 890 so as to obtain a flat nitride semiconductor layer (for example, the heterogeneous m-plane nitride semiconductor substrate 920 shown in FIG. 4(d)) are sometimes important with some device structure fabrication and process steps. In this case, if the width of the recessed portions 850, i.e., the S width region, is excessively large, it is necessary to continue the growth for a long period of time in order to form a sufficient cover over the lateral growth film in the regrowth process, causing the problem of cost increase of the process steps, for example.

According to the examinations carried out by the present inventors, when the growth method employed is a MOVPE growth method, the upper limit of the S width which is suitable for realizing a nitride semiconductor layer with no gaps in the lateral regrowth step is about 30 μm. If the S width is greater than that, the growth time becomes long, leading to an increase in the process cost.

That is, to sufficiently reduce the effect of the stacking faults on the optical characteristics and obtain a flat nitride semiconductor film 860 with no gaps in regrowth, the S width is desirably limited to a value not more than 30 μm, and furthermore, and the ratio of S width/(L width+S width) is desirably designed to be not less than 0.6. In this case, the upper limit of S width/(L width+S width) is, for example, 0.996 when the L width is 0.1 μm. When the L width is 1.0 μm, the upper limit of S width/(L width+S width) is 0.968. When the L width is 5.0 μm, the upper limit of S width/(L width+S width) is 0.857.

That is, so long as the aforementioned ranges of the L width and the S width, and the upper limit of the S width is 30 μm, and so long as the ratio of S width/(L width+S width) is in the range of not less than 0.6 and not more than 0.996, a flat regrown film can be obtained while the effect of the stacking faults is reduced.

On the other hand, in the sample of Pendeo lateral regrowth film, in view of device applications, nitride semiconductor films regrown from the ridge-shaped nitride semiconductor layers 830 that are the seed crystals do not necessarily need to connect to each other so as to be flat as a whole. With some process methods or final device structure designs, films regrown from the respective ridge-shaped nitride semiconductor layers 830 can be deliberately made independent of one another at the completion of a final device structure. In this case, the connecting portion 890 is not formed, and therefore, there is a merit that deterioration of the device characteristics in defect regions formed by connection can be prevented.

The results of epitaxial lateral overgrowth which was carried out with the S width being deliberately set within a wide range exceeding 30 μm as described above are shown in FIG. 40.

FIG. 40 shows laser microscope images obtained from the front surface side (i.e., m-axis side) of a heterogeneous nitride semiconductor substrate 920 with the L width being constant at 5 μm and varying S widths, (a) 10 μm, (b) 50 μm, (c) 100 μm, (d) 200 μm, and (e) 300 μm. There are two features observed in the samples of which S width was not less than 50 µm: a stripe structure of an m-plane GaN regrown from the ridge-shaped nitride semiconductor layers 830 that served as the starting points; and a region in which the sapphire substrate of the recessed portions 850 was exposed. Further, in these samples, the S width was not less than 50 µm, i.e., extremely large, but a nitride semiconductor would not grow on the sapphire substrate surface of the recessed portions 850. It can be seen that the supplied source materials underwent migration through the sapphire substrate surface and were taken into the ridge-shaped nitride semiconductor layers 830.

It is known from the examinations carried out by the present inventors that prevention of regrowth of the nitride semiconductor in such a region in which the sapphire substrate surface of the recessed portions 850 is exposed can be sufficiently achieved by optimizing the regrowth conditions for the nitride semiconductor.

In a structure which is grown such that regrown nitride semiconductor films formed in the recessed portions 850 are not reconnected deliberately and the sapphire substrate surface of the recessed portions 850 remains as it is as shown in FIG. 40, the source materials formed in sapphire substrate regions of the recessed portions 850 are not entirely taken into the sapphire substrate but into the m-plane GaN of the ridge structure. Therefore, a thickness of the GaN of the ridge structure along the vertical direction (m-axis direction) or horizontal direction (in this example, a direction inclined by 5° from the c-axis in the a-axis direction) sharply increases, and the crystallinity and the optical characteristics greatly improve.

These vertical and horizontal thicknesses and the growth speed can be appropriately controlled by means of the regrowth conditions. For example, in the case of the experimental results shown in FIG. 40, the lateral growth speed was mainly varied. As for the growth speed in the horizontal direction, assuming that it is 1 when the S width is 10 µm, the growth speed is about two times faster when the S width is 50 µm, and the growth speed is about three times faster when the S width is 100 µm.

As described above, when the unevenly-processed substrate 900 is prepared using a stripe structure of which S width exceeds 30 µm to fabricate a heterogeneous nitride semiconductor substrate 920, a regrown film can be obtained which is not a flat film in the overall sample but which has a large thickness, although partially, by the same process time.

Thanks to the effect of increasing the thickness of the film, the dislocation density and the stacking fault density in the regrown GaN film of the ridge portion are further reduced, and as a result, remarkable improvement in the crystal quality is achieved.

In a Pendeo regrown film structure in which connecting regions are not formed deliberately in the recessed portions 850, it is desirable that the S width is not less than 30 µm. The upper limit of the S width is, for example, 300 µm.

Thus, in the unevenly-processed substrate 900 which has large recessed portions 850 of which S width is not less than 30 µm, the ratio of S width/(L width+S width) with which the above-described effect of the stacking faults can be sufficiently reduced is not less than 0.75 and less than 1 when the preferred range of the L width is not less than 0.1 µm and not more than 10 µm, for example. When the range of the L width is not less than 1 µm and not more than 5 µm, it is not less than 0.857 and less than 1.

(Embodiment 3)

Figure 41:
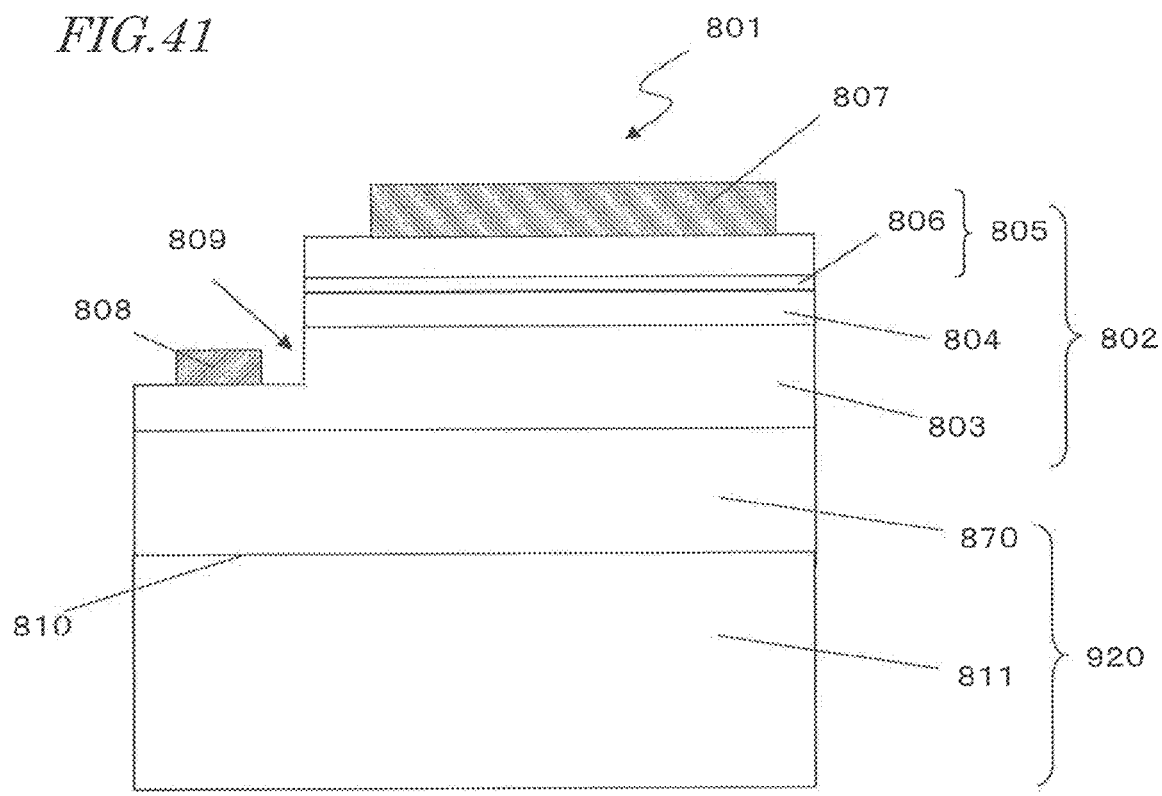
FIG. 41 is a schematic cross-sectional view of a nitride-based semiconductor light-emitting device 801 of an embodiment.

In exemplary Embodiment 3, a nitride-based semiconductor device is described in which a high quality heterogeneous m-plane nitride semiconductor substrate 920 that is fabricated by Pendeo epitaxial lateral overgrowth in Embodiments 1 and 2 is used as the substrate. The nitride-based semiconductor device of exemplary Embodiment 3 is, for example, a nitride-based semiconductor light-emitting device. The nitride-based semiconductor device of the present embodiment may be a LED. FIG. 41 is a schematic diagram showing the structure of a nitride-based semiconductor light-emitting device (LED) of exemplary Embodiment 3. FIG. 41 schematically shows a cross-sectional configuration of the nitride-based semiconductor light-emitting device 801. This nitride-based semiconductor light-emitting device 801 is, for example, a semiconductor device which has a nitride-based semiconductor multilayer structure which is made of a GaN-based semiconductor.

The nitride-based semiconductor light-emitting device 801 of the present embodiment includes a heterogeneous nitride semiconductor substrate 920 which is obtained by forming an m-plane nitride semiconductor film by Pendeo growth on an m-plane sapphire substrate 811 and of which growing plane is the m-plane, a semiconductor multilayer structure 802 formed thereon, and electrodes 807, 808 formed on the semiconductor multilayer structure 802. The heterogeneous nitride semiconductor substrate 920 used is the unevenly-processed substrate 910 (a structure for growth of a nitride semiconductor layer) of Embodiment 1 or 2, and can be formed by regrowing a nitride semiconductor to form the nitride semiconductor film 870. The heterogeneous nitride semiconductor substrate 920 includes the previously-described raised-portion nitride semiconductor layers 830 and recessed portions 850, although in this diagram illustration of these components is omitted for the sake of simple illustration of the entire configuration. The semiconductor multilayer structure 802 is an m-plane semiconductor multilayer structure which is formed by m-plane regrowth, and its growing plane is the m-plane.

The m-plane nitride-based semiconductor light-emitting device 801 may be, for example, a device from which the m-plane the sapphire substrate 811 was omitted. Further, it may be a device from which the m-plane sapphire substrate 811 and part of the nitride semiconductor film 870 are omitted. Omission of these components may be realized by, for example, polishing or the like after growth of the device structure of the m-plane nitride-based semiconductor light-emitting device 801.

So long as impurity doping for conductivity control is carried out on the raised-portion nitride semiconductor layers 830 and nitride semiconductor film 870 grown on the m-plane sapphire substrate as described above, an electrode can be directly formed at the interface 810 between the sapphire and the m-plane nitride semiconductor film after removal of the m-plane sapphire substrate 811. For example, when the raised-portion nitride semiconductor layers 830 and nitride semiconductor film 870 are doped with Si, the n-type conductivity can be obtained, and an n-electrode can be formed at the interface 810. In this case, in comparison to the structure of the present embodiment, a vertical structure is obtained which has electrodes at the upper surface and lower face of the device.

The semiconductor multilayer structure 802 of FIG. 41 includes an active layer 804 including an $Al_aIn_bGa_cN$ layer (a+b+c=1, a≥0, b≥0, c≥0), and an $Al_dGa_eN$ layer (d+e=1, d≥0, e≥0) 805. The $Al_dGa_eN$ layer 805 is on the opposite side to the substrate with respect to the active layer 804. Here, the active layer 804 is an electron injection region in the nitride-based semiconductor light-emitting device 801.

The active layer 804 of the present embodiment has a GaInN/GaN multi-quantum well (MQW) structure (e.g., 81 nm thick) in which $Ga_{0.9}In_{0.1}N$ well layers (e.g., 9 nm thick) and GaN barrier layers (e.g., 9 nm thick) are alternately stacked.

On the active layer 804, a p-type $Al_dGa_eN$ layer 805 is provided. The thickness of the p-type $Al_dGa_eN$ layer 805 is, for example, 0.2 to 2 μm. A region of the $Al_dGa_eN$ layer 805 bordering on the active layer 804 may be provided with an undoped GaN layer 806.

The semiconductor multilayer structure 802 of the present embodiment includes other layers. There is an $Al_uGa_vIn_wN$ layer (u+v+w=1, u≥0, v≥0, w≥0) 803 which is formed between the active layer 804 and the heterogeneous m-plane nitride semiconductor substrate 920. The $Al_uGa_vIn_wN$ layer 803 of the present embodiment is a first conductivity type (n-type) $Al_uGa_vIn_wN$ layer 803.

In the $Al_dGa_eN$ layer 805, the mole fraction of Al, d, is not necessarily uniform along the thickness direction. In the $Al_d$-$Ga_eN$ layer 805, the mole fraction of Al, d, may vary continuously or stepwise along the thickness direction. That is, the $Al_dGa_eN$ layer 805 may have a multilayer structure in which a plurality of layers having different Al mole fractions d are stacked, and the concentration of the dopant may vary along the thickness direction.

An electrode 807 is provided on the semiconductor multilayer structure 802. The electrode 807 of the present embodiment is in contact with a p-type semiconductor region and serves as part of the p-electrode (p-side electrode). The electrode 807 is realized by, for example, an Ag layer or a structure partially containing Ag. The thickness of the electrode 807 is, for example, 100 to 500 nm.

In the configuration of the present embodiment, an electrode 808 (n-electrode) is provided on part of an n-type $Al_uGa_vIn_wN$ layer (e.g., 0.2 to 2 μm thick) 803 on the m-plane nitride semiconductor substrate 920. In the shown example, in a region of the semiconductor multilayer structure 802 in which the electrode 808 is to be formed, recessed portions 809 are formed such that the n-type $Al_uGa_vIn_wN$ layer 803 is partially exposed. An electrode 808 is provided on the surface of the n-type $Al_uGa_vIn_wN$ layer 803 which is exposed at the recessed portions 809. The electrode 808 is realized by, for example, a multilayer structure of a Ti layer, an Al layer, and a Pt layer. The thickness of the electrode 808 is, for example, 100 to 200 nm.

(Other Embodiments)

The above-described light-emitting device of an embodiment of the present disclosure may be used as it is as a light source. However, if the light-emitting device of the embodiment is combined with a resin including a phosphoric material that produces wavelength conversion, for example, the device can be used effectively as a light source with an expanded operating wavelength range (such as a white light source).

Figure 42:
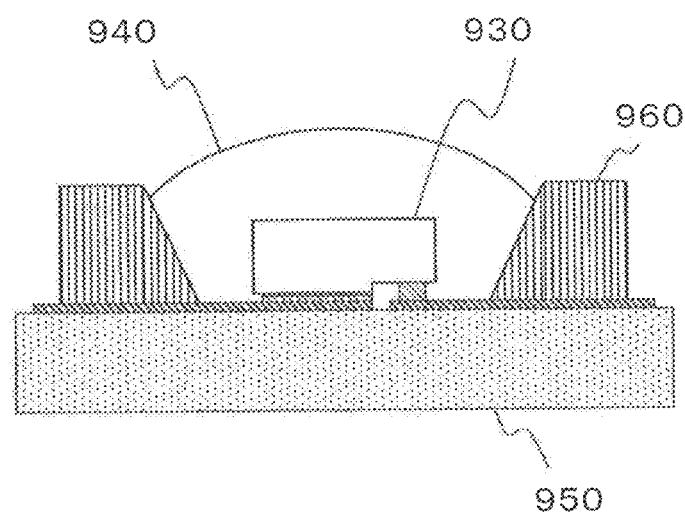
FIG. 42 is a cross-sectional view showing an embodiment of a white light source.

FIG. 42 is a schematic representation illustrating an example of such a white light source. The light source shown in FIG. 42 includes a light-emitting device 930 with the structure shown in FIG. 41 and a resin layer 940 in which particles of a phosphor such as YAG (yttrium aluminum garnet) are dispersed to change the wavelength of the light emitted from the light-emitting device 930 into a longer one. The light-emitting device 930 is mounted on a supporting member 950 on which a wiring pattern has been formed. And on the supporting member 950, a reflective member 960 is arranged so as to surround the light-emitting device 930. The resin layer 940 has been formed so as to cover the light-emitting device 930.

The principal surface that is the growing plane of the m-plane sapphire which is used as the substrate 811 of the light-emitting device 930 does not need to be perfectly parallel to the m-plane but may be inclined from the m-plane by a predetermined angle. The angle of the inclination is defined by an angle formed by the normal to the actual growing plane of the nitride semiconductor layer and the normal to the m-plane (m-plane without inclination). The actual growing plane can be inclined from the m-plane (m-plane without inclination) in the direction of a vector which is represented by a direction that is based on a certain crystal orientation such as, for example, c-axis, a-axis, and <11-22> directions. For example, the absolute value of the tilt angle θ may be not more than 5°, or not more than 1°, in the c-axis direction. In the a-axis direction, the absolute value of the tilt angle θ may be not more than 5°, or not more than 1°. Specifically, in the present disclosure, the "m-plane" includes a plane which is inclined from the m-plane (m-plane without inclination) in a predetermined direction by an angle in the range of ±5°. Within such an tilt angle range, the growing plane of the nitride semiconductor layer, as a whole, is inclined from the m-plane. However, it is inferred that, upon closer observation, a large number of m-plane regions are exposed. Thus, it is expected that a plane which is inclined from the m-plane by an angle of not more than 5° (absolute value) has the same characteristics as those of the m-plane. When the absolute value of the tilt angle θ is not more than 5°, decrease of the internal quantum efficiency due to a piezoelectric field can be prevented. Also, the "m-plane" of the present disclosure is globally inclined from the m-plane and includes a plane which has a plurality of m-plane steps.

The heterogeneous m-plane nitride semiconductor substrate 920 obtained by the m-plane nitride semiconductor Pendeo growth on the m-plane sapphire substrate according to the embodiment can naturally be used as an m-plane nitride semiconductor regrowth substrate for a non-LED light-emitting device (such as a semiconductor laser diode) or a device other than a light-emitting device (such as a transistor or a photodetector), and can realize cost reduction of these devices.

As described above, according to an embodiment, in epitaxial lateral overgrowth of an m-plane nitride-based semiconductor film by the Pendeo method, excellent surface flatness and higher quality can be realized using an m-plane sapphire substrate which is inexpensive and which can have a large diameter, and therefore, a high-efficiency non-polar m-plane light-emitting device can be provided at a low cost.

That is, according to an embodiment of the present disclosure, heterogeneous m-plane nitride semiconductor epitaxial lateral overgrowth is realized, and a high quality m-plane nitride semiconductor film which has a reduced density of dislocations and defects and a nitride-based semiconductor device which employs that m-plane nitride semiconductor film as the basic body can be provided.

As described above, in the heterogeneous nitride semiconductor growth, an m-plane nitride semiconductor film which has high quality and excellent surface flatness can be obtained by a epitaxial lateral overgrowth method, and abnormal growth of a semi-polar plane nitride semiconductor, such as the (11-22) plane, can be prevented. Therefore, light-emitting devices, such as LEDs and semiconductor lasers, and nitride-based semiconductor devices, such as electronic devices, which employ this heterogeneous m-plane nitride semiconductor film as the substrate, can be realized.

Next, the differences between the embodiments of the present disclosure and the prior art are described.

There are some reports on the Pendeo growth method of an m-plane nitride semiconductor grown on a heterogeneous substrate. In Applied Physics Letters 93, 142108 (2008), a SiO$_2$ mask is formed over an m-plane nitride semiconductor grown on a SiC substrate of which principal surface is the m-plane. Thereafter, regions in which the SiC substrate is exposed, which are to be raised-portion nitride semiconductor region and recessed portions, are formed by etching, and epitaxial lateral overgrowth is carried out, such that reduction of the dislocation density and stacking fault density is realized.

However, in the previously-described method of Applied Physics Letters 93, 142108 (2008), an expensive SiC substrate is used as the substrate, resulting in a cost increase. In nitride semiconductor growth with the principal surface being the c-plane, the lattice constant of the a-axis of the SiC substrate is closer to the lattice constant of the a-axis of the GaN, so that the lattice mismatch degree is small, and growth of a film which has relatively high quality is possible. However, in heterogeneous growth with the principal surface being the m-plane or the a-plane which is non-polar plane growth, the atomic arrangement in the c-axis direction of the nitride semiconductor is 2H. (The numeral before "H" represents the number of unit layers of Group III atoms and N atoms included in one period. The wurtzite crystal structure that is the crystal structure of the nitride semiconductor has two unit layers in one period.) On the other hand, the atomic arrangement in the c-axis direction of the SiC is 6H or 4H structure. Thus, there is a mismatch in the atomic arrangement in the c-axis direction. This is the reason that high density stacking faults are likely to occur in a nitride semiconductor film grown on a non-polar SiC substrate. Thus, in the nitride semiconductor growth with the principal surface being the m-plane, the SiC substrate is not necessarily suitable in view of the crystal quality.

When carrying out the Pendeo growth using a non-polar SiC substrate, the problem of semi-polar abnormal growth, which can occur in the Pendeo growth with the use of an m-plane sapphire substrate, would not occur. This is because the semi-polar abnormal growth is a problem which is inherent in the m-plane sapphire substrate.

In PCT INTERNATIONAL APPLICATION PUBLICATION NO. 2008/047907, a sapphire substrate is unevenly processed, and epitaxial lateral overgrowth is carried out, resulting in successful regrowth of an m-plane nitride semiconductor. The substrate used is a sapphire substrate of which principal surface is the a-plane. In this surface, an uneven structure having a shape of thin and elongated stripes, extending in the m-axis direction in the plane of the a-plane sapphire, are periodically formed by etching. In this case, the front surface (principal surface) of the raised portions to be formed is the a-plane, while the lateral surface is a facet of the c-plane (or a plane inclined from the c-plane). PCT INTERNATIONAL APPLICATION PUBLICATION NO. 2008/047907 discloses that, when a nitride semiconductor film is grown on the thus-processed a-plane sapphire substrate, the film can be grown from only the c-plane facet that is the lateral surface of the raised portions under some growth conditions.

On the c-plane sapphire, a nitride semiconductor of which principal surface is the c-plane grows. In this case, crystal growth occurs such that the a-axis of the sapphire and the m-axis of the nitride semiconductor film are parallel to each other. That is, the crystal orientation shifts by 30° in the plane. In PCT INTERNATIONAL APPLICATION PUBLICATION NO. 2008/047907, this relationship is utilized to grow the c-plane nitride semiconductor in a lateral direction from the c-plane sapphire facet plane of the raised portions. Further, the relationship that the a-axis of the sapphire and the m-axis of the nitride semiconductor film are parallel to each other is utilized to successfully grow a nitride semiconductor film of which principal surface is the m-plane.

In PCT INTERNATIONAL APPLICATION PUBLICATION NO. 2008/047907, as described above, the nitride semiconductor film is grown in a lateral direction from the c-plane facet that has a normal component which is parallel to a direction perpendicular to the longitudinal direction of the thin and elongated raised portion regions of the a-plane sapphire, and therefore, it is necessary to carry out etching somewhat deeply such that sufficient lateral surface regions are secured. In PCT INTERNATIONAL APPLICATION PUBLICATION NO. 2008/047907, unevenly-processed sapphire is formed so as to have a depth of not less than 700 nm. However, the sapphire is very hard, and the etching selection ratio with the mask material is small. Thus, in general, etching deep is difficult.

In PCT INTERNATIONAL APPLICATION PUBLICATION NO. 2008/047907, a nitride semiconductor layer is directly grown from a sapphire substrate. Therefore, nitride semiconductor films having the same plane orientation (in PCT INTERNATIONAL APPLICATION PUBLICATION NO. 2008/047907, –c plane GaN) grow from opposite lateral surfaces of the processed a-plane sapphire substrate, and the crystal plane orientation at connecting portions is discontinuous (in PCT INTERNATIONAL APPLICATION PUBLICATION NO. 2008/047907, the –c planes connect to each other), and therefore, high density defects occur at the connecting portions. PCT INTERNATIONAL APPLICATION PUBLICATION NO. 2008/047907 explains that these problems can be solved by appropriately selecting the growth conditions.

According to an embodiment of the present disclosure, for example, the Pendeo growth method such as illustrated in FIG. 4 is used as the basic epitaxial lateral overgrowth method. That is, the m-plane nitride semiconductor regions of the raised portions formed by the etching processing serve as the starting points of the epitaxial lateral overgrowth. Therefore, regrowth is started from the nitride semiconductor film. On the other hand, in PCT INTERNATIONAL APPLICATION PUBLICATION NO. 2008/047907, regrowth occurs from the processed sapphire lateral surfaces. In the present embodiment, as described herein, the nitride semiconductor regions serve as the core of the regrowth, and therefore, for example, in the case where the opposite lateral surfaces of the nitride semiconductor regions of the raised portions are the c-plane facets, these lateral surfaces are the +c plane and the –c plane, and occurrence of defects at the connecting portion 890 of FIG. 4(d) can be reduced.

In the embodiment of the present disclosure, it is only necessary to form regions from which nitride semiconductor layers are removed by etching, such as the recessed portions 850. Since growth lateral surfaces are formed as in PCT INTERNATIONAL APPLICATION PUBLICATION NO. 2008/047907, it is not necessary to deeply etch the sapphire substrate that is difficult to process.

PCT INTERNATIONAL APPLICATION PUBLICATION NO. 2008/047907 also describes an example in which an m-plane sapphire substrate is processed in the same way as the a-plane sapphire substrate. In that description, a problem that, in the case where the m-plane sapphire substrate is unevenly processed and a nitride semiconductor is regrown, a semi-polar plane of the (11-22) plane grows, is discussed. That is, it can also be seen from the results of PCT INTERNATIONAL APPLICATION PUBLICATION NO. 2008/047907 that Pendeo growth with the use of an m-plane nitride semiconductor film on an m-plane sapphire substrate is difficult to realize.

In the embodiment of the present disclosure, an m-plane nitride semiconductor film grown on an m-plane sapphire substrate is unevenly processed, and the raised portion m-plane nitride semiconductor regions are formed as the seed crystal, whereby a method for realizing Pendeo growth in which the nitride semiconductor regions rather than the sapphire substrate serve as the starting points of the regrowth is provided. In Pendeo growth in which the m-plane sapphire substrate is used as described above, the m-plane sapphire surface is exposed at the recessed portions 850, a problem occurs such that a semi-polar plane nitride semiconductor film grows concurrently with an m-plane nitride semiconductor. According to the embodiment of the present disclosure, the semi-polar plane abnormal growth can be prevented by appropriately selecting the uneven processing conditions, such as the in-plane mask tilt angle, the L&S pattern interval, the etching depth, etc. A high-quality and low-cost heterogeneous m-plane nitride semiconductor substrate can be realized in which the dislocation density and the stacking fault density are reduced by epitaxial lateral overgrowth. When such a wafer is used as the substrate of a light-emitting device such as LED, an internal electric field caused by spontaneous electrical polarization or piezoelectric polarization would not occur in a layer stacking direction of the active layer (the normal direction of the principal surface of the substrate) because the m-plane nitride semiconductor is a non-polar plane, and improvement in the emission efficiency is expected.

The present disclosure is applicable to a GaN-based semiconductor light-emitting device such as a light-emitting diode or a laser diode that operates at wavelengths over the ultraviolet range and the entire visible radiation range, which covers blue, green, orange and white parts of the spectrum. Such a light-emitting device is applicable to the fields of display, lighting, and optical data processing, for example. Also, the light-emitting device is applicable to electronic devices, for example.

Next, the results of examinations of improvement in the quality of a nitride-based semiconductor light-emitting device which is achieved by reduction of the polarization degree of light emitted from the nitride-based semiconductor light-emitting device are described.

It is known that, in a light-emitting device which includes a nitride semiconductor of which principal surface is a non-polar plane or semi-polar plane, light emitted from that active layer region has a polarization characteristic. As described in the article of "APPLIED PHYSICS LETTERS 92, (2008) 091105", this polarization characteristic is attributed to the optical anisotropy that is due to a low degree of symmetry of the crystal structure of non-polar and semi-polar plane nitride semiconductors. In the case of a nitride-based semiconductor light-emitting device which is fabricated on the c-plane that is a polar plane, the c-axis is parallel to the normal line of the principal surface (growing plane). For example, in the case of a nitride semiconductor with no strain, polarized light of which electric field vector is oriented in a direction perpendicular to the c-axis is mainly obtained. Therefore, in the case of conventional c-plane growth, the degree of symmetry of the crystal is high so that, when seen in the c-axis direction, each of the a-axis and the m-axis is present with the intervals of 60° (this is referred to as "sixfold symmetry"), and thus, light emitted in the c-axis direction is non-polarized light.

However, in non-polar plane and semi-polar plane growth in which the growing plane is a crystal plane which is different from the c-plane, the symmetry degree is low, so that emitted light is polarized light. For example, in a nitride-based semiconductor light-emitting device of which principal surface is the m-plane, polarized light of which electric field vector is parallel to the a-axis is mainly obtained from that surface.

Further, such a polarization characteristic is due to the structure of the valence band and therefore varies depending on the mole fraction of the Group III atom of the nitride semiconductor or the strain.

A semiconductor light-emitting device described in Japanese Laid-Open Patent Publication No. 2009-117641 has an active layer which is made of a Group III nitride semiconductor and of which growth principal surface is a non-polar plane or semi-polar plane in order to emit polarized light which has a high polarization ratio. The semiconductor light-emitting device includes an emission section which is configured to emit polarized light from the active layer, and slits which are provided in a light extraction surface from which the polarized light is to be extracted and which are lines and spaces that are narrower than the wavelength of the polarized light.

A light-emitting device described in Japanese Laid-Open Patent Publication No. 2008-305971 includes, in order to prevent decrease of the output efficiency of polarized light produced in an active layer, an emission section which is made of a Group III nitride semiconductor of which principal surface is a non-polar plane or semi-polar plane, in which a first semiconductor layer of the first conductivity type, the active layer, and a second semiconductor layer of the second conductivity type are stacked in this order, and which is configured to produce polarized light from the active layer, and an output section in which a plurality of stripe-shaped grooves extending in a direction perpendicular to the polarization direction of the polarized light are arranged along the polarization direction and has an output surface in the shape of a sawtooth wave. The polarized light is transmitted from the emission section through the output section and output from the output surface.

In this specification, light of which electric field intensity is deviated in a specific direction is referred to as "polarized light". For example, light of which electric field intensity is deviated in the X-axis direction is referred to as "X-axis direction polarized light". The X-axis direction is referred to as "polarization direction". Note that the "X-axis direction polarized light" not only means linearly-polarized light which is polarized in the X-axis direction but may include linearly-polarized light which is polarized in a different axial direction. More specifically, the "X-axis direction polarized light" means light in which the intensity (electric field intensity) of light transmitted through a "polarizer which has a polarization transmission axis extending in the X-axis direction" is higher than the electric field intensity of light transmitted through "a polarizer which has a polarization transmission axis extending in a different axial direction". Therefore, the "X-axis direction polarized light" includes not only linearly-polarized light and elliptically-polarized light which are polarized in the X-axis direction but also non-coherent light in which linearly-polarized light and elliptically-polarized light which are polarized in various directions are mixed together.

While the polarization transmission axis of the polarizer is rotated around the optical axis, the electric field intensity of light transmitted through the polarizer exhibits the strongest intensity, Imax, and the weakest intensity, Imin. The polarization degree is defined by the following formula (1):

$$\text{Polarization degree} = |I\text{max} - I\text{min}| / |I\text{max} + I\text{min}| \qquad \text{Formula (1)}$$

In the case of the "X-axis direction polarized light", when the polarization transmission axis of the polarizer is parallel to the X-axis, the electric field intensity of the light transmitted through the polarizer is Imax. When the polarization transmission axis of the polarizer is parallel to the Y-axis, the electric field intensity of the light transmitted through the polarizer is Imin. In the case of perfectly linearly-polarized light, Imin=0, and therefore, the polarization degree is equal to 1. On other hand, in the case of perfectly unpolarized light, Imax−Imin=0, and therefore, the polarization degree is equal to 0.

A nitride-based semiconductor light-emitting device that includes an active layer of which growing plane is the m-plane mainly emits the a-axis direction polarized light as described above. Here, the device also emits the c-axis direction polarized light and the m-axis direction polarized light. However, the c-axis direction polarized light and the m-axis direction polarized light have smaller intensities than the a-axis direction polarized light.

In the present embodiment, an active layer of which growing plane is the m-plane is discussed as an example, and the discussion is focused on the a-axis direction polarized light. Note that, in a nitride-based semiconductor light-emitting device grown on semi-polar planes, such as -r plane, (20-21) plane, (20-2-1) plane, (10-1-3) plane, and (11-22) plane, and other non-polar planes such as the a-plane, the degree of symmetry of the crystal is low, and therefore, light emitted from the active layer of that device has polarization characteristics. Thus, the same also applies to polarized light in a specific crystal direction.

In Japanese Laid-Open Patent Publication No. 2008-305971, maintaining the polarization characteristics that the light-emitting device has is intended. On the other hand, reducing the polarization characteristics is sometimes necessary depending on the use of light-emitting device.

In the case where a light-emitting device which has polarization characteristics is used as a light source, the reflectance varies depending on the angle between the orientation of the polarization (the orientation of the electric field vector of the polarization) and the incidence angle, and therefore, such a problem arises that the light distribution characteristics vary as compared with a light-emitting device which has no polarization. For example, in the case of an m-plane nitride-based semiconductor light-emitting device, the a-axis direction polarized light is emitted. Therefore, light from the light-emitting device is distributed larger in the c-axis direction than in the a-axis direction. That is, such a problem arises that the light distribution characteristics are largely distributed in the c-axis direction, and the light distribution characteristics are asymmetry between the a-axis direction and the c-axis direction and are therefore not uniform. Note that such light distribution characteristics are not seen in a conventional light-emitting device on the c-plane in which light emitted from the active layer has no polarization characteristics. That is, the light distribution characteristics in the conventional light-emitting device on the c-plane exhibit a uniform pattern with a high degree of symmetry.

The above problem that, in the m-plane nitride-based semiconductor light-emitting device of which principal surface is a non-polar plane, the light distribution characteristics are asymmetry is attributed to the fact that light emitted from the active layer of that device is polarized. This is attributed to the fact that the reflectance at the interface between the semiconductor layer and the air or between the semiconductor layer and the substrate varies depending on whether it is a p-wave in which the electric field vector of the polarized light is present in the incidence plane or an s-wave in which the electric field vector of polarization is perpendicular to the incidence plane.

Therefore, in the case where an LED device is applied to a commonly-employed lighting device or the like, if light emitted from the LED device is polarized light, it is important to reduce the polarization characteristics as much as possible, thereby improving the light distribution characteristics.

The present inventors examined the relationship, in a nitride-based semiconductor light-emitting device of which principal surface is the m-plane, between the polarization characteristics and light distribution characteristics of light emitted from the active layer and a plurality of stripe-shaped structures (stripe structures) that are provided on the side from which the light is to be emitted. As a result, the polarization characteristics of emitted light depends on the direction of a major electric field vector of polarized light produced in the active layer of the nitride-based semiconductor light-emitting device and the shape of the stripe structure which is formed so as to be traversed by the polarized light. Hereinafter, an embodiment of a light-emitting device according to the present disclosure is described with reference to the drawings.

In the drawings mentioned below, for the sake of simple description, elements which perform substantially the same functions are sometimes denoted by the same reference numerals. The present disclosure is not limited to the embodiments which will be described below.

(Fourth Embodiment)

Figure 43:
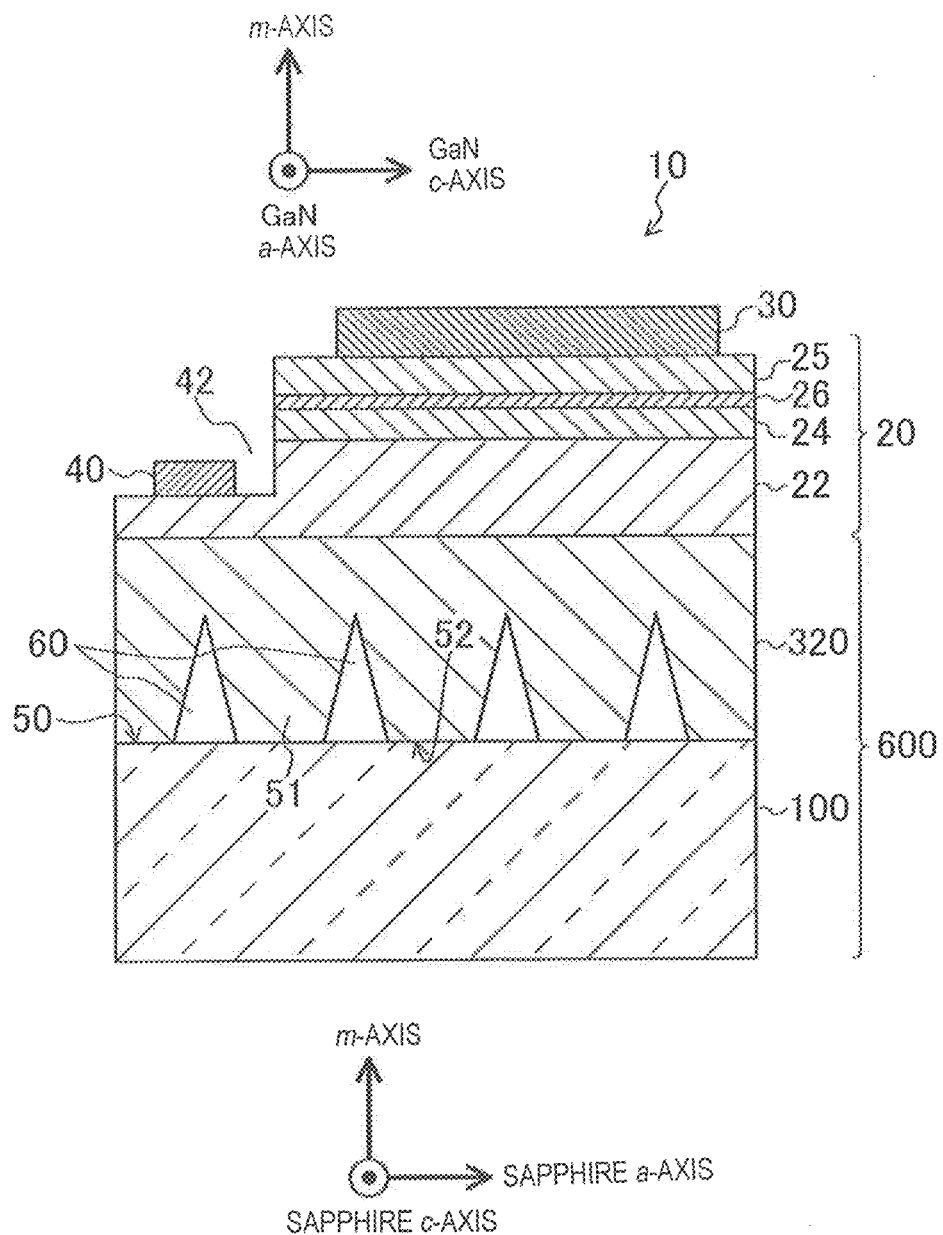
FIG. 43 is a schematic cross-sectional view showing a semiconductor light-emitting device of the fourth embodiment.

FIG. 43 schematically shows a cross-sectional configuration of a light-emitting device 10 according to the fourth embodiment. The light-emitting device 10 is a nitride-based semiconductor light-emitting device and has, for example, a nitride-based semiconductor multilayer structure which is made of an $Al_xIn_yGa_zN$ (where x+y+z=1, x≥0, y≥0, z≥0) semiconductor. The light-emitting device 10 is, for example, an LED device.

The light-emitting device 10 of the present embodiment includes a heterogeneous nitride semiconductor substrate 600, a semiconductor multilayer structure 20 provided on the heterogeneous nitride semiconductor substrate 600, and a p-electrode (p-side electrode) 30 and a n-electrode (n-side electrode) 40 which are provided on the semiconductor multilayer structure 20. The heterogeneous nitride semiconductor substrate 600 is obtained by growing a nitride semiconductor film 320 on a substrate for growth 100 of which principal surface is the m-plane. The growth substrate 100 is, for example, a sapphire substrate. Between the growth substrate 100 and the nitride semiconductor film 320, a plurality of stripe-shaped gaps 60 are formed by a selective growth method. The semiconductor multilayer structure 20 is a nitride-based semiconductor multilayer structure which is formed by regrowth of a nitride semiconductor, and its growing plane is the m-plane.

In the present embodiment, the growth substrate 100 and the growing plane of an active layer 24 may be inclined by an angle of not more than 5° with respect to the m-plane. This tilt angle is defined by an angle between the normal line of the surface of the sapphire substrate and the normal line of the m-plane. The direction of the inclination may be inclined in a certain direction in the m-plane which is crystallographically defined. For example, it may be the c-axis, a-axis, or <11-22> axis direction.

A plane which is inclined by an angle of not more than 5° with respect to the m-plane has the same characteristics as those of the m-plane. Therefore, the "m-plane" of the present disclosure includes a plane which is inclined by an angle of not more than 5° with respect to the m-plane. The −r plane, (20-21) plane, (20-2-1) plane, (10-1-3) plane, and (11-22)

plane, and the a-plane of the present disclosure may include planes which are inclined by an angle of not more than 5° with respect to these planes.

The semiconductor multilayer structure 20 includes the active layer 24 that is realized by an $Al_aIn_bGa_cN$ layer (where a+b+c=1, a≥0, b≥0, c≥0). The active layer 24 is an electron injection region in the light-emitting device 10 and is configured to mainly emit polarized light which is polarized in the a-axis direction. Since the growing plane of the active layer 24 is the m-plane, decrease of the emission efficiency due to piezoelectric polarization or the like is prevented, so that high efficiency emission light can be obtained.

The active layer 24 has a multi-quantum well (MQW) structure in which, for example, well layers having a thickness of not less than 1 nm and not more than 20 nm, which are made of $Al_uGa_vIn_wN$ (where u+v+w=1, u≥0, v≥0, w≥0), and barrier layers having a thickness of not less than 3 nm and not more than 50 nm, which are made of $Al_uGa_vIn_wN$ (where u+v+w=1, u≥0, v≥0, w≥0), are alternately stacked. The number of cycles in the quantum well structure may be not less than 2 cycles and not more than 30 cycles, for example. Also, the thickness of the barrier layer in the quantum well structure may be 9 nm, for example.

By respectively adjusting the mole fractions of Al and In in the multi-quantum well structure and the thicknesses of the well layer and the barrier layer, the state of the polarized light can be controlled.

For example, it is known that in a nitride-based semiconductor light-emitting device of which principal surface is the (11-22) plane that is a semi-polar plane, the direction of polarization varies depending on the mole fraction of In and the thickness of the well layer. However, in the case of a nitride-based semiconductor light-emitting device of which principal surface is the m-plane, the direction of polarization would not vary. The polarization state in the a-axis direction is maintained, while only the degree of polarization varies depending on the mole fractions and the quantum well structure. In the case of a nitride-based semiconductor light-emitting device of which principal surface is the (11-22) plane, variation of the polarization direction occurs in a region in which the mole fraction of 1n is as high as not less than 30%. In an active layer in which blue light emission with the mole fraction of 1n being greater than 20% is mainly obtained, the polarization direction maintains the polarization state in the m-axis direction that is perpendicular to the c-axis direction.

The multi-quantum well structure that forms the active layer 24 may be realized by well layers and barrier layers in both of which the mole fraction of Al is 0. In this case, it changes from the quaternary compound semiconductor to the ternary compound semiconductor, so that control of the composition is easy.

On the active layer 24, a p-type layer 25 is provided. The p-type layer is, for example, an $Al_dGa_eN$ layer (where d+e=1, d≥0, e≥0). The thickness of the p-type layer 25 is, for example, not less than 0.2 μm and not more than 2 μm. A region of the p-type layer 25 bordering on the active layer 24 may be provided with an undoped layer 26. The undoped layer 26 may be a GaN layer.

The mole fraction of Al in the p-type layer 25, d, does not need to be uniform along the thickness direction. In the p-type layer 25, the mole fraction of Al, d, may vary continuously or stepwise along the thickness direction. That is, the p-type layer 25 may have a multilayer structure in which a plurality of layers having different Al mole fractions d are stacked. The concentration of the dopant may vary along the thickness direction.

Between the active layer 24 and the heterogeneous nitride semiconductor substrate 600, an n-type layer 22 is provided. The n-type layer 22 is, for example, an $Al_uGa_vIn_wN$ layer (where u+v+w=1, u≥0, v≥0, w≥0). The thickness of the n-type layer 22 is, for example, not less than 0.2 μm and not more than 2 μm.

The p-electrode 30 is in contact with a p-type semiconductor region (p-type layer 25). The p-electrode 30 has, for example, Ag or a structure which contains Ag. The thickness of the p-electrode 30 is, for example, from 100 nm to 500 nm.

In the p-type layer 25, the mole fraction of Al near the interface with the p-electrode 30 may be 0 (Al mole fraction d=0). This enables improvement of the activation rate of the p-type impurity which serves as the dopant. The p-type layer 25 may be replaced by an InGaN layer which contains In. A region of the p-type layer 25 near the interface with the p-electrode 30 may have a higher p-type impurity concentration than in the other regions of the p-type layer 25 so as to function as a contact layer. In other words, a contact layer in which the p-type impurity concentration is higher than in the p-type layer 25 may be provided between the p-type layer 25 and the p-electrode 30.

The n-type layer 22 is partially exposed. On that exposed region, an n-electrode (n-side electrode) 40 is provided. The n-electrode 40 does not necessarily need to be provided on the surface of the n-type layer 22 but may be provided on the nitride semiconductor film 320. In this case, it is desirable that the nitride semiconductor film 320 also has n-type conductivity.

In the example shown in the drawing, a region of the semiconductor multilayer structure 20 in which the n-electrode 40 is to be formed has a recessed portion 42 such that the n-type layer 22 is partially exposed. The n-electrode 40 is provided on the surface of the n-type layer 22 which is exposed at this recessed portion 42. The n-electrode 40 has a structure which contains Al, for example. The thickness of the n-electrode 40 is, for example, not less than 100 nm and not more than 500 nm.

In the present embodiment, a plurality of gaps 60 extending in a stripe arrangement are provided near the interface 50 between the growth substrate 100 and the nitride semiconductor film 320. The gaps 60 may be provided, for example, in a region on the growth substrate 100 side or may be provided in a region on the nitride semiconductor film 320 side. In the nitride semiconductor film 320, a portion lying between adjacent two of the gaps 60 has a stripe structure. The gap 60 itself has a stripe structure which has a different refractive index from that of the nitride semiconductor. For example, the gaps 60 may be vacuum. The gaps 60 may contain a gas, e.g., the atmosphere employed in the crystal growth. Alternatively, the gaps 60 may contain a solid, e.g., a resin for sealing. Still alternatively, the gaps 60 may contain these gas and solid.

Such stripe structures may not necessarily be provided on the interface 50 but may be provided at a position which is traversed by the polarized light. That is, the stripe structures may be provided in any region between the active layer 24 and the growth substrate 100, in the major emission direction of light from the active layer 24. For example, the stripe structures may be provided in any region of the n-type layer 22, the nitride semiconductor film 320, and the growth substrate 100.

For example, the stripe structures may be provided on a nitride semiconductor layer which has a thickness of not less than 0 μm and not more than 10 μm from the interface 50. Alternatively, the stripe structures may be provided in a region inside the growth substrate 100 which is separated from the interface 50 by a distance of not less than 0 μm and not more than 10 μm.

In the light-emitting device 10, part of light emitted from the active layer 24 which is output upward in the drawing, i.e., light traveling from the active layer 24 toward the p-type layer 25, is reflected by the p-electrode which contains Ag and which has a high reflectance. Therefore, finally, the light from the light-emitting device is not emitted toward the p-electrode 30. The light emitted from the active layer 24 is mainly extracted from the growth substrate 100 side. Thus, the polarization characteristics can be reduced by providing the stripe-shaped gaps 60 on the light emission side. Hereinafter, the structure of the gaps 60 is described in detail.

The structure of the gaps 60 is described with reference to FIG. 44(a) and FIG. 44(b). FIG. 44(a) schematically shows a cross-sectional configuration near the interface between the growth substrate 100 and the nitride semiconductor film 320 in which the gaps 60 are provided. FIG. 44(b) shows a planar configuration where the structure shown in FIG. 44(a) is seen from the side of the m-plane that is the growing plane, i.e., seen in the m-axis direction.

As shown in FIG. 44(b), where the angle between the extending direction of the stripe-shaped raised portions (ridge portions) 51, i.e., the extending direction of the stripe-shaped gaps 60, and the a-axis direction in the active layer 24 is defined as the in-plane tilt angle β, the in-plane tilt angle β is set to a value which is not less than 3° and not more than 45°. Note that, as will be described later, all of the plurality of gaps 60 do not need to have equal angles. The respective gaps 60 may be formed to have different in-plane tilt angles β within the range of not less than 3° and not more than 45°, for example. The gaps 60 may be periodically formed. By forming the gaps 60 within this range of angle β, the polarization characteristics of light emitted from the active layer 24 can be reduced. As a result, the light distribution characteristics of emitted light is improved, so that the light extraction efficiency can be improved. The in-plane tilt angle β may be not less than 3° and not more than 35°. More specifically, the in-plane tilt angle β may be not less than 3° and not more than 10°.

In the example shown in FIG. 44(a), the gaps 60 are provided in the nitride semiconductor film 320. Provision of the gaps 60 leads to that a portion of the nitride semiconductor film 320 near the interface has an uneven shape, and as a result, a plurality of raised portions 51 are provided. Each of the raised portions 51 is formed such that its crest portion is oriented downward, i.e., toward the growth substrate 100 side, and has a bottom surface 52 which has a plane parallel to the interface 50 and at least one slope surface 53 which is not parallel to the interface 50. Note that, however, the raised portions 51 do not necessarily need to have the bottom surface 52.

FIG. 45(a) and FIG. 45(b) and FIGS. 46(a) to 46(c) show some examples of the cross-sectional configuration of the stripe-shaped gaps 60. These cross-sectional diagrams show cross-sectional shapes which are taken along a direction perpendicular to the extending direction of the stripe-shaped gaps 60.

For example, as shown in FIG. 45(a) and FIG. 45(b), the cross-sectional shape of the raised portions 51 may be an inverted trapezoidal shape or may be a trapezoidal shape. Alternatively, it may be a quadratic shape, although not shown. As shown in FIG. 46(a), it may be an inverted triangular shape which does not have the bottom surface 52. Alternatively, as shown in FIG. 46(b), the slope surface has a curved semicircular shape.

The cross-sectional structure of the gaps 60 may have a triangular shape or an inverted triangular shape as shown in FIG. 45(a) and FIG. 45(b). Alternatively, it may have a trapezoidal shape or a curved lateral surface, although not shown.

Alternatively, as shown in FIG. 46(c), the slope surface 53 of the gaps 60 may be formed by a plurality of slope surface portions. For example, as shown in FIG. 46(c), where the angle of the slope surface 53 is defined as $\alpha_i$, the raised portions structure 51 may have a plurality of slope surfaces defined by $\alpha_{i+1}, \alpha_{i+2}, \ldots, \alpha_k$, for example. When the number of angles α of this slope surface, k, is extremely large and the angles α are different from one another, the slope surface 53 is approximate to a curved surface, and the cross-sectional shape is semicircular or semielliptical as shown in FIG. 46(b). Further, the gaps 60 between these stripe-shaped structures do not necessarily need to be regularly arranged with equal intervals. Even when the periods are partially irregular, the effects of the present embodiment can be obtained.

In the present embodiment, providing stripe-shaped uneven structures on the side from which light from the active layer 24 is to be emitted and designing those uneven structures so as to partially have the slope surface 53 (angle α≠90°) are important. Therefore, for example, in the range where the gaps 60 are formed, the range of the angle $\alpha_i$ of the slope surface 53 can be selected from a wide range. The range of a plurality of angles $\alpha_i$ may be from 0° to 180°. More specifically, the range of the angles $\alpha_i$ may be not less than 0° and not more than 150°.

The height of each of the gaps 60 may be not less than λ/(4×n) where λ is the wavelength, and n is the refractive index of the nitride semiconductor film 320. More specifically, the height of each of the gaps 60 may be not less than λ/(4×n) and not more than 10 μm. For example, when the wavelength of light emitted from the active layer 24 is 450 nm, the refractive index of the GaN layer in this wavelength range is about 2.5. Therefore, the height of the gaps 60 may be at least not less than 45 nm. As is the case with the above-described periods of the stripe-shaped gaps 60, the height of the gaps 60 does not need to be equal among all of the structures.

Figure 47:
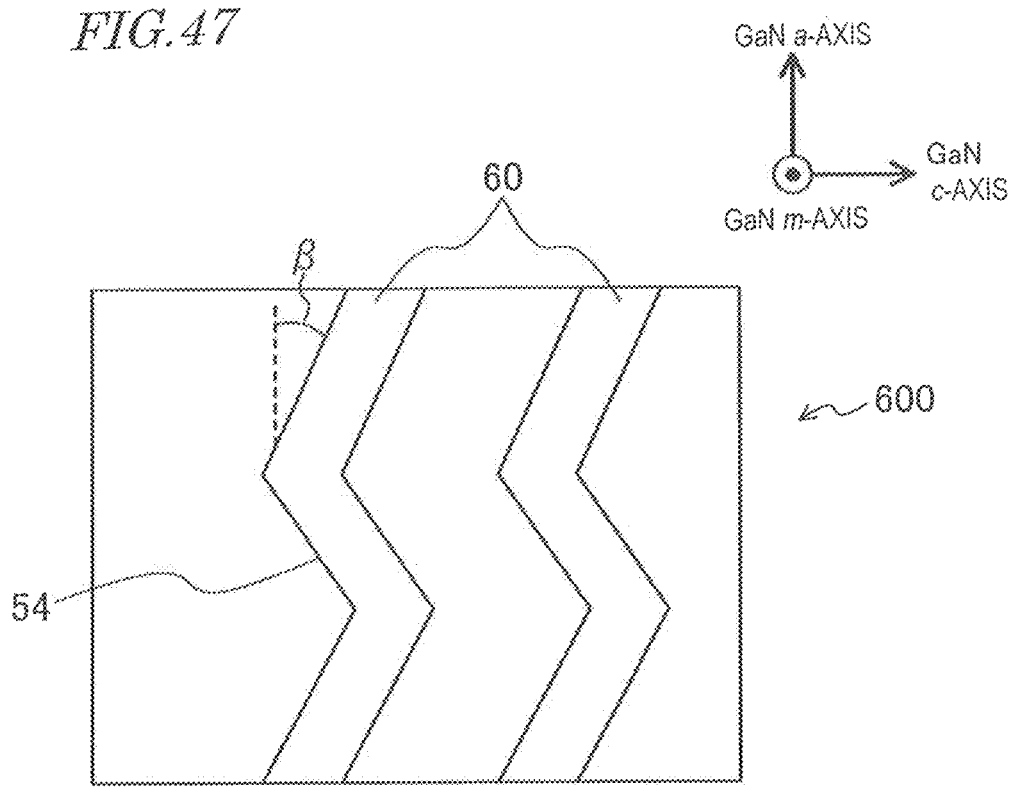
FIG. 47 is a schematic plan view of a heterogeneous nitride semiconductor substrate which shows a variation of the stripe structure.
Figure 48:
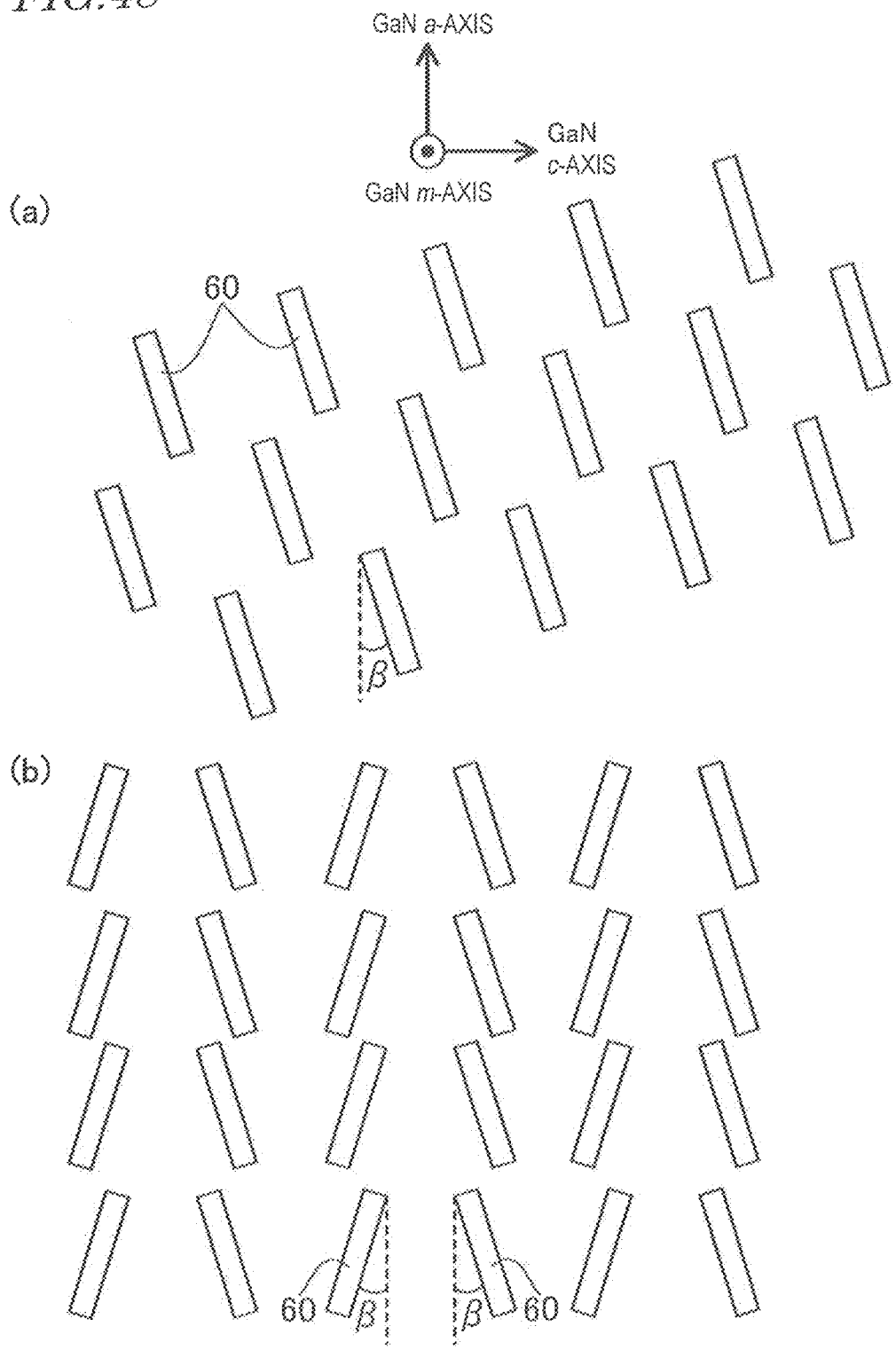
FIGS. 48(a) and 48(b) are schematic plan views of heterogeneous nitride semiconductor substrates which show other variations of the stripe structure.

As shown in FIG. 44(b), the stripe-shaped gap 60 forms a line 54 extending in the extending direction of the gaps 60. This line 54 is formed by, for example, the gap 60 and the wall surface of the nitride semiconductor film 320. This line 54 does not necessarily need to be a single line. As shown in FIG. 47, it may be formed by a stripe-shaped gap 60 which has an in-plane inclination that is defined by a plurality of angles β. Alternatively, the gaps 60 may be formed in a zigzag shape. Alternatively, the gaps 60 may be discontinuous as shown in FIG. 48(a). The range of the angle β may be 3°≤β≤45°. As shown in FIG. 48(b), the gaps 60 do not necessarily need to be inclined in the same direction in the plane. For example, the gaps 60 may be inclined in the +c axis direction of the nitride semiconductor from the a-axis by an angle of 3°≤β≤45°. On the contrary, the gaps 60 may be inclined in the −c axis direction. When the proportion of the gaps 60 which have such an tilt angle range is not less than 50% of all of the gaps 60, the remarkable effects of the present embodiment can be obtained.

As shown in FIG. 49(a), stripe structures which have different width dimensions may be periodically provided as the plurality of gaps 60. Alternatively, as shown in FIG. 49(b), structures which are only partially discontinuous may be provided as the plurality of gaps 60.

Next, the relationship between the gaps 60 and the polarization characteristics and light distribution characteristics of the light emitted from the light-emitting device 10 of which principal surface is the m-plane is described.

The light emitted from the nitride-based semiconductor light-emitting device of which principal surface is the m-plane is mainly polarized in the a-axis direction. As shown in FIG. 50(a), the propagation vector of the a-axis polarized light is in a direction perpendicular to the a-axis direction. Therefore, where the propagation vectors of the emitted light are, for example, k1, k2, . . . , these propagation vectors are present in a flat plane that is formed by the m-axis and the c-axis (which is referred to as "mc-plane" in this specification) and are parallel to this plane. Specifically, as shown in FIG. 50(b), light emitted from the m-plane nitride-based semiconductor light-emitting device is mainly emitted in a direction perpendicular to the a-axis so that, in the a-axis direction, the proportion of the emitted light relatively decreases. That is, the light has such light distribution characteristics that the radiation angle is wide in a direction perpendicular to the a-axis.

Figure 51:
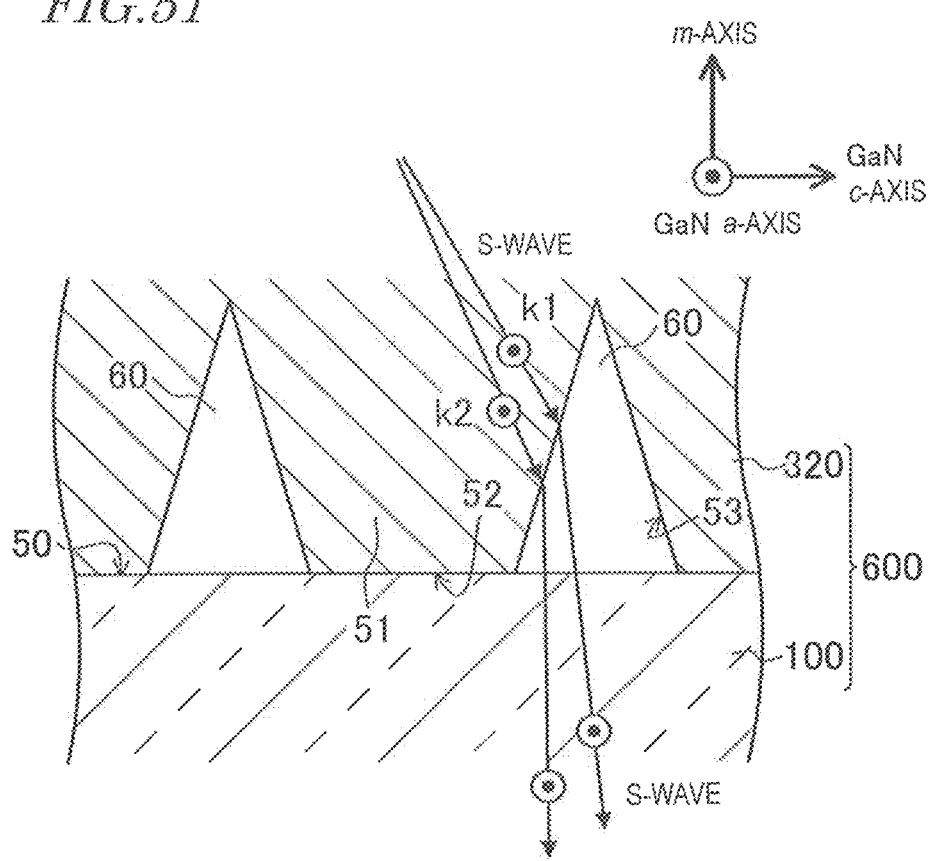
FIG. 51 is a schematic cross-sectional view showing an example of polarized light which is incident on a slope surface of a gap provided in a heterogeneous nitride semiconductor substrate in the case where the in-plane tilt angle β of the gap with respect to the a-axis direction is 0°.

FIG. 51 schematically shows an example where the stripe-shaped gaps 60 are formed so as to be parallel to the a-axis of the light-emitting device 10 of which principal surface is the m-plane (angle β=0°).

The stripe-shaped gaps 60 are provided at the interface between the growth substrate 100 on the light emission surface side and the nitride semiconductor film 320. In this case, the a-axis polarized light of emitted light is mainly incident as a s-wave onto the slope surface 53 of the gaps 60 and the bottom surface 52 of the raised portions 51. As previously described, in this case, c-axis polarized light is rarely emitted, and the propagation vector of the a-axis polarized light is parallel to the mc-plane. Therefore, the p-wave component is smaller than the s-wave component and is approximately 0. Therefore, in the case where the stripe-shaped gaps 60 are formed such that the in-plane tilt angle β=0°, the a-axis polarization characteristics of the light extracted from the light-emitting device 10 of which principal surface is the m-plane to the outside are maintained.

In the example of FIG. 51, when the stripe-shaped gaps 60 (raised portions 51) have the in-plane tilt angle β=0°, the a-axis polarized light emitted from the active layer 24 is incident on the stripe-shaped gaps 60 such that almost all of the incident light is the s-wave. The light extracted to the outside is also maintained as the s-wave, and therefore, the a-axis polarized state is likely to be maintained.

When the angle β is greater than 0°, the incident light includes not only the s-wave component but also the p-wave component, and therefore, the polarization degree is reduced. The effect of reducing this polarization degree can be obtained likewise even in the case of inclination from the a-axis direction of the nitride semiconductor to the +c axis direction or to the −c axis direction.

Figure 52:
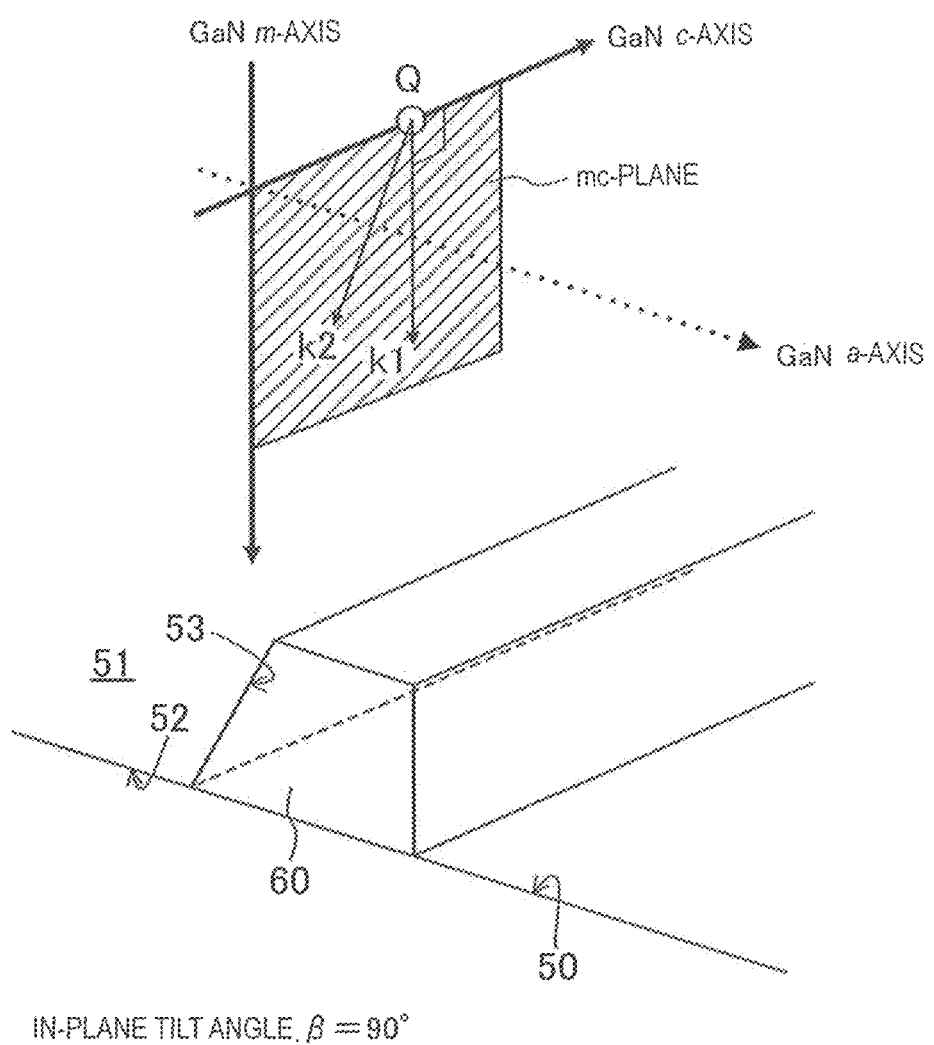
FIG. 52 is a schematic diagram showing an example of polarized light which is incident on a gap formed in a direction perpendicular to the polarization direction) (β=90°).

FIG. 52 schematically shows an example where the stripe-shaped gaps 60 are provided perpendicular to the a-axis of the light-emitting device 10 of which principal surface is the m-plane (in-plane tilt angle β=90°). In this case also, the propagation vector of light is parallel to the mc-plane. That is, it has such a light distribution characteristic that the radiation angle is wide in a direction perpendicular to the a-axis direction. For example, as in the case of the propagation vector k1 emitted from point Q, when the propagation direction is parallel to the m-axis direction, light is incident mainly as the p-wave on the slope surface 53 of the gap 60 and the bottom surface of the raised portion 51, while the s-wave is substantially 0. Thus, for the a-axis polarized light that has a propagation vector which is parallel to the m-axis, the polarization characteristic in the a-axis direction is maintained.

However, in this case, only a small portion of the light has a propagation vector which is parallel to the m-axis, while almost all of the light is parallel to the mc-plane, but its propagation direction is inclined in the c-axis direction as in the case of the propagation vector k2 shown in FIG. 52. When polarized light such as the propagation vector k2 is incident on the slope surface 53 of the gap 60, the incident light is an associated wave which contains not only the p-wave component but also the s-wave component, and therefore, the polarization is not maintained.

As described hereinabove, it is understood that the polarization degree of the light emitted from the light-emitting device structure depends on the in-plane tilt angle β of the gaps 60, and that the polarization degree can be maintained only when β is around 0°.

In this specification, the variation of the polarization degree with respect to the angle β is evaluated using a value which is referred to as "specific polarization degree", and discussed. The specific polarization degree refers to a value of the polarization degree that is obtained when the gaps 60 are inclined in the plane by an arbitrary angle, which is normalized with the polarization degree that is obtained when the in-plane tilt angle β=0°. This is defined by Formula (2) as follows:

Specific polarization degree=(the polarization degree of a light-emitting device which has stripe structures with arbitrary in-plane tilt angle β)/(the polarization degree of a light-emitting device which has stripe structures with in-plane tilt angle β=0°)   Formula (2)

The specific polarization degree represented by Formula (2) has a value which is approximately 1 when the angle β is smaller than about 3°. When the angle β is not less than 3°, it is understood that, the specific polarization degree abruptly decreases so that the polarization degree can be reduced.

As illustrated in FIG. 50(b), light emitted from a nitride-based semiconductor light-emitting device of which principal surface is the m-plane is a-axis polarized. Therefore, its propagation vector is parallel to the mc-plane, and it is rarely present in the ma-plane. Expressing this as the distribution of light, it can be said that a wider light distribution is detected in the c-axis direction than in the a-axis direction.

Such a characteristic can be a cause of the asymmetry of the light distribution characteristics. That is, an m-plane nitride-based semiconductor light-emitting device which has a flat light emission surface, and which does not have stripe structures on the light emission surface side, has different light distribution characteristics in the a-axis direction and the c-axis direction, leading to an asymmetrical result. The light distribution characteristic is widely distributed in the c-axis direction than in the a-axis direction. The light distribution characteristic in the c-axis direction is 0°, i.e., there is a tendency that the light intensity in a direction which is inclined in the c-axis direction is stronger than in the m-axis direction.

This asymmetry of the light distribution characteristics can also be reduced by forming the gaps 60 of the present embodiment on the light emission surface side. FIG. 53(a) schematically shows an example of a light-emitting device which has an interface between GaN and sapphire and which has a flat emission surface. FIG. 53(b) schematically shows an example of a light-emitting device which has gaps 60 with the angle β=0° in the emission surface. As shown in FIG. 53(a), in the case where the emission surface is flat, when light emitted from the GaN layer side is transmitted with a certain incidence angle θ1 to the sapphire substrate side, θ2 of the transmitted light is greater than θ1, and it is likely to be emitted as light which is more inclined to the c-axis direction.

This is attributed to the fact that θ2>θ1 always holds true because the refractive index of the nitride semiconductor layer is higher than that of the sapphire or air according to the Snell's law which will be described later. This is a cause of an increase in the asymmetry of the light distribution characteristics which have been previously described.

On the contrary, in the case where the gaps 60 shown in the present embodiment are formed on the light emission surface side, for example, when the stripe-shaped gaps 60 are provided in the a-axis direction of the angle β=0° as shown in FIG. 53(*b*), the incidence light which has a propagation vector in the mc-plane is likely to be incident on the interface 50 at a smaller angle than in the case of FIG. 53(*a*). As a result, in the mc-plane, the incident light is likely to be inclined in the m-axis direction than in the c-axis direction. That is, the light distribution characteristics of a conventional m-plane nitride-based semiconductor light-emitting device which has a flat light emission surface are widely distributed in the c-axis direction. On the other hand, in the case where the gaps 60 of the present embodiment are provided, the light intensity distribution on the m-axis side, i.e., in the major axis direction of the light-emitting device (vertical direction), is stronger. Thus, the light distribution characteristic in the c-axis direction is improved, and the asymmetry with the a-axis direction can be improved. Further, as described herein, the gaps 60 shown in the present embodiment also contribute to improvement of the light extraction efficiency.

Figure 54:
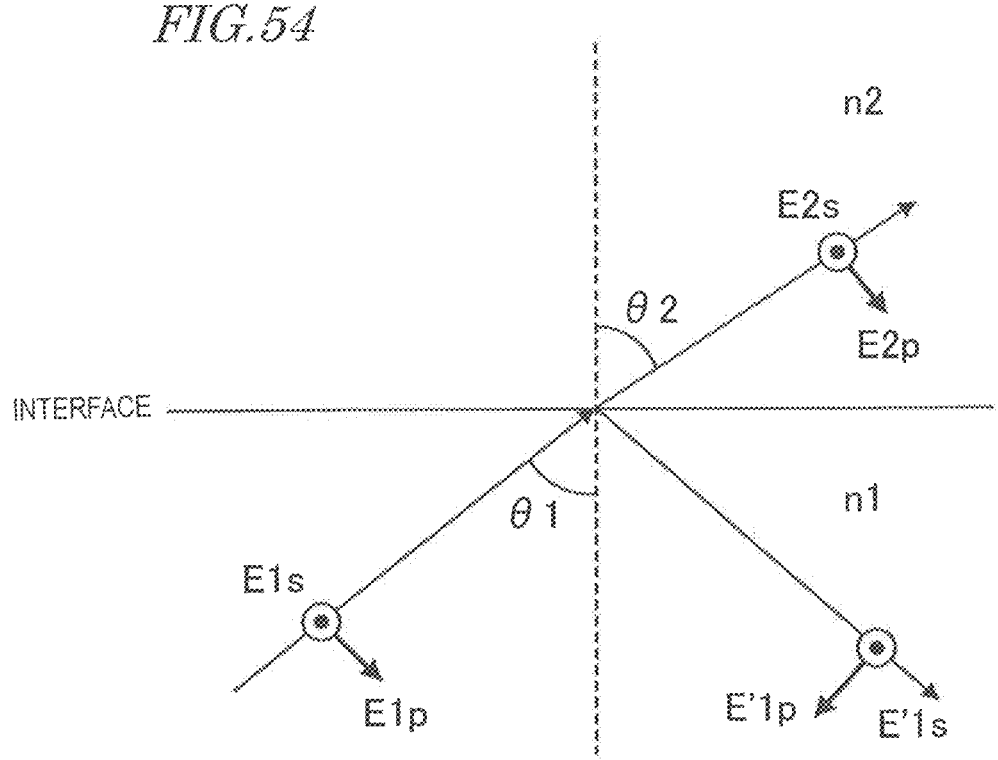
FIG. 54 is a diagram showing the relationship between the incidence angles of p-wave and s-wave and the reflectance and transmittance.

FIG. 54 shows incidence, reflection, and refraction of the p-wave and the s-wave at the interface of a material. The energy reflectances at such an interface ("Rp" for the p-wave and "Rs" for the s-wave) can be obtained according to the Snell's law (Formula (3)) and the Fresnel's formula (Formula (4), Formula (5)) as follows:

$$n_1 \sin \theta_1 = n_2 \sin \theta_2 \qquad \text{Formula (3)}$$

$$R_p = \tan^2(\theta_1 - \theta_2)/\tan^2(\theta_1 + \theta_2) \qquad \text{Formula (4)}$$

$$R_s = \sin^2(\theta_1 - \theta_2)/\sin^2(\theta_1 + \theta_2) \qquad \text{Formula (5)}$$

In the light-emitting device according to the present embodiment, light emitted from the active layer 24 propagates from the nitride semiconductor layer of a high refractive index to the air layer of a low refractive index.

Figure 55:
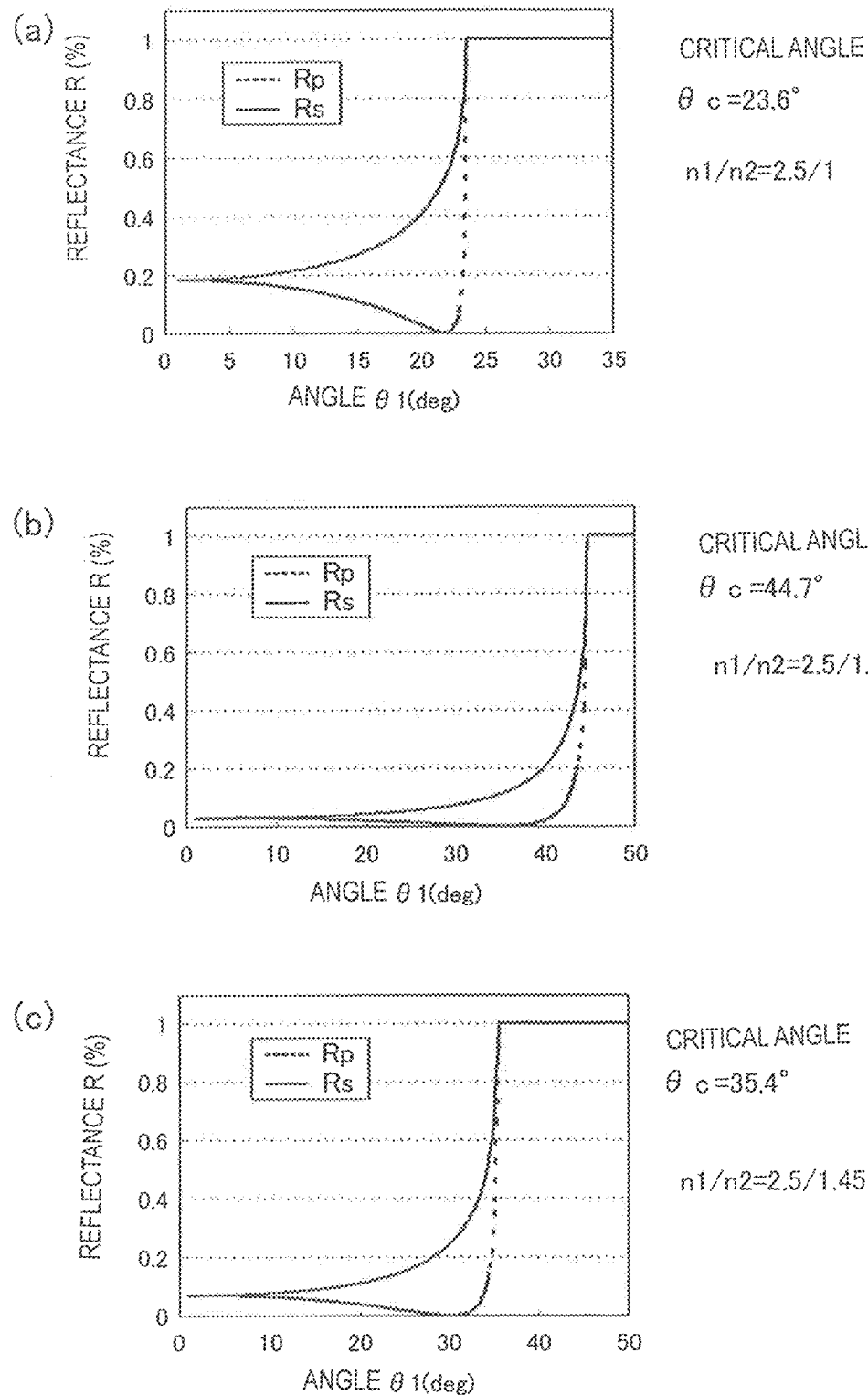
FIGS. 55(a) to 55(c) are graphs showing the calculation results of the incidence angle dependence of the energy reflectances Rp and Rs of the p-wave and the s-wave at interfaces which have different refractive indices.

FIG. 55(*a*) shows the calculation results of the incidence angle $\theta_1$ dependence of the energy reflectances $R_p$, $R_s$ of the p-wave and s-wave in the case where, in FIG. 54, the layer of the refractive index $n_1$ is the GaN layer, and the layer of the refractive index $n_2$ is the air.

In a region where the incidence angle is smaller than 23°, the reflectances for both of the p-wave and the s-wave are relatively low, and the light emitted from the nitride semiconductor layer can be readily extracted to the outside. In this angular range, the reflectance of the p-wave is lower than the reflectance of the s-wave. Near 22°, the reflectance of the p-wave is 0. This is called a Brewster's angle.

On the other hand, as in the present embodiment, it is known that when light travels from a material of a high refractive index to a material of a low refractive index, total reflection occurs. An incidence angle at which total reflection occurs is referred to as "critical angle $\theta_c$". The critical angle $\theta_c$ refers to a value of $\theta_1$ which is obtained when $\theta_2 = 90°$ in the Snell's law represented by Formula (3). That is, at the interface between the nitride semiconductor and the air, the critical angle $\theta_c$ is near 23°, and therefore, light which is incident on the interface at an angle greater than this angle is totally reflected, so that the light cannot be efficiently extracted to the outside of the light-emitting device. When such a phenomenon occurs, the light is not extracted to the outside, and it can be a cause of decrease of the external quantum efficiency of the light-emitting device.

FIG. 55(*b*) and FIG. 55(*c*) show the calculation results at the interface between the GaN layer and the sapphire and the interface between the GaN layer and the $SiO_2$ for the sake of comparison.

The gap 60 of the present embodiment has a slope surface 53 in part of its structure. With such a slope surface formed, the incidence angle is smaller than the critical angle as compared with a flat light emission surface in some cases (see FIG. 53(*b*), for example). In this case, the reflectance is low so that large part of the light is extracted to the outside, and thus, the light extraction efficiency and the external quantum efficiency can be improved.

The above-described effect of improving the light distribution characteristics and the light extraction efficiency is attributed to such features that light emission obtained from an m-plane nitride semiconductor is a-axis polarized and that the propagation vector of that light includes large components which are parallel to the mc-plane. Accordingly, the light intensity distribution is widely distributed in the c-axis direction than in the a-axis direction. Therefore, by forming the stripe-shaped uneven structure so as to be perpendicular to the c-axis, the light distribution characteristics and the light extraction efficiency can be improved. From the viewpoint of improving the light distribution characteristics and the light extraction efficiency, it is designed such that the polarization direction of the light emitted from the active layer 24 and the extending direction of the stripe structures are parallel to each other.

Therefore, when the a-axis polarization degree in the m-plane nitride-based semiconductor light-emitting device is maintained, it is desirable that the angle β is near 0°, i.e., the stripe structures are formed along the a-axis direction. Even under this condition, the light distribution characteristics and the light extraction efficiency can be improved.

On the other hand, by forming the stripe-shaped gaps 60 so as to be traversed by the emitted light, the light distribution characteristics and the light extraction efficiency can be improved. In addition to these effects, by determining the angle β of the stripe-shaped gaps 60 with respect to the a-axis direction so as to be greater than 0°, the polarization degree of the emitted light can be reduced.

That is, the range of the in-plane tilt angle β of the stripe-shaped gaps 60 in which reduction of the a-axis polarization degree and the effect of improving the light distribution characteristics and the light extraction efficiency, which are the major objects of the present embodiment, can be achieved is not less than 3° and not more than 45°. The value of the angle β may be not less than 3° and not more than 35°. More specifically, the value of the angle β may be not less than 3° and not more than 10°.

<Configuration of Light-Emitting Device 10 with Ridge Portions 51 and Gaps 60 Lying Therebetween>

Hereinafter, the configuration and manufacturing method of a nitride-based semiconductor light-emitting device which has gaps 60 near the interface are described in detail.

In the present embodiment, the nitride semiconductor layer is premised on a structure of which principal surface is a non-polar or semi-polar plane. Light emitted from such a nitride semiconductor structure of which principal surface is a non-polar plane or semi-polar plane has polarization, and the stripe-shaped gaps 60 provided on the light emission surface side enable reduction of the polarization degree and improvement of the light distribution characteristics and the light extraction efficiency.

In the present embodiment, a method for forming the stripe structures near the interface between the growth substrate 100 and the grown nitride semiconductor film 320 is described in detail, rather than a case where the stripe structures are formed in the rear surface of the growth substrate 100, i.e., a surface of the growth substrate 100 which is opposite to the principal surface on which epitaxial growth is to be carried out.

For example, in the case of a non-polar plane or semi-polar plane nitride-based semiconductor light-emitting device which is grown on the growth substrate 100 using sapphire, the effects of the present embodiment can be obtained by forming the stripe structures on the rear surface of the sapphire substrate. However, the sapphire substrate that is commonly employed in crystal growth of a nitride semiconductor has high hardness and is difficult to process.

In view of such, in the present embodiment, the rear surface of the growth substrate 100 is not processed. The stripe-shaped gaps 60 are formed in the front surface of the growth substrate 100 before growth of the nitride semiconductor film 320, or in the nitride semiconductor film 320 having a thickness of about several nanometers to several micrometers which is grown on the substrate 100.

By using such a method, the stripe-shaped gaps 60 can be readily formed on the principal surface of the growth substrate 100 without directly processing the substrate, even when the hardness of the growth substrate 100 is high. Here, the stripe structures are provided on the light emission surface side when seen from the active layer 24, and therefore, the polarization degree of emitted light can be reduced, and the light distribution characteristics and the light extraction efficiency can be improved.

As the growth substrate 100 of the present embodiment, a substrate on which a nitride semiconductor that has a non-polar plane or semi-polar plane can be grown is used. For example, the growth substrate 100 used may be a GaN bulk substrate which is a nitride semiconductor substrate. That is, the gaps 60 may be provided near the interface between the nitride semiconductor film 320 and the GaN bulk substrate. The GaN bulk substrate may be a substrate on which a non-polar plane or semi-polar plane can be grown. It may also be a GaN bulk substrate of which principal surface is the a-plane or m-plane, or a GaN bulk substrate of which principal surface is a semi-polar plane, such as (11-22) plane, (2-201) plane, or (2-20-1) plane.

However, in view of the existing technology, a GaN bulk substrate which is used in crystal growth of a nitride-based semiconductor device of which principal surface is a non-polar plane or semi-polar plane is expensive, and furthermore, increasing the diameter of the substrate is difficult.

For example, the price of an existing GaN bulk substrate of which principal surface is the m-plane is higher than that of a sapphire substrate of the same size by two or more orders of magnitude. The size of the m-plane GaN substrate is a square of about several centimeters on each side. Even in the case of a c-plane GaN bulk substrate, increasing the diameter so as to exceed about 5.1 cm (=2 inches) is difficult according to the existing technology. On the other hand, a sapphire substrate, which is one of the heterogeneous substrates, is presently inexpensive, e.g., about several thousands of Japanese yens for the two-inch size, and increase of the diameter to about 10.2 cm (=4 inches) or about 15.2 cm (=6 inches) or greater has already been realized.

Thus, even when a GaN bulk substrate is used as the growth substrate 100, a similar polarization degree reducing effect can be obtained. However, from the viewpoint of cost and increase of the diameter, using a substrate which is made of a material different from the nitride semiconductor, i.e., a hetero-substrate, is desired.

As the hetero-substrate, for example, sapphire, silicon carbide, (SiC), silicon (Si), gallium oxide ($Ga_2O_3$), lithium aluminum oxide ($LiAlO_2$) zinc oxide (ZnO), or the like, can be suitably used. For example, as the substrate for m-plane nitride semiconductor growth, m-plane sapphire, m-plane SiC, and (100) $LiAlO_2$ substrates have been reported.

In the case of a nitride-based semiconductor light-emitting device of which principal surface is the m-plane, the surface of the active layer 24 may be at least parallel to the m-plane or controlled to have an angle of ±5° with respect to the m-plane. Within a range where that condition is met, a hetero-substrate can be appropriately selected.

The effect of the present embodiment is valid even when silicon (Si) is used for the hetero-substrate. The Si substrate is inexpensive, and increase of the diameter of the Si substrate can be readily achieved. Further, it is known that growth of a nitride semiconductor of a semi-polar plane or non-polar plane is enabled by a growth method in which a facet plane of Si is used. In the present embodiment, the stripe-shaped gaps 60 are provided near the interface between Si and the nitride semiconductor layer, whereby the above-described effect can be obtained. However, since the Si substrate absorbs visible light, the light extraction efficiency decreases. Thus, when using a substrate which absorbs emitted light from the active layer 24, such as the Si substrate, it is desired that the Si substrate is removed after formation of the gaps 60.

In the case of, for example, sapphire which absorbs only small part of the visible light in the growth substrate 100, the growth substrate 100 does not necessarily need to be removed. However, even when the substrate is removed, the effect of the present embodiment can be obtained so long as the gaps 60 are provided in the nitride semiconductor layer which has an interface with the substrate before removal.

In the present embodiment, a manufacturing method of the heterogeneous nitride semiconductor substrate 600 in the light-emitting device 10 in which an m-plane nitride semiconductor on an m-plane sapphire substrate is the basic body is described with reference to the drawings. In the drawings mentioned below, for the sake of simple description, elements which perform substantially the same functions are denoted by the same reference numerals. Note that the present disclosure is not limited to the embodiments which will be described below.

In the present embodiment, as the seed crystal film or regrown film which is to be grown on a hetero-substrate, a gallium nitride layer (GaN layer) is mainly described. However, these layers may be layers which contain at least one of Al, In, and B. Further, the seed crystal or regrown film does not need to be formed by only a GaN layer but may contain, for example, only a single $Al_xGa_yIn_zN$ layer (where $0 \leq x, y, z \leq 1$, $x+y+z=1$) or may contain a plurality of $Al_xGa_yIn_zN$ layers ($0 \leq x, y, z \leq 1$, $x+y+z=1$) having different compositions which are alternately stacked. Alternatively, the film may have a configuration in which boron (B) is further contained in these layers.

FIG. 56(a) to FIG. 56(d) illustrate a method for forming stripe-shaped gaps in a region near the interface between a growth substrate and a nitride semiconductor film grown thereon.

First, as shown in FIG. 56(a), a nitride semiconductor layer 110 is grown on a growth substrate 100 of which growing plane is the m-plane. Then, a mask 120 which is made of a dielectric or oxide is selectively formed. The mask material used may be, for example, silicon oxide ($SiO_2$), silicon nitride (SiN), silicon oxynitride (SiON), zirconium oxide (ZrO), zinc oxide (ZnO), gallium oxide (Ga$_2$O$_3$), or aluminum oxide (Al$_2$O$_3$).

Then, as shown in FIG. 56(b), etching is carried out on the nitride semiconductor layer 110 and upper part of the growth substrate 100 using the mask 120, whereby recessed portions 210 are formed at which the growth substrate 100 is exposed through the mask 120.

As described above, an unevenly-processed substrate 500 is formed that has stripe-shaped nitride semiconductor layers 110a, which remain without being removed by the etching and which are raised portions that serve as starting points of regrowth, and recessed portions 210 at which the growth substrate 100 is exposed by etching. Note that etching which is carried out on the upper part of the growth substrate 100 is over-etching which is carried out such that the nitride semiconductor layer 110 does not remain. Details of this over-etching will be described later.

Then, as shown in FIG. 56(c), nitride semiconductor portions 310 are regrown on the unevenly-processed substrate 500, so that regrowth occurs preferentially from the stripe-shaped nitride semiconductor layers 110a. Further, by appropriately selecting the growth conditions, regrown nitride semiconductor portions 310 undergo lateral growth from the opposite lateral surfaces of the stripe-shaped nitride semiconductor layers 110a, and the growth advances so as to cover the recessed portions 210 in which the growth substrate 100 is exposed.

Then, the growth is continued so that the laterally-grown nitride semiconductor portions 310 connect to one another, thereby forming a connecting portion 410 as shown in FIG. 56(d). As a result, the bottom surfaces 210a of the recessed portions 210 formed in the exposed growth substrate 100 are covered with the regrown film. The growth is further continued so that, in this turn, the nitride semiconductor portions 310 grow in a direction perpendicular to the principal surface of the growth substrate 100, i.e., in the m-axis direction, so as to entirely cover the mask 120, so that connecting portions 400 are also formed above the mask 120. Finally, a flat nitride semiconductor film can be obtained.

In this case, between the recessed portions 210 and the laterally-grown nitride semiconductor portions 310, the gaps 60 are produced in which the epitaxial film is not present. These gaps 60 have a structure extending in the shape of a stripe and include the slope surfaces 53 and the bottom surface 52.

As described herein, uneven processing is carried out on the growth substrate 100 and the nitride semiconductor layer 110 regrown on the growth substrate 100 such that the unevenly-processed substrate 500 is prepared that has the stripe-shaped nitride semiconductor layers 110a which form the raised portions and the recessed portions 210 in which the growth substrate 100 is exposed. When regrowth of the nitride semiconductor portions 310 is carried out on this prepared unevenly-processed substrate 500, the stripe-shaped gaps 60 can be formed parallel to the extending direction of the stripe-shaped nitride semiconductor layers 110a that form the raised portions.

In the step of obtaining the stripe-shaped gaps 60 by the above-described method, regrowth of the nitride semiconductor portions 310 starts from the stripe-shaped nitride semiconductor layers 110a and advances in lateral directions. Therefore, some of dislocations which occur at that interface in heterogeneous growth and which are included in the nitride semiconductor layer 110 bend in lateral directions rather than in the m-axis direction that is the vertical direction. As a result, thanks to the recessed portions 210, the density of dislocations and defects can be greatly reduced. Accordingly, the quality of the surface region of the regrown nitride semiconductor portions 310 can be improved.

The method described hereinabove is a growth method which is commonly referred to as "epitaxial lateral overgrowth". The method of forming the gaps 60 according to the present embodiment employs the epitaxial lateral overgrowth method so that the effect of reducing the polarization degree can be achieved while the dislocation density and the stacking fault density can be reduced. In such epitaxial lateral overgrowth, it is generally considered that the depth of the recessed portions 210 formed by etching is desirably as large as possible, as compared with the stripe-shaped nitride semiconductor layers 110a that form the raised portions. This is because there is a probability that the nitride semiconductor portions 310 grow from the surface of the growth substrate 100 in the recessed portions 210 which is exposed by etching in the regrowth.

In this growth method, regrowth occurs only from the stripe-shaped nitride semiconductor layers 110a so that the density of dislocations and defects can be reduced. Thus, it is important to prevent regrowth from the bottom surfaces 210a of the recessed portions 210 formed by etching. If the regrowth occurs, it is important to prevent the regrowth from affecting the lateral regrowth.

As the etching depth becomes larger, it is more difficult for the source materials used in regrowth to reach the bottom surfaces 210a of the recessed portions 210. The growth occurs preferentially only from the nitride semiconductor layers 110 that form the raised portions so that epitaxial lateral overgrowth is enhanced. Even if growth occurs in the recessed portions 210, the larger etching depth contributes to reduction of the effect on and the interference with the regrown film.

The method of forming the gaps 60 according to the epitaxial lateral overgrowth which has previously been described with reference to FIG. 56 can be realized without using the mask 120 that is made of a dielectric or the like. Removing the mask 120 that is made of a dielectric has such an advantage that, for example, contamination with impurities from the material itself that forms the mask 120 can be prevented.

(A Variation of the Manufacturing Method)

FIG. 57(a) to FIG. 57(d) illustrate a growth method in the case where a mask for regrowth is not used.

First, in the step shown in FIG. 57(a), a nitride semiconductor layer 110 and a mask 121 are sequentially formed on a growth substrate 100 as in FIG. 56(a).

Then, as shown in FIG. 57(b), an unevenly-processed substrate 510 which has unevenness in the surface is formed by etching with the use of the mask. Thereafter, in this variation, the mask 121 is removed.

Then, as shown in FIG. 57(c), the unevenly-processed substrate 510 from which the mask 121 has been removed is used as a substrate for regrowth, and a nitride semiconductor film 320 is regrown from the stripe-shaped nitride semiconductor layers 110a that form the raised portions. Here, the regrowth occurs such that lateral growth occurs so as to cover the recessed portions 210 while growth also occurs at the upper surfaces of the stripe-shaped nitride semiconductor layers 110a. Finally, as a result of continuation of the regrowth, the flat nitride semiconductor film 320 can be obtained as shown in FIG. 57(d).

In this variation, the mask 121 is not present in the nitride semiconductor film 320, and therefore, contamination with impurities from the mask that is made of a dielectric, such as SiO₂, would not occur. Therefore, there is such an advantage that a high quality nitride semiconductor film 320 can be obtained.

Furthermore, a commonly-employed resist film can be used as the mask 121, and therefore, the step of forming the dielectric mask can be omitted. Thus, there is another advantage that the manufacture cost can be reduced.

Hereinafter, a method for forming the gaps 60 which have the in-plane tilt angle β with the use of the structure of the variation of FIG. 57 from which the mask 121 is to be removed is described. The difference from the formation method of FIG. 56 is only the presence/absence of the mask. Therefore, the polarization degree reducing effect, for example, can also be obtained likewise in the case of FIG. 56.

Figure 58:
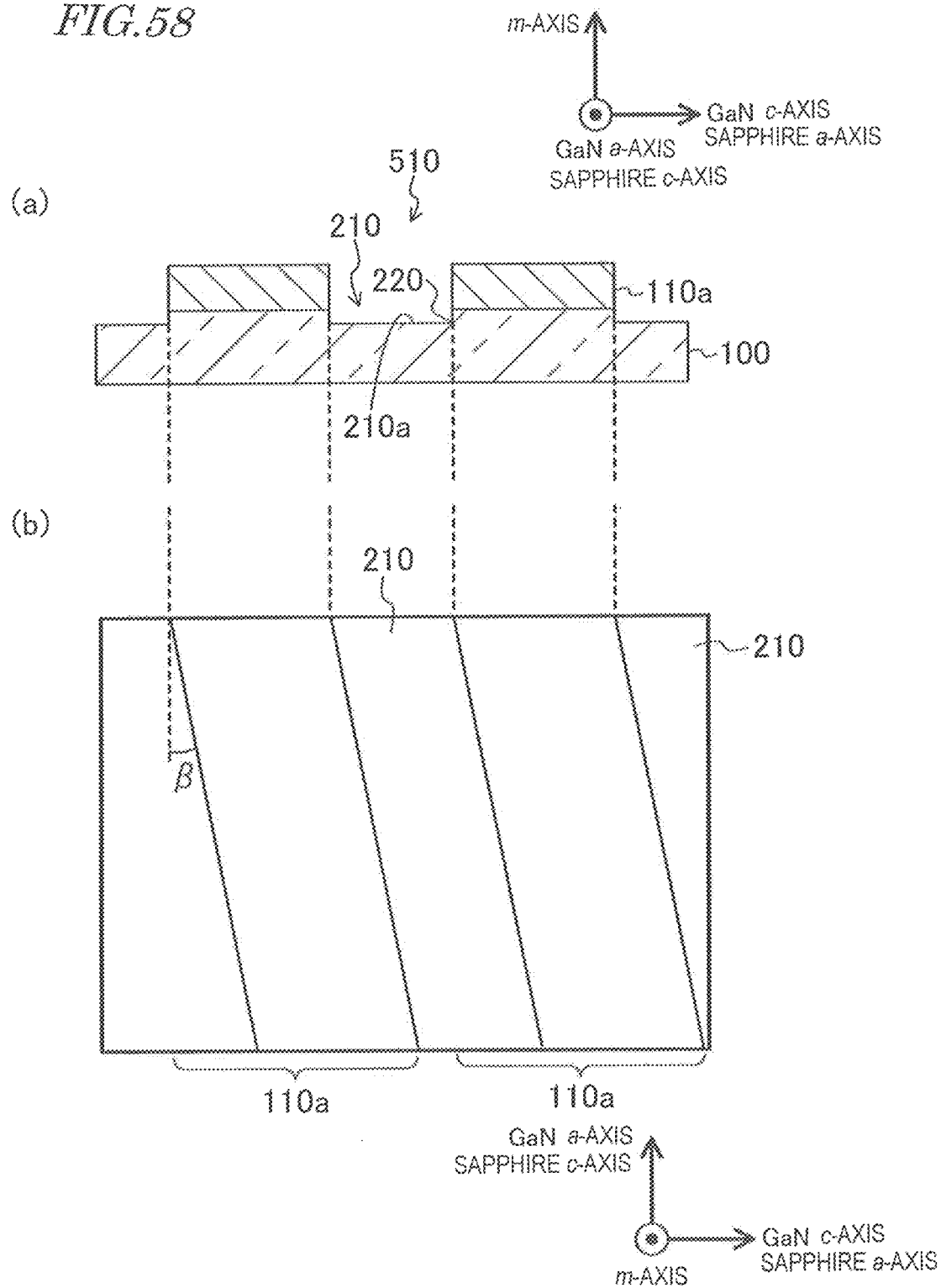
FIGS. 58(a) and 58(b) show an unevenly-processed substrate according to the fourth embodiment and the fifth embodiment.

FIG. 58(*a*) and FIG. 58(*b*) show the cross-sectional configuration and planar configuration of the unevenly-processed substrate 510 for growth of a nitride semiconductor layer according to the fourth embodiment.

As shown in FIG. 58(*a*), the unevenly-processed substrate 510 includes the growth substrate 100 which is made of sapphire of which growing plane is the m-plane and nitride semiconductor layers 110*a* which have a plurality of stripe-shaped raised portions provided on the growing plane of the growth substrate 100. Between respective ones of the plurality of stripe-shaped nitride semiconductor layers 110*a*, the recessed portions 210 are provided. In the example shown in FIG. 58(*b*), the stripe-shaped nitride semiconductor layers 110*a* extend in a direction which is inclined by the in-plane tilt angle β with respect to the a-axis direction of the m-plane nitride semiconductor.

As described above, the crystal axes of the m-plane nitride semiconductor layer and the m-plane sapphire in the plane deviate by 90°. That is, it is appreciated that epitaxial growth occurs such that, although the m-axis that is the principal surface is parallel, the a-axis (c-axis) in the plane of the nitride semiconductor is parallel to the c-axis (a-axis) of the sapphire.

Thus, defining the angle β relative to the growth substrate 100, the angle β is 0° when it is parallel to the c-axis direction of the growth substrate 100. When it is parallel to the a-axis direction of the growth substrate 100, the angle β is 90°.

That is, the unevenly-processed substrate 510 is designed such that the angle β between the extending direction of the stripe-shaped nitride semiconductor layers 110*a* and the a-axis of the nitride semiconductor layers 110*a* is not less than 3° and not more than 45°. Then, the nitride semiconductor film 320 is regrown on the formed unevenly-processed substrate 510, whereby the heterogeneous nitride semiconductor substrate 600 can be obtained that has the stripe-shaped gaps 60 which have equal in-plane tilt angles β. In the light-emitting device 10 with the m-plane principal surface which is manufactured on the heterogeneous nitride semiconductor substrate 600, the polarization degree of light emitted from the active layer 24 is reduced, while the light distribution characteristics and the light extraction efficiency are improved.

At the bottom surfaces 210*a* of the recessed portions 210, the m-plane of the growth substrate 100 is exposed. The source material particles of the nitride semiconductor are unlikely to adhere to the m-plane of the sapphire. Thus, in regrowth of the nitride semiconductor film 320 with the use of the stripe-shaped nitride semiconductor layers 110*a* as seed crystals, the source material particles are likely to adhere to the stripe-shaped nitride semiconductor layers 110*a* rather than to the bottom surfaces 210*a* of the recessed portions 210. Thus, growth of the nitride semiconductor film 320 of low crystallinity from the bottom surfaces 210*a* can be prevented.

FIG. 58(*a*) and FIG. 58(*b*) show an example where a mask is not provided on the upper surface of the stripe-shaped nitride semiconductor layers 110*a*. In the present embodiment, the mask 120 such as shown in FIG. 56(*b*) may be provided.

The unevenly-processed substrate 510 of the present embodiment may be formed using the growth substrate 100 which is in a wafer form, for example. FIG. 58 shows part of the wafer. Respective elements are shown in consideration of visibility, and the actual scale of the respective elements is not limited to the scale of the elements shown in the drawings.

In the present embodiment, as described above, the growing plane of the growth substrate 100 may be inclined by an angle of not more than 5° with respect to the m-plane. Also, a surface exposed at the bottom surfaces 210*a* of the recessed portions 210 may be inclined by an angle of not more than 5° with respect to the m-plane. Also, the growing plane of the stripe-shaped nitride semiconductor layers 110*a* may be inclined by an angle of not more than 5° with respect to the m-plane.

The range of the tilt angle β in the plane of the gaps 60 may be not less than 3° and not more than 35°. In the range of the in-plane tilt angle β>35°, abnormal growth of the nitride semiconductor film 320 that has a semi-polar plane is likely to occur from the wall surfaces 220 of the recessed portions 210 formed by etching. Therefore, it was proved from the examinations carried out by the present inventors that, in the nitride semiconductor film 320 obtained by lateral regrowth, the m-plane and the semi-polar plane coexist so that the crystal quality and the surface flatness significantly deteriorate. Specifically, when the plurality of gaps 60 are formed with the tilt angle being within the range of 3°≤β≤35°, the polarization degree can be reduced, and the light distribution characteristics and the light extraction efficiency can be improved. Furthermore, abnormal growth which could occur at the semi-polar plane from the growth substrate 100 exposed in the recessed portions 210 is prevented, and the m-plane nitride regrown film 320 and the heterogeneous nitride semiconductor substrate 600, which have excellent surface flatness and crystal quality, can be obtained.

The absolute value of the in-plane tilt angle β of the gaps 60 may be not less than 3° and not more than 10°. In this case, the stacking fault density can be particularly reduced. The details will be described with reference to the measurement results of examples which will be described later.

The stripe-shaped nitride semiconductor layers 110*a* which are formed by a plurality of raised portions according to the present embodiment are not limited to a simple arrangement of lines and spaces such as shown in FIG. 58(*b*). As previously described, it may be the structure shown in FIG. 47, FIG. 48, or FIG. 49.

The shape of a cross section which is perpendicular to the extending direction of the stripe-shaped gaps 60 may be appropriately selected. For example, it may be any of the configurations shown in FIG. 45 and FIG. 46.

As shown in FIG. 59(*a*), in the present embodiment, lateral surfaces 110A of the stripe-shaped nitride semiconductor layers 110*a* may be inclined with respect to the normal line of the growing plane of the growth substrate 100. In this case, the angle γ inside the ridge between the lateral surface 110A which is parallel to the extending direction of the stripe-shaped nitride semiconductor layers 110*a* and the m-plane may be greater than 0° and smaller than 150°.

The cross section of the stripe-shaped nitride semiconductor layers 110*a* is not limited to a quadrangular or trapezoidal shape but may be a triangular shape or another polygonal shape, or may include a curve.

In the present embodiment, in part of some or one of the plurality of stripe-shaped nitride semiconductor layers 110a, the condition that the extending direction of the stripe-shaped nitride semiconductor layers 110a has an inclination of not less than 3° and not more than 45° with respect to the a-axis direction of the nitride semiconductor may not be satisfied. In this case, at least 50% of the plurality of stripe-shaped nitride semiconductor layers 110a may satisfy the condition that the angle between the extending direction of the stripe-shaped nitride semiconductor layers 110a and the a-axis of the nitride semiconductor is not less than 3° and not more than 45°.

The thickness of the growth substrate 100 is, for example, not less than 0.1 mm and not more than 1 mm. The diameter of the growth substrate 100 (wafer) is, for example, not less than about 2.5 cm (1 inch) and not more than about 20.3 cm (8 inches).

The thickness of the stripe-shaped nitride semiconductor layers 110a is, for example, not less than 10 nm and not more than 10 μm. The width L along a direction perpendicular to the extending direction of the stripe-shaped nitride semiconductor layer 110a shown in FIG. 59(*a*) may be set to a value which is not less than 0.1 μm and not more than 10 μm, for example. The width S of the recessed portion 210 shown in FIG. 59(*a*) may be set to a value which is not less than 1 μm and not more than 30 μm.

The width L and width S shown in FIG. 59(*a*) are generally equal to the period of the uneven structure that is formed in a direction perpendicular to the extending direction of the stripe structures.

To obtain only the effect of reducing the polarization degree and the effect of improving the light distribution characteristics and the light extraction efficiency, which are the major objects of the present embodiment, the period which is determined from the above-described width L and width S may be on the level of the wavelength of light, i.e., may be not more than 1 μm.

On the other hand, in the case of obtaining the effect of improving the crystallinity of the heterogeneous nitride semiconductor film concurrently with the polarization control effect, the period which is determined from the above-described width L and width S can be controlled in a still wider range. As described above, even if the period was 40 μm, that effect was confirmed.

In the step of manufacturing the unevenly-processed substrate 510, the etching for formation of the recessed portions 210 may be carried out somewhat deeper in order to avoid the stripe-shaped nitride semiconductor layers 110a remaining at the bottom surfaces 210a of the recessed portions 210. In this case, the upper part of the growth substrate 100 is also removed, so that the wall surfaces 220 which are formed by the growth substrate 100 are exposed at the lower part of the recessed portions 210 as shown in FIG. 58(*a*).

As shown in FIG. 59(*b*), in forming the recessed portions 210, the recessed portions 210 may not be necessarily formed such that the upper part of the growth substrate 100 is removed. In this case, the bottom surfaces 210a of the recessed portions 210 are at the same height as the interface between the growth substrate 100 and the stripe-shaped nitride semiconductor layers 110a.

The depth of the bottom surfaces 210a of the recessed portions 210 relative to the interface between the growth substrate 100 and the stripe-shaped nitride semiconductor layers 110a may be, for example, not less than 0 nm and not more than 500 nm, or not less than 0 nm and not more than 150 nm.

In the present embodiment, it has previously been explained that, assuming that the absolute value of the angle between the extending direction of the stripe-shaped nitride semiconductor layers 110a and the a-axis of the nitride semiconductor film 320 of which principal surface is the m-plane is 35°, abnormal growth which is attributed to the semi-polar plane occurs. However, this problem can be avoided by decreasing the area of the sapphire which is exposed at the lateral surfaces of the stripe-shaped nitride semiconductor layers 110a.

For example, when the depth of the bottom surfaces 210a of the recessed portions 210 relative to the interface between the growth substrate 100 and the stripe-shaped nitride semiconductor layers 110a is not less than 0 nm and not more than 150 nm, abnormal growth of the nitride semiconductor film 320 from the lateral surfaces of the stripe-shaped nitride semiconductor layers 110a, which is attributed to the semi-polar plane, can be avoided.

As shown in FIG. 59(*b*), in a configuration where the area of the wall surfaces 220 inside the recessed portions 210 in the growth substrate 100 is as small as possible, the amount of a semi-polar nitride semiconductor which grows from the growth substrate 100 that is present at the lower part of the lateral surfaces of the stripe-shaped nitride semiconductor layers 110a is small. Therefore, even if the angle between the extending direction in the growing plane of the stripe-shaped nitride semiconductor layers 110a and the a-axis of the nitride semiconductor film 320 is not less than 35°, abnormal growth of the nitride semiconductor film 320 which is attributed to the semi-polar plane is prevented, so that the flatness of the surface can be improved.

When a plane which is different from the m-plane is exposed at the bottom surfaces 210a of the recessed portions 210 between the stripe-shaped nitride semiconductor layers 110a, regrowth of the nitride semiconductor film 320 from the bottom surfaces 210a of the recessed portions 210 is a problem, and therefore, it is necessary to form the recessed portions 210 deeper. In the present embodiment, the bottom surfaces 210a of the recessed portions 210 are made of the m-plane sapphire, the nitride semiconductor film 320 is unlikely to grown from the bottom surfaces 210a. Thus, the recessed portions 210 can be formed shallow, without consideration of growth from the bottom surfaces 210a.

Further, the absolute value of the angle between the in-plane direction in which the stripe-shaped nitride semiconductor layers 110a extend and the a-axis of the nitride semiconductor film 320 of which principal surface is the m-plane may be not less than 3° and not more than 35°, and furthermore, the depth of the bottom surfaces 210a of the recessed portions 210 relative to the interface between the growth substrate 100 and the stripe-shaped nitride semiconductor layers 110a may be more than 0 nm and not more than 150 nm. Thanks to this arrangement, even when the depth of the bottom surfaces 210a is more than 0 nm, the amount of the semi-polar nitride semiconductor that grows from a portion of the growth substrate 100 which is exposed at the lower part of the lateral surfaces of the stripe-shaped nitride semiconductor layers 110a can be further reduced.

Alternatively, the absolute value of the angle between the in-plane direction in which the stripe-shaped nitride semiconductor layers 110a extend and the a-axis of the nitride semiconductor film 320 of which principal surface is the m-plane may be not less than 0° and not more than 3°, and furthermore, the depth of the bottom surfaces 210a of the recessed portions 210 relative to the interface between the growth substrate 100 and the stripe-shaped nitride semiconductor layers 110a may be more than 0 nm and not more than 150 nm. Thanks to this arrangement, the amount of the semi-polar nitride semiconductor that grows from a portion of the growth substrate 100 which is exposed at the lower part of the lateral surfaces of the stripe-shaped nitride semiconductor layers 110a can be further reduced, and the polarized light can be maintained.

As described hereinabove, the stripe-shaped nitride semiconductor layers 110a are provided on the growth substrate 100 that is made of m-plane sapphire, and regrowth is carried out, whereby the stripe-shaped gaps 60 that are parallel to the stripe-shaped nitride semiconductor layers 110a can be formed. Thanks to this arrangement, the light-emitting device 10 of which principal surface is the m-plane can be obtained in which the stripe-shaped gaps 60 are provided near the heterogeneous interface in the heterogeneous nitride semiconductor substrate 600.

(Fifth Embodiment)

Hereinafter, the fifth embodiment is described with reference to the drawings.

FIG. 60(a) and FIG. 60(b) show schematic cross-sectional configuration and planar configuration of the heterogeneous nitride semiconductor substrate 600 which has the stripe-shaped gaps 60 and which is obtained by the manufacturing method described in the fourth embodiment. Here, the configuration shown in FIG. 60(a) is essentially identical with that of FIG. 57(d).

When the unevenly-processed substrate 510 is provided and the heterogeneous nitride semiconductor substrate 600 is formed by regrowth of the nitride semiconductor film 320, in general, the density of dislocations and defects in part of the nitride semiconductor film 320 formed above the recessed portions 210 is lower than in part of the nitride semiconductor film 320 formed on the stripe-shaped nitride semiconductor layers 110a, so that the quality of crystal is likely to be high.

This is because, in the stripe-shaped nitride semiconductor layers 110a, dislocations and defects produced at the heterogeneous interface extend in the m-axis direction that is the growth direction, while in the nitride semiconductor film 320 lying above the recessed portions 210 which is obtained by lateral growth, dislocations and defects bend, for example, so that they are unlikely to extend in the m-axis direction.

As a result, as shown in FIG. 60(a) and FIG. 60(b), a gradation of the density of dislocations and defects is formed in the plane of the heterogeneous nitride semiconductor substrate 600. The regions in which the density of dislocations and defects is high are formed on the stripe-shaped nitride semiconductor layers 110a that form the raised portions, and therefore, as shown in FIG. 60(b), when seen from the m-axis side, they are formed parallel to the stripe-shaped gaps 60 and have equal in-plane tilt angles β.

Figure 61:
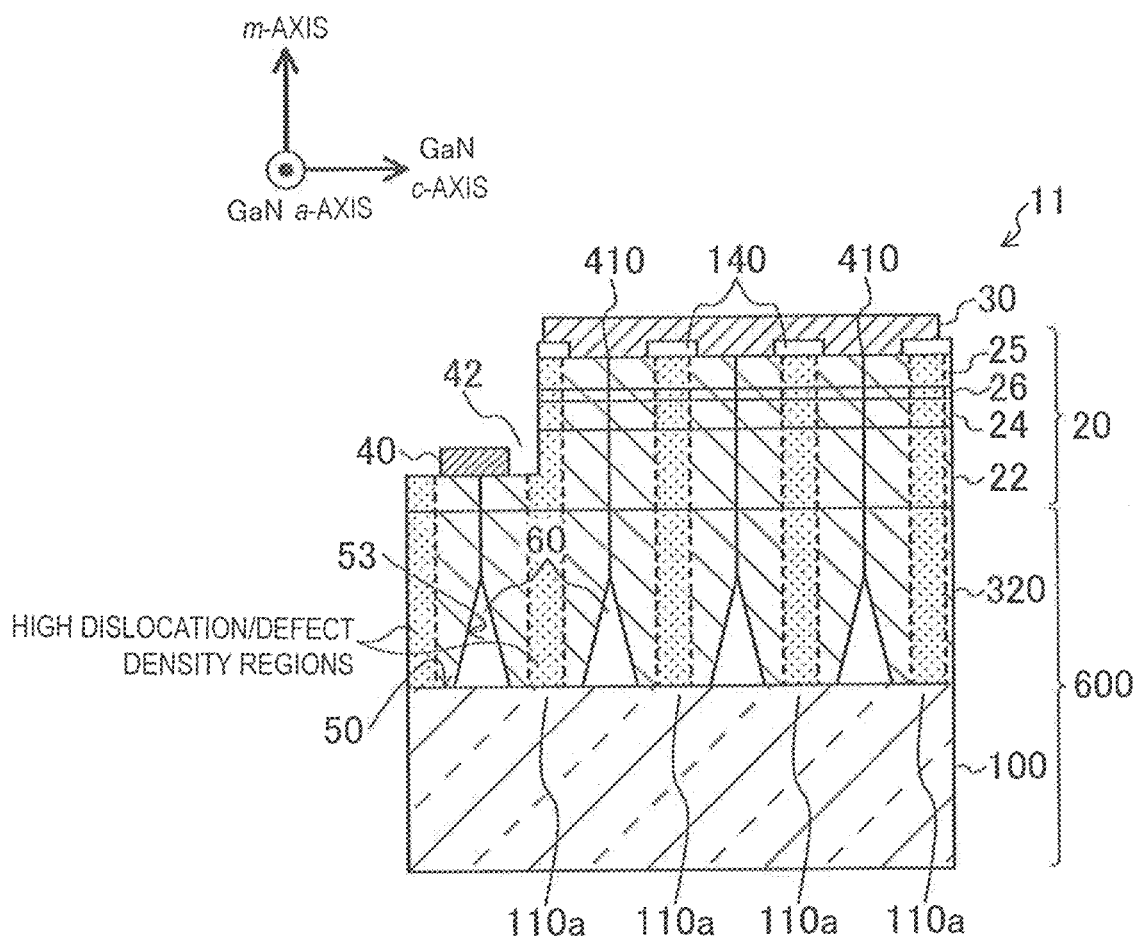
FIG. 61 is a schematic cross-sectional view showing a semiconductor light-emitting device of the fifth embodiment.

FIG. 61 schematically shows a cross-sectional configuration of a semiconductor light-emitting device according to the fifth embodiment. As shown in FIG. 61, the light-emitting device 11 of the present embodiment includes a heterogeneous nitride semiconductor substrate 600, and a semiconductor multilayer structure 20 which is provided on the heterogeneous nitride semiconductor substrate 600 and which includes an active layer 24. The heterogeneous nitride semiconductor substrate 600 is formed by a growth substrate 100 and a nitride semiconductor film 320 which is formed on the growth substrate 100 by selective growth and which includes a plurality of gaps 60 that have the in-plane tilt angle β. The semiconductor multilayer structure 20 is provided with a n-electrode 40 and a p-electrode 30. Light emitted from the active layer 24 is mainly reflected by the p-electrode 30 and outgoes from the growth substrate 100 side.

As previously described with reference to FIG. 60, in the present embodiment, above a region in which the stripe-shaped nitride semiconductor layers 110a that form the raised portions are to be formed, dislocations and defects which have a higher density than in the recessed portions 210 are formed parallel to the stripe-shaped gaps 60. Commonly, this defect density sometimes varies by one or more orders of magnitude. Therefore, in the light-emitting device 11 which employs the structure of the present embodiment as the basic body, the presence of the stripe-shaped nitride semiconductor layers 110a that are the raised portions which produce high dislocation density/high defect density regions in the nitride semiconductor film 320 can be a cause of decrease in the emission efficiency.

That is, in the fourth embodiment shown in FIG. 43, an electric current is injected into the entire active layer 24, and therefore, emission of light can also be obtained from the active layer 24 provided on the high dislocation density/high defect density regions. However, there is a probability that the emission efficiency decreases in those regions.

In the present embodiment, to avoid this problem of decrease of the emission efficiency, a plurality of insulating films 140 are selectively formed at the interface between the p-electrode 30 and a p-type nitride semiconductor layer 25. The respective insulating films 140 are formed on the stripe-shaped nitride semiconductor layers 110a that form the raised portions so as to form stripe structures which have the same angle β as the gaps 60. With such insulating films 140 provided, portions of the active layer 24 lying above the stripe-shaped nitride semiconductor layers 110a would not contribute to emission of light, while only portions of the active layer 24 lying above the recessed portions 210 which contain less dislocations and defects contribute to emission of light, so that the emission efficiency can be improved.

The insulating films 140 may be made of a material which is capable of transmitting polarized light emitted from the active layer 24. For example, $SiO_2$, SiN, ZrO, $Ga_2O_3$, $Al_2O_3$, ZnO, or the like, may be used for the insulating films 140.

In the light-emitting device 11 of the present embodiment, an electric current is not allowed to flow through the high dislocation density/high defect density regions, and the operation of a low emission efficiency region in the active layer 24 is prevented, so that the emission efficiency can be improved.

Note that the stripe-shaped insulating films 140 may not be formed. For example, the p-electrode 30 itself may have a stripe shape, and the p-electrode 30 may be provided only in portions lying above the respective recessed portions 210. However, with such a configuration, polarized light emitted from the active layer 24 is not reflected by the regions lying above the stripe-shaped nitride semiconductor layers 110a in which the p-electrode 30 is not provided. As a result, the light extraction efficiency in the light-emitting device 11 decreases.

Therefore, the insulating films 140 may be provided, between the p-type layer 25 and the p-electrode 30, in regions which are parallel to the gaps 60 and which are lying above the stripe-shaped nitride semiconductor layers 110a. Here, the p-electrode 30 may be provided so as to cover the plurality of insulating films 140. The thickness of the insulating films 140 may be small so long as the insulative property is ensured. For example, the thickness of the insulating films 140 is not less than 20 nm and not more than 200 nm.

As described above, by forming a light-emitting device structure 11 that has the gaps 60 which have the tilt angle β with respect to the a-axis direction in the plane of the principal surface of the heterogeneous nitride semiconductor substrate 600, the a-axis polarization degree of polarized light emitted from the active layer 24 can be prevented, while the light distribution characteristics and the light extraction efficiency can be improved. The range of the angle β of the gaps 60 may be not less than 3° and not more than 45°. More specifically, the angle β may be not less than 3° and not more than 35°. More specifically, the angle β may be not less than 3° and not more than 10°.

As shown in FIG. 57(d) and FIG. 60(a), in the step of preparing the heterogeneous nitride semiconductor substrate 600 which has the stripe-shaped gaps 60, connecting portions 410 that are formed by nitride semiconductor film portions 320 which are selectively grown in lateral directions so as to connect to one another are parallel to the stripe-shaped gaps 60.

(A Variation of the Fifth Embodiment)

As described above, at each of the connecting portions 410, nitride semiconductor film portions 320 regrown from different stripe-shaped nitride semiconductor layers 110a connect to each other. Therefore, small deviations occur in the crystal plane and crystal orientation and can be causes of additional defects and dislocations. Thus, if the active layer 24 is formed over the connecting portions 410, they serve as non-emission regions and can be a cause of decrease in the emission efficiency.

Figure 62:
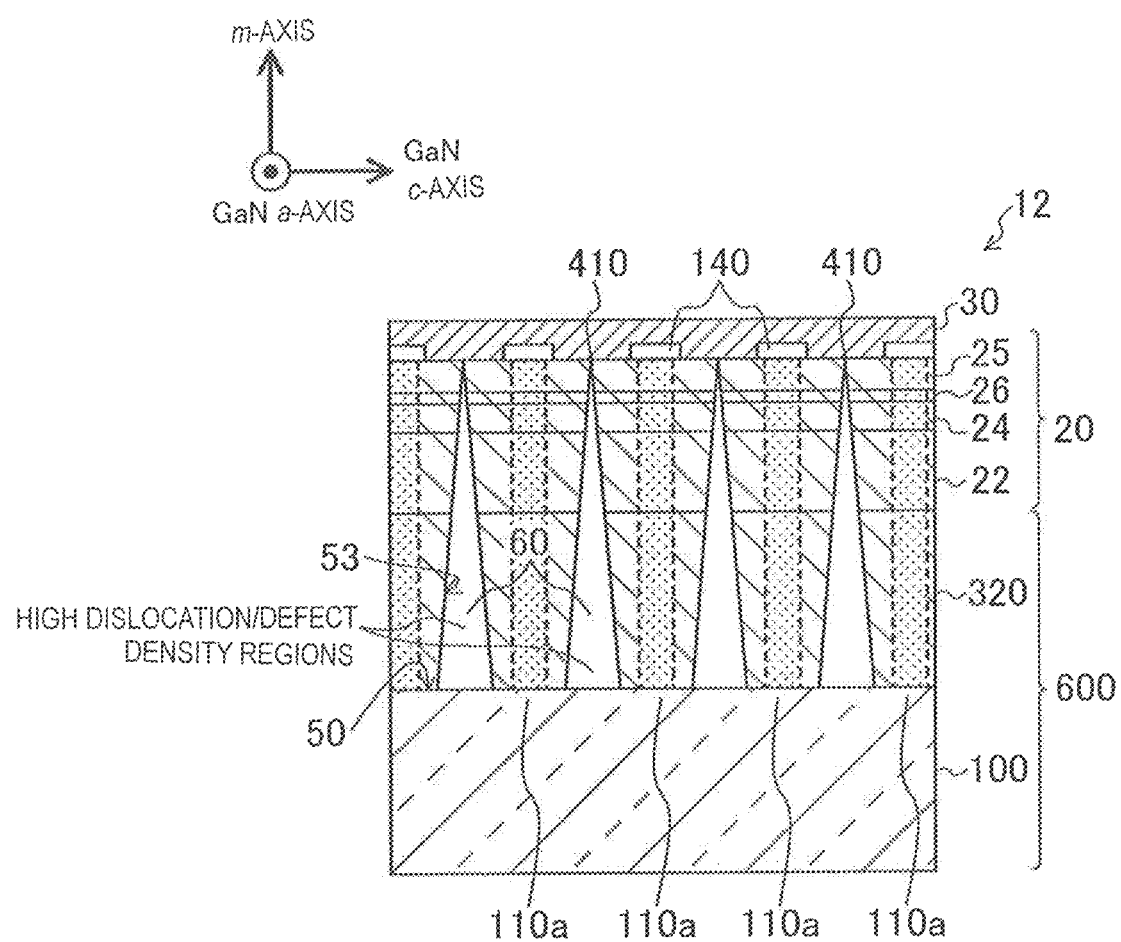
FIG. 62 is a schematic cross-sectional view which is seen from the a-axis direction in a semiconductor light-emitting device according to a variation of the fifth embodiment.
Figure 63:
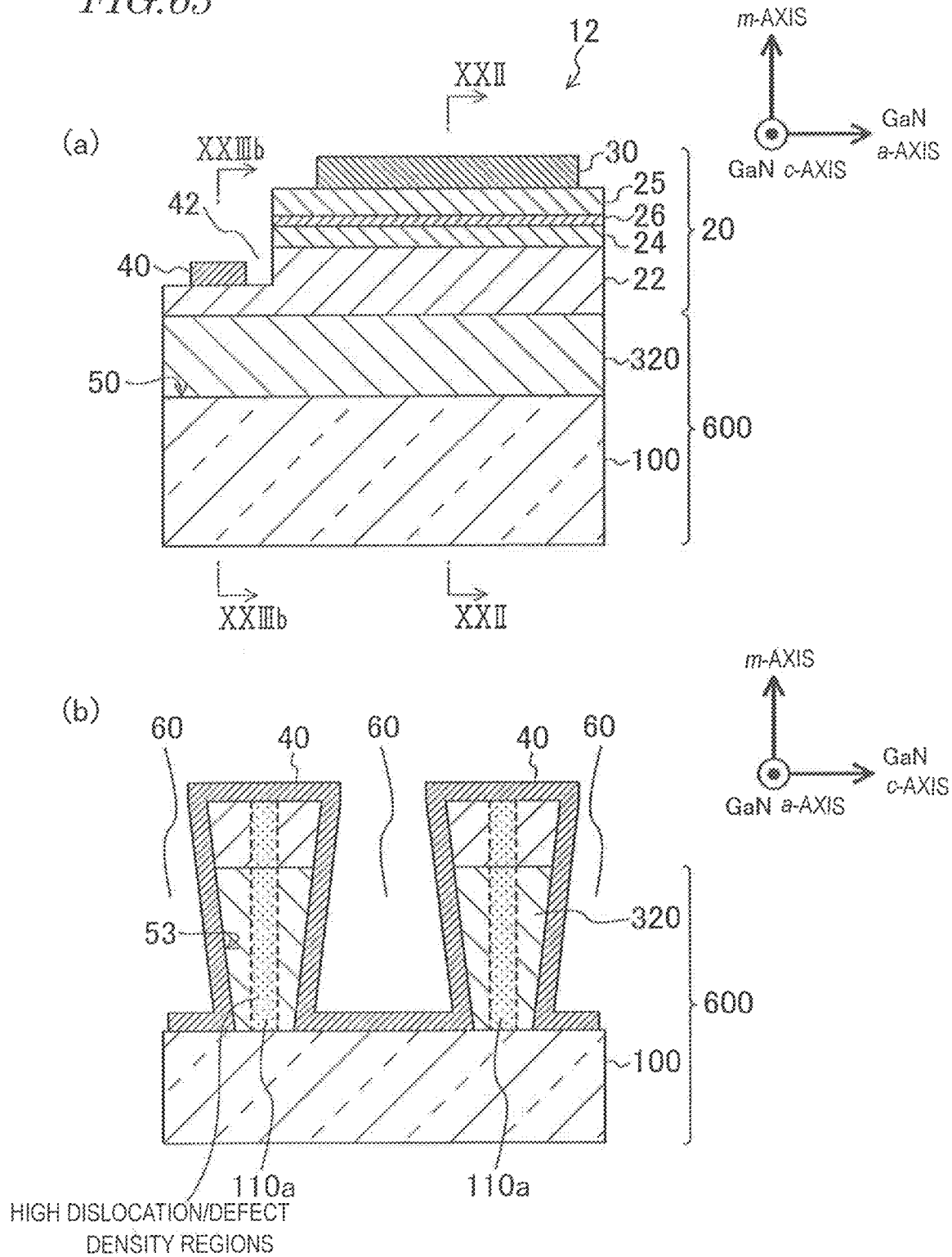
FIGS. 63(a) and 63(b) show a semiconductor light-emitting device according to a variation of the fifth embodiment.

FIG. 62 and FIG. 63 show a light-emitting device 12 of this variation which is unlikely to be affected by the connecting portions 410. Here, FIG. 62 and FIG. 63(b) show cross-sectional configurations which are seen in the a-axis direction. FIG. 63(a) shows a cross-sectional configuration which is seen in the c-axis direction.

In this variation, to prevent the connecting portions 410 from being included in the active layer 24, in regrowing the nitride semiconductor film 320 on the unevenly-processed substrate 510, portions of the semiconductor multilayer structure 20 up to the active layer 24 are grown, and then, in regrowth of the p-type layer 25, the nitride semiconductor film portions 320 regrown from the respective stripe-shaped nitride semiconductor layers 110a are allowed to connect to each other, whereby the connecting portions 410 are obtained.

When the light-emitting device 12 is manufactured in this way, the connecting portions 410 are not included in the active layer 24, so that decrease of the emission efficiency can be prevented. Furthermore, also in this variation, by forming the stripe-shaped gaps 60 that have the slope surface 53 of which tilt angle β is controlled within the range of not less than 3° and not more than 45° with respect to the a-axis direction in the plane of the principal surface of the heterogeneous nitride semiconductor substrate 600, the polarization degree of emitted light can be reduced, while the light distribution characteristics and the light extraction efficiency can be improved.

In this variation, the n-electrode 40 of the light-emitting device 12 may be formed as shown in FIG. 63(b). Specifically, in the light-emitting device 12, the n-type layer 22 may have a discontinuous configuration along the c-axis direction of the nitride semiconductor film 320 due to the plurality of gaps 60. Therefore, to achieve passage of an electric current in all of the n-type layer portions 22 that are isolated from one another along the c-axis direction, the n-electrode 40 may be formed so as to continuously cover not only the top and lateral surfaces of the respective n-type layer portions 22 but also the wall and bottom surfaces of the gaps 60 in the heterogeneous nitride semiconductor substrate 600.

By employing such a configuration, an electric current is allowed to flow through the active layer 24 formed on the heterogeneous nitride semiconductor substrate 600, and emission of light can be obtained from the entire device.

The configuration of the n-electrode 40 according to this variation shown in FIG. 63(b) is suitably used in a configuration where the plurality of active layer portions 24 and the plurality of n-type layer portions 22 are not connected to one another.

Thus, in the previously-described light-emitting device 11, the position of formation of the n-electrode 40 is not particularly limited so long as the surface of the n-type layer 22 can be formed by etching.

(Sixth Embodiment)

Hereinafter, the sixth embodiment is described with reference to the drawings.

FIG. 64(a) and FIG. 64(b) show details of a fabrication method of a heterogeneous nitride semiconductor substrate 601 according to the sixth embodiment.

First, as shown in FIG. 64(a), a nitride semiconductor layer 110 of which principal surface is a non-polar plane is formed on the growth substrate 100. In the present embodiment, for example, the growth substrate 100 is an m-plane sapphire substrate, and the nitride semiconductor layer 110 is a nitride semiconductor layer which is grown on the m-plane sapphire substrate and of which principal surface is the m-plane. Then, on the nitride semiconductor layer 110, a stripe-shaped mask 120 is selectively formed. The mask 120 is inclined in the principal surface of the nitride semiconductor layer 110. For example, the range of the tilt angle β with respect to the a-axis direction is not less than 3° and not more than 45°.

The above steps are the same as those of the fourth embodiment and the fifth embodiment. In the present embodiment, as shown in FIG. 64(b), etching is not carried out on the nitride semiconductor layer 110, but regrowth is carried out on the surface of the nitride semiconductor layer 110 via the mask 120, whereby the nitride semiconductor film 320 is obtained.

When the regrowth is carried out with such a configuration, regrowth of the nitride semiconductor film 320 would not occur on the mask 120, and regrowth preferentially occurs from the surfaces of exposed regions 200 of the nitride semiconductor 110 which are not covered with the mask 120. Under some growth conditions, growth of the nitride semiconductor film 320 is enhanced also in lateral directions. As a result, the connecting portions 410 at which regrown film portions connect to each other are formed above the mask 120, while the stripe-shaped gaps 60 are formed above the mask 120.

For the material of the mask 120, for example, $SiO_2$, $SiN$, $ZrO$, $ZnO$, $Ga_2O_3$ or $Al_2O_3$, or an oxide containing part of these compounds, or a dielectric material may be used.

Alternatively, a metal may be used for the material of the mask 120. For example, it may be aluminum (Al), titanium (Ti), nickel (Ni), tungsten (W) or tantalum (Ta), or an alloy material containing part of these elements.

In the present embodiment, regrowth of the nitride semiconductor film 320 is carried out on the surface of the nitride semiconductor layer 110 with the mask 120 formed thereon. Usually, growth of the nitride semiconductor is carried out at a high temperature, e.g., not less than 600° C. and not more than 1300° C. Therefore, even under such growth conditions, the material may be appropriately selected such that the shape of the mask is maintained, and thermal decomposition or reaction is unlikely to occur. For example, an oxide, a dielectric, or a metal material may be appropriately used. Note that, however, the metal material generally has a high optical absorption coefficient, and therefore, in consideration of application to a light-emitting device, it is preferred that the material of the mask 120 is capable of transmitting or reflecting visible-range polarized light emitted from the active layer 24. Therefore, the material of the mask 120 may be an oxide film or dielectric film which has high transmittance.

As described hereinabove, in the step of FIG. 64(a), the mask 120 is selectively formed on the nitride semiconductor layer 110, and furthermore, the nitride semiconductor film 320 is regrown. Thus, in the step of FIG. 64(b), the heterogeneous nitride semiconductor substrate 601 that has the gaps 60 which have the tilt angle β with respect to the a-axis can be fabricated.

Figure 65:
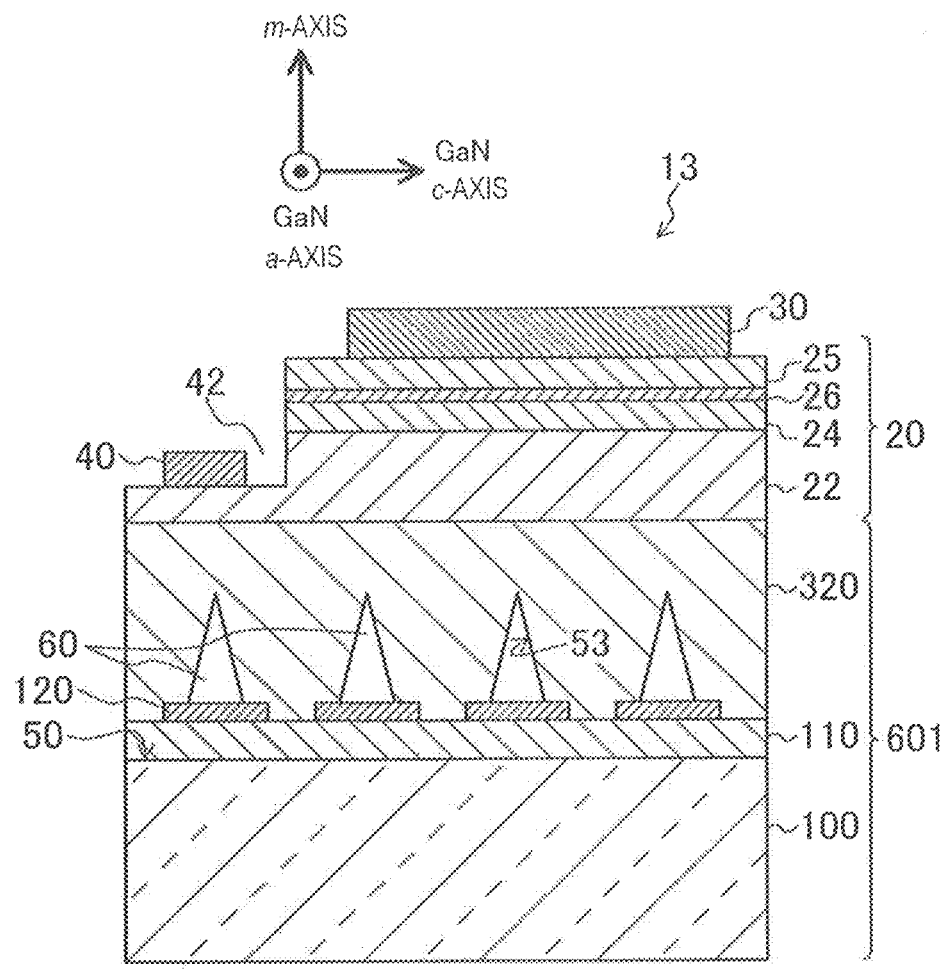
FIG. 65 is a schematic cross-sectional view showing a semiconductor light-emitting device of the sixth embodiment.

FIG. 65 schematically shows the cross-sectional configuration of a light-emitting device 13 manufactured on a heterogeneous nitride semiconductor substrate 601 according to the sixth embodiment. As shown in FIG. 65, the light-emitting device 13 of the present embodiment includes the heterogeneous nitride semiconductor substrate 601 and a semiconductor multilayer structure 20 which is provided on the heterogeneous nitride semiconductor substrate 600 and which includes an active layer 24. The heterogeneous nitride semiconductor substrate 601 is formed by a growth substrate 100, a nitride semiconductor layer 110 provided on the growth substrate 100, and a nitride semiconductor film 320 which is selectively grown on the nitride semiconductor layer 110 via a mask 120 and which includes a plurality of gaps 60 that have the in-plane tilt angle β. The semiconductor multilayer structure 20 is provided with a n-electrode 40 and a p-electrode 30. Light emitted from the active layer 24 is mainly reflected by the p-electrode 30 and outgoes from the growth substrate 100 side.

(First Variation of Sixth Embodiment)

In the present embodiment also, as in the fourth embodiment 1 and the fifth embodiment, portions of the nitride semiconductor film 320 overlying the mask 120 which are obtained by lateral growth have lower dislocation density and lower defect density than portions of the nitride semiconductor film 320 which are regrown on exposed regions 200 that are not covered with the mask 120.

That is, portions of the nitride semiconductor film 320 overlying the exposed regions 200 that are not covered with the mask 120 have a higher density of dislocations and defects than portions overlying the mask 120. Usually, these densities are different by one or more orders of magnitude in some cases. Thus, in the light-emitting device 13 which employs the structure of the present embodiment as the basic body, regions of the active layer 24 lying above the exposed regions 200 that are not covered with the mask 120, which are high dislocation density/high defect density regions, can be a cause of decrease in the emission efficiency.

This cause can be avoided by forming the insulating films 140 between the p-electrode 30 and the p-type nitride semiconductor layer 25 as in the fifth embodiment.

Figure 66:
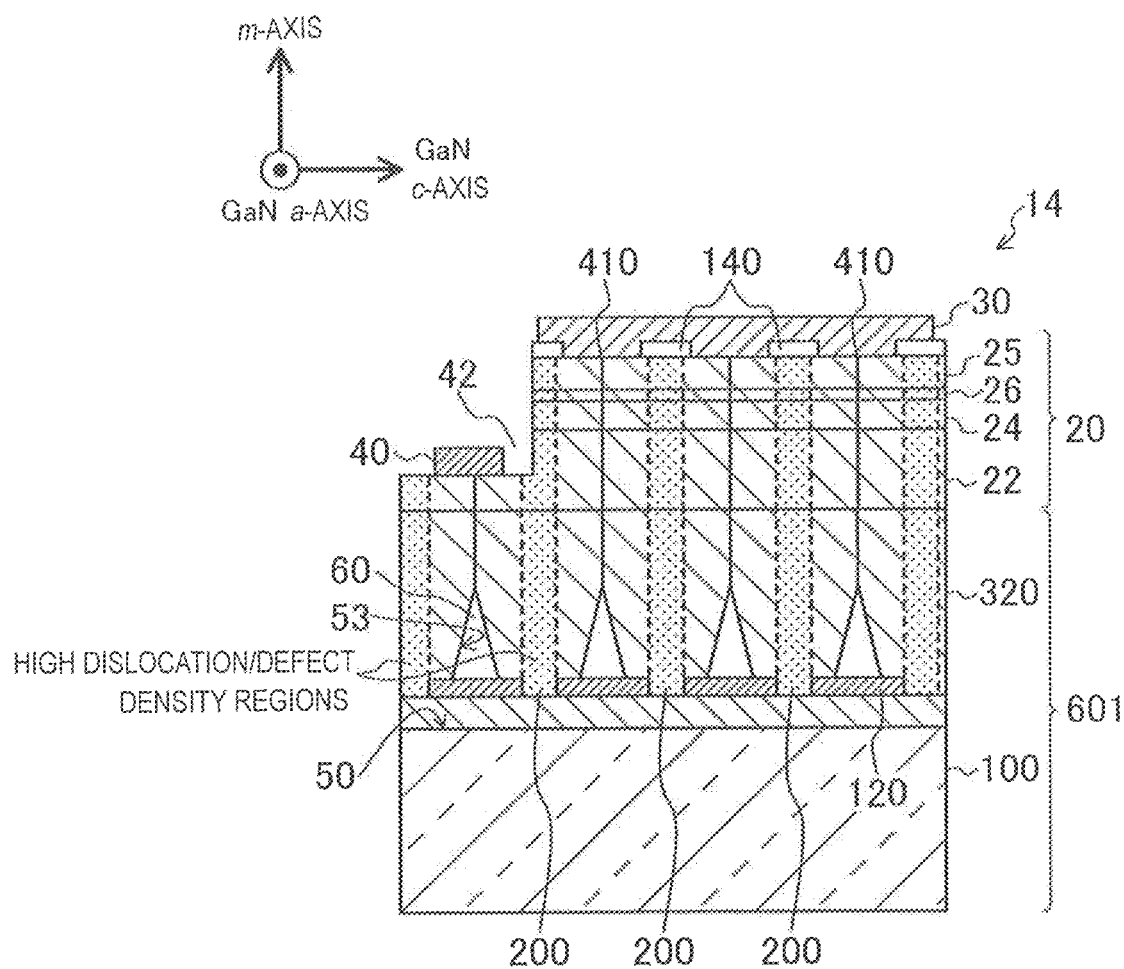
FIG. 66 is a schematic cross-sectional view showing a semiconductor light-emitting device of the first variation of the sixth embodiment.

FIG. 66 shows a light-emitting device 14 which is unlikely to be affected by the exposed regions 200. The insulating films 140 are provided above the exposed regions 200 and therefore have stripe structures which have equal angle β to that of the gaps 60. When the insulating films 140 are formed in this way, portions of the active layer 24 lying above the exposed regions 200 that are not covered with the mask 120 do not contribute to emission of light. Instead, only portions of the active layer 24 lying above the mask 120, which contain smaller dislocations and defects, contribute to emission of light, so that the emission efficiency can be improved.

Here, the insulating films 140 may be made of a material which is capable of transmitting polarized light emitted from the active layer 24. For example, $SiO_2$, SiN, ZrO, or the like, may be used for the insulating films 140. The thickness of the insulating films 140 may be thin so long as the insulation is ensured. For example, the thickness of the insulating films 140 may be not less than 20 nm and not more than 200 nm.

In the light-emitting device 14 of the present embodiment, an electric current is not allowed to flow through the high dislocation density/high defect density regions, and the operation of a low emission efficiency region in the active layer 24 is prevented, so that the emission efficiency can be improved.

Note that the stripe-shaped insulating films 140 may not be formed. For example, the p-electrode 30 itself may have a stripe shape, and the p-electrode 30 may be provided only in portions lying above the exposed regions 200 that are not covered with the mask 120. However, with such a configuration, polarized light emitted from the active layer 24 is not reflected by the portions lying above the exposed regions 200 that are not covered with the mask 120, in which the p-electrode 30 is not provided, so that the emission efficiency can decrease.

Therefore, the insulating films 140 may be provided, between the p-type layer 25 and the p-electrode 30, in regions which are parallel to the gaps 60 and which are lying above the exposed regions 200 that are not covered with the mask 120. Here, the p-electrode 30 may be provided so as to cover the plurality of insulating films 140.

As described above, by forming a light-emitting device structure 13, 14 that has the gaps 60 which have the tilt angle β with respect to the a-axis direction in the plane of the principal surface of the heterogeneous nitride semiconductor substrate 601, the a-axis polarization degree of polarized light emitted from the active layer 24 can be prevented, while the light distribution characteristics and the light extraction efficiency can be improved. In the case of a light-emitting device manufactured on the heterogeneous nitride semiconductor substrate 601, the range of the angle β of the gaps 60 may be not less than 3° and not more than 45°. Specifically, the angle β may be not less than 3° and not more than 10°.

(Second Variation of Sixth Embodiment)

As previously described with reference to FIG. 60 and FIG. 61 according to the fifth embodiment, in the present embodiment also, in the step of preparing a heterogeneous nitride semiconductor substrate 601 which has a plurality of stripe-shaped gaps 60, the connecting portions 410 are formed in the nitride semiconductor film 320 so as to be parallel to the stripe-shaped mask 120. These connecting portions 410 are formed by the nitride semiconductor film portions 320, which are regrown from the exposed regions 200 that are not covered with the mask 120, connecting to each other.

At each of the connecting portions 410, nitride semiconductor film portions 320 regrown from different exposed regions 200 of the nitride semiconductor layer 110 connect to each other. Therefore, small deviations occur in the crystal plane and crystal orientation and can be causes of additional defects and dislocations. Thus, if the active layer 24 is formed over the connecting portions 410, they serve as non-emission regions and can be a cause of decrease in the emission efficiency.

Figure 67:
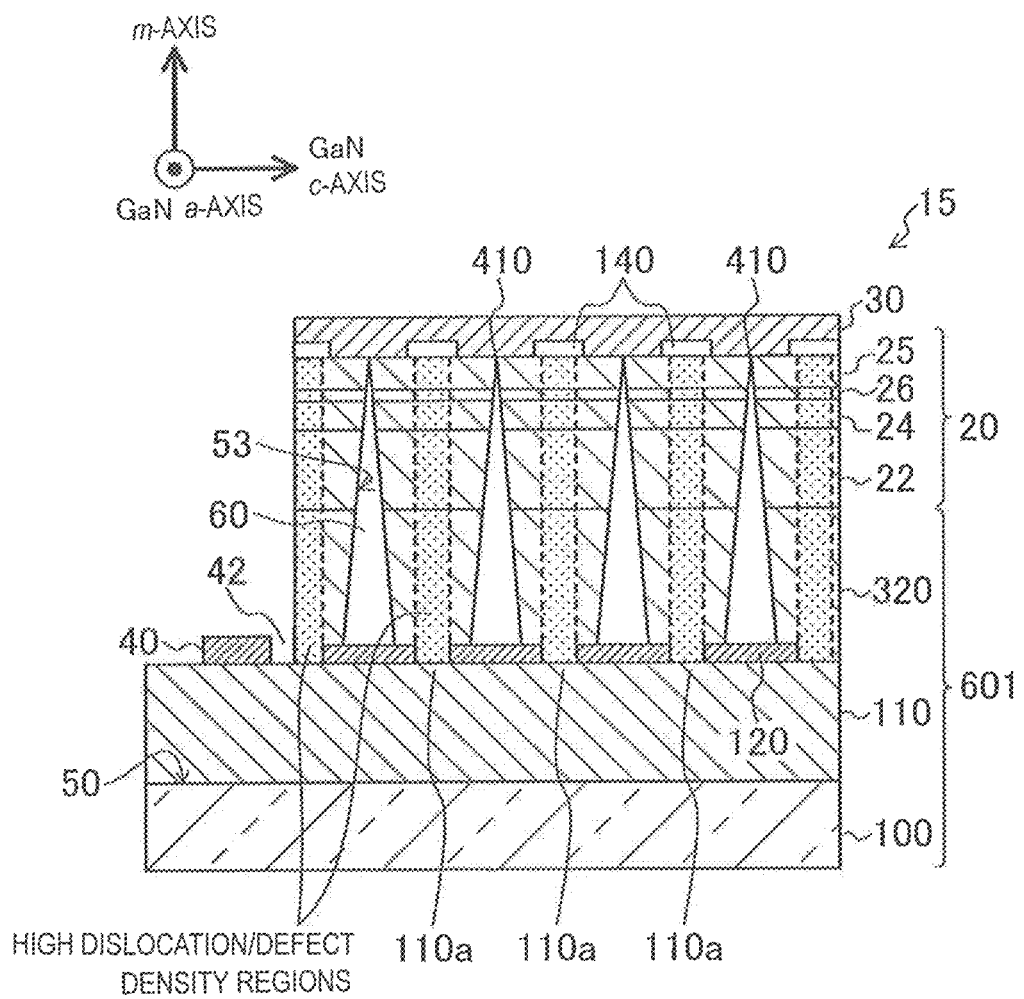
FIG. 67 is a schematic cross-sectional view showing a semiconductor light-emitting device of the second variation of the sixth embodiment.

FIG. 67 shows a light-emitting device 15 of this variation which is unlikely to be affected by the connecting portions 410. As shown in FIG. 67, as in a variation of the fifth embodiment, in manufacturing the light-emitting device 15, the connecting portions 410 are not included in the active layer 24, and mutual connection of regrown film portions is achieved during the growth of the p-type layer 25. Thanks to this arrangement, in the light-emitting device 15 of this variation, decrease of the emission efficiency can be prevented.

Further, also in this variation, by forming the stripe-shaped gaps 60 that have the slope surface 53 of which tilt angle β is controlled within the range of not less than 3° and not more than 45° with respect to the a-axis direction in the plane of the principal surface of the heterogeneous nitride semiconductor substrate 601, the polarization degree of emitted light can be reduced, while the light distribution characteristics and the light extraction efficiency can be improved.

In the light-emitting device 15 of this variation, the n-electrode 40 may be formed on the surface of the nitride semiconductor layer 110. For example, the surface of the nitride semiconductor layer 110 is exposed by etching, and thereafter, the n-electrode 40 may be formed on the exposed region of the nitride semiconductor layer 110. Here, the nitride semiconductor layer 110 needs to have the n-type conductivity.

(Seventh Embodiment)

Hereinafter, the seventh embodiment is described with reference to the drawings.

Figure 68:
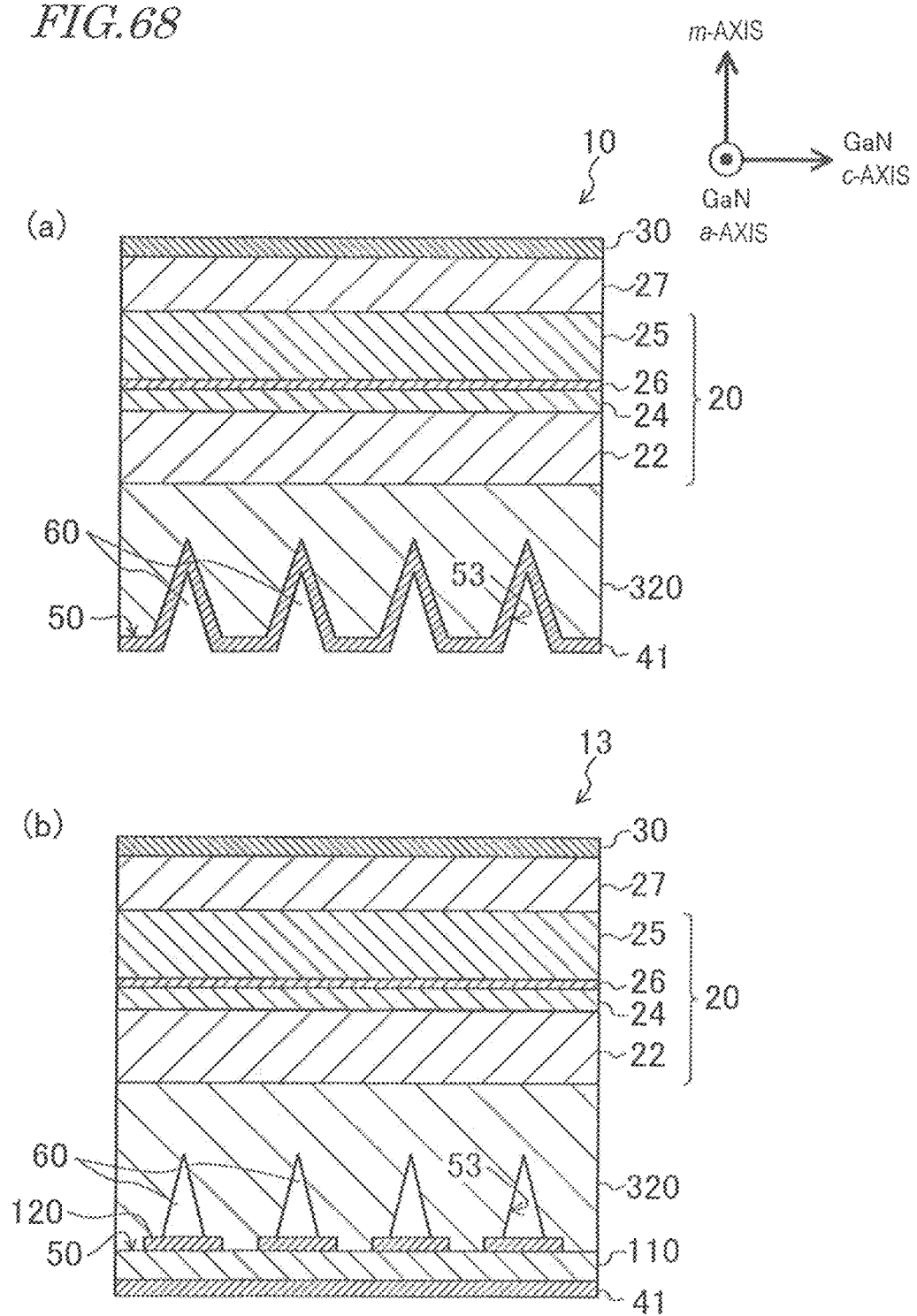
FIG. 68(a) is a schematic cross-sectional view showing a semiconductor light-emitting device of the seventh embodiment.
FIG. 68(b) is a schematic cross-sectional view showing a semiconductor light-emitting device of a variation of the seventh embodiment.

FIG. 68(a) schematically shows a cross-sectional configuration of a light-emitting device according to the seventh embodiment. FIG. 68(b) schematically shows a cross-sectional configuration of a light-emitting device according to a variation of the seventh embodiment. FIG. 68(a) shows a configuration which is obtained by removing the growth substrate 100 from the light-emitting device 10 of the fourth embodiment. FIG. 65(b) shows a configuration which is obtained by removing the growth substrate 100 from the light-emitting device 13 of the sixth embodiment.

In the present disclosure, the polarization degree of polarized light emitted from the active layer 24 is reduced by stripe-shaped ridge portions which are provided at or near the interface between the growth substrate 100 and the nitride semiconductor film 320 and gaps 60 which are present between the ridge portions, so that the effect of improving the light distribution characteristics and the light extraction efficiency can be obtained. Thus, the growth substrate 100 is not necessarily required in the light-emitting device and may be removed therefrom.

Particularly when at least a small portion of emitted light from the active layer 24 is absorbed in the growth substrate 100, it is desired that the growth substrate 100 is removed. Removal of the growth substrate 100 improves the light extraction efficiency and hence improves the characteristics of the light-emitting device.

Note that, however, in the case where a material by which absorption of visible range light is substantially negligible, such as sapphire, is used for the growth substrate 100, the substrate for growth does not necessarily need to be removed.

In order to remove the growth substrate 100, a preferred method may be appropriately used depending on the material of the growth substrate 100. For example, a laser lift-off method, an abrasion method, a wet etching method, a dry etching method, or the like, may be used.

In the present embodiment, a plurality of gaps 60 are provided near the interface between the growth substrate 100 and the nitride semiconductor film 320. Therefore, for example, the width along a direction which is perpendicular to the extending direction of the stripes in the nitride semiconductor layers 110a that form stripe-shaped raised portions (width L in FIG. 59) is made as small as possible to increase the formation region of each of the gaps 60, so that the growth substrate 100 can be readily removed.

For example, the growth substrate 100 can be removed by using a commonly-employed wafer bonding method.

FIG. 68(a) shows an example of the light-emitting device 10 from which the growth substrate 100 has been removed using a wafer bonding method. As shown in FIG. 68(a), a supporting substrate 27 which is used for removing the growth substrate 100 is bonded onto the p-type layer 25. In the present embodiment, the material of the supporting substrate 27 may be a material which has p-type conductivity. For example, it may be a p-type Si substrate or p-type GaAs substrate. However, these materials absorb emitted light from the active layer 24 so that the emission efficiency deteriorates. Therefore, as the substrate material, a p-type SiC substrate or an oxide substrate or diamond substrate which has p-type conductivity may be used. Furthermore, a joining layer may be provided between the p-type layer 25 and the supporting substrate 27 for joining substrates together.

When this joining layer is made of a material of high reflectance, e.g., Ag, Al, Rh, or the like, or a material which contains these elements in part thereof, the previously-described material which causes absorption of light, such as Si, GaAs, or the like, may be used as the supporting substrate.

In the light-emitting device 10 of the present embodiment, for the purpose of removing the growth substrate 100, when the conductivity type of the nitride semiconductor film 320 is n-type, for example, the p-electrode 30 is provided on the supporting substrate 27, and the n-electrode 41 is provided on the rear surface of the nitride semiconductor film 320, whereby the p-electrode 30 and the n-electrode 41 are at opposite positions to each other. With such a configuration employed, an injected electric current flows in a top-to-bottom direction of the light-emitting device 10, i.e., in a vertical direction. Thus, since concentration of the injected electric current would not occur, it is suitable to a large-current operation.

In the case of the light-emitting device 13 according to a variation shown in FIG. 68(b), not only the conductivity type of the nitride semiconductor film 320 but also the conductivity type of the nitride semiconductor layer 110 needs to be n-type.

The n-electrodes 41 shown in FIG. 68(a) and FIG. 68(b) are both provided on the light emission surface side. Since it is provided on the light emission surface side, the n-electrode 41 may be made of a material which has high transmittance. For example, it may be a transparent electrode which is made of a material containing $In_2O_3$ and $SnO_2$, called Indium Tin Oxide (ITO), a transparent electrode containing ZnO, or a metal electrode which has a small thickness of not more than 100 nm.

The n-electrode 41 may be provided over the entire light emission surface as shown in FIG. 68(a). When the conductivity of the nitride semiconductor film 320 that has n-type conductivity is high, the n-electrode 41 may be provided over part of the light emission surface.

(Eighth Embodiment)

Hereinafter, the eighth embodiment is described with reference to the drawings.

Figure 69:
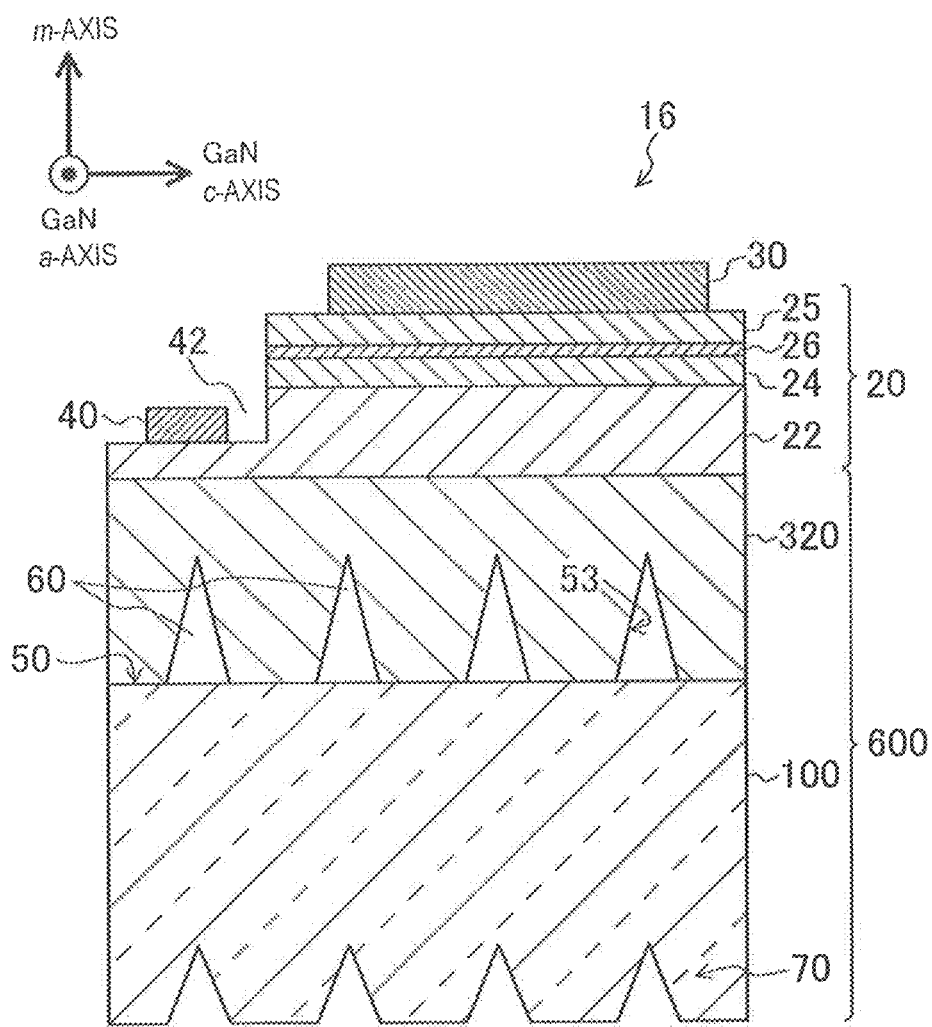
FIG. 69 is a schematic cross-sectional view showing a semiconductor light-emitting device of the eighth embodiment.

FIG. 69 schematically shows a cross-sectional configuration of a light-emitting device according to the eighth embodiment.

The light-emitting device 16 of the present embodiment has the same light-emitting device configuration as that of the light-emitting device 10 of the fourth embodiment. However, the difference resides in that the rear surface of the growth substrate 100 also has a stripe-shaped uneven structure 70.

Since the stripe-shaped uneven structure 70 is thus provided in the rear surface of the growth substrate 100, the polarization degree of emitted light which cannot be sufficiently reduced by the stripe-shaped gaps 60 provided in the nitride semiconductor film 320 can be further reduced. Accordingly, the light distribution characteristics and the light extraction effect in the light-emitting device 16 can be further improved.

The cross-sectional configuration and planar configuration of the stripe-shaped uneven structure 70 provided in the rear surface of the growth substrate 100 may be configurations shown in FIG. 45, FIG. 46, FIG. 47, FIG. 48, and FIG. 49.

The range of the in-plane tilt angle in the stripe-shaped uneven structure 70 may be equal to the above-described range of the angle β of the stripe-shaped gaps 60. For example, assuming that the in-plane tilt angle of the stripe-shaped uneven structure 70 is β' and, in the light-emitting device 16 of which principal surface is the m-plane, the a-axis direction in the plane is defined as β'=0°, the range of β' may be not less than 3° and not more than 45°.

The stripe-shaped uneven structure 70 may be formed by carrying out patterning and etching processes directly on the rear surface of the growth substrate 100. Note that, however, in the case where the growth substrate 100 is made of a material which is difficult to process, e.g., sapphire, a processible thin film for formation of unevenness is formed, or bonded, in addition to the growth substrate 100, and the unevenness processing may be carried out on that thin film. The stripe-shaped uneven structure 70 which has the in-plane tilt angle β' may be formed by, for example, depositing $SiO_2$ or the like on the rear surface of the growth substrate 100 and carrying out etching or the like on this deposited film.

The in-plane tilt angle β in the gaps 60 and the in-plane tilt angle β' in the stripe-shaped uneven structure 70 formed in the rear surface of the growth substrate 100 do not necessarily need to be identical with each other.

Also, the gaps 60 and the stripe-shaped uneven structure 70 do not need to have exactly identical structures. The structures illustrated in the fourth embodiment may be independently employed at respective sides so long as the polarization degree can be reduced.

The configuration of the present embodiment in which the stripe-shaped uneven structure 70 is provided in the rear surface of the growth substrate 100 is also applicable to the fifth to seventh embodiments.

(First Variation of Each of Embodiments)

In each of the embodiments, the gaps 60 which are configured to be inclined by a predetermined angle β with respect to the polarization direction, in the in-plane direction of the growing plane of the semiconductor multilayer structure 20 that is a constituent of the light-emitting device, may be filled with a material which has a different refractive index from that of the nitride semiconductor and which is different from air, such as a dielectric, for example.

For example, in each of the fourth to eighth embodiments, the gaps 60 may be partially, or entirely, filled with a dielectric, such as $SiO_2$, SiN, or the like.

In each of the embodiments, stripe-shaped ridge portions sandwiched by the gaps 60 are provided on the emission side of light from the active layer 24, the angle of the extending direction of the stripe-shaped ridge portions is within the range of not less than 3° and not more than 45° with respect to the a-axis direction of the nitride semiconductor. Further, it is important that the ridge portions sandwiched by the gaps 60 have the slope surface 53.

Therefore, in the configuration shown in each embodiment, the effect of this variation can be obtained even when each of the gaps 60 is filled with a dielectric, for example.

Further, in this variation, for example, the interface that forms the slope surface 53 is the nitride semiconductor and a dielectric film (e.g., $SiO_2$ film). Therefore, as shown in FIG. 55(c), the critical angle $θ_c$ is large as compared with the case of the gaps 60 (FIG. 53(a)), and therefore, it is an advantageous configuration in respect of light extraction.

As described hereinabove, when the stripe-shaped gaps 60 are filled with a dielectric, for example, and the in-plane tilt angle β of the stripe-shaped dielectric is not less than 3° and not more than 45°, the polarization degree of light emitted from the active layer 24 can be reduced, while the light distribution characteristics can be improved and the light extraction efficiency can also be improved.

(Second Variation of Each of Embodiments)

In each of the embodiments, the gaps 60 may be formed by carrying out patterning and etching directly on the principal surface that is the growing plane of the growth substrate 100 instead of forming the gaps 60 in the nitride semiconductor film 320 formed on the growth substrate 100. In this way, the stripe-shaped ridge portions may be formed by directly performing unevenness processing on the growth substrate 100. In this case, the effect of this variation can be obtained so long as the stripe-shaped gaps 60 which have previously been described in the fourth embodiment are formed in the surface of the growth substrate 100, and the nitride semiconductor film 320 can be regrown on a growth substrate 60 which has the gaps 60.

For example, in the case where the growth substrate 100 is made of sapphire, as shown in FIG. 55(b), the critical angle $θ_c$ is large as compared with the gaps 60 shown in FIG. 55(a) and $SiO_2$ shown in FIG. 55(c), so that it is advantageous in respect of the light extraction efficiency.

As described hereinabove, in a configuration where the nitride semiconductor film 320 is regrown on the growth substrate 100 which has the gaps 60 formed in the principal surface, the polarization degree of light emitted from the active layer 24 can be reduced, while the light distribution characteristics can be improved and the light extraction efficiency can be improved, so long as the in-plane tilt angle β of the stripe-shaped ridge structure is not less than 3° and not more than 45°.

(Third Variation of Each of Embodiments)

Each of the embodiments is likewise applicable to a device of which principal surface is a semi-polar plane.

For example, in the configurations from the fourth embodiment to the above-described second variation, the same effects can be obtained even when the principal surface (growing plane) of the nitride semiconductor layer 110 regrown on the growth substrate 100, the nitride semiconductor film 320, and the semiconductor multilayer structure 20 is the (11-22) plane that is a semi-polar plane.

It is known that a nitride-based semiconductor light-emitting device of which principal surface is the (11-22) plane mainly emits light which is polarized in the m-axis.

Thus, in the configurations from the fourth embodiment to the above-described second variation, it is assumed that the in-plane tilt angle of the stripe structures is η, and the η is defined as the angle between the m-axis in the (11-22) plane nitride semiconductor and the extending direction of the stripe structures. When the angle η is in the range of not less than 3° and not more than 45°, the polarization degree reducing effect, the light distribution characteristic improving effect and the light extraction efficiency improving effect can be obtained as in the above-described light-emitting devices in which the m-plane nitride semiconductor is employed.

EXAMPLE A

<Relationship Between the Angle β and the Polarization Degree and Light Distribution Characteristics in a Light-Emitting Device which has Stripe Structures in a Light Emission Surface>

(Manufacture of Inventive Example 6, Reference Example 1, and Comparative Example 1)

In this example, to examine the polarization degree reducing effect and the effects on the light distribution characteristics and light extraction efficiency with varying in-plane tilt angles β of the stripe structures, the experimental results of light-emitting devices in which a stripe-shaped ridge structure is formed in the rear surface of a growth substrate, which is a simple structure, are first described.

Figure 70:
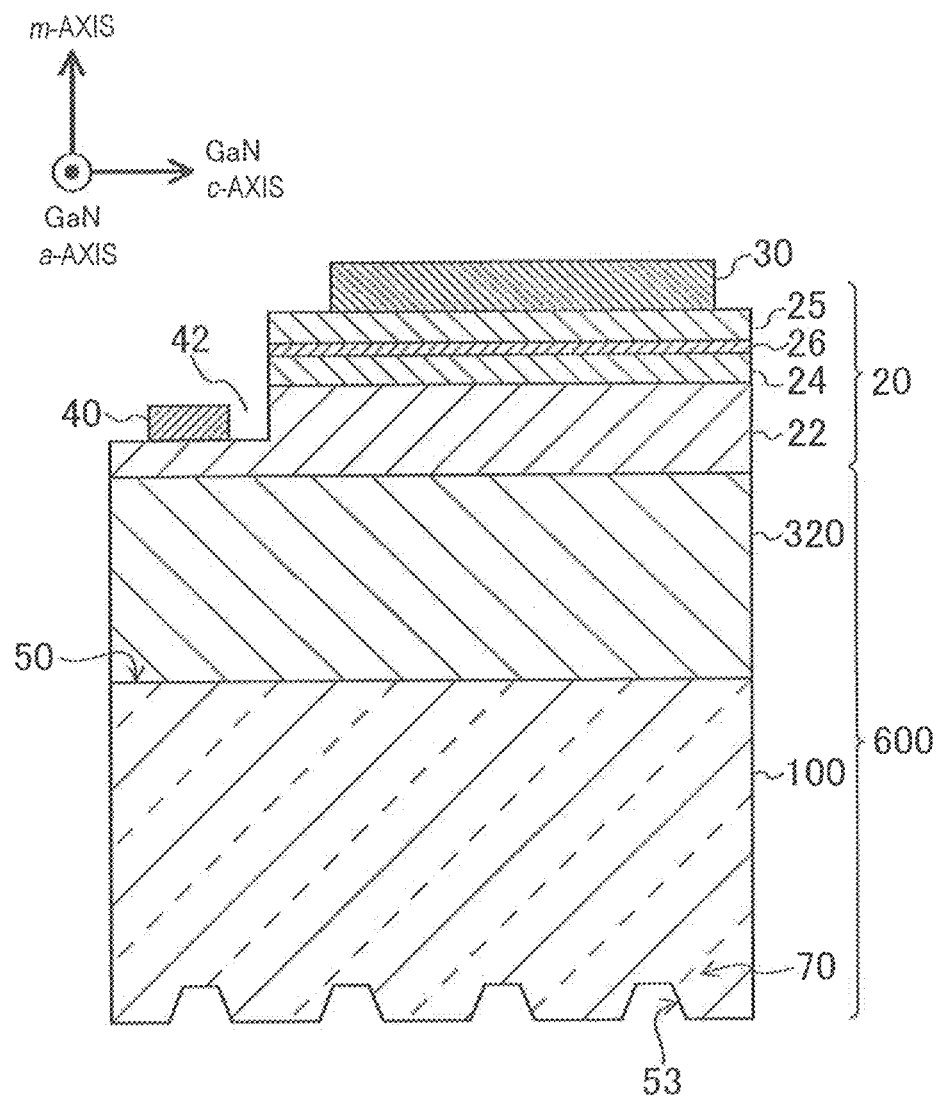
FIG. 70 is a schematic cross-sectional view showing a semiconductor light-emitting device of EXAMPLE A.

FIG. 70 schematically shows a light-emitting device which was examined in EXAMPLE A. In the light-emitting device of EXAMPLE A, the growth substrate 100 used was a GaN bulk substrate of which principal surface was the m-plane. In EXAMPLE A, the stripe structures were not formed near the interface 50 but in the rear surface of the growth substrate 100, i.e., the light emission surface.

First, on the principal surface of the growth substrate 100, a nitride semiconductor film 320 which was made of GaN and a semiconductor multilayer structure 20 on the nitride semiconductor film 320 were formed by epitaxial growth. For the epitaxial growth, a metal organic chemical vapor deposition (MOCVD) method was used.

Specifically, the nitride semiconductor film 320 was grown on the principal surface of the growth substrate 100, and then, an n-type layer 22 which was made of GaN was grown. The dopant used for the n-type layer 22 was silicon (Si). Here, the nitride semiconductor film 320 which was the first one that was grown on the growth substrate 100 was also doped with Si. Silane ($SiH_4$) gas was used as the source material of Si. From the viewpoint of decreasing the electric resistance of the light-emitting device, the nitride semiconductor film 320 may be doped. Note that, however, the nitride semiconductor film 320 does not necessarily need to be doped but may be an undoped layer. The total thickness of the nitride semiconductor film 320 and the n-type layer 22 was from about 3 μm to 8 μm. The growth temperature for the respective layers was 1050° C.

Then, an active layer 24 was grown on the n-type layer 22. The active layer 24 has a multi-quantum well structure in which $In_{0.13}Ga_{0.87}N$ well layers and GaN barrier layers were alternately stacked. The thicknesses of the well layer and the barrier layer were 3 nm and 12.5 nm, respectively. The number of periods of the quantum well structure was from 9 to 16. The growth temperature was from 700° C. to 800° C.

On the active layer 24, firstly, an undoped GaN layer 26 was grown. Then, two layers, a p-type $Al_{0.14}Ga_{0.86}N$ layer and a p-type GaN layer, were sequentially grown to form a p-type layer 25. The p-type dopant used was $Cp_2Mg$ (bis cyclopentadienyl magnesium) which was the source material of magnesium (Mg). The thickness of the p-type layer 25 was 250 nm. The growth temperature was 875° C.

Then, on the p-type layer 25, a p-type GaN contact layer was grown to such a thickness that the contact resistance of the p-electrode 30 can be decreased (not shown). The p-type contact layer had a higher Mg concentration than the Mg concentration of the p-type layer 25.

In this way, the semiconductor multilayer structure 20 was formed on the growth substrate 100 that was an m-plane GaN bulk substrate by a metal organic chemical vapor deposition method.

Then, a recessed portion 42 was formed by lithography and dry etching such that the n-type layer 22 was partially exposed from the semiconductor multilayer structure 20. Then, on the surface of the n-type layer 22 which was exposed at the recessed portion 42, a n-electrode 40 was formed of 100 nm thick aluminum (Al). Then, on the p-type GaN contact layer, a p-electrode 30 was formed of 400 nm thick silver (Ag). Note that the order of formation of the n-electrode 40 and the p-electrode 30 is not particularly limited. Thereafter, the growth substrate 100 which was made of bulk GaN was abraded such that the thickness of the growth substrate 100 was about 100 μm. In this way, the light-emitting device was manufactured.

Then, a method for forming the stripe-shaped uneven structure 70 is described.

Firstly, a $SiO_2$ film was formed as the hard mask material on the rear surface of the growth substrate 100. The $SiO_2$ film was formed by, for example, a plasma CVD (plasma chemical vapor deposition) method. Then, a resist film was applied over the $SiO_2$ film, and the resist film was patterned using an electron beam lithography apparatus so as to form stripe structures with periods of 300 nm. Thereafter, the patterned resist film was used as the mask in order to etch the $SiO_2$ film by dry etching with the use of a $CF_4$ gas and a $O_2$ gas, whereby a hard mask was formed from the $SiO_2$ film.

Then, dry etching with a chlorine ($Cl_2$) gas was carried out on the rear surface of the growth substrate 100 with the hard mask formed thereon such that a stripe-shaped uneven structure 70 was formed in the rear surface of the growth substrate 100. Here, the shape of a cross section of the uneven structure 70 taken along a direction perpendicular to the extending direction of the stripes of the uneven structure 70 is trapezoidal. Then, the $SiO_2$ film which was used as the hard mask was removed by wet etching.

By such a fabrication method, the stripe-shaped uneven structure 70, in which the period was 300 nm and the height difference of the recessed/raised portions was 300 nm, was formed in the rear surface of the growth substrate 100. The angle between the slope surface 53 and the surface of the growth substrate 100, i.e., the m-plane, was about 60°.

In this example, light-emitting devices which had the stripe-shaped uneven structures 70 with varying in-plane tilt angles β were manufactured in the same way. In this example, three light-emitting devices were manufactured, where the configuration of β=0° is referred to as Reference Example 1, the configuration of β=45° is referred to as Inventive Example 6, and the configuration of β=90° is referred to as Comparative Example 1.

(Manufacture of Inventive Example 7, Reference Example 2, and Comparative Example 2)

The stripe-shaped uneven structure 70 was formed in the rear surface of the growth substrate 100 that is an m-plane GaN bulk substrate by the same fabrication method as that employed for Inventive Example 6, Reference Example 1, and Comparative Example 1. The same constituent material of the hard mask, $SiO_2$, was used.

The period of the stripe structures was 8 μm. The height difference of the uneven structure was 4 μm. The cross-sectional shape was a near trapezoidal shape. The angle between the slope surface 53 and the substrate surface, i.e., the m-plane, was about 60°.

By the same manufacturing method as that employed for Inventive Example 6, the stripe-shaped uneven structure 70 was formed in the rear surface of the growth substrate 100, and light-emitting devices were manufactured with angles β being 0° (Reference Example 2), 45° (Inventive Example 7), and 90° (Comparative Example 2).

(Manufacture of Inventive Example 8, Reference Example 3, and Comparative Example 3)

The semiconductor multilayer structure 20 was fabricated on the growth substrate 100 that is an m-plane GaN bulk substrate by the same fabrication method as that employed for Inventive Example 6, Reference Example 1, and Comparative Example 1. Thereafter, light-emitting devices which had the stripe-shaped uneven structure 70 in the rear surface of the growth substrate 100 with varying angles 13, angle β=0°, 5°, 30°, 45°, and 90°, were manufactured.

In Inventive Example 8 and other examples, the stripe-shaped uneven structure 70 was fabricated by a different method from that employed for Inventive Example 6, Reference Example 1, and Comparative Example 1. In this example, the resist film was used as the mask, instead of using the hard mask of SiO$_2$. That is, dry etching was carried out using the patterned resist film as the mask so as to form the stripe-shaped uneven structure 70 in the rear surface of the growth substrate 100. A residue of the resist film after the etching was removed using an etchant that was a mixture solution of a sulfuric acid and a hydrogen peroxide solution.

In Inventive Example 8, Reference Example 3, and Comparative Example 3, the period of the stripe-shaped uneven structure 70 was 8 µm, and the height difference of the recessed/raised portions was 2.5 µm. The dry etching was carried out such that the cross-sectional shape of the stripe-shaped uneven structure 70 is triangular or elliptical. That is, as shown in FIG. 46(*a*) and FIG. 46(*b*), etching was carried out on the growth substrate 100 such that the area of the bottom surface of the stripe-shaped uneven structure 70 was decreased, whereby a stripe-shaped uneven region 70 was formed.

Here, the configuration where the extending direction of the stripe-shaped uneven structure 70 was identical with the a-axis, i.e., β was 0°, is referred to as Reference Example 3. The configuration where the angles β formed with respect to the a-axis were 5°, 30°, and 45° is referred to as Inventive Example 8. The configuration where the angle β formed with respect to the a-axis was 90° is referred to as Comparative Example 3.

(Manufacture of Comparative Example 4)

On the growth substrate 100 of a light-emitting device which was manufactured by the same manufacturing method as that employed for Inventive Example 6, a light-emitting device was manufactured which was different only in that the stripe-shaped uneven structure 70 was not provided. This device is referred to as Comparative Example 4. The configuration of Comparative Example 4 was such that, in the configuration of FIG. 70, the uneven structure 70 is not provided in the rear surface of the growth substrate 100. Thus, it has a flat light emission surface.

(Method for Measuring the Polarization Degree)

Figure 71:
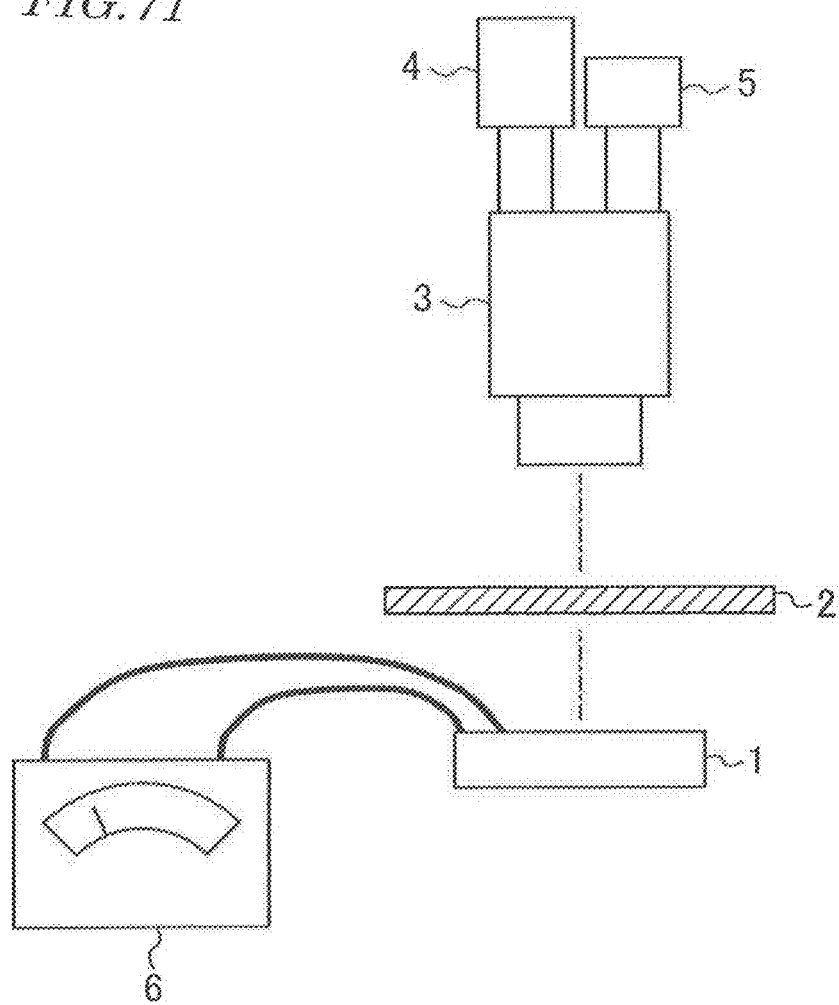
FIG. 71 is a schematic diagram showing a measurement system for the polarization degree of emitted light in a semiconductor light-emitting device.

FIG. 71 schematically shows a measurement system for the polarization degree. A light-emitting device 1 of a nitride-based semiconductor, which is a measurement object, is powered by a power supply 6 to emit light. The emission of the light-emitting device 1 is checked using a stereoscopic microscope 3. The stereoscopic microscope 3 has two ports. A silicon photodetector 4 is attached to one of the ports, and a CCD camera 5 is attached to the other port. A polarizing plate 2 is provided between the light-emitting device 1 and the stereoscopic microscope 3. While the polarizing plate 2 is rotated, the maximum and the minimum of the emission intensity are measured using the silicon photodetector 4.

(Method for Measuring the Light Distribution Characteristics)

For the manufactured light-emitting device, OL700-30 LED GONIOMETER manufactured by Optronic Laboratories, Inc. was used. The light distribution characteristic in the a-axis direction and the light distribution characteristic in the c-axis direction were measured based on condition A (the distance between the tip of the light-emitting device and the light receiving section 7 is 316 mm), which is described in CIE127 published by the International Commission on Illumination (CIE).

FIG. 72(*a*) and FIG. 72(*b*) schematically show the measurement system for the light distribution characteristics.

The light distribution characteristic in the a-axis direction shown in FIG. 72(*a*) is a value obtained by measuring the luminous intensity while a semiconductor light-emitting chip 700 is rotated around the c-axis of the semiconductor light-emitting chip 700, with the angle formed between the m-axis direction [1-100], which is the normal direction of the m-plane of the active layer of the semiconductor light-emitting chip 700, and the measurement line 8 extending between the semiconductor light-emitting chip 700 and the measuring device 7 being selected as the measurement angle.

The light distribution characteristic in the c-axis direction shown in FIG. 72(*b*) is a value obtained by measuring the luminous intensity while the semiconductor light-emitting chip 700 is rotated around the a-axis of the semiconductor light-emitting chip 700, with the angle formed between the m-axis direction [1-100], which is the normal direction of the m-plane of the active layer of the semiconductor light-emitting chip 700, and the measurement line 8 extending between the semiconductor light-emitting chip 700 and the measuring device 7 being selected as the measurement angle.

Here, the evaluation of the light distribution characteristics was made with values obtained by normalizing the luminous intensities in the a-axis direction and the c-axis direction at the same angle with respect to the normal direction using the luminous intensity in the normal direction [1-100] of the m-plane that was the principal surface, i.e., the luminous intensity at 0°, on the assumption that the luminous intensity in the m-axis direction [1-100] is 1.

The measured angle range was from −90° to +90° with the m-axis direction being at the median, i.e., 0°. The measurement was carried out in each of the a-axis direction and the c-axis direction.

The measurement method described hereinabove was used to evaluate the polarization degree and the light distribution characteristics of the light-emitting device.

Figure 73:
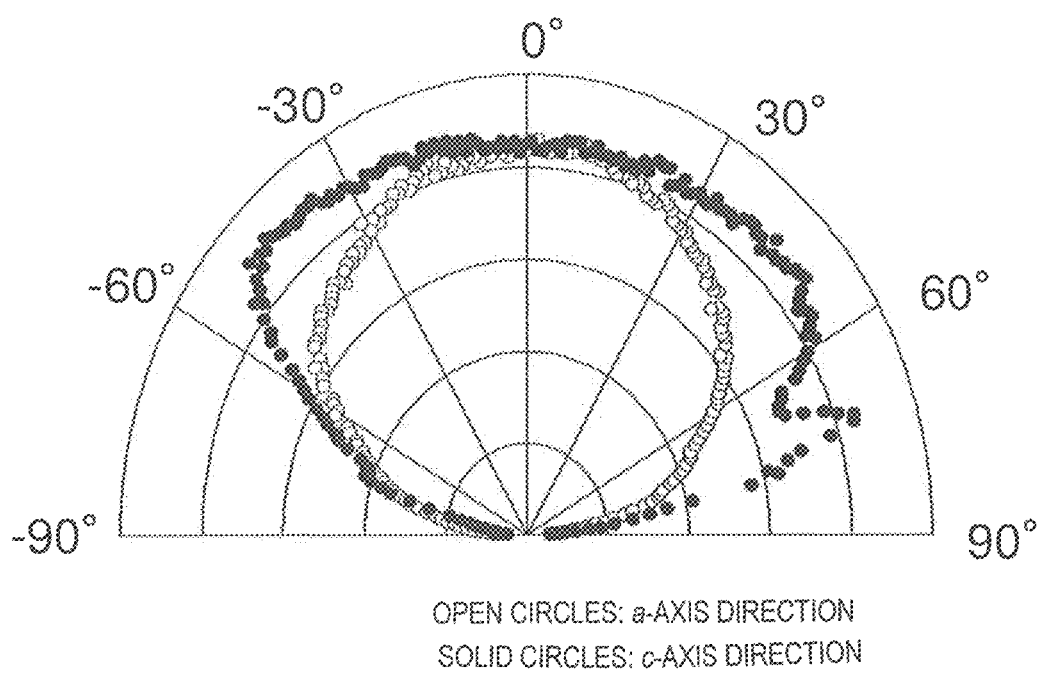
FIG. 73 is a graph showing the light distribution characteristics in a semiconductor light-emitting device of Comparative Example 4.

Firstly, the results of the light distribution characteristics of a light-emitting device of Comparative Example 4 which has a flat emission surface, and which does not have stripe structures, such as the uneven structure 70 and the gaps 60, on the light emission side, are shown in FIG. 73.

It is understood form FIG. 73 that the light distribution characteristics are apparently asymmetry with respect to the a-axis direction (open circles) and the c-axis direction (solid circles). The distribution of light emitted in the c-axis direction was such that the intensity was distributed over a wider angle range than the distribution of light in the a-axis direction. As previously described, this is attributed to a fact that the emission from a light-emitting device grown on an m-plane nitride semiconductor is the a-axis polarized light. As illustrated in FIG. 50(*b*), the propagation vector of the polarized light is mainly present in the mc-plane, and the intensity of light which is present in the ma-plane relatively decreases.

Thus, it was confirmed that, in a normal nitride-based semiconductor light-emitting device of which principal surface is the m-plane and in which no processing is performed on the light emission surface, the propagation vector is mainly present in the mc-plane, and the distribution of the emission intensity is wider in the c-axis direction than in the a-axis direction, resulting in an asymmetry distribution.

FIG. 74(*a*) and FIG. 74(*b*) show the evaluation results of the light distribution characteristics of the light-emitting devices of Inventive Example 6, Reference Example 1, and Comparative Example 1 in which the in-plane tilt angles β were 0°, 45°, and 90°, respectively.

FIG. 74(*a*) and FIG. 74(*b*) show the evaluation results of the light distribution characteristics in the a-axis direction and the c-axis direction, respectively. Here, as for the light distribution characteristic in the a-axis direction, assuming that, relative to the c-axis of the light-emitting device, the angle was 0° when the m-axis and the optical axis were parallel to each other as illustrated in FIG. 72(a), the light intensity distribution was evaluated with the angle increasing in a direction inclined from the m-axis to the a-axis. As for the evaluation of the light distribution characteristic in the c-axis direction, the measurement was carried out as illustrated in FIG. 72(b).

As seen from the results shown in FIG. 74(a), the light distribution characteristic in the a-axis direction does not depend on the in-plane tilt angle β. On the other hand, as seen from the results shown in FIG. 74(b), the light distribution characteristic in the c-axis direction which was obtained when the in-plane tilt angle β was not more than 45° is apparently different from the result of the light distribution characteristic in the c-axis direction of Comparative Example 4 that did not have the stripe structures, which is shown in FIG. 73. That is, it is appreciated that, when the in-plane tilt angle β of the stripe structures was not more than 45°, the light distribution characteristics in the a-axis direction and the c-axis direction were close to each other so that the asymmetry was improved.

Figure 75:
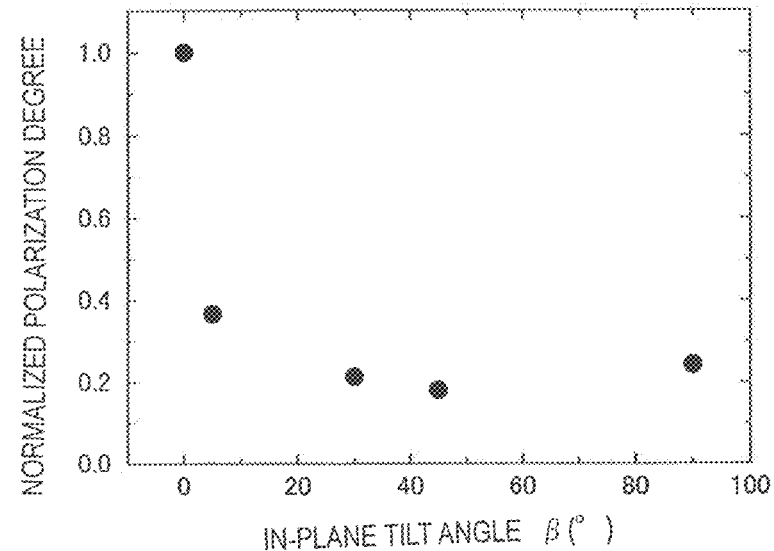
FIG. 75 is a graph showing the relationship between the in-plane tilt angle β of a stripe structure and the specific polarization degree in semiconductor light-emitting devices of Inventive Example 8, Reference Example 3, and Comparative Example 3.

Next, the relationship between the angle β and the polarization degree reducing effect was evaluated using Inventive Example 8, Reference Example 3, and Comparative Example 3. FIG. 75 shows the relationship between the in-plane tilt angle β of the stripe structures and the specific polarization degree. Here, the specific polarization degree refers to a value normalized with the polarization degree that is obtained when β=0° at which the polarization state of light emitted from the active layer 24 can be best maintained (the polarization degree of Reference Example 3) as previously shown in Formula (2).

As seen from FIG. 75, the in-plane tilt angle β was slightly greater than 0°, the polarization degree was abruptly reduced. When β=5°, the specific polarization degree was not more than 0.4. When β=30°, the specific polarization degree further decreased to 0.25 or smaller. The specific polarization degree was the minimum near β=45° and was somewhat greater at β=90°.

Thus, the polarization degree of light emitted from the active layer 24 strongly depends on the in-plane tilt angle β of the stripe-shaped uneven structure 70. The polarization degree reducing effect greatly varies in the range of 0° to 5°. In the angle range of not less than 5°, the polarization degree reducing effect varies relatively moderately. Near β=45°, the specific polarization degree reached the minimum value.

In the structure of the angle β=0°, it is considered that, if it is less than about ±3°, the polarization degree of light emitted from the active layer 24 can be maintained. Therefore, it is considered that the in-plane tilt angle β at which the effect of reducing the polarization degree of the light can be achieved may be not less than 3°.

As described hereinabove based on the experimental results, it was found that, when the in-plane tilt angle β of the stripe-shaped uneven structure 70 is set to an angle greater than 0°, the effect of reducing the polarization degree of light can be obtained.

However, the degree of reduction of the polarization degree depends on the shape of the stripe-shaped uneven structure 70 to some extent. For example, in the configuration of the uneven structure 70 of Inventive Example 8, the raised portions 51 have substantially no bottom surface, and their wall surfaces are formed by the slope surface 53 or curved surfaces as shown in FIG. 46(a) and FIG. 46(b).

On the other hand, when the cross-sectional shape of the uneven structure 70 is trapezoidal, the uneven structure 70 has a bottom surface, and the polarization degree reducing effect cannot be obtained in that region. That is, the polarization degree reducing effect varies to some extent depending on the shape of the uneven structure 70.

However, it was confirmed from comparative examination of Reference Example 2, Inventive Example 7, and Comparative Example 2 that, so long as the stripe-shaped uneven structure 70 or the gaps 60 are present on the light emission surface side of the light-emitting device and they include the slope surface 53 in part thereof, the in-plane tilt angle β dependence of the polarization characteristics would not substantially vary. The same effects can be obtained.

Figure 76:
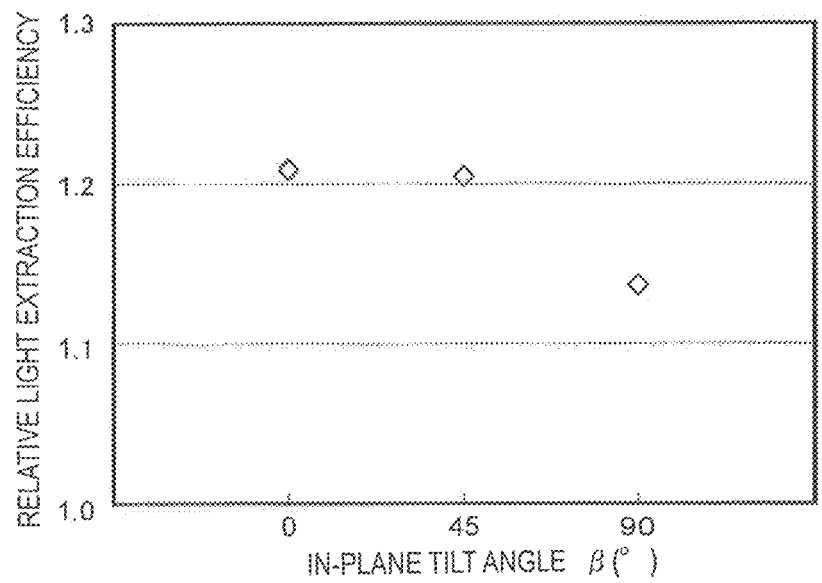
FIG. 76 is a graph showing the relationship between the angle formed between the stripe structure and the a-axis and the specific light extraction efficiency in semiconductor light-emitting devices of Inventive Example 6, Reference Example 1, and Comparative Example 1.

Next, the effect of light extraction was evaluated. FIG. 76 shows the relationship between the light extraction efficiency and the in-plane tilt angle β in light-emitting devices of Inventive Example 6, Reference Example 1, and Comparative Example 1. Here, the light extraction efficiency was evaluated as the specific light extraction efficiency. The specific light extraction efficiency refers to a value of the external quantum efficiency of each of Inventive Example 6, Reference Example 1, and Comparative Example 1 which is normalized with the external quantum efficiency of Comparative Example 4 that does not have the stripe structures but a flat light emission surface. The external quantum efficiency can be represented by Formula (6) shown below using the internal quantum efficiency and the light extraction efficiency:

$$\text{External Quantum Efficiency} = \text{Internal Quantum Efficiency} \times \text{Light Extraction Efficiency} \quad \text{Formula (6)}$$

The semiconductor multilayer structures 20 of Inventive Example 6, Reference Example 1, Comparative Example 1, and Comparative Example 4 have identical configurations, and therefore, it can be assumed that they have identical internal quantum efficiencies. Under this assumption, the light extraction efficiency was evaluated by comparison of the external quantum efficiencies.

First, as seen from FIG. 76, when the stripe-shaped uneven structure 70 is provided on the light emission surface side, the specific light extraction efficiency exhibits a large value which is not less than 1.1. The most important point is that, in a light-emitting device in which the in-plane tilt angle β is not less than 0° and not more than 45°, the specific light extraction efficiency exhibits a further increased value, which is not less than 1.2. This is because, for example, as illustrated in FIG. 50, the polarization direction of light emitted from the active layer 24 that is made of an m-plane nitride semiconductor is the a-axis direction, and its propagation vector is mainly present in the mc-plane. That is, the light extraction effect achieved by the stripe structures is attributed to the fact that the extending direction of the stripe structures is preferably closer to the a-axis direction) (β=0°) than the c-axis direction) (β=90°).

Thus, it is because, when the stripe structures are formed in such a way, light which is mainly propagating in the c-axis direction is more susceptible to the unevenness of the stripe structures.

Furthermore, it was confirmed from those experimental results that, when the angle β is in the range of not less than 0° and not more than 45°, the light extraction effect at substantially the same level can be obtained.

As described hereinabove, it was found that, in a nitride-based semiconductor light-emitting device of which principal surface is the m-plane, when the stripe-shaped uneven structure 70 is provided on the light emission surface side and its in-plane tilt angle β is not less than 3° and not more than 45°, the polarization degree of light emitted from the active layer 24 can be reduced, while improvement of the light distribution characteristics and the light extraction efficiency improving effect can be obtained.

EXAMPLE B

<Characteristics of a Light-Emitting Device in which Gaps are Provided at the Interface Between the Growth Substrate and the Nitride Semiconductor Film>

In EXAMPLE A, it was explained based on the experimental results that an m-plane nitride-based semiconductor light-emitting device which has a stripe-shaped uneven structure with a certain in-plane tilt angle β on the light emission surface side can achieve reduction of the polarization degree, improvement of the light distribution characteristics, and improvement of the light extraction efficiency.

In EXAMPLE B, it was experimentally confirmed that, in a semiconductor light-emitting device in which gaps 60 are provided near the interface between the growth substrate and the nitride semiconductor film, which constitute a major structure according to the fourth embodiment, the same effects as those described in EXAMPLE A are obtained. Hereinafter, details of this feature are described.

(Fabrication of the Heterogeneous Nitride Semiconductor Substrate 600)

First, a method for fabricating the heterogeneous nitride semiconductor substrate 600 is described.

In this example, a heterogeneous nitride semiconductor substrate 600 of which principal surface was the m-plane was fabricated based on a fabrication method in which the nitride semiconductor film 320 is regrown after removal of the mask 121 that is made of a resist which is used in formation of the nitride semiconductor layer 110 in the shape of raised portions as illustrated in FIG. 57.

1. Growth of a Nitride Semiconductor Layer on a Growth Substrate which was Made of m-Plane Sapphire In EXAMPLE B, an m-plane sapphire substrate was used as the growth substrate 100 shown in FIG. 57(a). The thickness of the m-plane sapphire substrate was 430 μm. The diameter of the m-plane sapphire substrate was about 5.1 cm (=2 inches). The angle between the normal line of the principal surface of the m-plane sapphire substrate and the normal line of the m-plane was 0°±0.1°.

Then, a nitride semiconductor layer 110 of which growing plane was the m-plane was grown on the growth substrate 100 by a metal organic chemical vapor deposition method. It is commonly believed that growth of a low temperature buffer layer is required for growth of an m-plane nitride semiconductor on a substrate that is made of m-plane sapphire. In this example, an AlN layer was used as the low temperature buffer layer.

After the growth of the low temperature buffer layer, the substrate temperature was increased to a temperature in the range of 900° C. to 1100° C. in order to grow the nitride semiconductor layer 110 of which principal surface was the m-plane. The thickness of the nitride semiconductor layer 110 was from about 1 μm to 3 μm.

2. Fabrication of the Unevenly-Processed Substrate 510

Then, the mask 121 was formed of a resist on the nitride semiconductor layer 110 by a known lithography method as shown in FIG. 57(a). For the mask 121, a typical line & space (L&S) pattern, i.e., a pattern of thin and elongated stripes, was used. In the L&S pattern used in this example, the width of the line portions of the mask 121, L, was 5 μm, and the width of the space portions, S, was 10 μm. The thickness of the mask 121 after the photolithography step was finished was about 2 μm to 3 μm.

By pattern formation of the mask 121, the in-plane tilt angle β, which is the extending direction of the stripe-shaped gaps 60, can be appropriately determined.

Then, the nitride semiconductor layer 110 that serves as a seed crystal was etched through the mask 121 using an inductively coupled plasma etching (ICP etching) apparatus such that the growth substrate 100 was selectively exposed through the nitride semiconductor layer 110, whereby the stripe-shaped nitride semiconductor layers 110a that form the raised portions and the recessed portions 210 provided therebetween were formed. In forming the recessed portions 210 by etching, the upper part of the growth substrate 100 was also etched away such that part of the nitride semiconductor layer 110 would not remain. That is, the etching was carried out till the GaN layer exposed through the space portions of the mask 121 was removed and the growth substrate 100 was exposed, whereby the recessed portions 210 were formed. Thereafter, the mask 121 remaining on the stripe-shaped nitride semiconductor layers 110a was removed, whereby the unevenly-processed substrate 510 shown in FIG. 57(b) was obtained.

FIG. 77(a) and FIG. 77(b) shows an example of the unevenly-processed substrate 510 of this example. FIG. 77(a) and FIG. 77(b) are scanning electron microscopic images (SEM images) that were obtained after the stripe-shaped nitride semiconductor layers 110a and the recessed portions 210 in which the surface of sapphire was exposed by etching were formed using a stripe-shaped L&S pattern mask. Here, a cross-sectional image (left) which is perpendicular to the extending direction of the stripe-shaped nitride semiconductor layers 110a and a perspective image (right) are shown. The cross-sectional shape of the stripe-shaped nitride semiconductor layers 110a can be controlled by appropriately selecting the formation conditions for the mask 121 and the etching conditions.

As shown in FIG. 77, the cross-sectional shape of the stripe-shaped nitride semiconductor layers 110a can be controlled to be a trapezoidal cross-sectional shape such as shown in FIG. 77(a) or a triangular cross-sectional shape such as shown in FIG. 77(b). In this example, a GaN layer with a trapezoidal cross-sectional shape was used as the stripe-shaped nitride semiconductor layers 110a. Further, as illustrated in FIG. 58(a), in this example, the etching was carried out such that the sapphire was exposed at the wall surfaces in the lower part of the recessed portions 210. In this case, the depth of the recessed portions 210, i.e., the height of the wall surfaces 220 of the growth substrate 100 in the recessed portions 210, was about 250 nm.

In this example, the thickness of the stripe-shaped nitride semiconductor layers 110a was from about 1 μm to 3 μm, although the thickness of the nitride semiconductor layers 110a may be appropriately adjusted. To realize epitaxial lateral overgrowth of the nitride semiconductor film 320 of which principal surface was the m-plane according to this example, it is only necessary to form the stripe-shaped nitride semiconductor layers 110a that are the seed crystal of which principal surface is the m-plane and from which regrowth of the nitride semiconductor is to start, and the recessed portions 210 in which the growth substrate 100 of the m-plane sapphire is exposed at the lower part.

3. Fabrication of the Heterogeneous Nitride Semiconductor Substrate 600 (Regrowth of a Nitride Semiconductor Film on an Unevenly-Processed Substrate)

Then, a nitride semiconductor film 320 was regrown on the unevenly-processed substrate 510.

The unevenly-processed substrate 510 was again carried into the metal organic chemical vapor deposition apparatus. Then, the growth temperature was set to a temperature in the range of about 900° C. to 1000° C. for carrying out regrowth.

The important point for growth of the nitride semiconductor film 320 is that regrowth of the nitride semiconductor film 320 starting from the stripe-shaped nitride semiconductor layers 110a that form the raised portions is enhanced in lateral directions. In this example, the growth was carried out under the conditions that the value of the V/III ratio, which is the ratio of the source materials for the Group V element and the Group III element, was about 160, the growth pressure was about 13.3 kPa, and the growth speed was about 4 μm/h. Under these conditions, the nitride semiconductor film 320 was formed by regrowth so as to have a thickness of 4 μm to 10 μm, whereby a heterogeneous nitride semiconductor substrate 600 of which principal surface was the m-plane was obtained.

In that process, the growth conditions for enhancing the growth speed of the lateral growth and the width L and width S of the raised portions of the unevenly-processed substrate 510 are appropriately selected such that the recessed portions 210 can be covered with the nitride semiconductor film 320. Further, the cross-sectional shape of the gaps 60 formed above the recessed portions 210 can also be controlled.

FIG. 78(a) and FIG. 78(b) show some fabricated examples of the heterogeneous nitride semiconductor substrate 600 which were obtained as described above. It can be seen that a plurality of gaps 60 were provided in an interface region between the growth substrate 100 and the nitride semiconductor film 320 as explained in the section of the fourth embodiment. It can be seen that, by adjusting the fabrication conditions for the heterogeneous nitride semiconductor substrate 600, the configuration and cross-sectional shape of the stripe-shaped gaps 60 can be controlled. For example, FIG. 78(a) and FIG. 78(b) are SEM images on the same scale. The height of the gaps 60 shown in FIG. 78(b) is higher than the height of the gaps 60 shown in FIG. 78(a).

The heterogeneous nitride semiconductor substrate 600 fabricated by the above-described fabrication method, which includes the gaps 60 in the interface region, can obtain the effect of greatly improving the crystallinity in addition to the effect of reducing the polarization degree of light, which is one of the major effects of this example.

Hereinafter, experimental results of that example are described.

Table 2 shows the results of the half-value width of the (1-100) plane X-ray ω rocking curve (XRC) in a regrown m-plane GaN film of the heterogeneous nitride semiconductor substrate 600 that was obtained in this example. Here, the X-ray was incident so as to be parallel to the a-axis direction and c-axis direction of the GaN. For the sake of comparison, the values of the XRC full width at half maximum in an m-plane GaN layer directly grown on an m-plane sapphire substrate are also shown in Table 2.

The half-value width of the m-plane GaN layer directly grown on the m-plane sapphire substrate exhibited a high value which was not less than 1000 seconds. Further, when the X-ray was incident in the a-axis direction and the c-axis direction of the GaN layer, the XRC full width at half maximum for the case where the X-ray was incident in the c-axis direction of the GaN layer was further increased by a factor of about two. This is because information of stacking faults was reflected in the XRC full width at half maximum which was obtained when the X-ray was incident in the c-axis direction.

That is, it is understood that, in measurement of the XRC full width at half maximum in the m-plane GaN layer directly grown on the m-plane sapphire substrate, when asymmetry is seen in the measurement results of the X-ray incidence in the a-axis direction and the c-axis direction, the crystal includes many stacking faults in addition to usual dislocations.

TABLE 2

|  | GaN: a-axis direction incidence | GaN: c-axis direction incidence |
| --- | --- | --- |
| Directly grown m-plane GaN | 1326 seconds | 2325 seconds |
| Regrown m-plane GaN | 548 seconds | 746 seconds |

On the other hand, when the m-plane GaN film was regrown after the unevenly-processed substrate 510 was formed, the XRC full width at half maximums in the a-axis direction and the c-axis direction decreased to 548 seconds and 746 seconds, respectively.

When the X-ray was incident in the a-axis direction in the regrown m-plane GaN layer, it decreased to ½ or a smaller value. This means that the dislocation density was greatly reduced by the regrowth. Further, as compared with the results of the directly-grown m-plane GaN layer, the values of the half-value width which were obtained when the X-ray was incident in the a-axis direction and the c-axis direction in the regrown m-plane GaN layer were close to each other, so that the degree of symmetry was improved. This demonstrates that, in the regrown m-plane GaN layer of this example, not only the dislocation density but also the stacking fault density decreased.

As described hereinabove, it is understood that, when the stripe-shaped gaps 60 of this example are provided near the interface between the growth substrate 100 and the nitride semiconductor film 320, the effect of reducing the polarization degree of light and the effect of reducing the density of dislocations and defects in the nitride semiconductor film 320 itself, i.e., the crystallinity improving effect, can be obtained.

Such a crystallinity improving effect was also confirmed by a transmission electron microscope (TEM).

FIG. 79(a) and FIG. 79(b) show cross-sectional TEM images of the heterogeneous nitride semiconductor substrate 600. FIG. 79(a) corresponds to a region around one of the stripe-shaped nitride semiconductor layers 110a of FIG. 57(d). FIG. 79(b) shows an enlarged image of a portion around the gap 60 shown in FIG. 79(a).

First, as seen from FIG. 79(a), a portion of the nitride semiconductor film 320 which was grown on the stripe-shaped nitride semiconductor layer (raised portion) 110a contains dislocations (black line-like portions in the drawing) at a high density as compared with portions grown on the recessed portions 210.

Examining the dislocation density, the GaN layer on the raised portion 110a had a dislocation density on the order of $10^{10}$ cm$^{-2}$, while the GaN layer on the recessed portions 210 had a dislocation density of not more than $10^9$ cm$^{-2}$. It was found that the dislocation densities were different by one or more orders of magnitude.

As in the case of the results of Table 2, it was also confirmed from the TEM images that, by configuring the heterogeneous nitride semiconductor substrate 600 so as to include the stripe-shaped gaps 60, the density of dislocations and defects is reduced and the crystallinity is improved.

Figure 60:
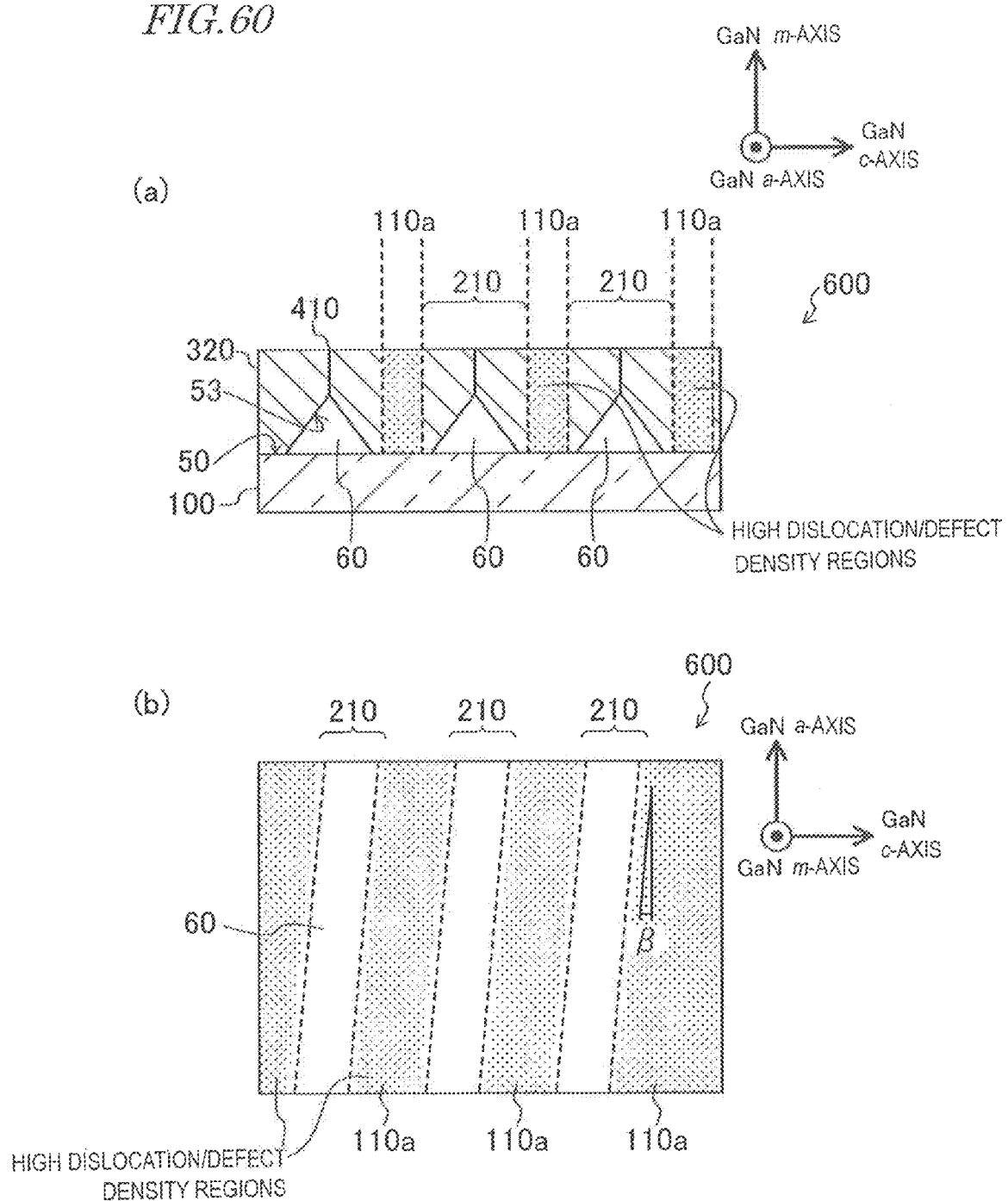
FIG. 60(a) is a schematic cross-sectional view showing a heterogeneous nitride semiconductor substrate which includes stripe-shaped gaps according to the fifth embodiment.
FIG. 60(b) is a schematic plan view where a heterogeneous nitride semiconductor substrate of the fifth embodiment is seen from the m-axis direction.
Figure 79:
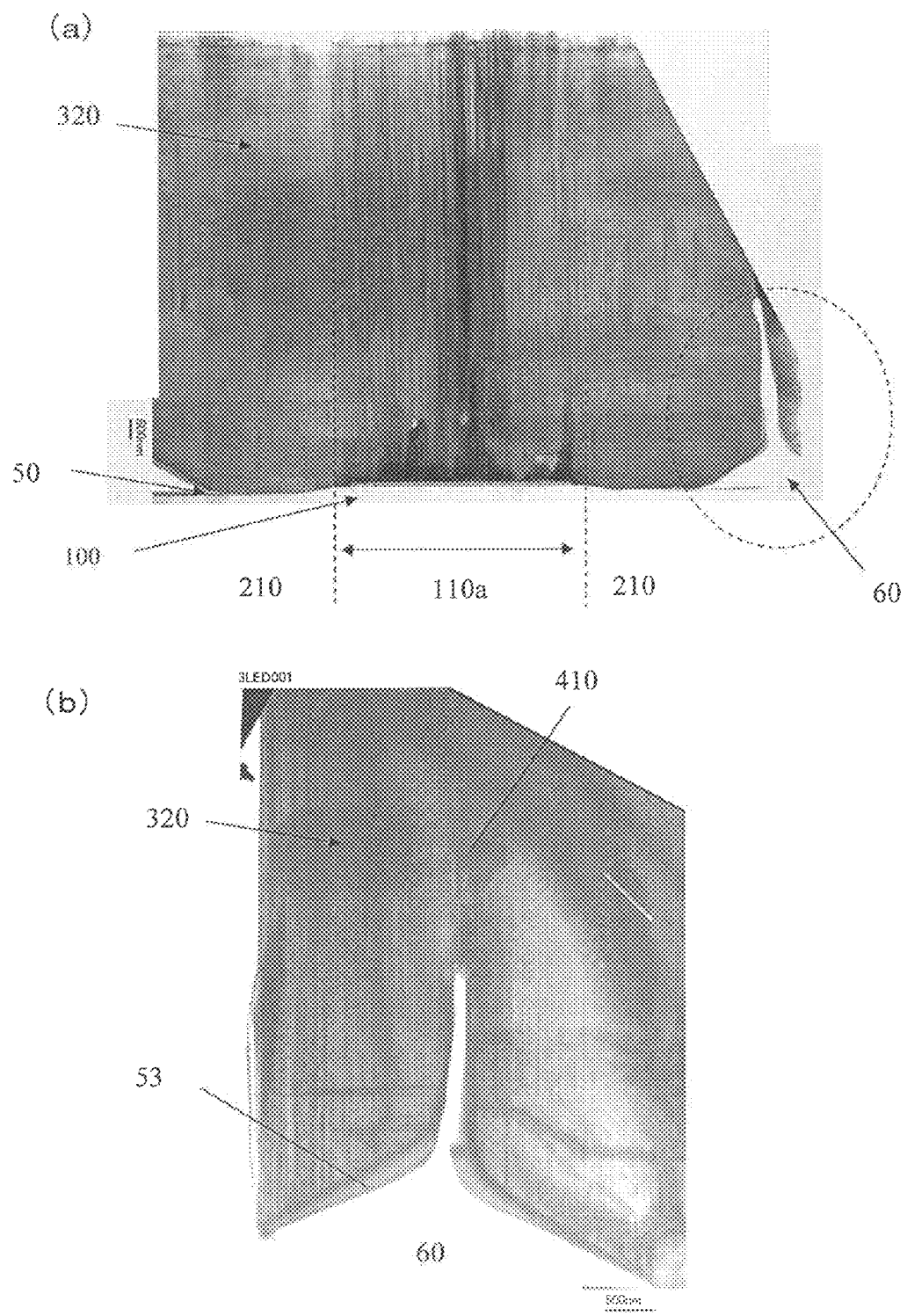
FIGS. 79(a) and 79(b) are transmission electron microscopic images showing a semiconductor light-emitting device of EXAMPLE B which was manufactured on a heterogeneous nitride semiconductor substrate.

The region of high dislocation/defect density, which is seen in FIG. 79, is identical with the region which has previously been illustrated in FIG. 60.

Thus, in this example, particularly when a light-emitting device is manufactured on the heterogeneous nitride semiconductor substrate 600 that has the gaps 60, high dislocation density/high defect density regions are formed above the raised portions 110*a*.

FIG. 79(*b*) shows an enlarged image of the cross-sectional shape of the gap 60. It can be confirmed that, by regrowing the nitride semiconductor film 320, the connecting portion 410 and the gap 60 having the slope surfaces 53 were formed.

By the above-described fabrication method, the heterogeneous nitride semiconductor substrate 600 that has the stripe-shaped gaps 60 near the region of the interface 50 between the growth substrate 100 and the nitride semiconductor film 320 can be prepared.

4. Manufacture of the Light-Emitting Device 10 on the Heterogeneous Nitride Semiconductor Substrate 600

Next, a semiconductor multilayer structure 20 was formed on the heterogeneous nitride semiconductor substrate 600 that had the stripe-shaped gaps 60, which was fabricated by the above-described method.

The in-plane tilt angle β of the gaps 60 in the heterogeneous nitride semiconductor substrate 600 of this example was 5°.

As illustrated in FIG. 75 of EXAMPLE A, it was confirmed that, in a light-emitting device in which the stripe-shaped uneven structure 70 is formed in the rear surface of the growth substrate 100, the polarization degree reducing effect can be obtained so long as the in-plane tilt angle β is 5°.

(Manufacture of Inventive Example 9)

A light-emitting device 10 was formed on the heterogeneous nitride semiconductor substrate 600 including the gaps 60 with the in-plane tilt angle β of 5° at the interface 50 between the growth substrate 100 and the nitride semiconductor film 320.

The configuration and manufacturing method of the light-emitting device 10 are equivalent to those of Inventive Example 6 of EXAMPLE A.

(Manufacture of Comparative Example 5)

A light-emitting device was manufactured by an equivalent method to that of Inventive Example 6, which was however only different from the light-emitting device of Inventive Example 6 in that the stripe-shaped uneven structure 70 was not provided. This light-emitting device is referred to as Comparative Example 5.

The light emission surface of the light-emitting device of Comparative Example 5 did not have the stripe-shaped uneven structure 70 illustrated in FIG. 70 but had a flat surface. In terms of the configuration, it was basically the same as the above-described Comparative Example 4. However, for the sake of strict comparison with the characteristics of the light-emitting device 10 manufactured on the heterogeneous nitride semiconductor substrate 600 of Inventive Example 9, the multilayer structure of the light-emitting device of Comparative Example 5 was grown concurrently with the light-emitting device 10 of Inventive Example 9, by a metal organic chemical vapor deposition method under the same growth conditions.

(Comparison of the Light Distribution Characteristics and the Polarization Degree)

The characteristics of the light-emitting devices of Inventive Example 9 and Comparative Example 5 were compared and evaluated. FIG. 80(*a*) and FIG. 80(*b*) show the evaluation results of the light distribution characteristics in the a-axis direction and the c-axis direction of the light-emitting devices. FIG. 80(*a*) shows the results of Comparative Example 5. FIG. 80(*b*) shows the results of Inventive Example 9 which had the gaps 60.

Comparative Example 5 had basically the same configuration as that of Comparative Example 4 described in EXAMPLE A. Therefore, the light distribution characteristic in the c-axis direction exhibited a wider distribution than in the a-axis direction, so that it was asymmetry, such as illustrate in FIG. 73.

On the other hand, it can be seen that, in the case of Inventive Example 9 where the heterogeneous nitride semiconductor substrate 600 had the gaps 60, the degree of asymmetry was apparently reduced as compared with Comparative Example 5, and the difference between the light distribution characteristic in the a-axis direction and the light distribution characteristic in the c-axis direction was small.

Next, comparison of the polarization degree between Comparative Example 5 and Inventive Example 9 was made. The polarization degree is a value which is determined by the definition of Formula (1) shown above. The measurement method used was the method which has previously been described in EXAMPLE A. The results of the comparison of the polarization degree are shown in Table 3.

TABLE 3

|  | Sample 1 | Sample 2 | Average |
| --- | --- | --- | --- |
| Comparative Example 5 | 0.642 | 0.665 | 0.654 |
| Inventive Example 9 | 0.294 | 0.313 | 0.304 |

In this example, a plurality of light-emitting device chips were manufactured, and the polarization degree under a current-injected condition was evaluated. Table 3 shows only the data of two samples for each example.

The polarization degree of the light-emitting device of Inventive Example 9 which had the gaps 60 near the interface 50 exhibited apparently small values as compared with the results of the light-emitting device of Comparative Example 5 which had a flat light emission surface. The value of Inventive Example 9 normalized with the value of Comparative Example 5 was 0.46.

This value is compared with FIG. 75 of EXAMPLE A. Note that, however, the results of FIG. 75 of EXAMPLE A are normalized with the polarization degree which was obtained when the in-plane tilt angle β of the stripe structures was 0° Therefore, strictly speaking, it is different from the value of this EXAMPLE B. On the other hand, Comparative Example 5 is a light-emitting device which did not have the stripe structures but a flat light emission surface.

However, the difference in polarization degree between a case where the in-plane tilt angle β of the stripe structures was zero) (β=0° and a case where no stripe structures were provided is very small. Therefore, although both sides had some errors, the comparison was made with consideration for this point.

Comparing the results of Table 3 with the results of FIG. 75, the value of the specific polarization degree which was obtained in this example, 0.46, is generally close to the value of the specific polarization degree at the in-plane tilt angle β=5° of EXAMPLE A, 0.37. It was found from this comparison that the same effects as those obtained in EXAMPLE A are obtained even in the light-emitting device 10 that has the gaps 60 near the interface 50.

The small difference in specific polarization degree between the results of EXAMPLE B and the results of EXAMPLE A may be attributed to the above-described errors, while on the other hand, the difference in shape of the stripe structures may be one of the causes.

As described hereinabove, it was substantiated by the results of EXAMPLE A and EXAMPLE B that, by forming a plurality of gaps 60 near the interface 50 between the growth substrate 100 and the nitride semiconductor film 320, the polarization degree of light can be reduced, and improvement of the light distribution characteristics and improvement of the light extraction efficiency can be achieved.

A shape of the stripe structures (e.g., gaps) which can achieve the effects of the embodiment may be such that the range of the angle β is not less than 3° and not more than 45°, where β is the angle between the extending direction of the stripe structures and the a-axis direction of the nitride semiconductor film 320, i.e., the electric field vector direction of polarized light, and a direction parallel to the a-axis direction is β=0°.

EXAMPLE C

<Fabrication Method of the Heterogeneous Nitride Semiconductor Substrate 601 According to the Sixth Embodiment and the Characteristics of a Light-Emitting Device>

In this EXAMPLE C, the experimental results of the light-emitting device 13 that had the gaps 60 described in the section of the sixth embodiment are shown.

(Fabrication of the Heterogeneous Nitride Semiconductor Substrate 601)

First, a method for fabricating the heterogeneous nitride semiconductor substrate 601 is described.

In this EXAMPLE C, a heterogeneous nitride semiconductor substrate 601 of which principal surface was the m-plane was fabricated based on the fabrication method of the heterogeneous nitride semiconductor substrate 601 which is illustrated in FIG. 64.

1. Growth of a Nitride Semiconductor Layer on a Growth Substrate which was Made of m-Plane Sapphire In this EXAMPLE C, an m-plane sapphire substrate was used as the growth substrate 100 of FIG. 64(*a*). The thickness of the m-plane sapphire substrate was 430 μm. The diameter of the m-plane sapphire substrate was about 5.1 cm (=2 inches). The angle between the normal line of the principal surface of the m-plane sapphire substrate and the normal line of the m-plane was 0°±0.1°.

Then, a nitride semiconductor layer 110 of which growing plane was the m-plane was grown on the growth substrate 100 by a metal organic chemical vapor deposition method. It is commonly believed that growth of a low temperature buffer layer is required for growth of an m-plane nitride semiconductor on a substrate that is made of m-plane sapphire. In this example, an AlN layer was used as the low temperature buffer layer.

After the growth of the low temperature buffer layer, the substrate temperature was increased to a temperature in the range of 900° C. to 1100° C. in order to grow the nitride semiconductor layer 110 of which principal surface was the m-plane. The thickness of the nitride semiconductor layer 110 was from about 1 μm to 3 μm.

2. Fabrication of the Heterogeneous Nitride Semiconductor Substrate 601

Next, as shown in FIG. 61(*a*), a SiO$_2$ film having a thickness of 200 nm, for example, was formed on the nitride semiconductor layer 110 by a plasma CVD method. Then, a resist pattern with lines & spaces (L&S) of 5 μm & 5 μm was formed on the SiO$_2$ film by a known lithography method. Thereafter, the SiO$_2$ film was dry-etched using the formed resist pattern as a mask such that a mask 120 is formed by the SiO$_2$ film. By pattern formation of the mask 120, the in-plane tilt angle β, which is the extending direction of the stripe-shaped gaps 60, can be appropriately determined.

Then, the nitride semiconductor film 320 which was made of m-plane GaN was regrown on the nitride semiconductor layer 110 which had the patterned mask 120. Specifically, the nitride semiconductor layer 110 which had the mask 120 on its surface was again carried into the metal organic chemical vapor deposition apparatus. Then, the growth temperature was increased to a temperature in the range of about 900° C. to 1000° C. for carrying out regrowth.

The important point for growth of the nitride semiconductor film 320 is that regrowth of the nitride semiconductor film 320 starting from the stripe-shaped nitride semiconductor layers 110*a* that were exposed through the mask 120 is enhanced in lateral directions. In this example, the growth was carried out under the conditions that the value of the V/III ratio was about 160, the growth pressure was about 13.3 kPa, and the growth speed was about 4 μm/h. Under these conditions, the nitride semiconductor film 320 was formed by regrowth so as to have a thickness of 4 μm to 10 μm, whereby a heterogeneous nitride semiconductor substrate 601 of which principal surface was the m-plane was obtained.

Thus, in the above-described fabrication method of the heterogeneous nitride semiconductor substrate 601, by appropriately selecting the dimensions of the mask 120 and the growth conditions of the nitride semiconductor film 320, the upper surface of the mask 120 can be covered with the nitride semiconductor film 320. Further, the cross-sectional shape of the gaps 60 formed above the mask 120 can also be controlled.

FIG. 81(*a*) and FIG. 81(*b*) show some fabricated examples of the heterogeneous nitride semiconductor substrate 601 which were obtained as described above. It can be seen that a plurality of gaps 60 were provided at the interface between the nitride semiconductor layer 110 and the nitride semiconductor film 320 as explained in the section of the sixth embodiment. The regrowth conditions for the nitride semiconductor film 320 were different between FIG. 81(*a*) and FIG. 81(*b*). It can be seen that, by appropriately selecting the regrowth conditions, the configuration and cross-sectional shape of the stripe-shaped gaps 60 can be controlled.

The heterogeneous nitride semiconductor substrate 601 fabricated by the above-described fabrication method, which includes the gaps 60 in the interface region, can obtain the effect of greatly improving the crystallinity as in EXAMPLE B, in addition to the effect of reducing the polarization degree of light.

As demonstrated by the results of EXAMPLE C, in the sixth embodiment also, the plurality of gaps 60 can be formed in a region near the interface 50 between the growth substrate 100 and the nitride semiconductor film 320. A heterogeneous nitride semiconductor substrate 601 having such a configuration is prepared, and a light-emitting device is manufactured on the prepared heterogeneous nitride semiconductor substrate 601. As a result, as previously described in EXAMPLE A and EXAMPLE B, the polarization degree can be reduced, while improvement of the light distribution characteristics and improvement of the light extraction efficiency can be realized.

A shape of the stripe structures (e.g., gaps) which can achieve the effects of this example may be such that the range of the angle β is not less than 3° and not more than 45°, where β is the angle between the extending direction of the stripe structures and the a-axis direction of the nitride semiconductor film 320, i.e., the electric field vector direction of polarized light, and a direction parallel to the a-axis direction is β=0°.

EXAMPLE D

<Experimental Grounds for the Range of the In-Plane Tilt Angle β (not Less than 3° and not More than 35°) in the Heterogeneous Nitride Semiconductor Substrate 600 that has the Gaps 60>

In the above-described EXAMPLES A, B, and C, it has been explained that, by providing the stripe structures on the light emission surface side, the polarization degree of polarized light emitted from the active layer 24 can be reduced, while improvement of the light distribution characteristics and improvement of the light extraction efficiency are possible. It has also been demonstrated based on the experimental results that, when the in-plane tilt angle β of the stripe structures is in the range of not less than 3° and not more than 45°, the effects of EXAMPLES A to C are obtained.

On the other hand, in the configuration illustrated in EXAMPLE B, when a light-emitting device which has the gaps 60 is manufactured using an m-plane sapphire substrate as the growth substrate 100 and the heterogeneous nitride semiconductor substrate 600 as the basic body, the polarization degree reducing effect and the light distribution characteristic improving effect are achieved, and meanwhile, a problem occurs in regrowth of the nitride semiconductor film 320. Therefore, the angle β between the extending direction of the stripe-shaped gaps 60 and the a-axis may be designed to be not less than 3° and not more than 35°.

In this EXAMPLE D, the reason why the angle β is not less than 3° and not more than 35° is described.

In this example, the structure of the heterogeneous nitride semiconductor substrate 600, which is an underlayer, was mainly fabricated and evaluated, and a light-emitting device 20 was not manufactured on the heterogeneous nitride semiconductor substrate 600.

The condition of the in-plane tilt angle β of not less than 3° and not more than 35°, which is described in this example, is limited to only the following sequence: the m-plane sapphire substrate is used as the growth substrate 100; the nitride semiconductor layer 110 is etched to form the recessed portions 210 in which the surface of the growth substrate 100 is exposed as illustrated in FIG. 56 and FIG. 57; and thereafter, the heterogeneous nitride semiconductor substrate 600 including the regrowth step is included in the light-emitting device.

Thus, in EXAMPLE A in which the stripe-shaped uneven structure 70 is not formed in the rear surface of the growth substrate 100 and EXAMPLE C in which the recessed portions 210 are not formed in the nitride semiconductor layer 110, the in-plane tilt angle β is not limited to the range of not less than 3° and not more than 35°. β may be in the range of not less than 3° and not more than 45°.

The present inventors examined the in-plane tilt angle β dependence of the nitride semiconductor film 320 based on the configuration of the heterogeneous nitride semiconductor substrate 600 for which the growth substrate 100 of which growing plane (principal surface) was the m-plane was used, and found that the surface flatness and the crystallinity largely depend on the angle β.

(Angle β and Surface Flatness)

FIG. 82(a) to FIG. 82(h) show surface microscopic images of the heterogeneous nitride semiconductor substrates 600 which had the stripe-shaped gaps 60 with varying angles β. In this experiment, the angle β was varied from 0° to 90°. Part of the results of the experiment is shown in FIG. 82.

In this experiment, a plurality of samples of the heterogeneous nitride semiconductor substrate 600 were fabricated on the growth substrate 100 of which principal surface was the m-plane under the same conditions as those described in EXAMPLE B, with only the angle β being varied, and the fabricated samples were evaluated. It can be seen from FIG. 82 that the flatness of the surface of the heterogeneous nitride semiconductor substrate 600 greatly varied depending on the angle β.

In these samples which were different only in angle β, the nitride semiconductor film 320, which was regrown GaN, was grown under the same growth conditions. However, the surface of each of the obtained samples apparently depended on the angle β, and the lateral growth was sufficient in some samples but was insufficient in the other samples. For example, when the angle β=0°, the nitride semiconductor film portions 320 regrown from the stripe-shaped nitride semiconductor layers 110a that form the raised portions did not at all connect to each other. However, when the angle β was increased, e.g., when the angle β was not less than 17°, the nitride semiconductor film portions 320 sufficiently connected to each other to form a regrown film having a flat surface.

The cause of such a phenomenon was analyzed as described below.

When β=0°, a surface perpendicular to the extending direction of the stripe-shaped nitride semiconductor layers 110a, i.e., a lateral surface of the ridge structure, is mainly the c-plane. On the other hand, when β=90°, a lateral surface of the ridge structure is the a-plane. Therefore, as the angle β increases, the lateral surface of the ridge structure transitions from the c-plane facet to the a-plane facet of the GaN.

In general, comparing the crystal growth in the nitride semiconductor between the c-plane facet and the a-plane facet, the a-plane facet is more thermally stable, and further, the growth speed at the a-plane facet is faster. Therefore, from the viewpoint of enhancing lateral growth, the a-plane facet growth may be employed rather than the c-plane facet growth.

Figure 83:
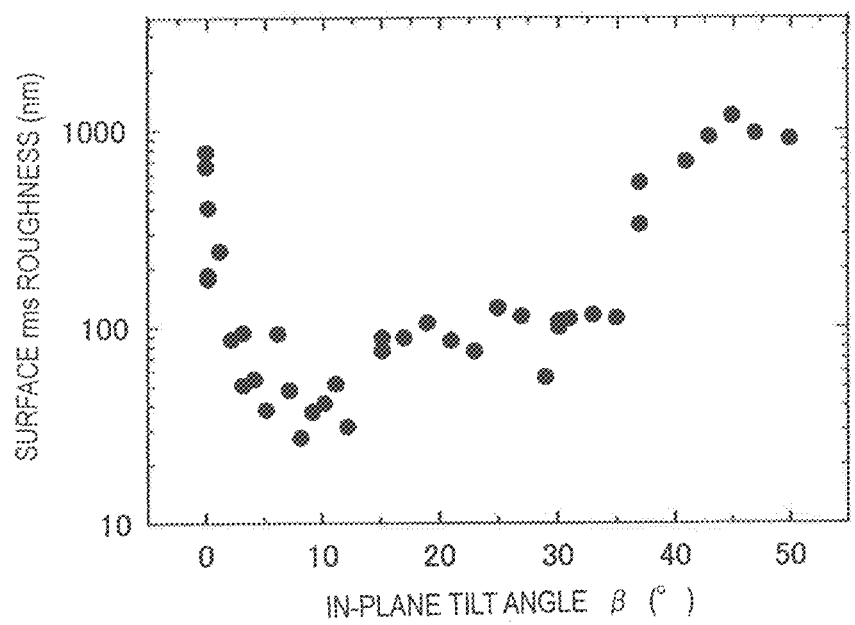
FIG. 83 is a graph showing the in-plane tilt angle β dependence of the surface rms roughness in a heterogeneous m-plane GaN substrate which is a regrown heterogeneous nitride semiconductor substrate.

FIG. 83 shows the relationship between the surface roughness (rms roughness) which was obtained by a laser microscope and the angle β. As previously described, as the angle β increases, the surface flatness dramatically improves. According to the various examinations carried out by the present inventors, this surface flatness improving effect is sufficiently achieved only by slightly increasing the angle β from 0°. For example, it can be seen from FIG. 83 that, when the angle β is not less than about 3°, the surface rms roughness is not more than 100 nm, and it was proved that the flatness improving effect can be obtained.

On the other hand, when based on the above-described assumption, the surface roughness only requires that the angle β should be not less than 3°. The surface must be the flattest when the angle β is around 90°. This is because the lateral surface of the ridge structure is wholly formed by only the a-plane facet. However, it was found from the results of FIG. 82 and FIG. 83 that the surface roughness deteriorated again when the angle β exceeded 35°.

This deterioration of the surface roughness is obviously different from the cause of deterioration of the surface roughness which occurred when the angle β was small. That is, as seen from the result at β=47° in FIG. 82(g) and the result at β=80° in FIG. 82(h), when β>35°, three-dimensional protrusions were seen in the surface obtained after the regrowth, and the density and number of the protrusions increased as the angle β increased.

(Cause of Protrusions Produced when Angle β>35°)

Figure 82:
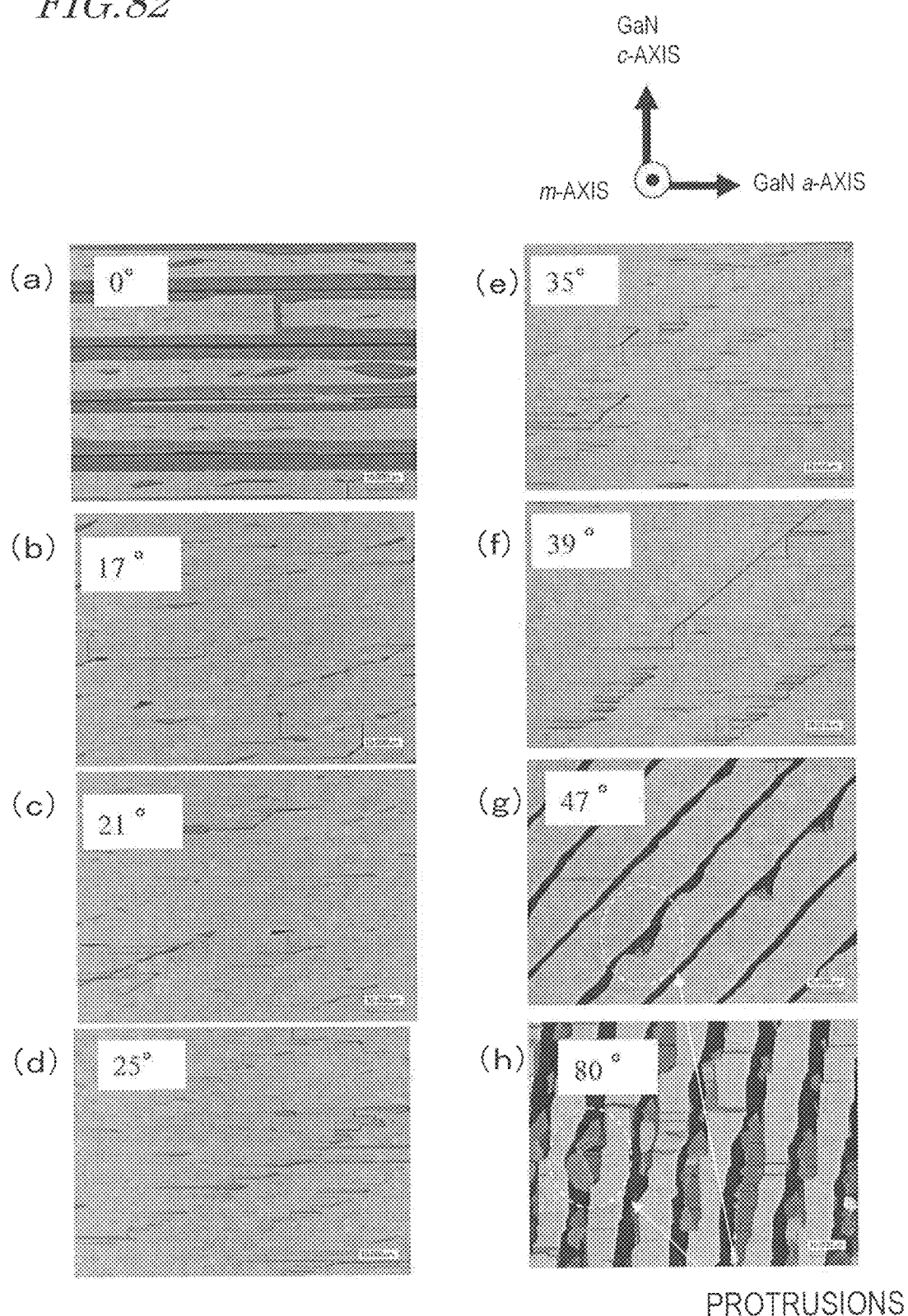
FIGS. 82(a) to 82(h) are surface microscopic images showing the in-plane tilt angle β dependence of the surface morphology of a heterogeneous nitride semiconductor substrate.

To clarify what the protrusions seen in FIG. 82(*g*) and other drawings are, X-ray diffraction measurement was carried out on the heterogeneous nitride semiconductor substrate 600 of this example.

Figure 84:
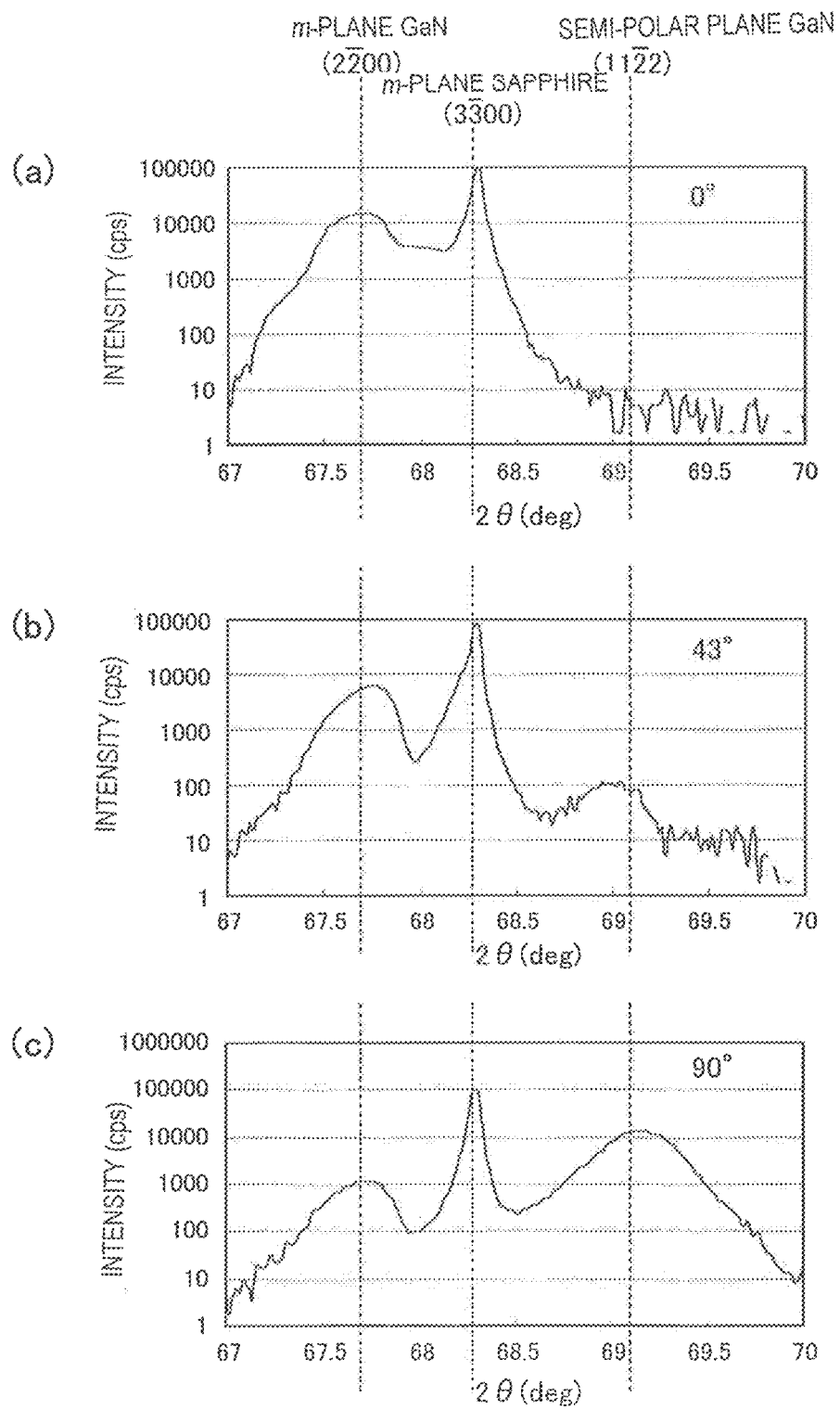
FIGS. 84(a) to 84(c) are graphs showing the results of X-ray 2θ-ω measurements carried out on a heterogeneous nitride semiconductor substrate which has a stripe structure of the in-plane tilt angle β.

FIG. 84 shows, as an example, the X-ray 2θ-ω measurement results for the cases where the in-plane tilt angles β were 0°, 43°, and 90°. When the angle β was 0°, only the diffraction peaks of m-plane sapphire (3-300) and m-plane GaN (2-200) were observed. This demonstrates that the nitride semiconductor film 320 formed on the m-plane sapphire substrate by regrowth was oriented only in the m-axis direction.

On the other hand, when β=43°, another diffraction peak was observed on the higher angle side in addition to the above-described diffraction peaks of m-plane GaN and m-plane sapphire. This diffraction peak is at the diffraction peak position of the (11-22) plane that is a semi-polar plane. This means that, in the heterogeneous nitride semiconductor substrate 600, in forming the stripe-shaped nitride semiconductor 110*a* at β=43° and regrowing the nitride semiconductor film 320, the nitride semiconductor film 320 includes not only a semiconductor of which principal surface is the m-plane but also a semiconductor of which principal surface is the (11-22) that is a semi-polar plane.

Further, it can be seen that, when β=90°, the diffraction intensity from this (11-22) plane is greater.

Figure 85:
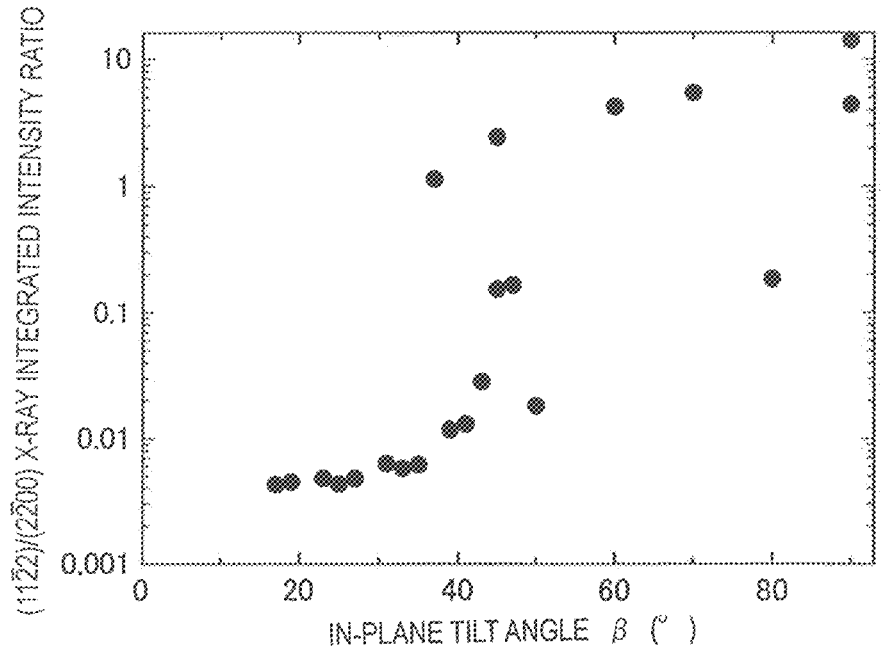
FIG. 85 is a graph showing the in-plane tilt angle β dependence of the value of the X-ray integrated intensity ratio of the (11-22) plane and the m-plane (2-200) plane.

FIG. 85 shows the angle β dependence of the value of the integrated intensity ratio of the (11-22) plane and the m-plane (2-200) plane, which was estimated from the X-ray 2θ-ω measurement results. It can be seen from FIG. 85 that the integrated intensity of the (11-22) plane that is a semi-polar plane increased after the angle exceeded around 35° at which the surface roughness started to increase. Such a variation of the XRD measurement results is identical with the variation of the surface morphology shown in FIG. 83.

From the above results, it is inferred that the cause of the deterioration of the surface flatness and protrusions which occur when the in-plane tilt angle β exceeds 35° is attributed to abnormal growth which occurs in the semi-polar plane. It was found that the semi-polar plane is growth with the (11-22) plane being the principal surface.

Next, the cause of the abnormal growth at the semi-polar plane of which principal surface is the (11-22) plane, which occurs when the angle β of the nitride semiconductor layer 110 of the ridge structure exceeds 35°, is described.

It is commonly known that the (11-22) plane that is a semi-polar plane can also be grown on the m-plane sapphire substrate. In that case, the epitaxy relationship with the sapphire is the growth starting from the r-plane facet of the m-plane sapphire. It is also commonly known that the a-plane nitride semiconductor can be grown on the r-plane sapphire. That is, it may be considered that the mechanism of the (11-22) plane growth on the m-plane sapphire is obtained as a result of growth of the a-plane nitride semiconductor on the inclined r-plane facet in the m-plane sapphire surface.

Therefore, simply, when a nitride semiconductor is grown on the m-plane sapphire that has a surface in which many r-plane facets are to be formed, the nitride semiconductor film 320 of which principal surface is the (11-22) plane is likely to be obtained.

FIG. 86(*a*) schematically shows the facet structure of the (11-22) plane nitride semiconductor. FIG. 86(*b*) schematically shows the facet structure of the m-plane sapphire. The r-plane facet of the sapphire is oriented in the c-axis direction. Therefore, it is inferred that, when both an a-plane facet and a c-plane facet are formed in the surface of the m-plane sapphire by dry etching, for example, the r-plane facet is more likely to be formed in the c-plane facet than in the a-plane facet.

FIG. 87(*a*) and FIG. 87(*b*) show the epitaxy relationship between the m-plane sapphire (growth substrate 100) and the m-plane GaN (nitride semiconductor layer 110) in the unevenly-processed substrate 510 where the in-plane tilt angles are β=0° and β=90°.

The relationship of the crystal orientation between the m-plane GaN and the m-plane sapphire is such that the growing planes (principal surfaces) are the same m-axis, but the in-plane crystal axes are deviated by 90°. That is, it is such a relationship that, for example, the c-axis of the GaN and the a-axis of the sapphire are parallel to each other.

In forming the stripe-shaped nitride semiconductor layer 110*a* that forms a raised portion, it is necessary to remove the nitride semiconductor layer 110 in the recessed portions 210, and therefore, part of the sapphire substrate is removed due to overetching in many cases. In such a case, if the in-plane tilt angle β of the stripe-shaped nitride semiconductor layers 110*a* is 0°, the wall surfaces 220 of the sapphire substrate are the a-plane as shown in FIG. 87(*a*), and the wall surfaces of the stripe-shaped nitride semiconductor layer 110*a* that is made of GaN are the c-plane.

In the case of β=90°, on the contrary to the above, as shown in FIG. 87(*b*), the wall surfaces 220 of the sapphire substrate are the c-plane, and the wall surfaces of the stripe-shaped nitride semiconductor layer 110*a* are the a-plane.

That is, when the angle β is large, the wall surfaces 220 of the sapphire substrate transition from the a-plane facet to the c-plane facet, so that the r-plane facet is more likely to be formed. It is considered that, when the r-plane facet is formed, as described above, the probability of growth of the (11-22) plane increases.

Inferring from the experimental results, when the in-plane tilt angle β was not more than 35°, there were small number of r-plane facets that served as the starting points of abnormal growth occurring in the semi-polar plane, and regions of the semi-polar plane were very few so that they could not detected even by the XRD measurement. Therefore, it can be considered that the effects of those regions are negligible as compared with the regrown m-plane regions.

On the other hand, when the angle β exceeds 35°, growth of the semi-polar plane is remarkable, and the source materials supplied during the regrowth undergo not only growth on the stripe-shaped nitride semiconductor layers 110*a* but also growth starting from the r-plane facets in the wall surfaces 220 of the growth substrate 100. As a result, it is inferred that, a regrown film (nitride semiconductor film 320) was obtained in which the m-plane and the (11-22) plane coexisted.

It was found from the above results that it is desirable to control the range of the in-plane tilt angle β of the gaps 60 within the range of not less than 3° and not more than 35° in order to realize high quality crystal growth of a nitride semiconductor layer film 320 that is a heterogeneous m-plane nitride semiconductor, while the polarization control effect is maintained, in the heterogeneous nitride semiconductor substrate 600 that is obtained by forming the nitride semiconductor layer 110 on an m-plane sapphire which is used as the growth substrate 100 and carrying out etching on the nitride semiconductor layer 110 such that the surface of the growth substrate 100 is selectively exposed to form the recessed portions 210.

(Abnormal Growth Occurring in the Semi-Polar Plane and the Height Dependence of the Wall Surfaces 220 of the Sapphire Substrate in the Unevenly-Processed Substrate 510)

Hereinabove, it has been described that, in the process of fabricating the unevenly-processed substrate 510, the wall surfaces 220 of the sapphire substrate which are formed in the recessed portions 210 serve as starting points of abnormal growth from the semi-polar plane that is the (11-22) plane. In addition, it has been described that this problem can be avoided by controlling the in-plane tilt angle β in the stripe structures so as to be not less than 3° and not more than 35°.

On the other hand, the present inventors carried out further examinations of the above-described cause of occurrence of abnormal growth in the semi-polar plane and, as a result, found that there is another method for preventing the abnormal growth from the semi-polar plane, other than optimizing the in-plane tilt angle β. The method is to decrease the area of the wall surfaces 220 of the growth substrate 100 shown in FIG. 87(a) and FIG. 87(b) at which the semi-polar plane growth occurs. In principle, when the depth of the wall surfaces 220 of the growth substrate 100 which is made of the m-plane sapphire is close to 0, the abnormal growth at the semi-polar plane is unlikely to occur, so that dependence on the in-plane tilt angle β decreases.

It is also inferred that, even if abnormal growth at the semi-polar plane occurs, it must occur in an extremely small area as compared with the nitride semiconductor film 320 that is the original m-plane nitride semiconductor region, and the effect of the nitride semiconductor film 320 that regrows on the entirety is small.

Based on such an inference, the depth dependence of the wall surfaces 220 of the growth substrate 100 in the heterogeneous nitride semiconductor substrate 600 was examined.

FIG. 88(a) and FIG. 88(b) show the in-plane tilt angle β dependence of the value of the intensity ratio of the X-ray diffraction peak integration between the (11-22) plane and the m-plane (2-200) plane of the nitride semiconductor layer, with different depths of the wall surfaces 220 which were exposed at the recessed portions 210 of the growth substrate 100.

FIG. 88(a) is equivalent to the results shown in FIG. 85. In this case, the depth of the wall surfaces 220 of the growth substrate 100 was about 250 nm. On the other hand, in FIG. 88(b), the etching duration in the unevenness processing was decreased such that the etching depth was about 150 nm.

In FIG. 88(a), as previously described, it can be seen that, when the in-plane tilt angle β exceeds 35°, the diffraction intensity of the (11-22) plane increases, and the semi-polar plane is also present together in the nitride semiconductor film 320 that is the regrown film. On the other hand, in the case of the sample shown in FIG. 88(b) with the etching depth of about 150 nm, such a tendency that the diffraction intensity of the (11-22) plane abruptly increases cannot be seen even if the value of the in-plane tilt angle β increases.

This experimental result demonstrates that the semi-polar plane abnormal growth can be prevented by reducing the depth of the wall surfaces 220 of the growth substrate 100 and decreasing the area of these wall surface regions.

This is probably because, as previously described, the number of r-plane facets which serve as starting points of the abnormal growth from the semi-polar plane was reduced by decreasing the depth of the wall surfaces 220 of the recessed portions 210 in the growth substrate 100.

It was found from the above results that, in a fabrication method for fabricating the heterogeneous nitride semiconductor substrate 600 based on the nitride semiconductor film 320 that is regrown on the m-plane sapphire substrate, the in-plane tilt angle β of the stripe structures and the etching depth in the growth substrate 100 that is the m-plane sapphire substrate are controlled so as to be within predetermined ranges, so that the abnormal growth which could occur in the semi-polar plane can be effectively prevented.

The abnormal growth from the semi-polar plane can be prevented by controlling the in-plane tilt angle β so as to be within the range of not less than 0° and not more than 35°. The abnormal growth from the semi-polar plane can also be prevented by controlling the etching depth of the wall surfaces 220 which are exposed from the growth substrate 100 so as to be within the range of 0 nm to 150 nm, irrespective of the in-plane tilt angle β.

Both the in-plane tilt angle β and the etching depth of the wall surfaces 220 which are exposed from the sapphire substrate may be concurrently controlled.

By such a design, the effect of the r-plane facet serving as the starting point of the abnormal growth that occurs in the semi-polar plane, which is present in the wall surfaces 220 exposed from the growth substrate 100 that is made of sapphire, is dramatically reduced so that a high quality heterogeneous nitride semiconductor substrate 600 can be fabricated.

As described hereinabove, it was found that it is desirable to control the range of the in-plane tilt angle β of the gaps 60 within the range of not less than 3° and not more than 35° and to design such that the height of the wall surfaces 220 of the sapphire substrate which are exposed from the lower part of the recessed portions 210 is from 0 nm to 150 nm in order to realize high quality crystal growth of a nitride semiconductor layer film 320 that is a heterogeneous m-plane nitride semiconductor, while the polarization control effect is maintained, in the fabrication method of the heterogeneous nitride semiconductor substrate 600 which includes the step of exposing the surface of the growth substrate 100 by etching to form the recessed portions 210, wherein m-plane sapphire is used as the growth substrate 100.

EXAMPLE E

<Experimental Grounds for the Range of the In-Plane Tilt Angle β (not Less than 3° and not More than 10°) in the Heterogeneous Nitride Semiconductor Substrate 600 that has the Gaps 60>

It is known that, in crystal growth in a nitride semiconductor of which principal surface is a non-polar plane or semi-polar plane, not only dislocations but also stacking faults are likely to occur, and particularly, the stacking faults greatly affect the characteristics of a nitride-based semiconductor light-emitting device of which principal surface is a non-polar or semi-polar plane.

Therefore, in crystal growth of a nitride semiconductor of which principal surface is a non-polar plane or semi-polar plane, not only reduction of the dislocation density but also reduction of the stacking fault density are important. This problem is very important particularly in a nitride semiconductor structure which is grown on a hetero-substrate which is different from the nitride semiconductor, such as a sapphire substrate, and of which principal surface is a non-polar of semi-polar plane.

As the values of the half-value width of the X-ray ω rocking curve (XRC) have been presented in EXAMPLE B (see Table 2), it is usual that the values of the XRC full width at half maximum of a nitride semiconductor layer directly grown on a sapphire substrate of which growing plane is the m-plane are asymmetric when measured with X-rays being incident in the a-axis direction and the c-axis direction. Usually, in the case of a nitride semiconductor, the XRC full width at half maximum is larger when the X-ray is incident in the c-axis direction. This is because the XRC full width at half maximum measured in the c-axis direction includes the information of stacking faults in addition to the information of dislocations.

On the other hand, as seen from Table 2 of EXAMPLE B, in the heterogeneous nitride semiconductor substrates 600 and 601 which have the gaps 60 according to the fourth embodiment and the sixth embodiment, not only the dislocation density but also the stacking fault density are greatly reduced, so that the crystallinity and the optical characteristics can be greatly improved. Further, it was found that the stacking fault reducing effect illustrated in EXAMPLE B varies depending on the in-plane tilt angle β of the gaps 60.

As illustrated in EXAMPLE A, the polarization degree reducing effect and the effects of improving the light distribution characteristics and improving the light extraction efficiency can be obtained over a wide range of the in-plane tilt angle β of the stripe structures, which is not less than 3° and not more than 45°.

However, it was found that, in the heterogeneous nitride semiconductor substrate 600, 601 in which a hetero-substrate which is different from the GaN bulk substrate is used as the growth substrate 100, reduction of the stacking fault density cannot be sufficiently realized in some range of the in-plane tilt angle β. Therefore, in the heterogeneous nitride semiconductor substrate 600, 601 which is fabricated on the growth substrate 100 that is a hetero-substrate which is likely to include many dislocations and defects, controlling the in-plane tilt angle β under not only the above-described condition which can achieve the polarization degree reducing effect but also the condition which can sufficiently reduce the stacking fault density is indispensable. That is, without appropriate control of the value of the in-plane tilt angle β, stacking faults are included in the active layer 24, so that the efficiency of the light-emitting device greatly deteriorates.

As a result of the examinations carried out by the present inventors, it was found that the range of the in-plane tilt angle β in the stripe-shaped gaps 60 in the heterogeneous nitride semiconductor substrate 600, 601 may be not less than 3° and not more than 10°.

Hereinafter, details of the experimental results are described.

In this example, the structure of the heterogeneous nitride semiconductor substrate 600 that is formed by a nitride semiconductor film grown on an m-plane sapphire substrate according to the fourth embodiment was used as the basic body, and the in-plane tilt angle β dependence of the gaps 60 in the dislocation density and the stacking fault density of these samples was examined.

The dislocation density reducing effect was evaluated based on the XRC full width at half maximum. In this case, the incidence direction of the X-ray was the a-axis direction in the GaN. The stacking fault density reducing effect was evaluated by measurement of the photoluminescence (PL). This is because the evaluation with the use of PL enables to more precisely examine the effect of the stacking fault density.

In EXAMPLE E, the heterogeneous nitride semiconductor substrate 600 was fabricated using an m-plane sapphire substrate under basically the same conditions as those of EXAMPLE B, and the in-plane tilt angle β of these samples were varied from 0° to 90°.

The effect of this example can also be obtained likewise in the embodiments and examples described in the sections of the sixth embodiment and EXAMPLE C in which regrowth is carried out on the mask 120 that is made of $SiO_2$. That is, in a configuration in which a nitride semiconductor of which principal surface is the m-plane on the hetero-substrate, the in-plane tilt angle β in the stripe structures may be controlled to be in the range of not less than 3° and not more than 10° in order to reduce the polarization degree of light and reduce the stacking fault density.

Note that, however, when the configuration which includes the gaps 60 at the interface between the nitride semiconductor layer 110 on the growth substrate 100 and the nitride semiconductor film 320 is a homoepitaxy-based configuration in which a GaN bulk substrate, or the like, is used as the growth substrate 100, the effect of the stacking fault density is not so large, and therefore, a suitable range of the in-plane tilt angle β becomes wider. For example, it may be not less than 3° and not more than 45°.

Figure 89:
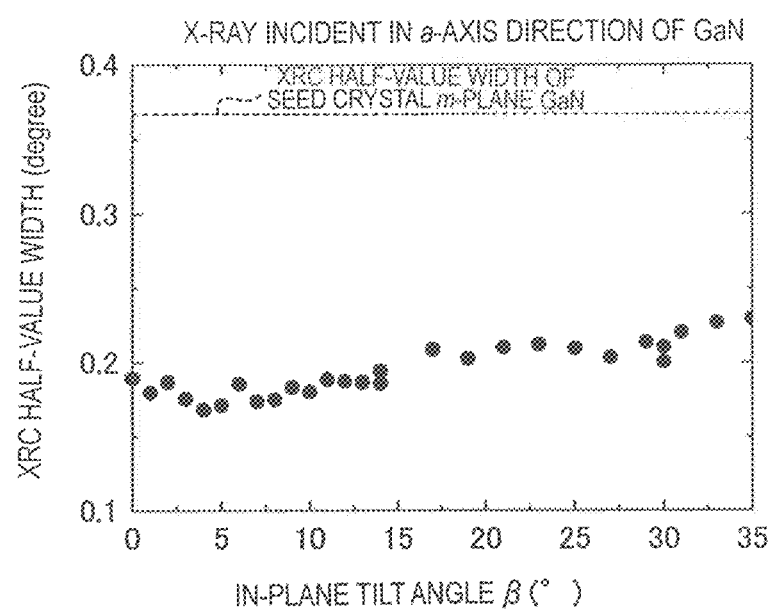
FIG. 89 is a graph showing the in-plane tilt angle dependence of the XRC full width at half maximum in a heterogeneous nitride semiconductor substrate.

FIG. 89 shows the XRC full width at half maximum of the heterogeneous nitride semiconductor substrate 600 with the in-plane tilt angle β being varied from 0° to 35°. The incidence direction of the X-ray was the a-axis direction of the GaN.

In this experiment, m-plane GaN films on two types of m-plane sapphire substrates were used as the nitride semiconductor layer 110 for seed crystal. That is, it was different between the samples with the in-plane tilt angles β from 0° to 15° and the samples with β from 17° to 35°.

The broken line shown in FIG. 89 represents the value of the XRC full width at half maximum of a typical directly-grown GaN film which is shown in Table 2 (1326 seconds, 0.37 degree). The two types of seed crystal GaNs of this example exhibited generally equal XRC full width at half maximums. It can be seen that the XRC full width at half maximum was approximately a half of the value of the directly-grown GaN film over a wide range of the in-plane tilt angle β from 0° to 35°.

The above results demonstrate that, by using the heterogeneous nitride semiconductor substrate 600 which has the gaps 60 such as illustrated in the section of the fourth embodiment, not only control of the polarization degree of light but also the crystallinity improving effect can be obtained.

The XRC full width at half maximum shown in FIG. 89 appears to gradually deteriorate as the in-plane tilt angle β increases. However, this is attributed to the difference in crystallinity between the m-plane GaN layers 110 of the two types of seed crystals used in this example and, probably, is not the evidence of the dependence of the in-plane tilt angle β.

FIG. 90(*a*) and FIG. 90(*b*) show the PL spectrum at room temperature. In the PL evaluation, a He—Cd laser (continuous wave, intensity: up to 30 mW) was used as the excitation source. As an example, FIG. 90(*a*) shows the result for the case of the in-plane tilt angle β=5°, and FIG. 90(*b*) shows the result for the case of the in-plane tilt angle β=14°. The emission peak near the band edge of the GaN was seen at around 3.4 eV, while the other emissions were resulted from Deep Level.

Both samples did not have a large difference in the value of the XRC full width at half maximum as seen from FIG. 89. However, the emission intensity at the band edge was high in the sample shown in FIG. 90(*a*) with a small in-plane tilt angle, β=5°, while in the sample shown in FIG. 90(*b*) with β=14°, the Deep Level emission was dominant.

Considering that there is no difference in the XRC full width at half maximum shown in FIG. 89, there is a small probability that the cause of the difference in emission spectrum between the two samples is the dislocation density. That is, the cause of this difference is attributed to the stacking fault density.

Figure 91:
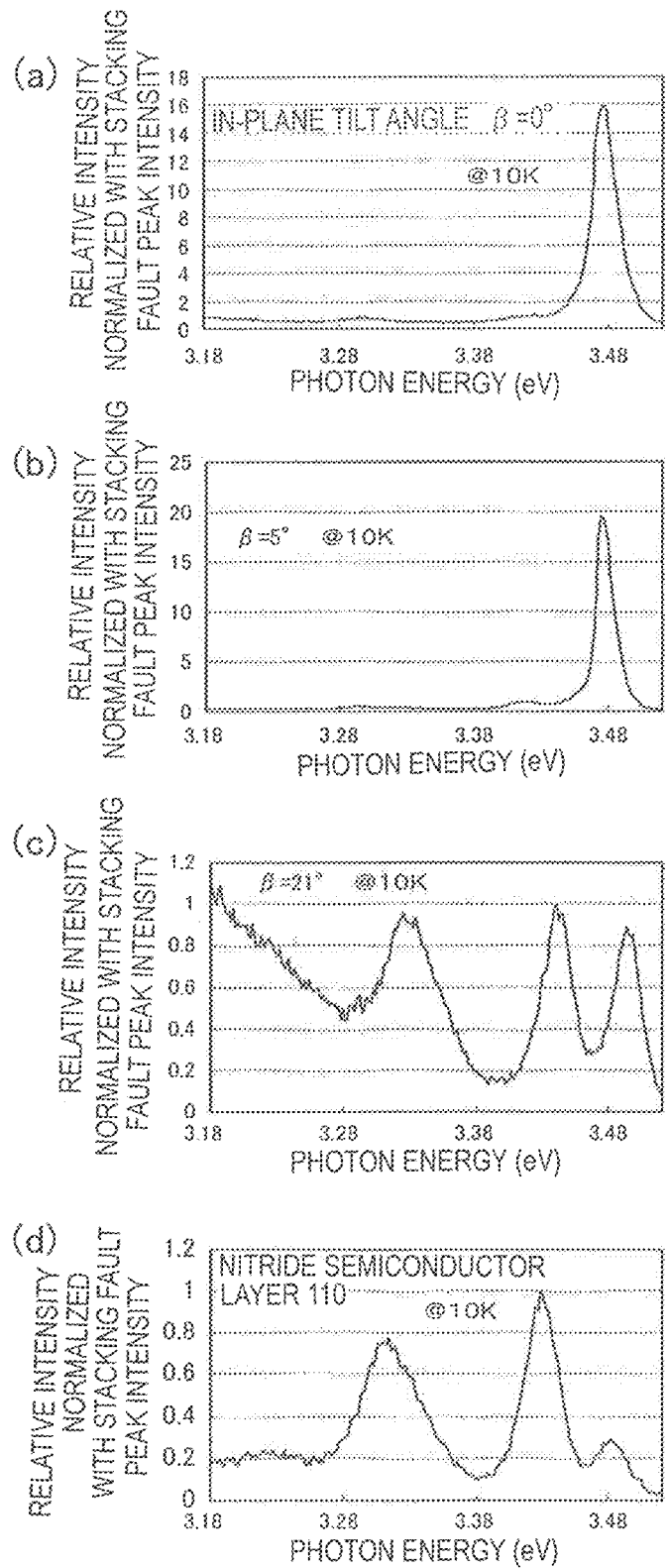
FIGS. 91(a) to 91(c) are graphs showing the results of low temperature PL measurements carried out on heterogeneous nitride semiconductor substrates in the case where the in-plane tilt angles β were 0°, 5°, and 21°, respectively.
FIG. 91(d) is a graph showing the result of a low temperature PL measurement carried out on a seed crystal m-plane GaN film which was directly grown on an m-plane sapphire substrate for the sake of comparison.

FIG. 91(a) to FIG. 91(c) show the results of the PL measurement at the low temperature (10K). FIG. 91(a) to FIG. 91(c) are the results for the cases where the in-plane tilt angles β were 0°, 5°, and 21°, respectively. For the sake of comparison, FIG. 91(d) shows the spectrum in the nitride semiconductor layer 110 that is the seed crystal GaN. The vertical axis in FIG. 91 is normalized with the intensity of the peak which is attributed to stacking faults (near 3.42 eV).

In the case shown in FIG. 91(c) with a large in-plane tilt angle, β=21°, and in the sample of the seed crystal shown in FIG. 91(d), three peaks were mainly observed.

The values of the respective emission peaks have some deviations depending on, for example, the strain amount of a grown film in some cases. However, it is inferred from the systematic analysis of the experimental results obtained herein and the comparison with other document results that the emission near 3.42 eV was attributed to the stacking faults. That is, the peak near 3.48 eV was the emission that was attributed to the donor bound exciton (D0, X). Further, the peak on the low energy side was the emission that was attributed to dislocations and defects.

Firstly, comparing the result of the seed crystal GaN shown in FIG. 91(d) and the result of β=21° shown in FIG. 91(c), in the sample of β=21°, it can be seen that the relative intensity with respect to the peak that was attributed to stacking faults, which was the emission that is attributed to the donor bound exciton (D0, X), increased. This is probably because, as compared with the seed crystal that was obtained by direct growth on an m-plane sapphire substrate, the stacking fault density in the crystal of the heterogeneous nitride semiconductor substrate 600 that had the stripe-shaped gaps 60 decreased. However, in the sample of β=21°, the intensity of the emission that was attributed to the donor bound exciton (D0, X) was generally equivalent to that of the stacking faults, and the overall emission intensity was small.

In comparison to these results, in the case of the sample shown in FIG. 91(a) with a small in-plane tilt angle β, β=0°, and the sample shown in FIG. 91(b) with β=5°, the emission which was attributed to the emission which was attributed to the donor bound exciton (D0, X) near 3.48 eV was dominant, rather than the peak intensity which was attributed to the stacking faults. The relative intensity with respect to the peak that was attributed to the stacking faults increased by one or more orders of magnitude as compared with β=21°.

Thus, in a regrown GaN film of which emission intensity near the band edge was strong in the PL measurement at room temperature, great reduction of the emission intensity which was attributed to the stacking faults and increase of the (D0, X) intensity were confirmed even in the PL measurement at the low temperature. Therefore, it was found that, by appropriately selecting the range of the in-plane tilt angle β, not only the dislocation reducing effect but also the stacking fault density reducing effect can be obtained.

Figure 92:
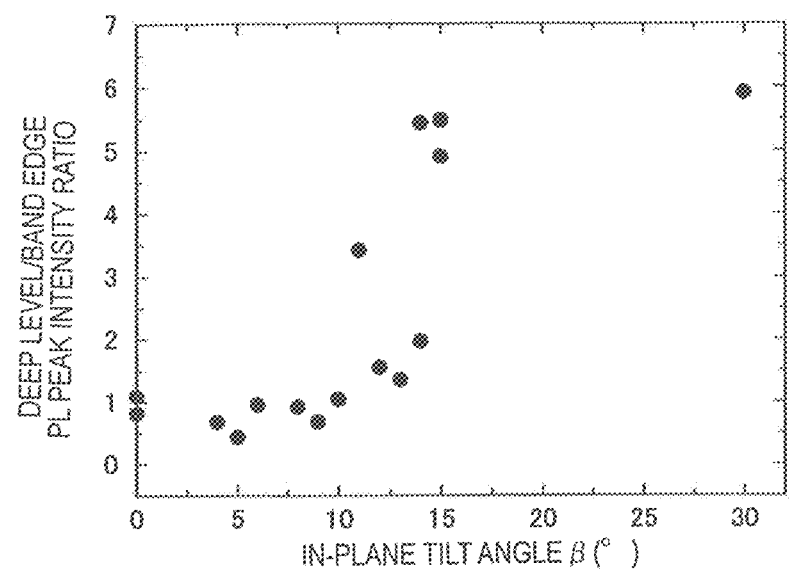
FIG. 92 is a graph showing the in-plane tilt angle β dependence of the value of the ratio between the Deep level emission intensity and the band edge emission intensity in a heterogeneous nitride semiconductor substrate.

FIG. 92 shows the in-plane tilt angle β dependence of the value of the ratio between the Deep Level emission intensity obtained by the PL measurement at room temperature and the emission intensity near the band edge.

When the in-plane tilt angle β is in the range of 0° to 10°, the value of the intensity ratio is small. Even at room temperature, the emission near the band edge is intense. It can be seen from this that the stacking fault density was sufficiently reduced.

On the other hand, when the in-plane tilt angle β was not less than 10°, the value of the ratio between the Deep Level emission intensity and the emission intensity near the band edge abruptly increased, so that the Deep level emission was dominant. As seen from the measurement result of the XRC full width at half maximum shown in FIG. 89, the crystal quality improving effect achieved by reduction of the dislocation density can be realized even when at least the in-plane tilt angle β is in the range of 0° to 35°.

It was proved by the experimental results of FIG. 89 to FIG. 92 that, to obtain the stacking fault density reducing effect in addition to the above effect, it is necessary to narrow the range of the in-plane tilt angle β and that the range of the angle β may be not less than 0° and not more than 10°.

It was proved by the results of FIG. 92 that the stacking fault density reducing effect can be obtained even when the in-plane tilt angle β is not 0°.

Note that, as described in EXAMPLE D, when the in-plane tilt angle β is greater than 0°, reconnection of films regrown from the ridge-shaped nitride semiconductor layer 110 is enhanced, and the surface flatness of the heterogeneous nitride semiconductor substrate 600, 601 is improved.

By controlling the in-plane tilt angle β in the stripe structures provided in the nitride semiconductor film 320 of which principal surface is a non-polar plane, which is grown on a hetero-substrate, and in which particularly the stacking fault density is likely to be high, so as to be not less than 3° and not more than 45° as in the fourth embodiment, the polarization degree of emitted light can be reduced, while improvement of the light distribution characteristics and improvement of the light extraction efficiency can be achieved.

Further, as demonstrated by the results of EXAMPLE E, by controlling the range of the angle β so as to be not less than 3° and not more than 10°, the effect of reducing the density of stacking faults in a regrown nitride semiconductor can be obtained while the above-described effects are maintained.

When the range of the angle β is not less than 0° and less than 3°, and particularly when β is 0° as seen from FIG. 75, the polarization degree of emitted light is maintained. In this case, it can be seen from FIG. 89 and FIG. 92 that the crystallinity of the nitride semiconductor is excellent. Further, abnormal growth of a nitride semiconductor which has a semi-polar plane can be prevented.

Other Embodiments

The light-emitting device according to each of the above-described fourth to eighth embodiments may be used as a light source device, without making any modification. However, when combined with, for example, a resin material containing a fluorescent material for wavelength conversion, the light-emitting device according to each of the embodiments may be suitably used as a light source device with an expanded wavelength range (e.g., a white light source device). The configuration of the white light source device is the same as that of the device shown in FIG. 42, and therefore, description thereof is herein omitted.

According to the present embodiment, a light source device according to the present embodiment is capable of reducing the polarization degree of light and improving the light distribution characteristics and the light extraction efficiency as the light-emitting devices of the fourth to eighth embodiments are, and furthermore, capable of controlling the wavelength band of emitted light with the use of a wavelength conversion section which is realized by a resin layer containing a phosphor dispersed therein.

As described hereinabove, according to each of the above-described embodiments, variations thereof, and examples, in a nitride-based semiconductor of which principal surface (growing plane) is a non-polar plane or semi-polar plane, a plurality of stripe structures are provided on the light emission surface side. The extending direction of the stripe structures is inclined, in the m-plane, by not less than 3° and not more than 45° with respect to the a-axis direction of the nitride semiconductor of which growing plane is the m-plane, so that the polarization degree of emitted light from an active layer which is made of a nitride semiconductor of which growing plane is the m-plane can be greatly reduced, and the light distribution characteristics can be improved.

Figure 44:
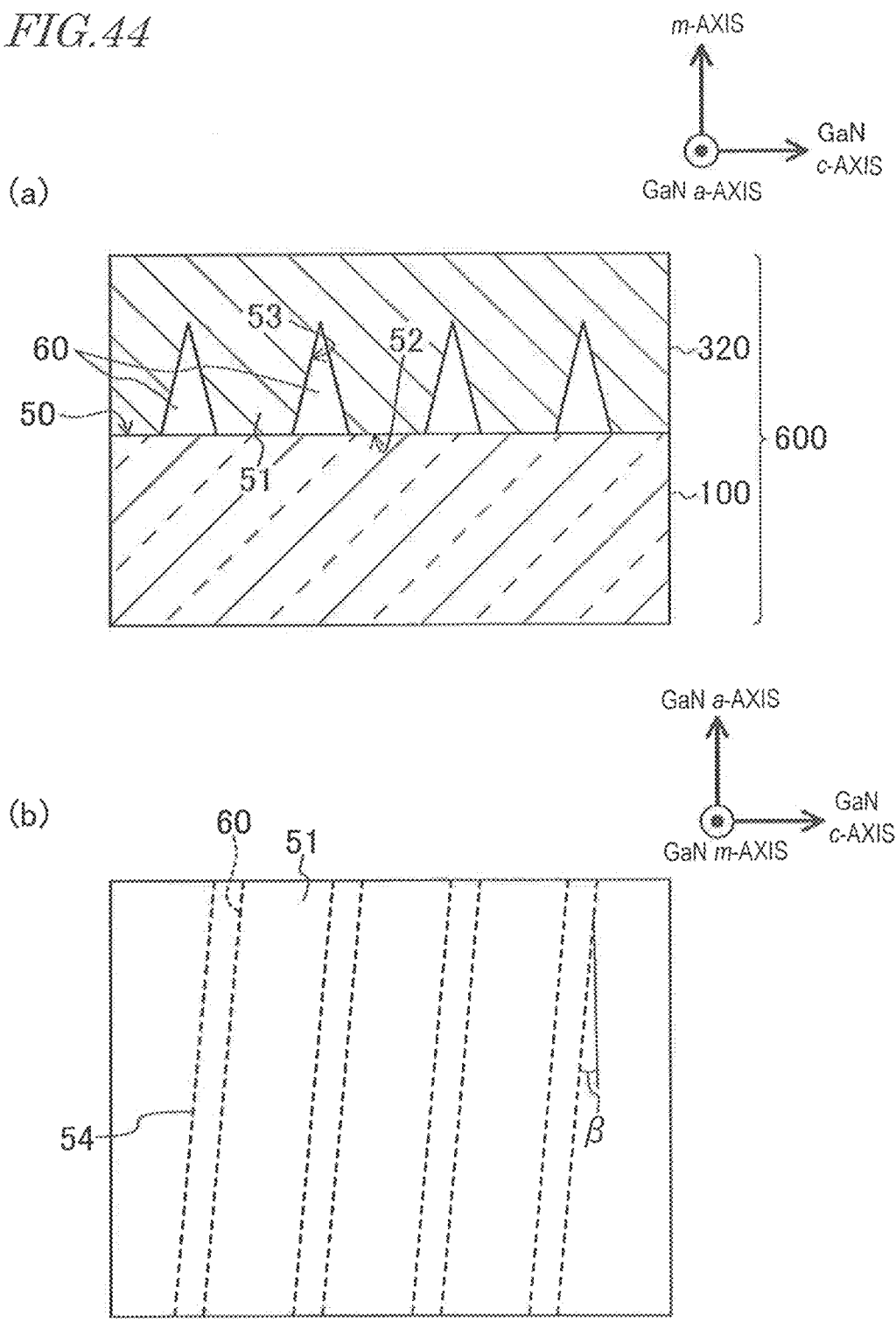
FIG. 44(a) is a cross-sectional view showing a heterogeneous nitride semiconductor substrate which includes stripe-shaped gaps according to the fourth embodiment.
FIG. 44(b) is a plan view where the stripe-shaped gaps are seen in the m-axis direction.
Figure 45:
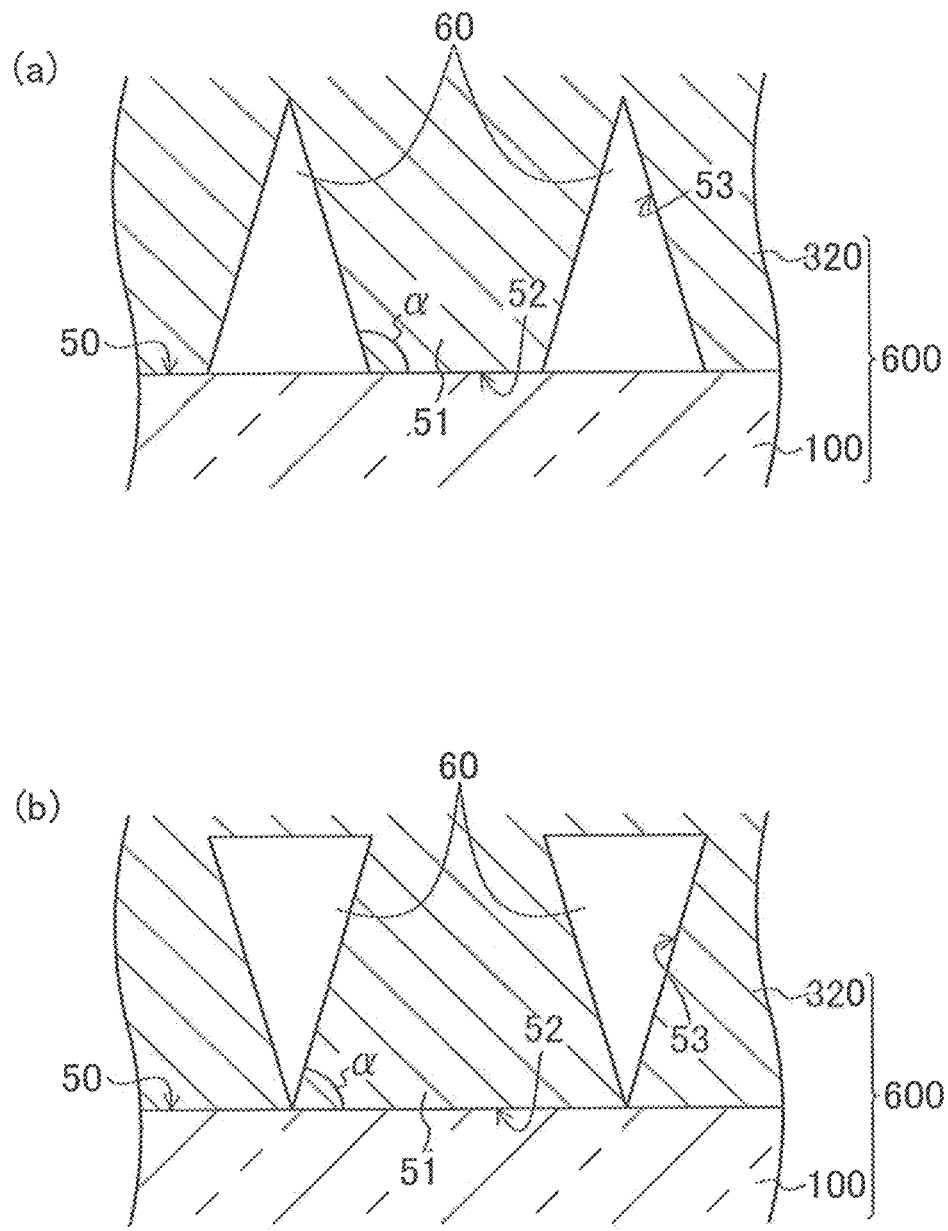
FIGS. 45(a) and 45(b) are enlarged schematic cross-sectional views of heterogeneous nitride semiconductor substrates which show variations of the gaps.

The stripe structures may be provided on the light emission surface side. For example, the stripe structures may be provided in the rear surface of the growth substrate, and may be structures which have an uneven shape along a direction perpendicular to the extending direction of the stripe structures. For example, the stripe structures are realized by a plurality of raised portions 51 provided in the lower part of the nitride semiconductor film 320 with gaps 60 interposed therebetween as shown in FIG. 44. Alternatively, the gaps 60 themselves may form the stripe structures. Still alternatively, as shown in FIG. 56(*d*), it can be said that part of the nitride semiconductor portion 310 sandwiched by two gaps 60 on adjacent mask portions 120 forms a stripe structure. Still alternatively, as shown in FIG. 56(*d*) and FIG. 58(*d*), it can be said that the stripe-shaped nitride semiconductor layers 110*a* provided on the principal surface of the growth substrate 100 form the stripe structures. Still alternatively, when the nitride semiconductor 320 and the nitride semiconductor layer 110 are integrated to surround the perimeter of the gaps 60 as shown in FIG. 64(*b*), it can be said that part of the nitride semiconductor 320 which is sandwiched by two adjacent gaps 60 also forms a stripe structure. In this case, the stripe structures are provided inside the nitride-based semiconductor multilayer structure. Still alternatively, as shown in FIG. 69, it can be said that the uneven structure 70 provided in the substrate 100 forms the stripe structures.

The stripe structures may be made of two types of materials which have different refractive indices. For example, when the stripe structures are provided in the rear surface of the above-described growth substrate, the interface, which has an uneven shape of the stripe structures, is formed by two types of materials, the air and the material of the growth substrate. Alternatively, for example, other combinations, such as the interface between the sapphire substrate and GaN layer, the interface between the air and the GaN layer, etc., are possible.

To enhance improvement of the light extraction efficiency, it is important that the stripe structures themselves are made of a material which causes only a small light absorption loss. For example, as the stripe structures, deliberately forming gaps, using a dielectric layer, such as $SiO_2$, or using a metal layer which has high reflectance is desirable. By periodically forming such stripe structures with angle β, the effect of reducing the polarization degree of light and the effect of improving the light distribution characteristics can be obtained.

The stripe structures may be provided at and near the interface between a nitride semiconductor layer of which growing plane is a non-polar plane and a substrate for growth of the nitride semiconductor layer. In general, a sapphire substrate which is used as a substrate for growth of a nitride semiconductor layer is very hard and difficult to process. Therefore, such a problem can be avoided when the stripe structures are provided near the interface of the nitride semiconductor layer bordering on the sapphire substrate, so that control of the polarization degree and the light distribution characteristics can be readily achieved.

The present disclosure is applicable to, for example, general-purpose lighting devices.

While the present disclosure has been described with respect to preferred embodiments thereof, it will be apparent to those skilled in the art that the disclosed disclosure may be modified in numerous ways and may assume many embodiments other than those specifically described above. Accordingly, it is intended by the appended claims to cover all modifications of the disclosure that fall within the true spirit and scope of the disclosure.

What is claimed is:

1. A multilayer structure, comprising:
   a structure for growth of a nitride semiconductor layer; and
   a nitride semiconductor layer, wherein
   the structure for growth of the nitride semiconductor layer comprises:
     a sapphire substrate having a growing plane which is an m-plane; and
     a plurality of ridge-shaped nitride semiconductor regions formed on the growing plane of the sapphire substrate;
   a bottom surface of a recessed portion provided between respective ones of the plurality of ridge-shaped nitride semiconductor regions is the m-plane of the sapphire substrate;
   a growing plane of the plurality of ridge-shaped nitride semiconductor regions is an m-plane;
   an absolute value of an angle between an extending direction of the plurality of ridge-shaped nitride semiconductor regions and a c-axis of the sapphire substrate is not less than 5° and not more than 35°;
   a back surface of the nitride semiconductor layer is in contact with the plurality of the ridge-shaped nitride semiconductor regions; and
   a front surface of the nitride semiconductor layer has a surface rms roughness of not more than 100 nanometers.

2. The multilayer structure according to claim 1, wherein an angle inside the plurality of ridge-shaped nitride semiconductor regions between a lateral surface which is parallel to the extending direction of the plurality of ridge-shaped nitride semiconductor regions and the m-plane is greater than 0° and smaller than 150°.

3. The multilayer structure according to claim 1, wherein a depth of the bottom surface relative to an interface between the sapphire substrate and the ridge-shaped nitride semiconductor regions is more than 0 nm and not more than 150 nm.

4. The multilayer structure according to claim 1, wherein an angle between the extending direction of the plurality of ridge-shaped nitride semiconductor regions and the c-axis of the sapphire substrate is not less than 0° and not more than 10°.

5. The multilayer structure according to claim 1, wherein a value of S width/(L width+S width) is not less than 0.6 and less than 1,
   where L width represents a width of the plurality of ridge-shaped nitride semiconductor regions at a base, and
   S width represents a width of the recessed portions at a bottom surface.

6. The multilayer structure according to claim 1, wherein an upper surface of the plurality of ridge-shaped nitride semiconductor regions is not provided with a mask.

7. The multilayer structure according to claim 1, further comprising a buffer layer provided between the growing plane of the sapphire substrate and the ridge-shaped nitride semiconductor regions, the buffer layer being formed of $Al_xGa_yIn_zN$, where $0 \leq x, y, z \leq 1$, $x+y+z=1$.

8. The multilayer structure according to claim 1, wherein the back surface of the nitride semiconductor layer is in contact with an upper surface of the plurality of ridge-shaped nitride semiconductor regions.

9. A nitride-based semiconductor light-emitting device comprising the multilayer structure as set forth in claim 1.

10. The multilayer structure according to claim 5, wherein the L width is not less than 0.1 μm and not more than 10 μm, the S width is not less than 0.15 μm and not more than 30 μm, and
the value of S width/(L width+S width) is not less than 0.6 and not more than 0.996.

11. The multilayer structure according to claim 5, wherein the L width is not less than 0.1 μm and not more than 10 μm, the S width is not less than 30 μm and not more than 300 μm, and
the value of S width/(L width+S width) is not less than 0.75 and less than 1.

12. The multilayer structure according to claim 5, wherein the L width is not less than 1 μm and not more than 5 μm, the S width is not less than 30 μm and not more than 300 μm, and
the value of S width/(L width+S width) is not less than 0.857 and less than 1.

13. The multilayer structure according to claim 7, wherein the buffer layer is not present on a bottom surface or lateral surface of the recessed portions.

14. The multilayer structure according to claim 7, wherein the buffer layer is formed of AlN.

15. A light source, comprising:
    the nitride-based semiconductor light-emitting device as set forth in claim 9; and
    a wavelength converter including a phosphoric material which is capable of converting a wavelength of light emitted from the nitride-based semiconductor light-emitting device.

16. A method for fabricating a multilayer structure, comprising the steps of:

(a) providing a sapphire substrate having a growing plane which is an m-plane;

(b) growing a nitride semiconductor film on the growing plane of the sapphire substrate;

(c) forming a plurality of recessed portions so as to penetrate through the nitride semiconductor film, thereby forming a plurality of ridge-shaped nitride semiconductor regions; and (d) growing a nitride semiconductor layer such that the growth starts from the plurality of ridge-shaped nitride semiconductor regions, wherein in the step (c), the plurality of recessed portions are formed such that a bottom surface of the plurality of recessed portions is the m-plane of the sapphire substrate, the growing plane of the plurality of ridge-shaped nitride semiconductor regions is an m-plane, and an absolute value of an angle between an extending direction of the plurality of ridge-shaped nitride semiconductor regions and a c-axis of the sapphire substrate is not less than 5° and not more than 35°; and in the step (d), a front surface of the nitride semiconductor layer has a surface rms roughness of not more than 100 nanometers.

* * * * *